US011309334B2

(12) United States Patent
Lin et al.

(10) Patent No.: US 11,309,334 B2
(45) Date of Patent: Apr. 19, 2022

(54) LOGIC DRIVE USING STANDARD COMMODITY PROGRAMMABLE LOGIC IC CHIPS COMPRISING NON-VOLATILE RANDOM ACCESS MEMORY CELLS

(71) Applicant: Cometrue Company Ltd., Zhubei (TW)

(72) Inventors: Mou-Shiung Lin, Hsinchu (TW); Jin-Yuan Lee, Hsinchu (TW)

(73) Assignee: iCometrue Company Ltd., Hsin-Chu County (TW)

( * ) Notice: Subject to any disclaimer, the term of this patent is extended or adjusted under 35 U.S.C. 154(b) by 0 days.

(21) Appl. No.: 17/100,937

(22) Filed: Nov. 22, 2020

(65) Prior Publication Data

US 2021/0104551 A1 Apr. 8, 2021

Related U.S. Application Data

(63) Continuation-in-part of application No. 16/565,967, filed on Sep. 10, 2019, now Pat. No. 10,892,011.
(Continued)

(51) Int. Cl.

| | |
|---|---|
| ***H01L 27/11*** | (2006.01) |
| ***G11C 14/00*** | (2006.01) |
| ***H01L 27/118*** | (2006.01) |

(52) U.S. Cl.
CPC .... *H01L 27/11807* (2013.01); *G11C 14/0081* (2013.01); *H01L 2027/11838* (2013.01); *H01L 2027/11875* (2013.01)

(58) Field of Classification Search
None
See application file for complete search history.

(56) References Cited

U.S. PATENT DOCUMENTS

| | | | |
|---|---|---|---|
| 4,870,302 | A | 9/1989 | Freeman |
| 5,272,368 | A | 12/1993 | Turner et al. |

(Continued)

FOREIGN PATENT DOCUMENTS

| | | |
|---|---|---|
| CN | 103681367 | 3/2014 |
| CN | 104078453 | 10/2014 |

(Continued)

*Primary Examiner* — Tan T. Nguyen

(57) ABSTRACT

A multi-chip package includes: an interposer; a first IC chip over the interposer, wherein the first IC chip is configured to be programmed to perform a logic operation, comprising a NVM cell configured to store a resulting value of a look-up table, a sense amplifier having an input data associated with the resulting value from the NVM cell and an output data associated with the first input data of the sense amplifier, and a logic circuit comprising a SRAM cell configured to store data associated with the output data of the sense amplifier, and a multiplexer comprising a first set of input points for a first input data set for the logic operation and a second set of input points for a second input data set having data associated with the data stored in the SRAM cell, wherein the multiplexer is configured to select, in accordance with the first input data set, an input data from the second input data set as an output data for the logic operation; and a second IC chip over the interposer, wherein the first IC chip is configured to pass data associated with the output data for the logic operation to the second IC chip through the interposer.

24 Claims, 72 Drawing Sheets

Related U.S. Application Data

(60) Provisional application No. 62/729,527, filed on Sep. 11, 2018, provisional application No. 62/869,567, filed on Jul. 2, 2019.

(56) References Cited

U.S. PATENT DOCUMENTS 5,587,603 A 12/1996 Kowshik
5,592,102 A 1/1997 Lane et al.
5,689,195 A 11/1997 Cliff et al.
5,796,662 A 8/1998 Kalter et al.
6,020,633 A 2/2000 Erikson
6,167,558 A 12/2000 Trimberger
6,356,478 B1 3/2002 McCollum
6,388,466 B1 5/2002 Wittig et al.
6,404,226 B1 6/2002 Schadt
6,687,167 B2 2/2004 Guaitini et al.
6,798,240 B1 9/2004 Pedersen
6,812,086 B2 11/2004 Murthy et al.
6,828,823 B1 12/2004 Tsui
6,943,580 B2 9/2005 Lewis et al.
6,998,872 B1 2/2006 Chirania et al.
7,030,652 B1 4/2006 Lewis et al.
7,061,271 B1 6/2006 Young et al.
7,193,433 B1 3/2007 Young
7,219,237 B1 5/2007 Trimberger
7,366,306 B1 4/2008 Trimberger
7,385,417 B1 6/2008 Agrawal et al.
7,420,390 B1 9/2008 Hutton et al.
7,550,994 B1 6/2009 Camarota et al.
7,598,555 B1 10/2009 Papworth Parkin
7,653,891 B1 1/2010 Anderson et al.
7,747,025 B1 6/2010 Trimberger
7,853,799 B1 12/2010 Trimberger
7,933,140 B2 4/2011 Wang et al.
7,944,231 B2 5/2011 Javerliac
7,948,266 B2 5/2011 Schmit et al.
7,973,556 B1 7/2011 Noguera Serra et al.
8,064,224 B2 11/2011 Mahajan et al.
8,159,268 B1 4/2012 Madurawe
8,243,527 B2 8/2012 Hung et al.
8,354,297 B2 1/2013 Pagaila et al.
8,378,407 B2 2/2013 Audzeyeu et al.
8,531,032 B2 9/2013 Yu et al.
8,546,955 B1 10/2013 Wu
8,592,886 B2 11/2013 Hsu et al.
8,709,865 B2 4/2014 Hu et al.
8,742,579 B2 6/2014 Pagaila et al.
8,786,060 B2 7/2014 Yen et al.
8,796,137 B2 8/2014 Pagaila et al.
8,866,292 B2 10/2014 Beer et al.
8,872,349 B2 10/2014 Chiu et al.
8,878,360 B2 11/2014 Meyer et al.
8,883,561 B2 11/2014 Park et al.
8,885,334 B1 11/2014 Baxter
8,895,440 B2 11/2014 Choi et al.
8,912,822 B2 12/2014 Yasuda
8,916,421 B2 12/2014 Gong et al.
8,941,230 B2 1/2015 Kyozuka et al.
8,952,489 B2 2/2015 Elian et al.
8,952,521 B2 2/2015 Wojnowski et al.
8,987,918 B2 3/2015 Razdan et al.
8,993,377 B2 3/2015 Koo et al.
9,003,221 B1 4/2015 Abugharbieh et al.
9,082,806 B2 7/2015 Lin et al.
9,106,229 B1 8/2015 Hutton
9,135,185 B2 9/2015 Loh et al.
9,147,638 B2 9/2015 Liu et al.
9,224,647 B2 12/2015 Koo et al.
9,225,512 B1 12/2015 Trimberger
9,252,127 B1 2/2016 Shen et al.
9,263,370 B2 2/2016 Shenoy et al.
9,281,292 B2 3/2016 Hu et al.
9,324,672 B2 4/2016 Pagaila et al.
9,331,060 B2 5/2016 Otremba et al.
9,343,442 B2 5/2016 Chen et al.
9,349,703 B2 5/2016 Chiu et al.
9,349,713 B2 5/2016 Kim et al.
9,362,187 B2 6/2016 Ossimitz
9,385,006 B2 7/2016 Lin
9,385,009 B2 7/2016 Lin et al.
9,385,105 B2 7/2016 Meyer et al.
9,396,998 B2 7/2016 Kurita et al.
9,397,050 B2 7/2016 Shin et al.
9,406,619 B2 8/2016 Pagaila et al.
9,406,658 B2 8/2016 Lee et al.
9,437,260 B2 9/2016 Prenat et al.
9,449,930 B2 9/2016 Kim et al.
9,455,218 B2 9/2016 Ooi et al.
9,508,626 B2 11/2016 Pagaila et al.
9,524,955 B2 12/2016 Huang et al.
9,543,276 B2 1/2017 Jee et al.
9,583,431 B1 2/2017 Rahman
9,593,009 B2 3/2017 Fuergut et al.
9,607,967 B1 3/2017 Shih
9,627,365 B1 4/2017 Yu et al.
9,640,259 B2 5/2017 Li et al.
9,679,863 B2 6/2017 Lin et al.
9,704,843 B2 7/2017 Kilger et al.
9,735,113 B2 8/2017 Chi et al.
9,763,329 B1 9/2017 Mason
9,773,757 B2 9/2017 Yu et al.
9,806,058 B2 10/2017 Wei et al.
9,812,337 B2 11/2017 Chen et al.
9,818,720 B2 11/2017 Wei et al.
9,831,148 B2 11/2017 Yu et al.
9,859,896 B1 1/2018 Gaide et al.
9,881,850 B2 1/2018 Yu et al.
9,887,206 B2 2/2018 Su et al.
9,893,732 B1 2/2018 Lewis
9,899,248 B2 2/2018 Yu et al.
9,899,355 B2 2/2018 Yuan et al.
9,935,113 B2 4/2018 Wu et al.
9,966,325 B2 5/2018 Beyne
9,997,464 B2 6/2018 Hsieh et al.
10,015,916 B1 7/2018 Karp
10,026,681 B2 7/2018 Ko et al.
10,033,383 B1 7/2018 Richter et al.
10,037,963 B2 7/2018 Chen et al.
10,038,647 B1 7/2018 Lesea
10,043,768 B2 8/2018 Meyer et al.
10,056,351 B2 8/2018 Yu et al.
10,056,907 B1 8/2018 Asnaashari
10,062,648 B2 8/2018 Hsieh et al.
10,062,651 B2 8/2018 Liang et al.
10,079,243 B2 9/2018 Ramkumar
10,109,588 B2 10/2018 Jeong et al.
10,109,617 B2 11/2018 Sugiyama et al.
10,153,222 B2 12/2018 Yu et al.
10,153,239 B2 12/2018 Wang et al.
10,157,828 B2 12/2018 Hsu et al.
10,157,849 B2 12/2018 Huang et al.
10,162,139 B1 12/2018 Wang et al.
10,163,798 B1 12/2018 Alur et al.
10,163,802 B2 12/2018 Lin et al.
10,177,188 B2 1/2019 Kang et al.
10,204,684 B2 2/2019 Widjaja
10,211,070 B2 2/2019 Lee et al.
10,211,182 B2 2/2019 Meyer et al.
10,229,723 B1 * 3/2019 Choi ...................... H01L 43/04
10,256,219 B2 4/2019 Chew
10,290,611 B2 5/2019 Yu et al.
10,325,882 B2 6/2019 Kang et al.
10,333,623 B1 6/2019 Liao et al.
10,340,249 B1 7/2019 Yu et al.
10,373,885 B2 8/2019 Yu et al.
10,419,001 B2 9/2019 Jo et al.
10,431,536 B2 10/2019 Kim et al.
10,447,274 B2 10/2019 Lee et al.
10,476,505 B2 11/2019 Ngai
10,490,521 B2 11/2019 Hu et al.
10,490,540 B2 11/2019 Yu et al.
10,504,835 B1 12/2019 Wang et al.
10,510,634 B2 12/2019 Lin et al.

(56) References Cited

U.S. PATENT DOCUMENTS 10,510,650 B2 12/2019 Yu et al.
10,522,449 B2 12/2019 Chen et al.
10,541,227 B2 1/2020 Yeh et al.
10,541,228 B2 1/2020 Chen et al.
10,622,321 B2 4/2020 Yu et al.
10,741,537 B2 8/2020 Lu et al.
10,784,248 B2 9/2020 Yu et al.
10,797,031 B2 10/2020 Liao et al.
10,886,457 B2* 1/2021 Lee ...................... G11C 11/161
10,892,011 B2 1/2021 Lin et al.
2001/0045844 A1 11/2001 New et al.
2003/0122578 A1 7/2003 Masui et al.
2004/0041584 A1 3/2004 Sunaga et al.
2004/0145850 A1 7/2004 Fukumoto et al.
2004/0222817 A1 11/2004 Madurawe
2005/0185457 A1* 8/2005 Kim ...................... B82Y 10/00
365/173
2005/0218929 A1 10/2005 Wang et al.
2007/0166912 A1 7/2007 Fenigstein et al.
2007/0279987 A1 12/2007 Fang et al.
2009/0114971 A1 5/2009 Cai et al.
2009/0243650 A1 10/2009 Madurawe
2009/0243652 A1 10/2009 Dorairaj et al.
2009/0267238 A1 10/2009 Joseph
2010/0039136 A1 2/2010 Chua-Eoan et al.
2010/0157669 A1 6/2010 Audzeyeu
2010/0283085 A1 11/2010 Bemanian et al.
2011/0026232 A1 2/2011 Lin et al.
2011/0221470 A1 9/2011 Javerliac et al.
2012/0193785 A1 8/2012 Lin et al.
2012/0217549 A1 8/2012 Widjaja
2013/0082399 A1 4/2013 Kim et al.
2013/0257477 A1 10/2013 Yasuda et al.
2013/0285253 A1 10/2013 Aoki et al.
2014/0017882 A1 1/2014 Lei
2014/0070403 A1 3/2014 Pan et al.
2014/0131858 A1 5/2014 Pan et al.
2014/0183731 A1 7/2014 Lin et al.
2014/0185264 A1 7/2014 Chen et al.
2014/0203412 A1 7/2014 Wang et al.
2014/0210097 A1 7/2014 Chen
2014/0254232 A1 9/2014 Wu
2014/0302659 A1 10/2014 Phatak
2015/0008957 A1 1/2015 Olgiati et al.
2015/0014844 A1 1/2015 Wu et al.
2015/0116965 A1 4/2015 Kim et al.
2015/0227662 A1 8/2015 Lepereq
2015/0327367 A1 11/2015 Shen
2016/0118390 A1 4/2016 Liaw
2016/0133571 A1 5/2016 Lee et al.
2016/0173101 A1 6/2016 Gao et al.
2016/0190113 A1 6/2016 Sharan et al.
2016/0217835 A1 7/2016 Blott et al.
2016/0351626 A1 12/2016 McCollum
2016/0372449 A1 12/2016 Rusu et al.
2017/0071552 A1 3/2017 Harpe et al.
2017/0301650 A1 10/2017 Yu et al.
2018/0040358 A1* 2/2018 Noguchi ............... G11C 11/161
2018/0053730 A1 2/2018 Shao
2018/0061742 A1 3/2018 Ananiev
2018/0076179 A1 3/2018 Hsu et al.
2018/0102776 A1 4/2018 Chandrasekar et al.
2018/0150667 A1 5/2018 Yu et al.
2018/0151477 A1 5/2018 Yu et al.
2018/0151501 A1 5/2018 Yu et al.
2018/0158746 A1 6/2018 Lin
2018/0165396 A1 6/2018 Lin et al.
2018/0174865 A1 6/2018 Yu et al.
2018/0204810 A1 7/2018 Yu et al.
2018/0204828 A1 7/2018 Yu et al.
2018/0210799 A1 7/2018 Gao
2018/0226349 A1 8/2018 Yu et al.
2018/0247905 A1 8/2018 Yu et al.
2018/0269188 A1 9/2018 Yu et al.
2018/0275193 A1 9/2018 Rouge et al.
2018/0284186 A1 10/2018 Chadha
2018/0286776 A1 10/2018 Yu et al.
2018/0301351 A1 10/2018 Yu et al.
2018/0301376 A1 10/2018 Shih et al.
2018/0350629 A1 12/2018 Liu et al.
2018/0350763 A1 12/2018 Yu et al.
2018/0358312 A1 12/2018 Yu et al.
2018/0374824 A1 12/2018 Yu et al.
2019/0013276 A1 1/2019 Lee et al.
2019/0019756 A1 1/2019 Yu et al.
2019/0020343 A1 1/2019 Lin et al.
2019/0051641 A1 2/2019 Lin et al.
2019/0057932 A1 2/2019 Wu et al.
2019/0058112 A1* 2/2019 Chen .................... G11C 11/161
2019/0097304 A1 3/2019 Hsiao et al.
2019/0129817 A1 5/2019 Zhuo
2019/0221547 A1 7/2019 Drab et al.
2019/0238134 A1 8/2019 Lin et al.
2019/0238135 A1 8/2019 Lin et al.
2019/0245543 A1 8/2019 Lin et al.
2019/0253056 A1 8/2019 Lin et al.
2019/0304803 A1 10/2019 Hu et al.
2019/0333871 A1 10/2019 Chen et al.
2019/0347790 A1 11/2019 Lin et al.
2019/0363715 A1 11/2019 Lin et al.
2019/0372574 A1 12/2019 Lin et al.
2020/0058617 A1 2/2020 Wu et al.
2020/0373215 A1 11/2020 Wu et al.

FOREIGN PATENT DOCUMENTS

CN 104282650 1/2015
CN 105745752 7/2016
CN 104064556 4/2019
WO WO00/36748 6/2000
WO WO2005010976 2/2005
WO WO2016160063 10/2016

* cited by examiner

| Input | | | | Output | | | | |
|---|---|---|---|---|---|---|---|---|
| A1 | A0 | x A3 | A2 | Dout C3 | C2 | C1 | C0 | |
| 0 | 0 | 0 | 0 | 0 | 0 | 0 | 0 | D0 |
| 0 | 0 | 0 | 1 | 0 | 0 | 0 | 0 | D1 |
| 0 | 0 | 1 | 0 | 0 | 0 | 0 | 0 | D2 |
| 0 | 0 | 1 | 1 | 0 | 0 | 0 | 0 | D3 |
| 0 | 1 | 0 | 0 | 0 | 0 | 0 | 0 | D4 |
| 0 | 1 | 0 | 1 | 0 | 0 | 0 | 1 | D5 |
| 0 | 1 | 1 | 0 | 0 | 0 | 1 | 0 | D6 |
| 0 | 1 | 1 | 1 | 0 | 0 | 1 | 1 | D7 |
| 1 | 0 | 0 | 0 | 0 | 0 | 0 | 0 | D8 |
| 1 | 0 | 0 | 1 | 0 | 0 | 1 | 0 | D9 |
| 1 | 0 | 1 | 0 | 0 | 1 | 0 | 0 | D10 |
| 1 | 0 | 1 | 1 | 0 | 1 | 1 | 0 | D11 |
| 1 | 1 | 0 | 0 | 0 | 0 | 0 | 0 | D12 |
| 1 | 1 | 0 | 1 | 0 | 0 | 1 | 1 | D13 |
| 1 | 1 | 1 | 0 | 0 | 1 | 1 | 0 | D14 |
| 1 | 1 | 1 | 1 | 1 | 0 | 0 | 1 | D15 |

Before reconfiguration

| $IU_{(n-1)}$ | $CPM_{(n-1)}$ | $LS_{(n-1)}$ | $DIM_{(n-1)}$ |
|---|---|---|---|
| $IU_{(n-1)a}$ | $CPM_{(a,1,1)}$ | $LS_{(n-1)a}$ | $DIM_{(a,1,1')}$<br>$DIM_{(a,2,2')}$ |
| $IU_{(n-1)b}$ | $CPM_{(b,2,2)}$<br>$CPM_{(b,3,3)}$ | $LS_{(n-1)b}$ | $DIM_{(b,3,3')}$<br>$DIM_{(b,4,4')}$ |
| $IU_{(n-1)c}$ | $CPM_{(c,4,4)}$ | $LS_{(n-1)c}$ | $DIM_{(c,5,5')}$<br>$DIM_{(c,6,6')}$<br>$DIM_{(c,7,6')}$ |

After reconfiguration

| $IUC_n$ | $CPMC_n$ | $LSC_n$ | $DIMC_n$ |
|---|---|---|---|
| $IUC_{ne}$ | $CPMC_{(e,1,1)}$ | $LSC_{ne}$ | $DIMC_{(e,1,1')}$<br>$DIMC_{(e,2,2')}$ |
| $IUC_{nf}$ | $CPMC_{(f,2,4)}$<br>$CPMC_{(f,3,5)}$ | $LSC_{nf}$ | $DIMC_{(f,3,8')}$<br>$DIMC_{(f,4,9')}$<br>$DIMC_{(f,5,10')}$ |
| $IUC_{ng}$ | $CPMC_{(g,4,2)}$<br>$CPMC_{(g,5,5)}$ | $LSC_{ng}$ | $DIMC_{(g,6,11')}$<br>$DIMC_{(g,8,5')}$ |
| $IUC_{nh}$ | $CPMC_{(h,6,6)}$ | $LSC_{nh}$ | $DIMC_{(h,7,7')}$<br>$DIMC_{(h,9,6')}$ |

Fig. 29

LOGIC DRIVE USING STANDARD COMMODITY PROGRAMMABLE LOGIC IC CHIPS COMPRISING NON-VOLATILE RANDOM ACCESS MEMORY CELLS

PRIORITY CLAIM

This application is a continuation-in-part of U.S. patent application Ser. No. 16/565,967, filed on Sep. 10, 2019, now U.S. Pat. No. 10,892,011, which claims priority benefits from U.S. provisional application No. 62/729,527, filed on Sep. 11, 2018 and entitled "LOGIC DRIVE WITH BRAIN-LIKE ELASTICITY AND INTEGRALITY USING STANDARD COMMODITY PROGRAMMABLE LOGIC IC CHIPS"; and U.S. provisional application No. 62/869,567, filed on Jul. 2, 2019 and entitled "CRYPTOGRAPHY METHOD FOR STANDARD COMMODITY PROGRAMMABLE LOGIC IC CHIPS IN LOGIC DRIVE". The present application incorporates the foregoing disclosures herein by reference.

BACKGROUND OF THE DISCLOSURE

Field of the Disclosure

The present invention relates to a logic package, logic package drive, logic device, logic module, logic drive, logic disk, logic disk drive, logic solid-state disk, logic solid-state drive, Field Programmable Gate Array (FPGA) logic disk, or FPGA logic drive (to be abbreviated as "logic drive" below, that is when "logic drive" is mentioned below, it means and reads as "logic package, logic package drive, logic device, logic module, logic drive, logic disk, logic disk drive, logic solid-state disk, logic solid-state drive, FPGA logic disk, or FPGA logic drive") comprising plural FPGA IC chips for field programming purposes, and more particularly to a standardized commodity logic drive formed by using plural standardized commodity FPGA IC chips comprising non-volatile random access memory cells, and to be used for different specific applications when field programmed or user programmed.

Brief Description of the Related Art

The Field Programmable Gate Array (FPGA) semiconductor integrated circuit (IC) has been used for development of new or innovated applications, or for small volume applications or business demands. When an application or business demand expands to a certain volume and extends to a certain time period, the semiconductor IC supplier may usually implement the application in an Application Specific IC (ASIC) chip, or a Customer-Owned Tooling (COT) IC chip. The switch from the FPGA design to the ASIC or COT design is because the current FPGA IC chip, for a given application and compared with an ASIC or COT chip, (1) has a larger semiconductor chip size, lower fabrication yield, and higher fabrication cost, (2) consumes more power, and (3) gives lower performance. When the semiconductor technology nodes or generations migrate, following the Moore's Law, to advanced nodes or generations (for example below 20 nm), the Non-Recurring Engineering (NRE) cost for designing an ASIC or COT chip increases greatly (more than US $5M or even exceeding US $10M, US $20M, US $50M or US $100M). The cost of a photo mask set for an ASIC or COT chip at the 16 nm technology node or generation may be over US $1M, US $2M, US $3M, or US $5M. The high NRE cost in implementing the innovation and/or application using the advanced IC technology nodes or generations slows down or even stops the innovation and/or application using advanced and powerful semiconductor technology nodes or generations. A new approach or technology is needed to inspire the continuing innovation and to lower down the barrier for implementing the innovation in the semiconductor IC chips using the advanced and powerful semiconductor technology nodes or generations.

SUMMARY OF THE DISCLOSURE

One aspect of the disclosure provides a standardized commodity logic drive in a multi-chip package comprising plural FPGA IC chips for use in different algorithms, architectures and/or applications requiring logic, computing and/or processing functions by field programming Uses of the standardized commodity logic drive is analogues to uses of a standardized commodity data storage solid-state disk (drive), data storage hard disk (drive), data storage floppy disk, Universal Serial Bus (USB) flash drive, USB drive, USB stick, flash-disk, or USB memory, and differs in that the latter has memory functions for data storage, while the former has logic functions for processing and/or computing.

Another aspect of the disclosure provides a method to reduce Non-Recurring Engineering (NRE) expenses for implementing an innovation and/or an innovation, accelerating workload processing or an application in semiconductor IC chips by using the standardized commodity logic drive. A person, user, or developer with an innovation and/or an application concept or idea or an aim for accelerating workload processing needs to purchase the standardized commodity logic drive and develops or writes software codes or programs to load into the standardized commodity logic drive to implement his/her innovation and/or application concept or idea; wherein said innovation and/or application (maybe abbreviated as innovation) comprises (i) innovative algorithms and/or architectures of computing, processing, learning and/or inferencing, and/or (ii) innovative and/or specific applications. Compared to the implementation by developing a logic ASIC or COT IC chip, the NRE cost using the standardized commodity logic drive may be reduced by a factor of larger than 2, 5, or 10. For advanced semiconductor technology nodes or generations (for example more advanced than or below 20 nm), the NRE cost for designing an ASIC or COT chip increases greatly, more than US $5M or even exceeding US $10M, US $20M, US $50M, or US $100M. The cost of a photo mask set for an ASIC or COT chip at the 16 nm technology node or generation may be over US $2M, US $5M, or US $10M. Implementing the same or similar innovation and/or application using the logic drive may reduce the NRE cost down to smaller than US $10M or even less than US $5M, US $3M, US $2M or US $1M. The aspect of the disclosure inspires the innovation and lowers the barrier for implementing the innovation in IC chips designed and fabricated using an advanced IC technology node or generation, for example, a technology node or generation more advanced than or below 20 nm or 10 nm.

Another aspect of the disclosure provides a standard commodity FPGA IC chip comprising a plurality of non-volatile memory cell arrays, sense amplifiers and SRAM cells. A non-volatile memory cell array of the plurality of non-volatile memory cell arrays comprises bit lines and word lines both coupled to the non-volatile memory cells in the non-volatile memory cell array. The word lines are coupled to an Address Controller or decoder Unit (ACU) for selecting the non-volatile memory cells for write (programming) or read. For the read operation, the bit lines are coupled to sense amplifiers. The sense amplifiers sense and amplify data or signals from the selected non-volatile memory cells, and output the data or signals to the SRAM cells for programming or configuring the programmable logic blocks or cells and the programmable interconnects in the standard commodity FPGA IC chip.

Another aspect of the disclosure provides the standard commodity FPGA IC chip described above, comprising a programmable logic block or cell configured to be programmed to perform a logic operation, wherein the programmable logic block or cell comprises: (1) a plurality of SRAM cells configured to store or latch a plurality of resulting values (data or information) of a look-up table (LUT), respectively, (2) a multiplexer comprising a first set of input points for a first input data set for the logic operation and a second set of input points for a second input data set associated with the data stored or latched in the plurality of SRAM cells, wherein the multiplexer is configured to select, in accordance with the first input data set, an input data from the second input data set as an output data for the logic operation. The standard commodity FPGA IC chip further comprises: (1) a plurality of non-volatile memory cells in the non-volatile memory cell array, wherein the plurality of resulting values (data or information) of the look-up table (LUT) are associated with a plurality of resulting values stored in the plurality of non-volatile memory cells, respectively, (2) the sensing amplifiers coupling to the plurality of non-volatile memory cells in the non-volatile cell array, respectively, wherein each of the plurality of sense amplifiers is configured to sense and amplify data associated with one of the plurality of resulting values of the look-up table (LUT) from a non-volatile memory cell of the plurality of non-volatile memory cells.

One or a plurality of LUTs and multiplexers (the selection circuits) may form a logic cell or element. A FPGA IC chip may comprise one or a plurality of logic arrays each comprises a plurality of logic cells or elements.

The logic cell or element may provide freedom and flexibility to implement logic function or operation, and/or computing or processing. For a first example, the logic cell or element may comprise: (i) a logic operator or circuit comprising (a) first and second basic logic gates or circuits, each comprises a LUT and a multiplexer. Each LUT comprises 8 SRAM cells for storing 8 ($2^3$) resulting values, data or information; and each LUT is followed by a corresponding multiplexer to select a resulting value, data or information from the each LUT according to the three input data of the corresponding multiplexer, as an output data for the each LUT/multiplexer. Each basic logic gate or circuit may be configured as, for example, a NAND, NOR, AND, OR or Exclusive-OR Boolean gate, operator or circuit. Each of the first and second basic logic gates or circuits may have the output data at an output point thereof; (b) a full adder (FA) having two input data (at its input points) from the two output data of the first and second basic logic gates or circuits respectively. The full adder may have a third input point for a carry-in data from another logic cell or element at a prior computing stage. The full adder (FA) comprises two output points, one for an output data of addition computing, and the other one for carry-out for another logic cell or element at a following computing stage; (c) a LUT-selection multiplexer to select one from the two output data of the first and second basic logic gates or circuits as an output data of the LUT-selection multiplexer. The LUT-selection multiplexer comprises two input points for two input data from the two output data of the first and second basic logic gates or circuits, and selects a data from its two input data, according to a control data from an input data of the logic cell or element, as an output data at its output point; (d) an addition-selection multiplexer to select a data path (in the logic cell or element) to go through full adder or not. The addition-selection multiplexer comprises two input points for two input data from the output data of the LUT-selection multiplexer and the full adder, and selects a data from its two input data, according to a configuration data stored in a SRAM cell of the logic cell or element, as an output data at its output point. In summary, the logic operator or circuit in the first example has 5 input data (3 for the two first and second basic logic gates or circuits, 1 for the LUT-selection multiplexer and 1 for the carry-in). The logic operator or circuit in the first example has 2 output data (1 for the logic operator or circuit and 1 for the carry-out). The logic operator or circuit in the first example comprises 16 SRAM cells for storing 16 resulting values for the two LUTs and 1 SRAM cell for the addition-selection multiplexer. (ii) a flip-flop for synchronizing the output of the operator or circuits. The flip-flop has two input points, including a first input point for the output data from the operator or circuit and a second input point for the clock signal, wherein the flip-flop may generate an output data by synchronizing the output of the operator or circuits with the clock signal. (iii) a synchronization-selection multiplexer to select synchronization or asynchronization of the output data of the logic operator or circuit. The synchronization-selection multiplexer comprises two input points, including a first input point for data from the output data of the logic operator or circuit and a second input point for the output data from the flip-flop, and selects a data from its two input data, according to a configuration data stored in a SRAM cell of the logic cell or element, as an output data thereof at its output point. In summary, the logic cell or element in the first example has 6 input data (3 for the two multiplexers for the LUTs, 1 for the LUT-selection multiplexer, 1 for the carry-in and 1 for the clock signal). The logic cell or element in the first example has 2 output data (1 for the logic cell or element and 1 for the carry-out). The logic cell or element in the first example comprises 16 SRAM cells for storing 16 resulting values for the two LUTs, 1 SRAM cell for the addition-selection multiplexer and 1 SRAM cell for the synchronization-selection multiplexer.

For a second example, the logic cell or element may comprise: (i) a logic operator or circuit comprising a basic logic gate or circuit comprising a LUT and a multiplexer. The LUT comprises 16 SRAM cells for storing 16 ($2^4$) resulting values, data or information; and the LUT is followed by a corresponding multiplexer to select a resulting value, data or information from the LUT according to the four input data of the corresponding multiplexer, as an output data of the basic logic gate or circuit. The basic logic gate or circuit may be configured as, for example, a NAND, NOR, AND, OR or Exclusive-OR Boolean gate, circuit or operator. The basic logic gate or circuit may have the output data at an output point thereof. The logic operator or circuit may further comprise an input point for a carry-in data and an output point for a carry-out data; (ii) a cascade circuit comprising, for example, an AND or OR logic gate or circuit to perform an AND or OR logic operation. The cascade circuit has a first input point for the output data of the basic logic gate or circuit and a second input point for a cascade-in data from another logic cell or element at a prior computing stage. The cascade circuit may generate a cascade-out data based on performing the AND or OR logic operation on the two input data at the first and second input points of the cascade circuit; (iii) a flip-flop for synchronizing the cascade-out data. The flip-flop has two input points, including a first input point for the cascade-out data from the cascade circuit and a second input point for the clock signal, wherein the flip-flop may generate an output data by synchronizing the cascade-out data with the clock signal; (iv) a synchronization-selection multiplexer to select synchronization or asynchronization of the cascade-out data of the cascade circuit. The synchronization-selection multiplexer comprises two input points, including a first input point for the cascade-out data of the cascade circuit and a second input point for the output data from the flip-flop, and selects a data from its two input data at its first and second input points, according to a configuration data stored in a SRAM cell of the logic cell or element, as an output data thereof at its output point. The output data at the output point of the synchronization-selection multiplexer is synchronizing with the clock signal. The logic cell or element may further comprise an output point (cascade-out point), wherein the cascade-out data is bypassing the flip-flop and is not synchronizing with the clock signal. The cascade-out point may couple to the second input point for a cascade-in data of the cascade circuit of another logic cell or element in the next computing stage through fixed metal wires, lines or traces. In summary, the logic cell or element in the second example has 6 input data (4 for the LUT and multiplexer, 1 for the carry-in and 1 for the clock signal). The logic cell or element in the second example has 3 output data (1 for the logic cell or element and 1 for the carry-out and 1 for cascade-out). The logic cell or element in the second example comprises 16 SRAM cells for storing 16 resulting values for the LUT and 1 SRAM cell for the synchronization-selection multiplexer.

In the first and second examples, the flip-flop may further comprise a set input point and a reset input point for set and reset data from a set/reset circuit to control setting, resetting or no-change of the flip-flop. The clock signal is controlled by a clock circuit to control on, off or inverse of the clock signal. In the second example, the logic operator or circuit may be a look-up table (LUT) comprising 16 SRAM cells for storing 16 resulting values and a multiplexer to select a resulting value according to four inputs thereof, wherein the look-up table (LUT) and multiplexer may be configured as a full adder.

Another aspect of the disclosure provides the standard commodity FPGA IC chip described above, configured for programmable interconnection, comprising: (1) a configurable switch configured for programmable interconnection, (2) a plurality of SRAM cells configured to store or latch a plurality of programing codes for configuring the configurable switch for programmable interconnection, (3) a plurality of non-volatile memory cells in the non-volatile memory cell array, wherein the plurality of programming codes for programmable interconnection in the plurality of SRAM cells are associated with a plurality of programming codes stored in the plurality of non-volatile memory cells, respectively, (4) the sensing amplifiers coupling to the plurality of non-volatile memory cells in the non-volatile cell array, respectively, wherein each of the plurality of sense amplifiers is configured to sense and amplify data (programming codes) associated with one of the plurality of programming codes for programmable interconnection from a non-volatile memory cell of the plurality of non-volatile memory cells.

Another aspect of the disclosure provides a hardware (the logic drive) and a software (tool) for users or software developers, in addition to current hardware developers, to easily develop their innovated or specific applications by using the standardized commodity logic drive. The software tool provides capabilities for users or software developers to write software using popular, common, or easy-to-learn programming languages, for example, C, Java, C++, C#, Scala, Swift, Matlab, Assembly Language, Pascal, Python, Visual Basic, PL/SQL or JavaScript languages. The users, or software developers may write software codes into the standard commodity logic drive (that is, loading the software codes in the non-volatile memory cells in the one or more non-volatile IC chips in or of the standardized commodity logic drive, or in the non-volatile Random-Access-Memory cells (NVRAM) of the FPGA chips in the logic drive) for their desired applications, for example, in algorithms, architectures and/or applications of Artificial Intelligence (AI), machine learning, deep learning, big data, Internet Of Things (IOT), car electronics, Virtual Reality (VR), Augmented Reality (AR), Graphic Processing, Digital Signal Processing, micro controlling, and/or Central Processing. The logic drive may be programed to perform functions like a graphic chip, or a baseband chip, or an Ethernet chip, or a wireless (for example, 802.11ac) chip, or an AI chip. The logic drive may be alternatively programmed to perform functions of all or any combinations of functions of Artificial Intelligence (AI), machine learning, deep learning, big data, Internet Of Things (IOT), car electronics, Virtual Reality (VR), Augmented Reality (AR), car electronics, Graphic Processing (GP), Digital Signal Processing (DSP), Micro Controlling (MC), and/or Central Processing (CP).

Another aspect of the disclosure provides a standard commodity FPGA IC chip for use in the standard commodity logic drive. The standard commodity FPGA IC chip is designed, implemented and fabricated using an advanced semiconductor technology node or generation, for example more advanced than or equal to, or below or equal to 20 nm or 10 nm, and for example using the technology node of 16 nm, 14 nm, 12 nm, 10 nm, 7 nm, 5 nm or 3 nm; with a chip size and manufacturing yield optimized with the minimum manufacturing cost for the used semiconductor technology node or generation. The standard commodity FPGA IC chip may have an area between 144 $mm^2$ and 16 $mm^2$, 75 $mm^2$ and 16 $mm^2$, or 50 $mm^2$ and 16 $mm^2$. Transistors used in the advanced semiconductor technology node or generation may be a FIN Field-Effect-Transistor (FINFET), a FINFET on Silicon-On-Insulator (FINFET SOI), a Fully Depleted Silicon-On-Insulator (FDSOI) MOSFET, a Partially Depleted Silicon-On-Insulator (PDSOI) MOSFET or a conventional MOSFET. The standard commodity FPGA IC chip may only communicate directly with other chips in or of the logic drive only; its I/O circuits may require only small I/O drivers or receivers, and small or none Electrostatic Discharge (ESD) devices. The driving capability, loading, output capacitance, or input capacitance of I/O drivers or receivers, or I/O circuits may be between 0.1 pF and 2 pF or 0.1 pF and 1 pF. The size of the ESD device may be between 0.05 pF and 2 pF or 0.05 pF and 1 pF. All or most control and/or Input/Output (I/O) circuits or units (for example, the off-logic-drive I/O circuits, i.e., large I/O circuits, communicating with circuits or components external or outside of the logic drive) are outside of, or not included in, the standard commodity FPGA IC chip, but are included in another dedicated control chip, dedicated I/O chip, or dedicated control and I/O chip, packaged in the same logic drive. None or minimal area of the standard commodity FPGA IC chip is used for the control or I/O circuits, for example, less than 15%, 10%, 5%, 2% or 1% area (not counting the seal ring and the dicing area of the chip; that means, only including area upto the inner boundary of the seal ring) is used for the control or 10 circuits; or, none or minimal transistors of the standard commodity FPGA IC chip are used for the control or I/O circuits, for example, less than 15%, 10%, 5%, 2% or 1% of the total number of transistors are used for the control or I/O circuits; or all or most area of the standard commodity FPGA IC chip is used for (i) logic blocks comprising logic gate arrays, computing units or operators, and/or Look-Up-Tables (LUTs) and multiplexers, and/or (ii) programmable interconnection. For example, greater than 85%, 90%, 95% or 99% area (not counting the seal ring and the dicing area of the chip; that means, only including area upto the inner boundary of the seal ring) is used for logic blocks, and/or programmable interconnection; or, all or most transistors of the standard commodity FPGA IC chip are used for logic blocks or repetitive arrays, and/or programmable interconnection, for example, greater than 85%, 90%, 95% or 99% of the total number of transistors are used for logic blocks, and/or programmable interconnection.

Another aspect of the disclosure provides a standard commodity FPGA IC chip for use in the standard commodity logic drive, wherein the standard commodity FPGA IC chip comprises SRAM cells for storing data or information for the Look-Up-Tables (LUT) or for storing the programming codes for programmable interconnection. The SRAM cells may be distributed over all locations in the FPGA chip, and are nearby or close to their corresponding LUTs or programmable interconnects. Alternatively, the SRAM cells may be located in a SRAM array, in a certain area or location of the FPGA chip. Alternatively, the SRAM cells may be located in one of multiple SRAM arrays, in multiple certain areas of the FPGA chip.

Another aspect of the disclosure provides a non-volatile memory cell in the FPGA IC chip, wherein the non-volatile memory cell is a Magnetoresistive Random Access Memory cell, abbreviated as "MRAM" cell for non-volatile storage of data or information; wherein the FPGA IC chip is used in the logic drive. The MRAM cells may be used as configuration memory cells for storing configuration information or data (programing codes or data) to program (write into) the 5T or 6T SRAMs in this FPGA IC chip for programmable interconnection and/or for data storage of the LUTs.

Another aspect of the disclosure provides a non-volatile memory cell in the FPGA IC chip, wherein the non-volatile memory cell is a Spin Orbit Torque Magnetoresistive Random Access Memory cell, abbreviated as "SOT MRAM" cell for non-volatile storage of data or information; wherein the FPGA IC chip is used in the logic drive. The SOT MRAM cells may be used as configuration memory cells for storing programing information or data (programing codes or data) to program (write into) the 5T or 6T SRAMs in this FPGA IC chip for programmable interconnection and/or for data or information storage of the LUTs.

Another aspect of the disclosure provides a non-volatile memory cell in the FPGA IC chip, wherein the non-volatile memory cell is a Resistive Random Access Memory cell, abbreviated as "RRAM" cell for non-volatile storage of data or information; wherein the FPGA IC chip is used in the logic drive. The RRAM cells may be used as configuration memory cells for storing configuration information or data (programing codes or data) to program (write into) the 5T or 6T SRAMs in this FPGA IC chip for programmable interconnection and/or for data storage of the LUTs.

Another aspect of the disclosure further provides selectors in addition to the above RRAM cells the FPGA IC chip, wherein the selectors are used for selecting RRAM cells for programming and read. This is the 1S1R RRAM cell array. The selector provides an RRAM cell array in the simple crossbar layout or structure, wherein a bit line and a word line in the cell array run perpendicularly to each other and the RRAM cell is sandwiched at a crosspoint between the bit line at the top and the word line at the bottom. The 1S1R RRAM cell array is a crosspoint cell array.

Another aspect of the disclosure provides a non-volatile memory cell in the FPGA IC chip, wherein the non-volatile memory cell is a Self-Select RRAM (SS RRAM) cell for non-volatile storage of data or information; wherein the FPGA IC chip is used in the logic drive. The SS RRAM cells may be used as configuration memory cells for storing configuration information or data (programing codes or data) to program (write into) the 5T or 6T SRAMs in this FPGA IC chip for programmable interconnection and/or for data storage of the LUTs. The SS RRAM provides a cell array in the simple crossbar layout or structure, wherein a bit line and a word line in the cell array run perpendicularly to each other and the SS RRAM cell is sandwiched at a crosspoint between the bit line at the top and the word line at the bottom. The SS RRAM cell array is a crosspoint cell array.

Another aspect of the disclosure provides the standard commodity logic drive in a multi-chip package comprising the standard commodity plural FPGA IC chips, for use in different algorithms, architectures and/or applications requiring logic, computing and/or processing functions by field programming, wherein the standard commodity plural FPGA IC chips, each is in a bare-die format or in a single-chip or multi-chip package. Each of standard commodity plural FPGA IC chips may have standard common features, counts or specifications: (1) logic blocks including (i) system gates with the count greater than or equal to 2M, 10M, 20M, 50M or 100M, (ii) logic cells or elements with the count greater than or equal to 64K, 128K, 512K, 1M, 4M or 8M, (iii) hard macros, for example DSP slices, microcontroller macros, multiplexer macros, fixed-wired adders, and/or fixed-wired multipliers and/or (iv) blocks of memory with the bit count equal to or greater than 1M, 10M, 50M, 100M, 200M or 500M bits; (2) the number of inputs to each of the logic blocks or operators: the number of inputs to each of the logic block or operator may be greater or equal to 4, 8, 16, 32, 64, 128, or 256; (3) the power supply voltage: the voltage may be between 0.1V and 8V, 0.1V and 6V, 0.1V and 2.5V, 0.1V and 2V, 0.1V and 1.5V, or 0.1V and 1V; (4) the I/O pads, in terms of layout, location, number and function. Since the FPGA chips are standard commodity IC chips, the number of FPGA chip designs or products for each technology node is reduced to a small number, therefore, the expensive photo masks or mask sets for fabricating the FPGA chips using advanced semiconductor nodes or generations are reduced to a few mask sets. For example, reduced down to between 3 and 20 mask sets, 3 and 10 mask sets, or 3 and 5 mask sets for a specific technology node or generation. The NRE and production expenses are therefore greatly reduced. With the few designs and products, the manufacturing processes may be tuned or optimized for the few chip designs or products, and resulting in very high manufacturing chip yields. This is similar to the current advanced standard commodity DRAM or NAND flash memory design and production. Furthermore, the chip inventory management becomes easy, efficient and effective; therefore, resulting in a shorter FPGA chip delivery time and becoming very cost-effective.

Another aspect of the disclosure provides the standard commodity logic drive in a multi-chip package comprising the plural standard commodity FPGA IC chips, for use in different algorithms, architectures and/or applications requiring logic, computing and/or processing functions by field programming, wherein the plural standard commodity FPGA IC chips, each is in a bare-die format or in a single-chip or multi-chip package. Each of the plural standard commodity FPGA IC chips may have standard common features or specifications as described and specified above. Similar to the standard DRAM IC chips for use in a DRAM module, the standard commodity FPGA IC chips in the logic drive, each chip may further comprise some additional I/O pins or pads, for example: (1) one chip enable pin or pad, (2) one input enable pin or pad, (3) one output enable pin or pad, (4) two input selection pins or pads and/or (5) two output selection pins or pads. Each of the plural standard commodity FPGA IC chips may comprise, for example, 4 I/O ports, and each I/O port may comprise 64 bi-directional I/O circuits.

Another aspect of the disclosure provides the standard commodity logic drive in a multi-chip package comprising plural standard commodity FPGA IC chips, for use in different algorithms, architectures and/or applications requiring logic, computing and/or processing functions by field programming, wherein the plural standard commodity FPGA IC chips, each is in a bare-die format or in a single-chip or multi-chip package format. The standard commodity logic drive may have standard common features, counts or specifications: (1) logic blocks including (i) system gates with the count greater than or equal to 8M, 40M, 80M, 200M or 400M, (ii) logic cells or elements with the count greater than or equal to 256K, 512K, 2M, 4M, 16M or 32M, (iii) hard macros, for example DSP slices, microcontroller macros, multiplexer macros, fixed-wired adders, and/or fixed-wired multipliers and/or (iv) blocks of memory with the bit count equal to or greater than 4M, 40M, 200M, 400M, 800M or 2G bits; (2) the power supply voltage: the voltage may be between 0.1V and 12V, 0.1V and 7V, 0.1V and 3V, 0.1V and 2V, 0.1V and 1.5V, or 0.1V and 1V; (3) the I/O pads in the multi-chip package of the standard commodity logic drive, in terms of layout, location, number and function; wherein the logic drive may comprise the I/O pads, metal pillars or bumps connecting or coupling to one or multiple (2, 3, 4, or more than 4) Universal Serial Bus (USB) ports, one or more IEEE 1394 ports, one or more Ethernet ports, one or more audio ports or serial ports, for example, RS-232 or COM (communication) ports, wireless transceiver I/Os, and/or Bluetooth transceiver I/Os, and etc. The logic drive may also comprise the I/O pads, metal pillars or bumps connecting or coupling to Serial Advanced Technology Attachment (SATA) ports, or Peripheral Components Interconnect express (PCIe) ports for communicating, connecting or coupling with the memory drive. Since the logic drives are standard commodity products, the product inventory management becomes easy, efficient and effective, therefore resulting in a shorter logic drive delivery time and becoming cost-effective.

Another aspect of the disclosure provides the above standard commodity logic drive in a multi-chip package further comprising a dedicated control chip, a dedicated I/O chip, and/or a dedicated control and I/O chip.

Another aspect of the disclosure provides a logic drive in a multi-chip package format further comprising an Innovated ASIC or COT (abbreviated as IAC below) chip for Intellectual Property (IP) circuits, Application Specific (AS) circuits, analog circuits, mixed-mode signal circuits, Radio-Frequency (RF) circuits, and/or transmitter, receiver, transceiver circuits, etc. The IAC chip is designed, implemented and fabricated using varieties of semiconductor technology nodes or generations, including old or matured technology nodes or generations, for example, less advanced than or equal to, or more mature than 20 nm or 30 nm, and for example using the technology node of 22 nm, 28 nm, 40 nm, 90 nm, 130 nm, 180 nm, 250 nm, 350 nm or 500 nm. The semiconductor technology node or generation used in the IAC chip is 1, 2, 3, 4, 5 or greater than 5 nodes or generations older, more matured or less advanced than that used in the standard commodity FPGA IC chips packaged in the same logic drive. Transistors used in the IAC chip may be a FINFET, a Fully Depleted Silicon-on-insulator (FDSOI) MOSFET, a Partially Depleted Silicon-On-Insulator (PDSOI) MOSFET or a conventional MOSFET. Transistors used in the IAC chip may be different from that used in the standard commodity FPGA IC chips packaged in the same logic drive; for example, the IAC chip may use the conventional MOSFET, while the standard commodity FPGA IC chips packaged in the same logic drive may use the FINFET; or the IAC chip may use the Fully Depleted Silicon-on-insulator (FDSOI) MOSFET, while the standard commodity FPGA IC chips packaged in the same logic drive may use the FINFET. Since the IAC chip in this aspect of disclosure may be designed and fabricated using older or less advanced technology nodes or generations, for example, less advanced than or equal to, or more mature than 20 nm or 30 nm, and for example using the technology node of 22 nm, 28 nm, 40 nm, 90 nm, 130 nm, 180 nm, 250 nm, 350 nm or 500 nm, its NRE cost is cheaper than or less than that of the current or conventional ASIC or COT chip designed and fabricated using an advanced IC technology node or generation, for example, more advanced than or below 20 nm or 10 nm, and for example using the technology node of 16 nm, 14 nm, 12 nm, 10 nm, 7 nm, 5 nm or 3 nm. The NRE cost for designing a current or conventional ASIC or COT chip using an advanced IC technology node or generation, for example, more advanced than or below 20 nm or 10 nm, may be more than US $5M, US $10M, US $20M or even exceeding US $50M, or US $100M. The cost of a photo mask set for an ASIC or COT chip at the 16 nm technology node or generation is over US $2M, US $5M, or US $10M. Implementing the same or similar innovation and/or application using the logic drive including the IAC chip designed and fabricated using older or less advanced technology nodes or generations may reduce NRE cost down to less than US $10M, US $7M, US $5M, US $3M or US $1M. Compared to the implementation by developing the current conventional logic ASIC or COT IC chip, the NRE cost of developing the IAC chip for use in the standard commodity logic drive to achieve the same or similar innovation and/or application may be reduced by a factor of larger than 2, 5, 10, 20, or 30.

Another aspect of the disclosure provides the logic drive in a multi-chip package comprising plural standard commodity FPGA IC chips, further comprising a processing and/or computing IC chip, for example, a Central Processing Unit (CPU) chip, a Graphic Processing Unit (GPU) chip, a Digital Signal Processing (DSP) chip, a Tensor Processing Unit (TPU) chip, and/or an Application Processing Unit (APU) chip.

The logic drive may comprise one or more of the processing and/or computing IC chips, and one or more high speed, high bandwidth cache SRAM chips or DRAM IC chips for high speed parallel processing and/or computing. For example, the logic drive may comprise multiple GPU chips, for example 2, 3, 4 or more than 4 GPU chips, and multiple high speed, high bandwidth cache SRAM chips or DRAM IC chips. The communication between one of GPU chips and one of SRAM or DRAM IC chips may be with data bit-width of equal or greater than 64, 128, 256, 512, 1024, 2048, 4096, 8K, or 16K. For another example, the logic drive may comprise multiple TPU chips, for example 2, 3, 4 or more than 4 TPU chips, and multiple high speed, high bandwidth cache SRAM chips or DRAM IC chips. The communication between one of TPU chips and one of SRAM or DRAM IC chips may be with data bit-width of equal or greater than 64, 128, 256, 512, 1024, 2048, 4096, 8K, or 16K.

The communication, connection, or coupling between one of logic, processing and/or computing chips (for example, FPGA, CPU, GPU, DSP, APU, TPU, and/or ASIC chips) and one of high speed, high bandwidth SRAM, DRAM or NVM chips, through the First Interconnection Scheme of the Interposer (FISIP, to be described and specified below) and the Second Interconnection Scheme of the Interposer (SISIP and, to be described and specified below), may be the same or similar as that between internal circuits in a same chip. Alternatively, the communication, connection, or coupling between one of logic, processing and/or computing chips (for example, FPGA, CPU, GPU, DSP, APU, TPU, and/or ASIC chips) and one of high speed, high bandwidth SRAM, DRAM or NVM chips, through the FISIP and/or SISIP, may be using small I/O drivers and/or receivers. The driving capability, loading, output capacitance, or input capacitance of the small I/O drivers or receivers, or I/O circuits may be between 0.1 pF and 2 pF or 0.1 pF and 1 pF. For example, a bi-directional (or tri-state) I/O pad or circuit may be used for the small I/O drivers or receivers, or I/O circuits for communicating between high speed, high bandwidth logic and memory chips in the logic drive, and may comprise an ESD circuit, a receiver, and a driver, and may have an input capacitance or output capacitance between 0.1 pF and 2 pF or 0.1 pF and 1 pF.

Another aspect of the disclosure provides the standard commodity FPGA IC chip for use in the logic drive. The standard commodity FPGA chip is designed, implemented and fabricated using an advanced semiconductor technology node or generation, for example more advanced than or equal to, or below or equal to 20 nm or 10 nm, and for example using the technology node of 16 nm, 14 nm, 12 nm, 10 nm, 7 nm, 5 nm or 3 nm. The standard commodity FPGA IC chip also comprises MRAM, SOT MRAM, RRAM or SS RRAM cells. The standard commodity FPGA IC chips comprise:

(1) A First Interconnection Scheme in, on or of the Chip (FISC) over the substrate and on or over a layer comprising transistors, by a wafer process. The FISC comprises multiple interconnection metal layers, with an inter-metal dielectric layer between each of the multiple interconnection metal layers. The FISC structure may be formed by performing a single damascene copper process and/or a double damascene copper process. The FISC may comprise 4 to 15 layers, or 6 to 12 layers of interconnection metal layers. The thickness of the metal lines or traces of the FISC is, for example, between 3 nm and 1,000 nm, or between 10 nm and 500 nm, or, thinner than or equal to 5 nm, 10 nm, 30 nm, 50 nm, 100 nm, 200 nm, 300 nm, 500 nm, or 1,000 nm. The width of the metal lines or traces of the FISC is, for example, between 3 nm and 1,000 nm, or between 10 nm and 500 nm, or, narrower than 5 nm, 10 nm, 20 nm, 30 nm, 70 nm, 100 nm, 300 nm, 500 nm or 1,000 nm. The thickness of the inter-metal dielectric layer has a thickness, for example, between 3 nm and 1,000 nm, or between 10 nm and 500 nm, or thinner than 5 nm, 10 nm, 30 nm, 50 nm, 100 nm, 200 nm, 300 nm, 500 nm or 1,000 nm.

(2) MRAM, SOT MRAM, RRAM or SS RRAM cells either embedded in the FISC layers (under a passivation layer), or, on or over a passivation layer of the FPGA chips.

(3) A Second Interconnection Scheme in, on or of the Chip (SISC) on or over the FISC structure. An emboss copper process is performed to form a metal layer of SISC. The SISC may comprise 2 to 6, or 3 to 5 layers of interconnection metal layers. The metal lines or traces of the interconnection metal layers of the SISC have the adhesion layer (Ti or TiN, for example) and the copper seed layer only at the bottom, but not at the sidewalls of the metal lines or traces. The metal lines or traces of the interconnection metal layers of FISC have the adhesion layer (Ti or TiN, for example) and the copper seed layer at both the bottom and the sidewalls of the metal lines or traces. The SISC interconnection metal lines or traces are coupled or connected to the FSIC interconnection metal lines or traces, or to transistors in the chip, through vias in openings of the passivation layer. The thickness of the metal lines or traces of SISC is between, for example, 0.3 μm and 20 μm, 0.5 μm and 10 μm, 1 μm and 5 μm, 1 μm and 10 μm, or 2 μm and 10 μm; or thicker than or equal to 0.3 μm, 0.5 μm, 0.7 μm, 1 μm, 1.5 μm, 2 μm or 3 μm. The width of the metal lines or traces of SISC is between, for example, 0.3 μm and 20 μm, 0.5 μm and 10 μm, 1 μm and 5 μm, 1 μm and 10 μm, or 2 μm and 10 μm; or wider than or equal to 0.3 μm, 0.5 μm, 0.7 μm, 1 μm, 1.5 μm, 2 μm or 3 μm. The thickness of the inter-metal dielectric layer has a thickness between, for example, 0.3 μm and 20 μm, 0.5 μm and 10 μm, 1 μm and 5 μm, or 1 μm and 10 μm; or thicker than or equal to 0.3 μm, 0.5 μm, 0.7 μm, 1 μm, 1.5 μm, 2 μm or 3 μm. The metal lines or traces of SISC may be used for the programmable interconnection.

Another aspect of the disclosure provides an interposer for flip-chip assembly or packaging in forming the multi-chip package of the logic drive. The multi-chip package is based on multiple-Chips-On-an-Interposer (COIP) flip-chip packaging method. The interposer or substrate in the COIP multi-chip package comprises high density interconnects for fan-out and interconnection between IC chips flip-chip-assembled, bonded or packaged on or over it. The high density interconnection scheme comprises:

(1) A First Interconnection Scheme on or of the Interposer (FISIP). Metal lines or traces of the interconnection metal layer and vias in the FISIP is formed using the single damascene copper process or the double damascene copper process. The FISIP may comprise 2 to 10 layers, or 3 to 6 layers of interconnection metal layers. The metal lines or traces of the interconnection metal layers of FISIP have the adhesion layer (Ti or TiN, for example) and the copper seed layer at both the bottom and the sidewalls of the metal lines or traces. The metal lines or traces in the FISIP are coupled or connected to the micro copper bumps or pillars of the IC chips in or of the logic drive, and coupled or connected to the TSVs in the substrate. The thickness of the metal lines or traces of the FISIP is, for example, between 3 nm and 1,000 nm, between 10 nm and 500 nm, or between 10 nm and 3,000 nm, or, thinner than or equal to 10 nm, 30 nm, 50 nm, 100 nm, 200 nm, 300 nm, 500 nm, or 1,000 nm. The minimum width of the metal lines or traces of the FISIP is, for example, equal to or greater than 10 nm, 50 nm, 100 nm, 150 nm, 200 nm or 300 nm. The minimum space between two neighboring metal lines or traces of the FISIP is, for example, equal to or greater than 10 nm, 50 nm, 100 nm, 150 nm, 200 nm or 300 nm. The minimum pitch of the metal lines or traces of the FISIP is, for example, equal to or greater than 20 nm, 100 nm, 200 nm, 300 nm, 400 nm or 600 nm. The thickness of the inter-metal dielectric layer has a thickness, for example, between 3 nm and 1,000 nm, between 10 nm and 500 nm, or between 10 nm and 3,000 nm, or, thinner than or equal to 10 nm, 30 nm, 50 nm, 100 nm, 200 nm, 300 nm, 500 nm, or 1,000 nm.

(2) A Second Interconnection Scheme of the Interposer (SISIP) on or over the FISIP structure. The SISIP on or of the interposer is optional. The SISIP comprises multiple interconnection metal layers, with an inter-metal dielectric layer between each of the multiple interconnection metal layers. The metal lines or traces and the metal vias are formed by the emboss copper processes as described or specified in forming the metal lines or traces and metal vias in the SISC of FPGA IC chips. The SISIP may comprise 1 to 5 layers, or 1 to 3 layers of interconnection metal layers. The thickness of the metal lines or traces of SISIP is between, for example, 0.3 μm and 20 μm, 0.5 μm and 10 μm, 1 μm and 5 μm, 1 μm and 10 μm, or 2 μm and 10 μm; or thicker than or equal to 0.3 μm, 0.5 μm, 0.7 μm, 1 μm, 1.5 μm, 2 μm or 3 μm. The width of the metal lines or traces of SISIP is between, for example, 0.3 μm and 20 μm, 0.5 μm and 10 μm, 1 μm and 5 μm, 1 μm and 10 μm, or 2 μm and 10 μm; or wider than or equal to 0.3 μm, 0.5 μm, 0.7 μm, 1 μm, 1.5 μm, 2 μm or 3 μm. The thickness of the inter-metal dielectric layer has a thickness between, for example, 0.3 μm and 20 μm, 0.5 μm and 10 μm, 1 μm and 5 μm, or 1 μm and 10 μm; or thicker than or equal to 0.3 μm, 0.5 μm, 0.7 μm, 1 μm, 1.5 μm, 2 μm or 3 μm.

Another aspect of the disclosure provides a method for forming the logic drive in a COIP multi-chip package using an interposer comprising the FISIP, the SISIP, micro copper bumps or pillars and TSVs (in the silicon substrate) based on a flip-chip assembled multi-chip packaging technology and process.

Another aspect of the disclosure provides Through-Package-Vias or Through-Polymer Vias (TPVs) in a space between two neighboring semiconductor IC chips of the multichip package used for the logic drive. The multichip package is in a COIP multi-chip package using an interposer comprising the FISIP, the SISIP, the TPVs, micro copper bumps or pillars and TSVs based on a flip-chip assembled multi-chip packaging technology and process. Wherein the multichip package comprises a plurality of semiconductor IC chips at the same plane (co-planar) and coplanar with the TPVs. The plurality of semiconductor IC chips comprise the FPGA chips, the dedicated control chip, the dedicated I/O chip, the dedicated control and I/O chip, the Central Processing Unit (CPU) chip, the Graphic Processing Unit (GPU) chip, the Digital Signal Processing (DSP) chip, the Tensor Processing Unit (TPU) chip, the Application Processing Unit (APU) chip, and/or the memory chip. The contact metal pads, pillars or bumps at the frontside (which the side of the semiconductor IC chip with transistors is facing) of the multichip package may be coupled or connected to the contact metal pads, pillars or bumps at the backside (which the side of the semiconductor IC chips without transistors is facing) of the multichip package. The transistors or circuits of the semiconductor IC chips may be coupled or connected to the external circuits at the frontside and/or the backside of the multichip package.

Another aspect of the disclosure provides Through-Package-Vias or Through-Polymer Vias (TPVs) in the space outside a semiconductor IC chip of a single-chip package. The single-chip package is using an interposer comprising the FISIP, the SISIP, the TPVs, micro copper bumps or pillars and TSVs based on a flip-chip assembled chip packaging technology and process. The semiconductor IC chip and TPVs in the single-chip package are coplanar. The semiconductor IC chip may be the FPGA chips, the dedicated control chip, the dedicated I/O chip, the dedicated control and I/O chip, the Central Processing Unit (CPU) chip, the Graphic Processing Unit (GPU) chip, the Digital Signal Processing (DSP) chip, the Tensor Processing Unit (TPU) chip, the Application Processing Unit (APU) chip, or the memory chip. The contact metal pads, pillars or bumps at the frontside (which the side of the semiconductor IC chip with transistors is facing) of the single-chip package may be coupled or connected to the contact metal pads, pillars or bumps at the backside (which the side of the semiconductor IC chip without transistors is facing) of the single chip package. The transistors or circuits of the semiconductor IC chip may be coupled or connected to the external circuits at the frontside and/or the backside of the single-chip package.

Another aspect of the disclosure provides Through-Package-Vias or Through-Polymer Vias (TPVs) in the space between two neighboring semiconductor IC chips of the multichip package, and a Backside metal Interconnection Scheme at the backside of the multichip package (abbreviated as BISD in below). The multichip package is used for the logic drive. The BISD is formed at the backside of the multichip package and TPVs are formed in the space between chips in or of the multichip package, and/or in the peripheral area of the multichip package and outside the edges of chips in or of the multichip package (the side with transistors of the IC chips are facing down). The BISD may comprise metal lines, traces, or planes in a plurality of interconnection metal layers, and is formed on or over the backside of the IC chips (the sides of IC chips with the transistors are facing down), the molding compound after the process step of planarization of the molding compound, and the exposed top surfaces of the TPVs. The BISD provides additional interconnection metal layer or layers at the backside of the logic drive package, and provides copper pads, copper pillars or solder bumps in an area array at the backside of the multichip package, including at locations directly and vertically over the backside of the IC chips of the multichip package (IC chips with the transistors side faced down). The TPVs are used for connecting or coupling circuits or components (for example, the FISIP and/or SISIP) of the interposer of the logic drive to that (for example, the BISD) at the backside of the logic drive package. The multichip package is in a COIP multi-chip package using an interposer comprising the FISIP, the SISIP, the TPVs, micro copper bumps or pillars and TSVs based on a flip-chip assembled multi-chip packaging technology and process. Wherein the multichip package comprises a plurality of semiconductor IC chips at the same plane (co-planar) and coplanar with the TPVs. The plurality of semiconductor IC chips comprise the FPGA chips, the dedicated control chip, the dedicated I/O chip, the dedicated control and I/O chip, the Central Processing Unit (CPU) chip, the Graphic Processing Unit (GPU) chip, the Digital Signal Processing (DSP) chip, the Tensor Processing Unit (TPU) chip, the Application Processing Unit (APU) chip, and/or the memory chip. The contact metal pads, pillars or bumps at the frontside (which the side of the semiconductor IC chips with transistors is facing) of the multichip package may be coupled or connected to the contact metal pads, pillars or bumps at the backside (which the side of the semiconductor IC chips is facing) of the multichip package. The transistors or circuits on the semiconductor IC chips may be coupled or connected to the external circuits at the frontside and/or the backside of the multichip package.

The BISD may comprise 1 to 6 layers, or 2 to 5 layers of interconnection metal layers. The interconnection metal lines, traces or planes of the BISD are formed by the embossing metal process and have the adhesion layer (Ti or TiN, for example) and the copper seed layer only at the bottom, but not at the sidewalls of the metal lines or traces. The interconnection metal lines or traces of FISC and FISIP have the adhesion layer (Ti or TiN, for example) and the copper seed layer at both the bottom and the sidewalls of the metal lines or traces.

The thickness of the metal lines, traces or planes of the BISD is between, for example, 0.3 μm and 40 μm, 0.5 μm and 30 μm, 1 μm and 20 μm, 1 μm and 15 μm, 1 μm and 10 μm, or 0.5 μm to 5 μm, or thicker than or equal to 0.3 μm, 0.7 μm, 1 μm, 2 μm, 3 μm, 5 μm, 7 μm or 10 μm. The width of the metal lines or traces of the BISD is between, for example, 0.3 μm and 40 μm, 0.5 μm and 30 μm, 1 μm and 20 μm, 1 μm and 15 μm, 1 μm and 10 μm, or 0.5 μm to 5 μm, or wider than or equal to 0.3 μm, 0.7 μm, 1 μm, 2 μm, 3 μm, 5 μm, 7 μm or 10 μm. The thickness of the inter-metal dielectric layer of the BISD is between, for example, 0.3 μm and 50 μm, 0.3 μm and 30 μm, 0.5 μm and 20 μm, 1 μm and 10 μm, or 0.5 μm and 5 μm, or thicker than or equal to 0.3 μm, 0.5 μm, 0.7 μm, 1 μm, 1.5 μm, 2 μm, 3 μm or 5 μm. The planes in a metal layer of interconnection metal layers of the BISD may be used for the power, ground planes of a power supply, and/or used as heat dissipaters or spreaders for the heat dissipation or spreading; wherein the metal thickness may be thicker, for example, between 5 μm and 50 μm, 5 μm and 30 μm, 5 μm and 20 μm, or 5 μm and 15 μm; or thicker than or equal to 5 μm, 10 μm, 20 μm, or 30 μm. The power, ground plane, and/or heat dissipater or spreader may be layout as interlaced or interleaved shaped structures in a plane of an interconnection metal layer of the BISD; or may be layout in a fork shape.

Another aspect of the disclosure provides Through-Package-Vias or Through-Polymer Vias (TPVs) in the space outside the semiconductor IC chip of the single-chip package, and a Backside metal Interconnection Scheme at the backside of the single-chip package (abbreviated as BISD in below). The BISD is formed at the backside of the single-chip package and TPVs are formed in the space outside the chip in or of the single-chip package, and/or in the peripheral area of the single-chip package and outside the edges of the chip in or of the single-chip package (the side with transistors of the IC chip is facing down). The BISD may comprise metal lines, traces, or planes in multiple interconnection metal layers, and is formed on or over the backside of the IC chip (the side of the IC chip with the transistors is facing down), the molding compound after the process step of planarization of the molding compound, and the exposed top surfaces of the TPVs. The BISD provides additional interconnection metal layer or layers at the backside of the single-chip package, and provides copper pads, copper pillars or solder bumps in an area array at the backside of the single-chip package, including at locations directly and vertically over the IC chip of the single-chip package (the side of the IC chip with the transistors is facing down). The TPVs are used for connecting or coupling circuits or components (for example, the FISIP and/or SISIP) of the interposer of the single-chip package to that (for example, the BISD) at the backside of the single-chip package. The single-chip package is using an interposer comprising the FISIP, the SISIP, the TPVs, micro copper bumps or pillars and TSVs based on a flip-chip assembled packaging technology and process. The semiconductor IC chip is coplanar with the TPVs in the single-chip package. The contact metal pads, pillars or bumps at the frontside (which the side of the semiconductor IC chip with transistors is facing) of the single-chip package may be coupled or connected to the contact metal pads, pillars or bumps at the backside (which the side of the semiconductor IC chip without transistors is facing) of the single-chip package. The transistors or circuits on the semiconductor IC chip may be coupled or connected to the external circuits at the frontside and/or the backside of the single-chip package.

Another aspect of the disclosure provides the logic drive in a multi-chip package format further comprising one or plural dedicated programmable interconnection IC (DPIIC) chip or chips. The DPIIC chip comprises 5T or 6T SRAM cells and configurable cross-point switches, as described and specified in the standard commodity FPGA chips. The programmable interconnections comprise interconnection metal lines or traces of the FISIP and/or SISIP between the standard commodity FPGA chips, with cross-point switch circuits in the middle of interconnection metal lines or traces of the FISIP and/or SISIP. For example, n metal lines or traces of the FISIP and/or SISIP are input to a cross-point switch circuit on or of the DPIIC chip, and m metal lines or traces of the FISIP and/or SISIP are output from the switch circuit. The cross-point switch circuit is designed such that each of the n metal lines or traces of the FISIP and/or SISIP can be programed to connect to anyone of the m metal lines or traces of the FISIP and/or SISIP. The cross-point switch circuit may be controlled by the programming code stored in, for example, a SRAM cell in or of the DPIIC chip. Alternatively, the cross-point switch on or of the standard commodity FPGA chips is designed such that each of the n metal lines or traces of the FISIP and/or SISIP can be programed to connect to anyone of the m metal lines or traces of the FISIP and/or SISIP.

Another aspect of the disclosure provides programmable TPVs, programmable metal pads, pillars or bumps on or under the TSVs of the interposer, and programmable metal pads, pillars or bumps on or over the BISD using the configurable switches on the DPIIC and/or FPGA IC chips in the logic drive.

Another aspect of the disclosure provides the standardized commodity logic drive (for example, the single-layer-packaged logic drive) with a fixed design, layout or footprint of (i) the metal pads, pillars or bumps (copper pillars or bumps, solder bumps or gold bumps) on or under the metal via contacts of the FISIP and/or SISIP, and (ii) copper pads, copper pillars or solder bumps (on or over the BISD) on the backside (top side, the side with the transistors of IC chips are faced down) of the standard commodity logic drive. The standardized commodity logic drive may be used, customized for different algorithms, architectures and/or applications by software coding or programming, using the programmable metal pads, pillars or bumps on or under the metal via contacts of the FISIP and/or SISIP, and/or using programmable copper pads, copper pillars or bumps, or solder bumps on or over the BISD (through programmable TPVs), as described and specified above, for different algorithms, architectures and/or applications.

Another aspect of the disclosure provides the logic drive, either in the single-layer-packaged or in a stacked format, comprising IC chips, logic blocks (comprising LUTs, multiplexers, logic circuits, logic gates, and/or computing circuits) and/or memory cells or arrays, immersed in a super-rich interconnection scheme or environment. The logic blocks (comprising LUTs, multiplexers, logic circuits, logic gates, and/or computing circuits) and/or memory cells or arrays of each of the multiple standard commodity FPGA IC chips (and/or other IC chips in the single-layer-packaged or in a stacked logic drive) are immersed in a programmable 3D Immersive IC Interconnection Environment (IIIE). The programmable 3D IIIE on, in, or of the logic drive package provides the super-rich interconnection scheme or environment. The programmable 3D IIIE provides an almost unlimited number of the transistors or logic blocks, interconnection metal lines or traces, and memory cells/switches at an extremely low cost. The programmable 3D IIIE similar or analogous to the human brain.

Another aspect of the disclosure provides a "public innovation platform" for innovators to easily and cheaply implement or realize their innovation (algorithms, architectures and/or applications) in semiconductor IC chips using advanced IC technology nodes more advanced than 20 nm, and for example, using a technology node of 16 nm, 10 nm, 7 nm, 5 nm or 3 nm by using logic drives; wherein said innovation comprises (i) innovative algorithms or architectures of computing, processing, learning and/or inferencing, and/or (ii) innovative and/or specific applications. In early days, 1990's, innovators could implement their innovation (algorithms, architectures and/or applications) by designing IC chips and fabricate their designed IC chips in a semiconductor foundry fab using technology nodes at 1 μm, 0.8 μm, 0.5 μm, 0.35 μm, 0.18 μm or 0.13 μm, at a cost of about several hundred thousands of US dollars. The IC foundry fab was then the "public innovation platform". However, when IC technology nodes migrate to a technology node more advanced than 20 nm, and for example to the technology node of 16 nm, 10 nm, 7 nm, 5 nm or 3 nm, only a few giant system or IC design companies, not the public innovators, can afford to use the semiconductor IC foundry fab. It costs about or over 10 million US dollars to develop and implement an IC chip using these advanced technology nodes. The semiconductor IC foundry fab is now not "public innovation platform" anymore, they are "club innovation platform" for club innovators. The concept of the disclosed logic drives, comprising standard commodity FPGA IC chips, provides public innovators "public innovation platform" back to semiconductor IC industry again; just as in 1990's. The innovators can implement or realize their innovation (algorithms, architectures and/or applications) by using logic drives (comprising FPGA IC chips fabricated using advanced than 20 nm technology nodes) and writing software programs in common programing languages, for example, C, Java, C++, C#, Scala, Swift, Matlab, Assembly Language, Pascal, Python, Visual Basic, PL/SQL or JavaScript languages, at cost of less than 500K or 300K US dollars. The innovators can use their own commodity logic drives or they can rent logic drives in data centers or clouds through networks.

Another aspect of the disclosure provides an innovation platform for an innovator, comprising: multiple logic drives in a data center or a cloud, wherein multiple logic drives comprise multiple standard commodity FPGA IC chips fabricated using a semiconductor IC process more advanced than 20 nm technology node; an innovator's device and multiple users' devices communicating with the multiple logic drives in the data center or the cloud through an internet or a network, wherein the innovator develops and writes software programs to implement his innovation (algorithms, architectures and/or applications) in a common programing language to program, through the internet or the network, the multiple logic drives in the data center or the cloud, wherein the common programing language comprises Java, C++, C#, Scala, Swift, Matlab, Assembly Language, Pascal, Python, Visual Basic, PL/SQL or JavaScript language; after programming the logic drives, the innovator or the multiple users may use the programed logic drives for his or their innovation (algorithms, architectures and/or applications) through the internet or the network; wherein said innovations comprise (i) innovative algorithms or architectures of computing, processing, learning and/or inferencing, and/or (ii) innovative and/or specific applications.

Another aspect of the disclosure provides a reconfigurable plastic and/or integral architecture for system/machine computing or processing using integral and alterable memory units and logic units, in addition to the sequential, parallel, pipelined or Von Neumann computing or processing system architecture and/or algorithm. The disclosure provides a programmable logic device (the logic drive) with elasticity and integrality, comprising integral and alterable memory units and logic units, to alter or reconfigure logic functions and/or computing (or processing) architecture (or algorithm), and/or the memories (data or information) in the memory units. The properties of the elasticity and integrality of the logic drive is similar or analogous to that of a human brain. The brain or nerves have elasticity and integrality. Many aspects of brain or nerves can be altered (or are "plastic") and reconfigured through adulthood. The logic drives (or FPGA IC chips) described and specified above provide capabilities to alter or reconfigure the logic functions and/or computing (or processing) architecture (or algorithm) for a given fixed hardware using the memories (data or information) stored in the near-by Configuration Programing Memory cells (CPM). In the logic drive (or FPGA IC chips), the memories (data or information) stored in the memory cells of CPM are used for altering or reconfiguring the logic functions and/or computing/processing architecture (or algorithm). The data or information stored in the Configuration Programing Memory cells (CPM) are used for LUTs or the programming interconnection in the FPGA IC chips. Configuration Programing Memory cells (CPM) are the NVRAM cells (MRAM, RRAM or SS RRAM cells described and specified above) and/or SRAM cells in the standard commodity FPGA IC chips of the logic drive. Some other memories stored in the memory cells (for example, the SRAM or DRAM cells in the HBM IC chips in the logic drive or NAND flash memory cells in NVM IC chips in the logic drive) are just used for data or information (Data Information Memory cells, DIM); wherein one or more of the NVM (NAND flash memory) IC chips are further included in the logic drive. The NAND flash IC chips are packaged in the logic drive by using the same method that the FPGA IC chips are packaged in the logic drive. The NAND flash IC chips may be used to backup the data or information of DIM cells of the SRAM or DRAM cells in the HBM IC chips. When the power supply of the logic drive is turned off, the data or information stored in the NVM (NAND flash memory) IC chips will be kept. The data or information in the DIM cells are related to the operation, computing or processing, for example: (i) the input data or information required for the operation, computing or processing, or (ii) the output data or information of the operation, computing or processing.

Another aspect of the disclosure provides a logic drive comprising a plurality of single-layer-packaged logic drives; and each of single-layer-packaged logic drives in a multiple-chip package is as the logic drive described and specified above.

Another aspect of the disclosure provides the logic drive comprising plural single-layer-packaged logic drives; and each of single-layer-packaged logic drives in a multiple-chip package is as described and specified above. The multiple single-layer-packaged logic drives, for example, 2, 3, 4, 5, 6, 7, 8 or greater than 8 single-layer-packaged logic drives, may be, for example, (1) flip-package assembled on a printed circuit board (PCB), high-density fine-line PCB, Ball-Grid-Array (BGA) substrate, or flexible circuit film or tape; or (2) stack assembled using the Package-on-Package (POP) assembling technology; that is assembling one single-layer-packaged logic drive on top of the other single-layer-packaged logic drive. The POP assembling technology may apply, for example, the Surface Mount Technology (SMT).

Another aspect of the disclosure provides a standard commodity memory drive, package, package drive, device, module, disk, disk drive, solid-state disk, or solid-state drive (to be abbreviated as "drive" below, that is when "drive" is mentioned below, it means and reads as "drive, package, package drive, device, module, disk, disk drive, solid-state disk, or solid-state drive"), in a multi-chip package comprising plural standard commodity memory IC chips for use in data storage. The plural memory IC chips comprise non-volatile memory chips, for example, NAND flash chips, in a bare-die format or in a package format. Alternatively, the non-volatile memory IC chips may comprise Non-Volatile Radom-Access-Memory (NVRAM) IC chips, in a bare-die format or in a package format. The NVRAM may be a Ferroelectric RAM (FRAM), Magnetoresistive RAM (MRAM), Spin Orbit Torque Magnetoresistive RAM (SOT MRAM), Resistive RAM (RRAM) or Phase-change RAM (PRAM). Alternatively, the plural memory IC chips comprise volatile memory chips, for example, DRAM chips or SRAM chips. The standard commodity memory drive is formed using same or similar process steps in forming the standard commodity logic drive, as described and specified in the above paragraphs.

Another aspect of the disclosure provides the stacked memory drive comprising plural single-layer-packaged memory drives, as described and specified above, each in a multiple-chip package. The single-layer-packaged memory drive may comprise a plurality of memory chips (for example, DRAM, SRAM or NAND flash memory chips). The single-layer-packaged memory drive with TPVs and/or BISD for use in the stacked non-volatile memory drive may be in a standard format or having standard sizes. For example, the single-layer-packaged memory drive may be in a shape of square or rectangle, with a certain widths, lengths and thicknesses. The stacked memory drive may comprise, for example 2, 3, 4, 5, 6, 7, 8 or greater than 8 single-layer-packaged memory drives, and may be formed by the similar or the same process steps as the assembly method of Package-On-Package (POP). The memory chips are as described above.

Another aspect of the disclosure provides the stacked logic and memory (for example, DRAM, SRAM or NAND flash memory chips) drive comprising plural single-layer-packaged logic drives and plural single-layer-packaged memory drives, each in a multiple-chip package, as described and specified above. Each of plural single-layer-packaged logic drives and each of plural single-layer-packaged memory drives may be in a same standard format or having a same standard shape, size and dimension, may have the same standard footprints of the metal pads, pillars or bumps on the top surface, and the same standard footprints of the metal pads, pillars or bumps at the bottom surface, as described and specified in above. The stacked logic and memory drive may comprise, for example 2, 3, 4, 5, 6, 7, 8 or greater than 8 single-layer-packaged logic drives or volatile-memory drives (in total), and may be formed by the POP process. The stacking sequence, from bottom to top, may be: (a) all single-layer-packaged logic drives at the bottom and all single-layer-packaged memory drives at the top, or (b) single-layer-packaged logic drives and single-layer-packaged drives are stacked interlaced or interleaved layer over layer, from bottom to top, in sequence: (i) single-layer-packaged logic drive, (ii) single-layer-packaged memory drive, (iii) single-layer-packaged logic drive, (iv) single-layer-packaged memory, and so on. The single-layer-packaged logic drives and single-layer-packaged memory drives used in the stacked logic and memory drives, each comprises TPVs and/or BISD for the stacking assembly purpose.

Another aspect of the disclosure provides the stacked logic, non-volatile (for example, NAND flash) memory and volatile (for example, DRAM) memory drive comprising plural single-layer-packaged logic drives, plural single-layer-packaged non-volatile memory drives and plural single-layer-packaged volatile memory drives, each in a multiple-chip package, as described and specified above. Each of plural single-layer-packaged logic drives, each of plural single-layer-packaged non-volatile memory drives and each of plural single-layer-packaged volatile memory drives may be in a same standard format or having a same standard shape, size and dimension, and have standard footprints of metal pads, pillars or bumps on the top surface and at the bottom surface, as described and specified above. The stacked logic, non-volatile (flash) memory and volatile (DRAM) memory drive may comprise, for example 2, 3, 4, 5, 6, 7, 8 or greater than 8 single-layer-packaged logic drives, single-layer-packaged non-volatile-memory drives or single-layer-packaged volatile-memory drives (in total), and may be formed by the similar or the same process steps as described and specified in forming the stacked logic drive. The stacking sequence is, from bottom to top, for example: (a) all single-layer-packaged logic drives at the bottom, all single-layer-packaged volatile memory drives in the middle, and all single-layer-packaged non-volatile memory drives at the top, or, (b) single-layer-packaged logic drives, single-layer-packaged volatile memory drives, and single-layer-packaged non-volatile memory drives are stacked interlaced or interleaved layer over layer, from bottom to top, in sequence: (i) single-layer-packaged logic drive, (ii) single-layer-packaged volatile memory drive, (iii) single-layer-packaged non-volatile memory drive, (iv) single-layer-packaged logic drive, (v) single-layer-packaged volatile memory, (vi) single-layer-packaged non-volatile memory drive, and so on. The single-layer-packaged logic drives, single-layer-packaged volatile memory drives, and single-layer-packaged volatile memory drives used in the stacked logic, non-volatile-memory and volatile-memory drives, each comprises TPVs and/or BISD for the stacking assembly purpose. The process steps for forming TPVs and/or BISD, and the specifications of TPVs and/or BISD are described and specified in the above paragraphs for use in the stacked logic drive. The stacking methods (POP) using TPVs and/or BISD are as described and specified in above paragraphs for forming the stacked logic drive.

These, as well as other components, steps, features, benefits, and advantages of the present application, will now become clear from a review of the following detailed description of illustrative embodiments, the accompanying drawings, and the claims.

BRIEF DESCRIPTION OF THE DRAWINGS

The drawings disclose illustrative embodiments of the present application. They do not set forth all embodiments. Other embodiments may be used in addition or instead. Details that may be apparent or unnecessary may be omitted to save space or for more effective illustration. Conversely, some embodiments may be practiced without all of the details that are disclosed. When the same reference number or reference indicator appears in different drawings, it may refer to the same or like components or steps.

Aspects of the disclosure may be more fully understood from the following description when read together with the accompanying drawings, which are to be regarded as illustrative in nature, and not as limiting. The drawings are not necessarily to scale, emphasis instead being placed on the principles of the disclosure. In the drawings:

FIG. 12D-1 is a schematically cross-sectional view in an x-z plane showing spin-orbit-torque (SOT) based magnetoresistive random access memory (MRAM) cells for a third alternative in a semiconductor integrated-circuit (IC) chip in accordance with an embodiment of the present application, wherein an upper side of FIG. 12D-1 is a schematically enlarged cross-sectional view in an x-z plane showing a spin-orbit-torque (SOT) based magnetoresistive random access memory (MRAM) cells for a third alternative.

FIG. 12D-2 is a schematically cross-sectional view in an y-z plane showing spin-orbit-torque (SOT) based magnetoresistive random access memory (MRAM) cells for a third alternative in a semiconductor integrated-circuit (IC) chip in accordance with an embodiment of the present application, wherein an upper side of FIG. 12D-2 is a schematically enlarged cross-sectional view in an y-z plane showing a spin-orbit-torque (SOT) based magnetoresistive random access memory (MRAM) cells for a third alternative.

FIG. 12I-1 is a schematically cross-sectional view in an x-z plane showing spin-orbit-torque (SOT) based magnetoresistive random access memory (MRAM) cells for a fourth alternative in a semiconductor integrated-circuit (IC) chip in accordance with an embodiment of the present application, wherein an upper side of FIG. 12I-1 is a schematically enlarged cross-sectional view in an x-z plane showing a spin-orbit-torque (SOT) based magnetoresistive random access memory (MRAM) cells for a fourth alternative.

FIG. 12I-2 is a schematically cross-sectional view in an y-z plane showing spin-orbit-torque (SOT) based magnetoresistive random access memory (MRAM) cells for a fourth alternative in a semiconductor integrated-circuit (IC) chip in accordance with an embodiment of the present application, wherein an upper side of FIG. 12I-2 is a schematically enlarged cross-sectional view in an y-z plane showing a spin-orbit-torque (SOT) based magnetoresistive random access memory (MRAM) cells for a fourth alternative.

FIG. 29 shows two tables illustrating reconfiguration for a commodity standard logic drive in accordance with an embodiment of the present application.

Figure 1A:
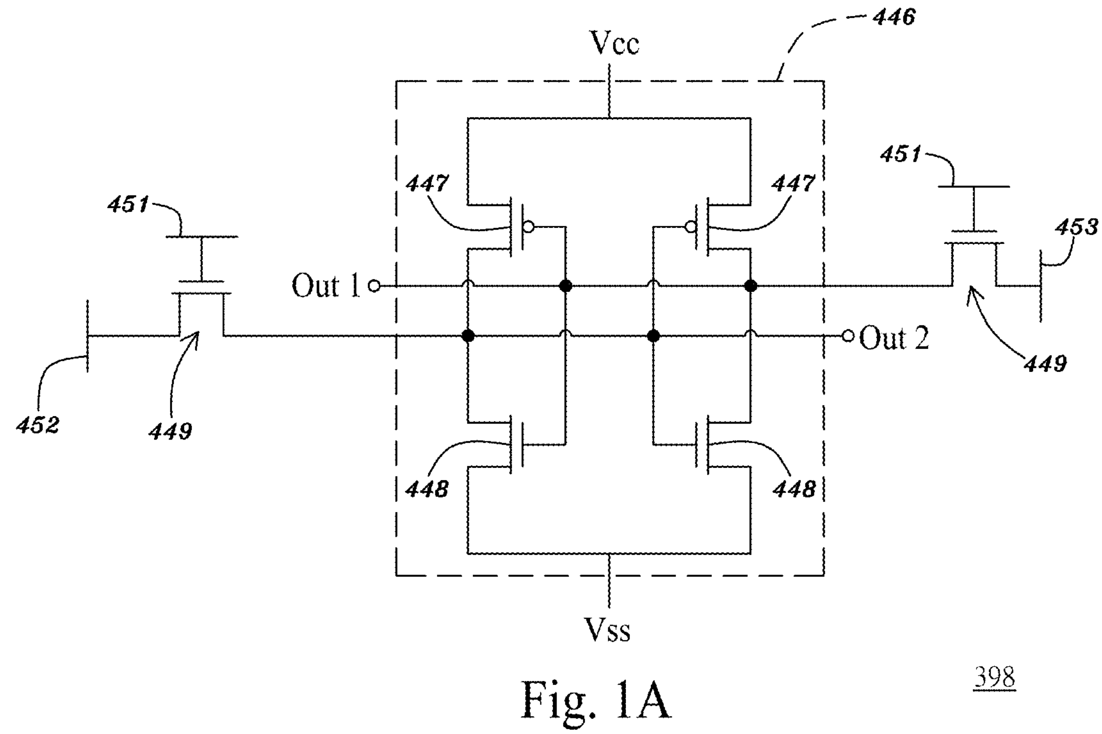
FIGS. 1A and 1B are circuit diagrams illustrating first and second types of SRAM cells in accordance with an embodiment of the present application.

While certain embodiments are depicted in the drawings, one skilled in the art will appreciate that the embodiments depicted are illustrative and that variations of those shown, as well as other embodiments described herein, may be envisioned and practiced within the scope of the present application.

DETAILED DESCRIPTION OF THE DISCLOSURE

Illustrative embodiments are now described. Other embodiments may be used in addition or instead. Details that may be apparent or unnecessary may be omitted to save space or for a more effective presentation. Conversely, some embodiments may be practiced without all of the details that are disclosed.

Specification for Static Random-Access Memory (SRAM) Cells

(1) First Type of Volatile Storage Unit

FIG. 1A is a circuit diagram illustrating a first type of volatile storage unit in accordance with an embodiment of the present application. Referring to FIG. 1A, a first type of volatile storage unit 398 may have a memory unit 446, i.e., static random-access memory (SRAM) cell, composed of 4 data-latch transistors 447 and 448, that is, two pairs of a P-type MOS transistor 447 and N-type MOS transistor 448 both having respective drain terminals coupled to each other, respective gate terminals coupled to each other and respective source terminals coupled to the voltage Vcc of power supply and to the voltage Vss of ground reference. The gate terminals of the P-type and N-type MOS transistors 447 and 448 in the left pair are coupled to the drain terminals of the P-type and N-type MOS transistors 447 and 448 in the right pair, acting as a first output point of the memory unit 446 for a first data output Out1 of the memory unit 446. The gate terminals of the P-type and N-type MOS transistors 447 and 448 in the right pair are coupled to the drain terminals of the P-type and N-type MOS transistors 447 and 448 in the left pair, acting as a second output point of the memory unit 446 for a second data output Out2 of the memory unit 446.

Referring to FIG. 1A, the first type of volatile storage unit 398 may further include two switches or transfer (write) transistor 449, such as N-type or P-type MOS transistors, a first one of which has a gate terminal coupled to a word line 451 and a channel having a terminal coupled to a bit line 452 and another terminal coupled to the drain terminals of the P-type and N-type MOS transistors 447 and 448 in the left pair and the gate terminals of the P-type and N-type MOS transistors 447 and 448 in the right pair, and a second one of which has a gate terminal coupled to the word line 451 and a channel having a terminal coupled to a bit-bar line 453 and another terminal coupled to the drain terminals of the P-type and N-type MOS transistors 447 and 448 in the right pair and the gate terminals of the P-type and N-type MOS transistors 447 and 448 in the left pair. A logic level on the bit line 452 is opposite a logic level on the bit-bar line 453. The switch 449 may be considered as a programming transistor for writing a programing code or data into storage nodes of the 4 data-latch transistors 447 and 448, i.e., at the drains and gates of the 4 data-latch transistors 447 and 448. The switches 449 may be controlled via the word line 451 to turn on connection from the bit line 452 to the drain terminals of the P-type and N-type MOS transistors 447 and 448 in the left pair and the gate terminals of the P-type and N-type MOS transistors 447 and 448 in the right pair via the channel of the first one of the switches 449, and thereby the logic level on the bit line 452 may be reloaded into the conductive line between the gate terminals of the P-type and N-type MOS transistors 447 and 448 in the right pair and the conductive line between the drain terminals of the P-type and N-type MOS transistors 447 and 448 in the left pair. Further, the bit-bar line 453 may be coupled to the drain terminals of the P-type and N-type MOS transistors 447 and 448 in the right pair and the gate terminals of the P-type and N-type MOS transistors 447 and 448 in the left pair via the channel of the second one of the switches 449, and thereby the logic level on the bit line 453 may be reloaded into the conductive line between the gate terminals of the P-type and N-type MOS transistors 447 and 448 in the left pair and the conductive line between the drain terminals of the P-type and N-type MOS transistors 447 and 448 in the right pair. Thus, the logic level on the bit line 452 may be registered or latched in the conductive line between the gate terminals of the P-type and N-type MOS transistors 447 and 448 in the right pair and in the conductive line between the drain terminals of the P-type and N-type MOS transistors 447 and 448 in the left pair; a logic level on the bit line 453 may be registered or latched in the conductive line between the gate terminals of the P-type and N-type MOS transistors 447 and 448 in the left pair and in the conductive line between the drain terminals of the P-type and N-type MOS transistors 447 and 448 in the right pair.

(2) Second type of Volatile Storage Unit

Figure 1B:
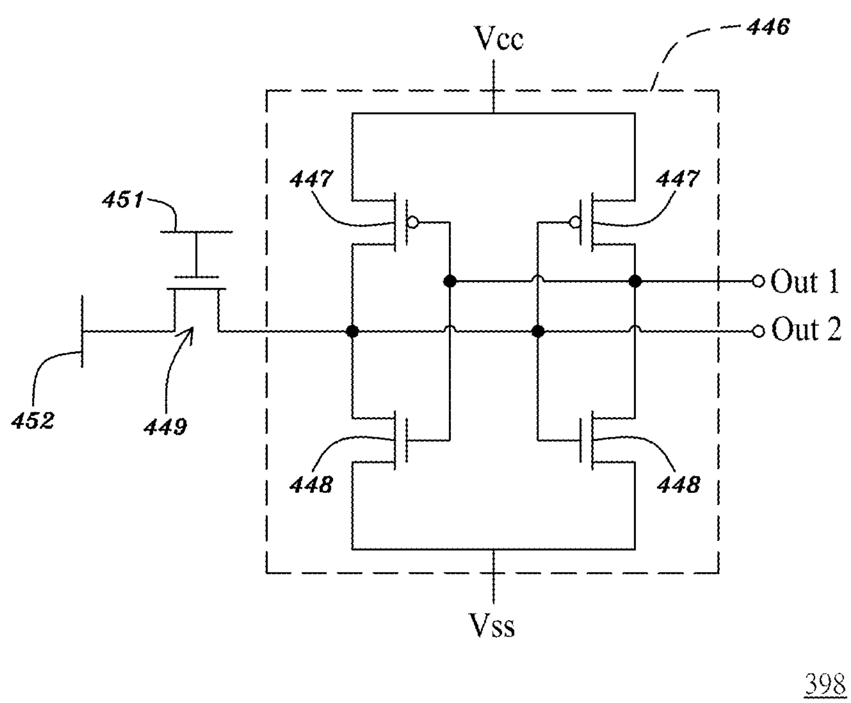

FIG. 1B is a circuit diagram illustrating a second type of volatile storage unit in accordance with an embodiment of the present application. Referring to FIG. 1B, a second type of volatile storage unit 398 may have the memory unit 446, i.e., static random-access memory (SRAM) cell, as illustrated in FIG. 1A. The second type of volatile storage unit 398 may further have a switch or transfer (write) transistor 449, such as N-type or P-type MOS transistor, having a gate terminal coupled to a word line 451 and a channel having a terminal coupled to a bit line 452 and another terminal coupled to the drain terminals of the P-type and N-type MOS transistors 447 and 448 in the left pair and the gate terminals of the P-type and N-type MOS transistors 447 and 448 in the right pair. The switch 449 may be considered as a programming transistor for writing a programing code or data into storage nodes of the 4 data-latch transistors 447 and 448, i.e., at the drains and gates of the 4 data-latch transistors 447 and 448. The switch 449 may be controlled via the word line 451 to turn on connection from the bit line 452 to the drain terminals of the P-type and N-type MOS transistors 447 and 448 in the left pair and the gate terminals of the P-type and N-type MOS transistors 447 and 448 in the right pair via the channel of the switch 449, and thereby a logic level on the bit line 452 may be reloaded into the conductive line between the gate terminals of the P-type and N-type MOS transistors 447 and 448 in the right pair and the conductive line between the drain terminals of the P-type and N-type MOS transistors 447 and 448 in the left pair. Thus, the logic level on the bit line 452 may be registered or latched in the conductive line between the gate terminals of the P-type and N-type MOS transistors 447 and 448 in the right pair and in the conductive line between the drain terminals of the P-type and N-type MOS transistors 447 and 448 in the left pair; a logic level, opposite to the logic level on the bit line 452, may be registered or latched in the conductive line between the gate terminals of the P-type and N-type MOS transistors 447 and 448 in the left pair and in the conductive line between the drain terminals of the P-type and N-type MOS transistors 447 and 448 in the right pair.

Specification for Pass/No-Pass Switches (1) First Type of Pass/No-Pass Switch

Figure 2B:
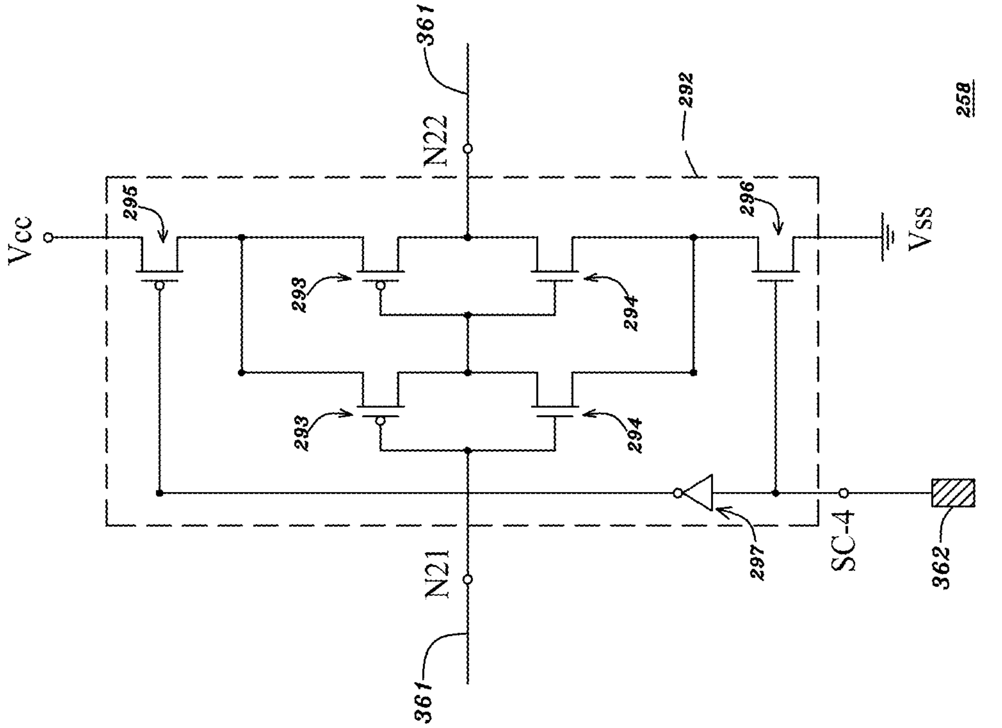
FIGS. 2A-2C are circuit diagrams illustrating first, second and third types of pass/no-pass switches in accordance with an embodiment of the present application.
Figure 2A:
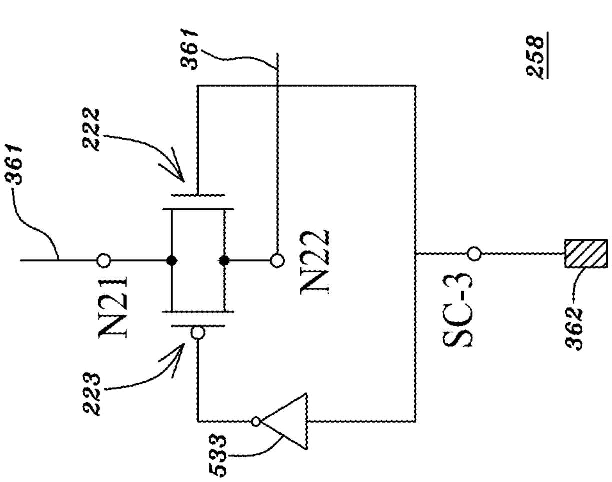

FIG. 2A is a circuit diagram illustrating a first type of pass/no-pass switch in accordance with an embodiment of the present application. Referring to FIG. 2A, a first type of pass/no-pass switch 258 may include an N-type metal-oxide-semiconductor (MOS) transistor 222 and a P-type metal-oxide-semiconductor (MOS) transistor 223 coupling in parallel to each other. Each of the N-type and P-type metal-oxide-semiconductor (MOS) transistors 222 and 223 of the first type of pass/no-pass switch 258 may be configured to form a channel having an end at a node N21 of the pass/no-pass switch 258 and the other opposite end at a node N22 of the pass/no-pass switch 258. Thereby, the first type of pass/no-pass switch 258 may be set to turn on or off connection between its nodes N21 and N22. The first type of pass/no-pass switch 258 may further include an inverter 533 configured to invert its data input at its input point coupling to a gate terminal of the N-type MOS transistor 222 and a node SC-3 as its data output at its output point coupling to a gate terminal of the P-type MOS transistor 223.

(2) Second Type of Pass/No-Pass Switch

FIG. 2B is a circuit diagram illustrating a second type of pass/no-pass switch in accordance with an embodiment of the present application. Referring to FIG. 2B, a second type of pass/no-pass switch 258 may be a multi-stage tri-state buffer 292, i.e., switch buffer, having a pair of a P-type MOS transistor 293 and N-type MOS transistor 294 in each stage, both having respective drain terminals coupling to each other and respective source terminals configured to couple to the voltage Vcc of power supply and to the voltage Vss of ground reference. In this case, the multi-stage tri-state buffer 292 is two-stage tri-state buffer, i.e., two-stage inverter buffer, having two pairs of the P-type MOS transistor 293 and N-type MOS transistor 294 in the two respective stages, i.e., first and second stages. The P-type MOS and N-type MOS transistors 293 and 294 in the pair in the first stage may have gate terminals at a node N21 of the pass/no-pass switch 258. The drain terminals of the P-type MOS and N-type MOS transistors 293 and 294 in the pair in the first stage may couple to each other and to gate terminals of the P-type MOS and N-type MOS transistors 293 and 294 in the pair in the second stage, i.e., output stage. The P-type MOS and N-type MOS transistors 293 and 294 in the pair in the second stage, i.e., output stage, may have drain terminals couple to each other at a node N22 of the pass/no-pass switch 258.

Referring to FIG. 2B, the second type of pass/no-pass switch 258 may further include a switching mechanism configured to enable or disable the multi-stage tri-state buffer 292, wherein the switching mechanism may be composed of (1) a control P-type MOS transistor 295 having a source terminal coupling to the voltage Vcc of power supply and a drain terminal coupling to the source terminals of the P-type MOS transistors 293 in the first and second stages, (2) a control N-type MOS transistor 296 having a source terminal coupling to the voltage Vss of ground reference and a drain terminal coupling to the source terminals of the N-type MOS transistors 294 in the first and second stages and (3) an inverter 297 configured to invert a data input SC-4 of the pass/no-pass switch 258 at an input point of the inverter 297 coupling to a gate terminal of the control N-type MOS transistor 296 as a data output of the inverter 297 at an output point of the inverter 297 coupling to a gate terminal of the control P-type MOS transistor 295.

For example, referring to FIG. 2B, when the pass/no-pass switch 258 has the data input SC-4 at a logic level of "1" to turn on the pass/no-pass switch 258, the pass/no-pass switch 258 may amplify its data input and pass its data input from its input point at the node N21 to its output point at its node N22 as its data output. When the pass/no-pass switch 258 has the data input SC-4 at a logic level of "0" to turn off the pass/no-pass switch 258, the pass/no-pass switch 258 may neither pass data from its node N21 to its node N22 nor pass data from its node N22 to its node N21.

(3) Third Type of Pass/No-Pass Switch

Figure 2C:
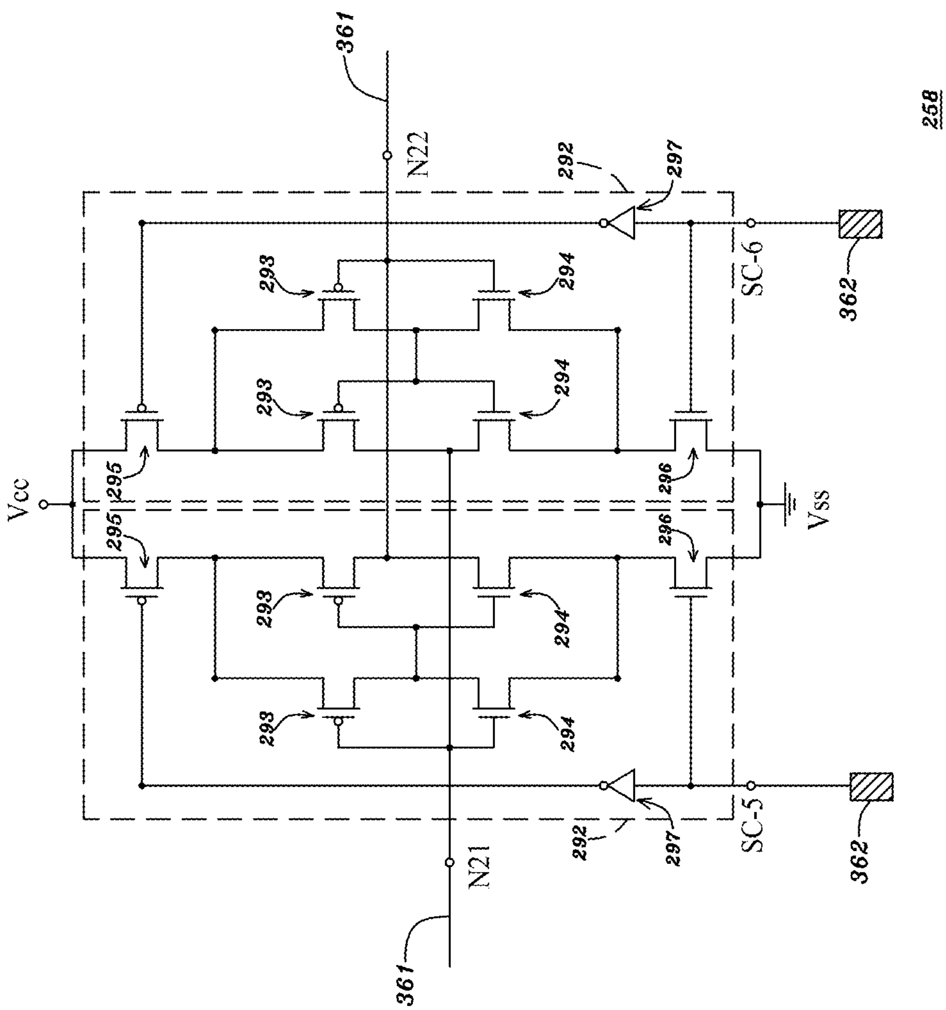

FIG. 2C is a circuit diagram illustrating a third type of pass/no-pass switch in accordance with an embodiment of the present application. For an element indicated by the same reference number shown in FIGS. 2B and 2C, the specification of the element as seen in FIG. 2C may be referred to that of the element as illustrated in FIG. 2B. Referring to FIG. 2C, a third type of pass/no-pass switch 258 may include a pair of multi-stage tri-state buffers 292, i.e., switch buffers, as illustrated in FIG. 2B. The P-type and N-type MOS transistors 293 and 294 in the first stage in the left one of the multi-stage tri-state buffers 292 in the pair may have their gate terminals at a node N21 of the pass/no-pass switch 258, which couples to the drain terminals of the P-type and N-type MOS transistors 293 and 294 in the second stage, i.e., output stage, in the right one of the multi-stage tri-state buffers 292 in the pair. The P-type and N-type MOS transistors 293 and 294 in the first stage in the right one of the multi-stage tri-state buffers 292 in the pair may have gate terminals at a node N22 of the pass/no-pass switch 258, which couples to the drain terminals of the P-type and N-type MOS transistors 293 and 294 in the second stage, i.e., output stage, in the left one of the multi-stage tri-state buffers 292 in the pair. For the left one of the multi-stage tri-state buffers 292 in the pair, its inverter 297 is configured to invert a data input SC-5 of the pass/no-pass switch 258 at an input point of its inverter 297 coupling to the gate terminal of its control N-type MOS transistor 296 as a data output of its inverter 297 at an output point of its inverter 297 coupling to the gate terminal of its control P-type MOS transistor 295. For the right one of the multi-stage tri-state buffers 292 in the pair, its inverter 297 is configured to invert a data input SC-6 of the pass/no-pass switch 258 at an input point of its inverter 297 coupling to the gate terminal of its control N-type MOS transistor 296 as a data output of its inverter 297 at an output point of its inverter 297 coupling to the gate terminal of its control P-type MOS transistor 295.

For example, referring to FIG. 2C, when the pass/no-pass switch 258 has the data input SC-5 at a logic level of "1" to turn on the left one of the multi-stage tri-state buffers 292 in the pair and the pass/no-pass switch 258 has the data input SC-6 at a logic level of "0" to turn off the right one of the multi-stage tri-state buffers 292 in the pair, the third type of pass/no-pass switch 258 may amplify its data input and pass its data input from its input point at its node N21 to its output point at its node N22 as its data output. When the pass/no-pass switch 258 has the data input SC-5 at a logic level of "0" to turn off the left one of the multi-stage tri-state buffers 292 in the pair and the pass/no-pass switch 258 has the data input SC-6 at a logic level of "1" to turn on the right one of the multi-stage tri-state buffers 292 in the pair, the third type of pass/no-pass switch 258 may amplify its data input and pass its data input from its input point at its node N22 to its output point at its node N21 as its data output. When the pass/no-pass switch 258 has the data input SC-5 at a logic level of "0" to turn off the left one of the multi-stage tri-state buffers 292 in the pair and the pass/no-pass switch 258 has the data input SC-6 at a logic level of "0" to turn off the right one of the multi-stage tri-state buffers 292 in the pair, the third type of pass/no-pass switch 258 may neither pass data from its node N21 to its node N22 nor pass data from its node N22 to its node N21. When the pass/no-pass switch 258 has the data input SC-5 at a logic level of "1" to turn on the left one of the multi-stage tri-state buffers 292 in the pair and the pass/no-pass switch 258 has the data input SC-6 at a logic level of "1" to turn on the right one of the multi-stage tri-state buffers 292 in the pair, the third type of pass/no-pass switch 258 may either amplify its data input and pass its data input from its input point at its node N21 to its output point at its node N22 as its data output or amplify its data input and pass its data input from its input point at its node N22 to its output point at its node N21 as its data output.

Figure 3A:
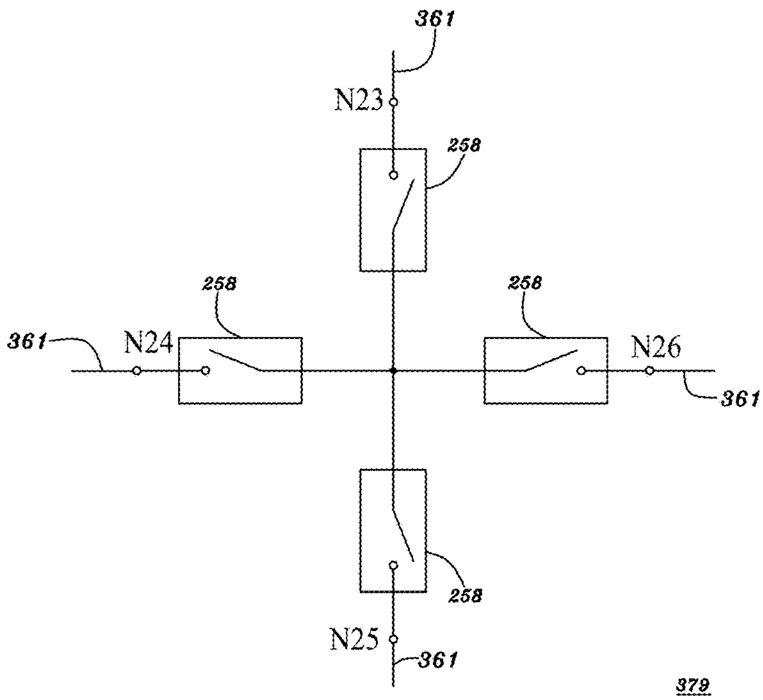
FIGS. 3A and 3B are circuit diagrams illustrating first and second types of cross-point switches composed of multiple pass/no-pass switches in accordance with an embodiment of the present application.

Specification for Cross-Point Switches Constructed from Pass/No-Pass Switches (1) First Type of Cross-Point Switch FIG. 3A is a circuit diagram illustrating a first type of cross-point switch composed of four pass/no-pass switches in accordance with an embodiment of the present application. Referring to FIG. 3A, four pass/no-pass switches 258, each of which may be one of the first and third types of pass/no-pass switches 258 as illustrated in FIGS. 2A and 2C respectively, may compose a first type of cross-point switch 379. The first type of cross-point switch 379 may have four terminals N23-N26 each configured to be switched to couple to another one of its four terminals N23-N26 via two of its four pass/no-pass switches 258. The first type of cross-point switch 379 may have a central node configured to couple to its four terminals N23-N26 via its four respective pass/no-pass switches 258. Each of the pass/no-pass switches 258 may have one of the nodes N21 and N22 coupling to one of the four terminals N23-N26 and the other one of the nodes N21 and N22 coupling to the central node of the first type of cross-point switch 379. For example, the first type of cross-point switch 379 may be switched to pass data from its terminal N23 to its terminal N24 via top and left ones of its four pass/no-pass switches 258, to its terminal N25 via top and bottom ones of its four pass/no-pass switches 258 and/or to its terminal N26 via top and right ones of its four pass/no-pass switches 258.

(2) Second Type of Cross-Point Switch

Figure 3B:
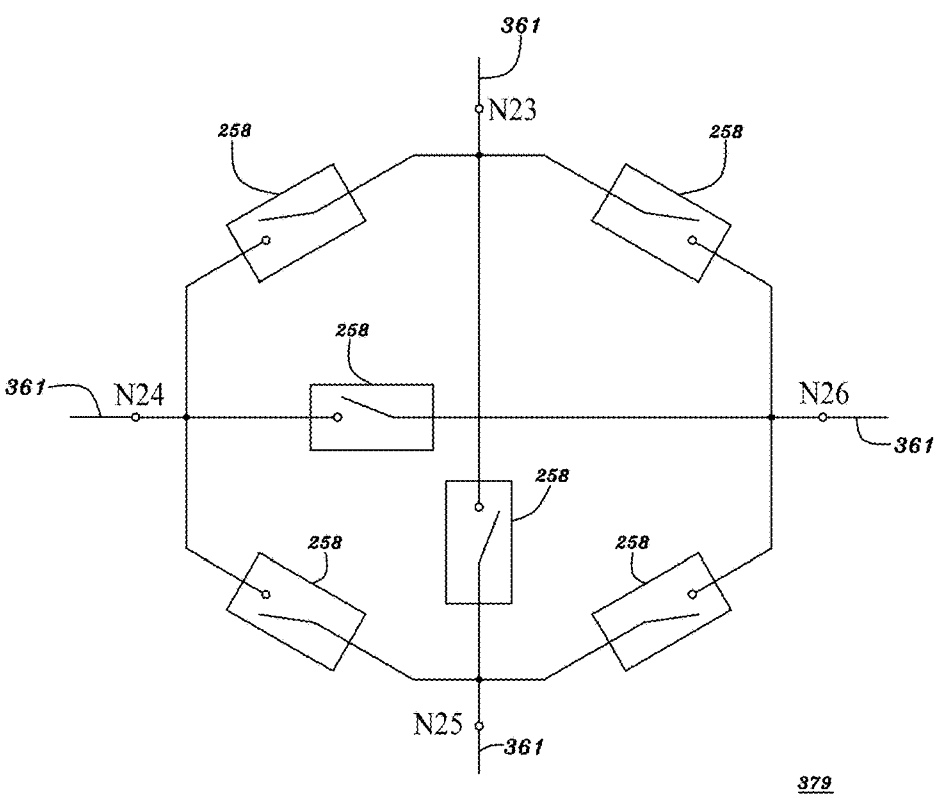

FIG. 3B is a circuit diagram illustrating a second type of cross-point switch composed of six pass/no-pass switches in accordance with an embodiment of the present application. Referring to FIG. 3B, six pass/no-pass switches 258, each of which may be one of the first and three types of pass/no-pass switches as illustrated in FIGS. 2A and 2C respectively, may compose a second type of cross-point switch 379. The second type of cross-point switch 379 may have four terminals N23-N26 each configured to be switched to couple to another one of its four terminals N23-N26 via one of its six pass/no-pass switches 258. Each of the pass/no-pass switches 258 may have one of the nodes N21 and N22 coupling to one of the four terminals N23-N26 and the other one of the nodes N21 and N22 coupling to another one of the four terminals N23-N26. For example, the second type of cross-point switch 379 may be switched to pass data from its terminal N23 to its terminal N24 via a first one of its six pass/no-pass switches 258 between its terminals N23 and N24, to its terminal N25 via a second one of its six pass/no-pass switches 258 between its terminals N23 and N25 and/or to its terminal N26 via a third one of its six pass/no-pass switches 258 between its terminals N23 and N26.

Specification for Multiplexer (MUXER)

Figure 4:
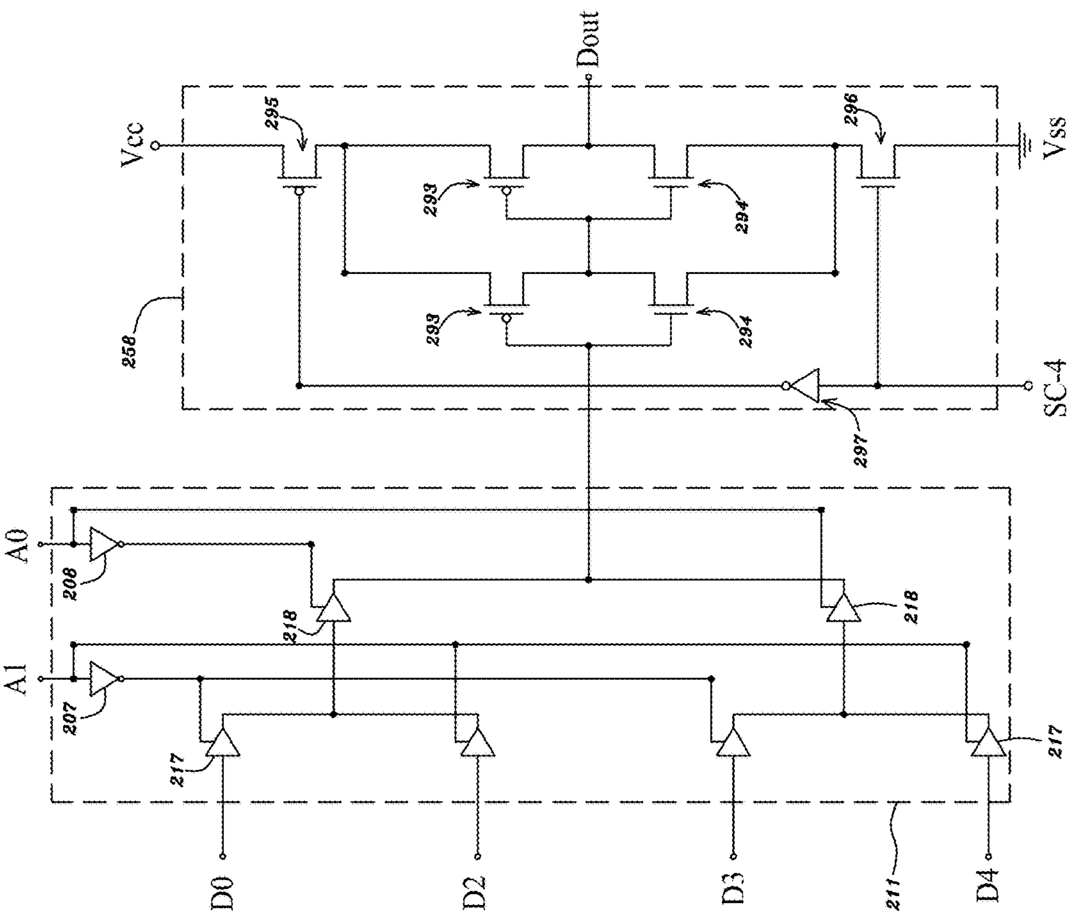
FIG. 4 is a circuit diagram illustrating a multiplexer in accordance with an embodiment of the present application.

FIG. 4 is a circuit diagram illustrating a multiplexer in accordance with an embodiment of the present application. Referring to FIG. 4, a multiplexer (MUXER) 211 may have a first set of two input points arranged in parallel for a first input data set, e.g., A0 and A1, and a second set of four input points arranged in parallel for a second input data set, e.g., D0, D1, D2 and D3. The multiplexer (MUXER) 211 may select a data input, e.g., D0, D1, D2 or D3, from its second input data set at a second set of its input points as a data output Dout at its output point based on its first input data set, e.g., A0 and A1, at a first set of its input points.

Referring to FIG. 4, the multiplexer 211 may include multiple stages of switch buffers, e.g., two stages of switch buffers 217 and 218, coupling to each other or one another stage by stage. For more elaboration, the multiplexer 211 may include four switch buffers 217 in two pairs in the first stage, i.e., input stage, arranged in parallel, each having a first input point for a first data input associated with data A1 of the first input data set of the multiplexer 211 and a second input point for a second data input associated with data, e.g., D0, D1, D2 or D3, of the second input data set of the multiplexer 211. Said each of the four switch buffers 217 in the first stage may be switched on or off to pass or not to pass its second data input from its second input point to its output point in accordance with its first data input at its first input point. The multiplexer 211 may include an inverter 207 having an input point for the data A1 of the first input data set of the multiplexer 211, wherein the inverter 207 is configured to invert the data A1 of the first input data set of the multiplexer 211 as a data output at an output point of the inverter 207. One of the two switch buffers 217 in each pair in the first stage may be switched on, in accordance with the first data input at its first input point coupling to one of the input and output points of the inverter 207, to pass the second data input from its second input point to its output point as a data output of said pair of switch buffers 217 in the first stage; the other one of the switch buffers 217 in said each pair in the first stage may be switched off, in accordance with the first data input at its first input point coupling to the other one of the input and output points of the inverter 207, not to pass the second data input from its second input point to its output point. The output points of the two switch buffers 217 in said each pair in the first stage may couple to each other. For example, a top one of the two switch buffers 217 in a top pair in the first stage may have its first input point coupling to the output point of the inverter 207 and its second input point for its second data input associated with data D0 of the second input data set of the multiplexer 211; a bottom one of the two switch buffers 217 in the top pair in the first stage may have its first input point coupling to the input point of the inverter 207 and its second input point for its second data input associated with data D1 of the second input data set of the multiplexer 211. The top one of the two switch buffers 217 in the top pair in the first stage may be switched on in accordance with its first data input at its first input point to pass its second data input from its second input point to its output point as a data output of the top pair of switch buffers 217 in the first stage; the bottom one of the two switch buffers 217 in the top pair in the first stage may be switched off in accordance with its first data input at its first input point not to pass its second data input from its second input point to its output point. Thereby, each of the two pairs of switch buffers 217 in the first stage may be switched in accordance with its two first data inputs at its two first input points coupling to the input and output points of the inverter 207 respectively to pass one of its two second data inputs from one of its two second input points to its output point coupling to a second input point of one of the switch buffers 218 in the second stage, i.e., output stage, as a data output of said each of the two pairs of switch buffers 217 in the first stage.

Referring to FIG. 4, the multiplexer 211 may include a pair of two switch buffers 218 in the second stage, i.e., output stage, arranged in parallel, each having a first input point for a first data input associated with data A0 of the first input data set of the multiplexer 211 and a second input point for a second data input associated with the data output of one of the two pairs of switch buffers 217 in the first stage. Said each of the two switch buffers 218 in the pair in the second stage, i.e., output stage, may be switched on or off to pass or not to pass its second data input from its second input point to its output point in accordance with its first data input at its first input point. The multiplexer 211 may include an inverter 208 having an input point for the data A0 of the first input data set of the multiplexer 211, wherein the inverter 208 is configured to invert the data A0 of the first input data set of the multiplexer 211 as its data output at an output point of the inverter 208. One of the two switch buffers 218 in the pair in the second stage, i.e., output stage, may be switched on, in accordance with the first data input at its first input point coupling to one of the input and output points of the inverter 208, to pass the second data input from its second input point to its output point as a data output of said pair of switch buffers 218 in the second stage; the other one of the two switch buffers 218 in the pair in the second stage, i.e., output stage, may be switched off, in accordance with the first data input at its first input point coupling to the other one of the input and output points of the inverter 208, not to pass the second data input from its second input point to its output point. The output points of the two switch buffers 218 in the pair in the second stage, i.e., output stage, may couple to each other. For example, a top one of the two switch buffers 218 in the pair in the second stage, i.e., output stage, may have its first input point coupling to the output point of the inverter 208 and its second input point for its second data input associated with the data output of the top one of the two pairs of switch buffers 217 in the first stage; a bottom one of the two switch buffers 218 in the pair in the second stage, i.e., output stage, may have its first input point coupling to the input point of the inverter 208 and its second input point for its second data input associated with the data output of the bottom one of the two pairs of switch buffers 217 in the first stage. The top one of the two switch buffers 218 in the pair in the second stage, i.e., output stage, may be switched on in accordance with its first data input at its first input point to pass its second data input from its second input point to its output point as a data output of the pair of switch buffers 218 in the second stage; the bottom one of the two switch buffers 218 in the pair in the second stage, i.e., output stage, may be switched off in accordance with its first data input at its first input point not to pass its second data input from its second input point to its output point. Thereby, the pair of switch buffers 218 in the second stage, i.e., output stage, may be switched in accordance with its two first data inputs at its two first input points coupling to the input and output points of the inverter 207 respectively to pass one of its two second data inputs from one of its two second input points to its output point as a data output of the pair of switch buffers 218 in the second stage, i.e., output stage.

Referring to FIG. 4, the second type of pass/no-pass switch or switch buffer 292 as seen in FIG. 2B may be provided to couple to the output point of the pair of switch buffers 218 of the multiplexer 211. The pass/no-pass switch or switch buffer 292 may have the input point at its node N21 coupling to the output point of the pair of switch buffers 218 in the last stage, e.g., in the second stage or output stage in this case. For an element indicated by the same reference number shown in FIGS. 2B and 4, the specification of the element as seen in FIG. 4 may be referred to that of the element as illustrated in FIG. 2B. Accordingly, referring to FIG. 4, the multiplexer (MUXER) 211 may select a data input from its second input data set, e.g., D0, D1, D2 and D3, at its second set of four input points as its data output Dout at its output point based on its first input data set, e.g., A0 and A1, at its first set of two input points. The second type of pass/no-pass switch 292 may amplify its data input associated with the data output Dout of the pair of switch buffers 218 of the multiplexer 211 as its data output at its output point at its node N22.

Specification for Large I/O Circuits

Figure 5A:
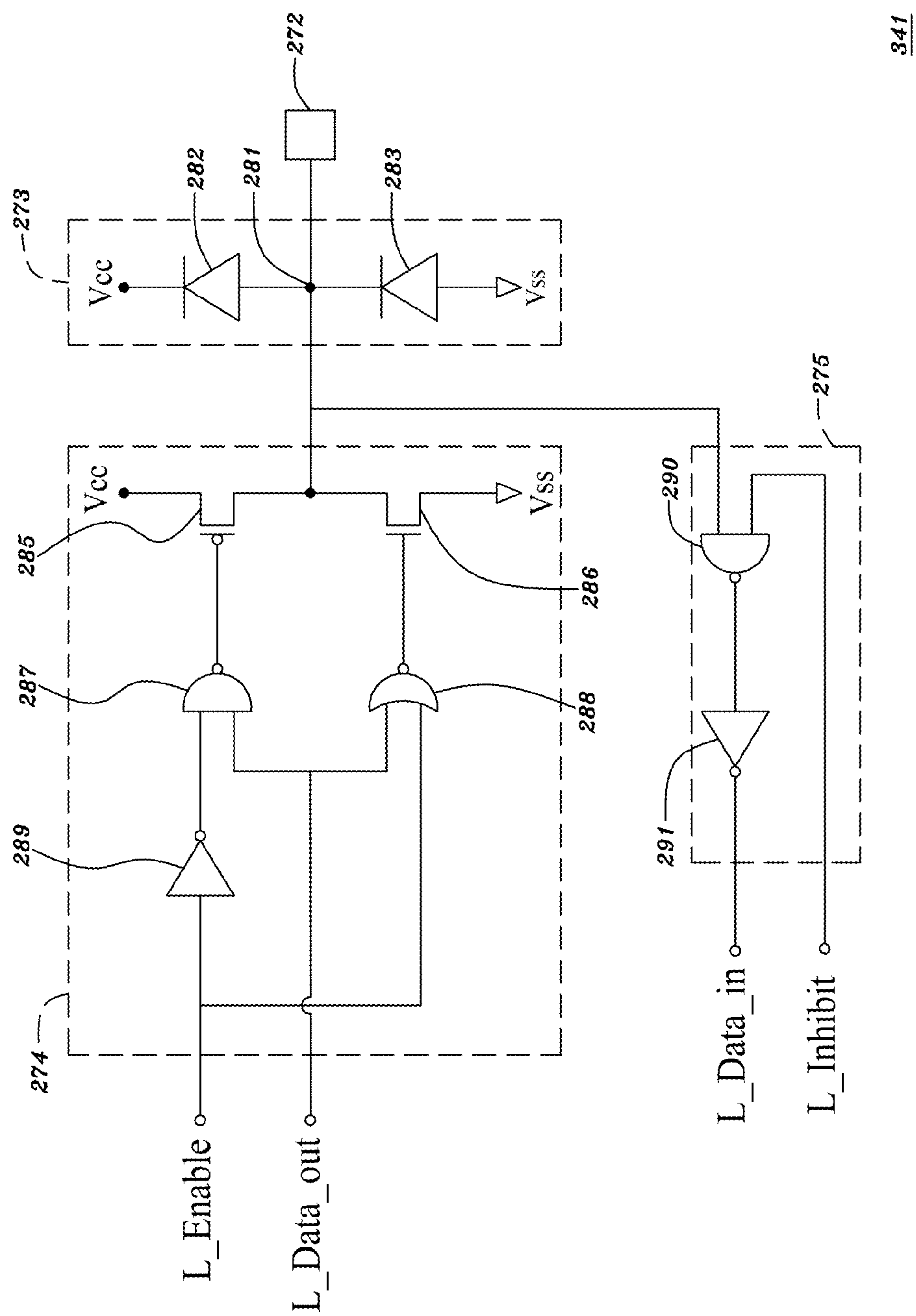
FIG. 5A is a circuit diagram of a large I/O circuit in accordance with an embodiment of the present application.

FIG. 5A is a circuit diagram of a large I/O circuit in accordance with an embodiment of the present application. Referring to FIG. 5A, a semiconductor chip may include multiple I/O pads 272 each coupling to its large ESD protection circuit or device 273, its large driver 274 and its large receiver 275. The large driver 274, large receiver 275 and large ESD protection circuit or device 273 may compose a large I/O circuit 341. The large ESD protection circuit or device 273 may include a diode 282 having a cathode coupling to the voltage Vcc of power supply and an anode coupling to a node 281 and a diode 283 having a cathode coupling to the node 281 and an anode coupling to the voltage Vss of ground reference. The node 281 couples to one of the I/O pads 272.

Referring to FIG. 5A, the large driver 274 may have a first input point for a first data input L_Enable for enabling the large driver 274 and a second input point for a second data input L_Data_out, and may be configured to amplify or drive the second data input L_Data_out as its data output at its output point at the node 281 to be transmitted to circuits outside the semiconductor chip through said one of the I/O pads 272. The large driver 274 may include a P-type MOS transistor 285 and N-type MOS transistor 286 both having respective drain terminals coupling to each other as its output point at the node 281 and respective source terminals coupling to the voltage Vcc of power supply and to the voltage Vss of ground reference. The large driver 274 may have a NAND gate 287 having a data output at an output point of the NAND gate 287 coupling to a gate terminal of the P-type MOS transistor 285 and a NOR gate 288 having a data output at an output point of the NOR gate 288 coupling to a gate terminal of the N-type MOS transistor 286. The NAND gate 287 may have a first data input at its first input point associated with a data output of its inverter 289 at an output point of an inverter 289 of the large driver 274 and a second data input at its second input point associated with the second data input L_Data_out of the large driver 274 to perform a NAND operation on its first and second data inputs as its data output at its output point coupling to the gate terminal of its P-type MOS transistor 285. The NOR gate 288 may have a first data input at its first input point associated with the second data input L_Data_out of the large driver 274 and a second data input at its second input point associated with the first data input L_Enable of the large driver 274 to perform a NOR operation on its first and second data inputs as its data output at its output point coupling to the gate terminal of the N-type MOS transistor 286. The inverter 289 may be configured to invert its data input at its input point associated with the first data input L_Enable of the large driver 274 as its data output at its output point coupling to the first input point of the NAND gate 287.

Referring to FIG. 5A, when the large driver 274 has the first data input L_Enable at a logic level of "1", the data output of the NAND gate 287 is always at a logic level of "1" to turn off the P-type MOS transistor 285 and the data output of the NOR gate 288 is always at a logic level of "0" to turn off the N-type MOS transistor 286. Thereby, the large driver 274 may be disabled by its first data input L_Enable and the large driver 274 may not pass the second data input L_Data_out from its second input point to its output point at the node 281.

Referring to FIG. 5A, the large driver 274 may be enabled when the large driver 274 has the first data input L_Enable at a logic level of "0". Meanwhile, if the large driver 274 has the second data input L_Data_out at a logic level of "0", the data outputs of the NAND and NOR gates 287 and 288 are at a logic level of "1" to turn off the P-type MOS transistor 285 and on the N-type MOS transistor 286, and thereby the data output of the large driver 274 at the node 281 is at a logic level of "0" to be passed to said one of the I/O pads 272. If the large driver 274 has the second data input L_Data_out is at a logic level of "1", the data outputs of the NAND and NOR gates 287 and 288 are at a logic level of "0" to turn on the P-type MOS transistor 285 and off the N-type MOS transistor 286, and thereby the data output of the large driver 274 at the node 281 is at a logic level of "1" to be passed to said one of the I/O pads 272. Accordingly, the large driver 274 may be enabled by its first data input L_Enable to amplify or drive its second data input L_Data_out at its second input point as its data output at its output point at the node 281 to be transmitted to circuits outside the semiconductor chip through said one of the I/O pads 272.

Referring to FIG. 5A, the large receiver 275 may have a first data input L_Inhibit at its first input point and a second data input at its second input point coupling to said one of the I/O pads 272 to be amplified or driven by the large receiver 275 as its data output L_Data_in. The large receiver 275 may be inhibited by its first data input L_Inhibit from generating its data output L_Data_in associated with its second data input. The large receiver 275 may include a NAND gate 290 and an inverter 291 having a data input at an input point of the inverter 291 associated with a data output of the NAND gate 290. The NAND gate 290 has a first input point for its first data input associated with the second data input of the large receiver 275 and a second input point for its second data input associated with the first data input L_Inhibit of the large receiver 275 to perform a NAND operation on its first and second data inputs as its data output at its output point coupling to the input point of its inverter 291. The inverter 291 may be configured to invert its data input associated with the data output of the NAND gate 290 as its data output at its output point acting as the data output L_Data_in of the large receiver 275 at an output point of the large receiver 275.

Referring to FIG. 5A, when the large receiver 275 has the first data input L_Inhibit at a logic level of "0", the data output of the NAND gate 290 is always at a logic level of "1" and the data output L_Data_in of the large receiver 275 is always at a logic level of "0". Thereby, the large receiver 275 is inhibited from generating its data output L_Data_in associated with its second data input at the node 281.

Referring to FIG. 5A, the large receiver 275 may be activated when the large receiver 275 has the first data input L_Inhibit at a logic level of "1". Meanwhile, if the large receiver 275 has the second data input at a logic level of "1" from circuits outside the semiconductor chip through said one of the I/O pads 272, the NAND gate 290 has its data output at a logic level of "0", and thereby the large receiver 275 may have its data output L_Data_in at a logic level of "1". If the large receiver 275 has the second data input at a logic level of "0" from circuits outside the semiconductor chip through said one of the I/O pads 272, the NAND gate 290 has its data output at a logic level of "1", and thereby the large receiver 275 may have its data output L_Data_in at a logic level of "0". Accordingly, the large receiver 275 may be activated by its first data input L_Inhibit signal to amplify or drive its second data input from circuits outside the semiconductor chip through said one of the I/O pads 272 as its data output L_Data_in.

Referring to FIG. 5A, the large driver 274 may have an output capacitance or driving capability or loading, for example, between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF. The output capacitance of the large driver 274 can be used as driving capability of the large driver 274, which is the maximum loading at the output point of the large driver 274, measured from said one of the I/O pads 272 to loading circuits external of said one of the I/O pads 272. The size of the large ESD protection circuit or device 273 may be between 0.1 pF and 3 pF or between 0.1 pF and 1 pF, or larger than 0.1 pF. Said one of the I/O pads 272 may have an input capacitance, provided by the large ESD protection circuit or device 273 and large receiver 275 for example, between 0.15 pF and 4 pF or between 0.15 pF and 2 pF, or greater than 0.15 pF. The input capacitance is measured from said one of the I/O pads 272 to circuits internal of said one of the I/O pads 272.

Specification for Small I/O Circuits

Figure 5B:
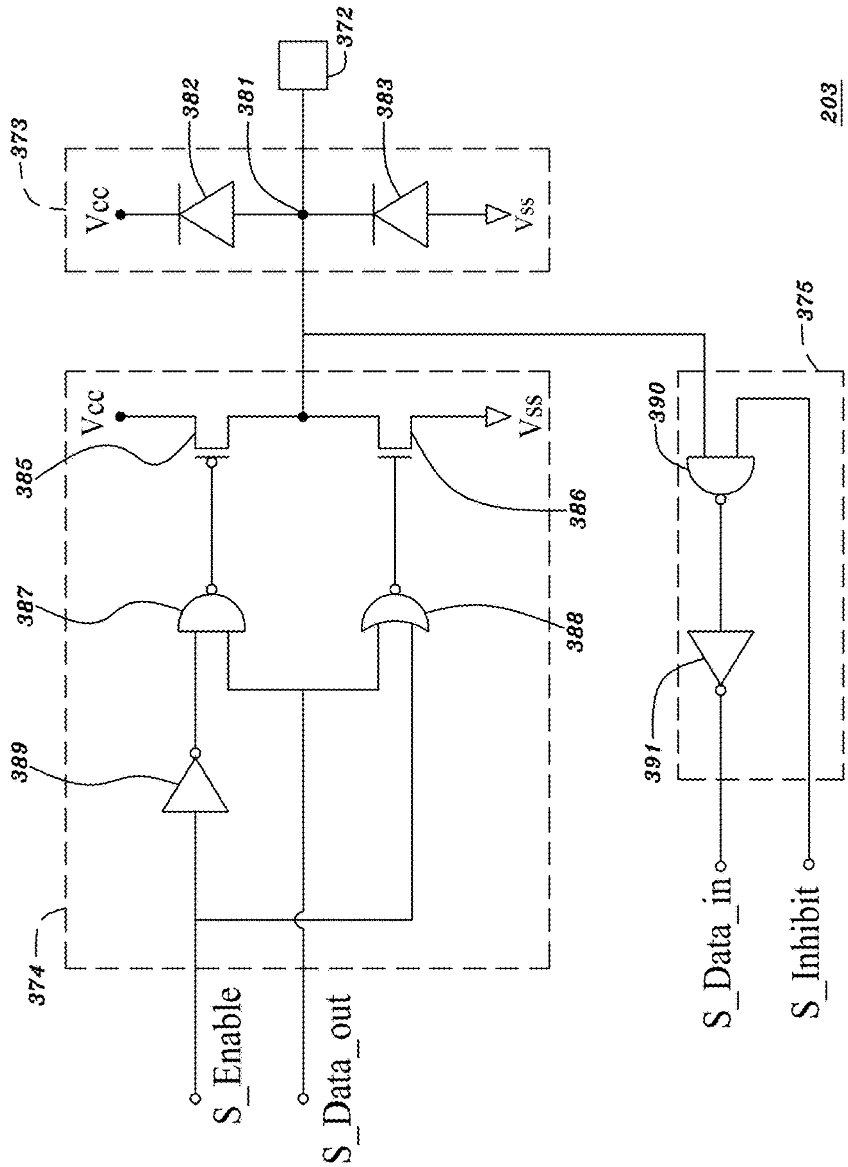
FIG. 5B is a circuit diagram of a small I/O circuit in accordance with an embodiment of the present application.

FIG. 5B is a circuit diagram of a small I/O circuit in accordance with an embodiment of the present application. Referring to FIG. 5B, a semiconductor chip may include multiple I/O pads 372 each coupling to its small ESD protection circuit or device 373, its small driver 374 and its small receiver 375. The small driver 374, small receiver 375 and small ESD protection circuit or device 373 may compose a small I/O circuit 203. The small ESD protection circuit or device 373 may include a diode 382 having a cathode coupling to the voltage Vcc of power supply and an anode coupling to a node 381 and a diode 383 having a cathode coupling to the node 381 and an anode coupling to the voltage Vss of ground reference. The node 381 couples to one of the I/O pads 372.

Referring to FIG. 5B, the small driver 374 may have a first input point for a first data input S_Enable for enabling the small driver 374 and a second input point for a second data input S_Data_out, and may be configured to amplify or drive the second data input S_Data_out as its data output at its output point at the node 381 to be transmitted to circuits outside the semiconductor chip through said one of the I/O pads 372. The small driver 374 may include a P-type MOS transistor 385 and N-type MOS transistor 386 both having respective drain terminals coupling to each other as its output point at the node 381 and respective source terminals coupling to the voltage Vcc of power supply and to the voltage Vss of ground reference. The small driver 374 may have a NAND gate 387 having a data output at an output point of the NAND gate 387 coupling to a gate terminal of the P-type MOS transistor 385 and a NOR gate 388 having a data output at an output point of the NOR gate 388 coupling to a gate terminal of the N-type MOS transistor 386. The NAND gate 387 may have a first data input at its first input point associated with a data output of its inverter 389 at an output point of an inverter 389 of the small driver 374 and a second data input at its second input point associated with the second data input S_Data_out of the small driver 374 to perform a NAND operation on its first and second data inputs as its data output at its output point coupling to the gate terminal of its P-type MOS transistor 385. The NOR gate 388 may have a first data input at its first input point associated with the second data input S_Data_out of the small driver 374 and a second data input at its second input point associated with the first data input S_Enable of the small driver 374 to perform a NOR operation on its first and second data inputs as its data output at its output point coupling to the gate terminal of the N-type MOS transistor 386. The inverter 389 may be configured to invert its data input at its input point associated with the first data input S_Enable of the small driver 374 as its data output at its output point coupling to the first input point of the NAND gate 387.

Referring to FIG. 5B, when the small driver 374 has the first data input S_Enable at a logic level of "1", the data output of the NAND gate 387 is always at a logic level of "1" to turn off the P-type MOS transistor 385 and the data output of the NOR gate 388 is always at a logic level of "0" to turn off the N-type MOS transistor 386. Thereby, the small driver 374 may be disabled by its first data input S_Enable and the small driver 374 may not pass the second data input S_Data_out from its second input point to its output point at the node 381.

Referring to FIG. 5B, the small driver 374 may be enabled when the small driver 374 has the first data input S_Enable at a logic level of "0". Meanwhile, if the small driver 374 has the second data input S_Data_out at a logic level of "0", the data outputs of the NAND and NOR gates 387 and 388 are at a logic level of "1" to turn off the P-type MOS transistor 385 and on the N-type MOS transistor 386, and thereby the data output of the small driver 374 at the node 381 is at a logic level of "0" to be passed to said one of the I/O pads 372. If the small driver 374 has the second data input S_Data_out at a logic level of "1", the data outputs of the NAND and NOR gates 387 and 388 are at a logic level of "0" to turn on the P-type MOS transistor 385 and off the N-type MOS transistor 386, and thereby the data output of the small driver 374 at the node 381 is at a logic level of "1" to be passed to said one of the I/O pads 372. Accordingly, the small driver 374 may be enabled by its first data input S_Enable to amplify or drive its second data input S_Data_out at its second input point as its data output at its output point at the node 381 to be transmitted to circuits outside the semiconductor chip through said one of the I/O pads 372.

Referring to FIG. 5B, the small receiver 375 may have a first data input S_Inhibit at its first input point and a second data input at its second input point coupling to said one of the I/O pads 372 to be amplified or driven by the small receiver 375 as its data output S_Data_in. The small receiver 375 may be inhibited by its first data input S_Inhibit from generating its data output S_Data_in associated with its second data input. The small receiver 375 may include a NAND gate 390 and an inverter 391 having a data input at an input point of the inverter 391 associated with a data output of the NAND gate 390. The NAND gate 390 has a first input point for its first data input associated with the second data input of the large receiver 275 and a second input point for its second data input associated with the first data input S_Inhibit of the small receiver 375 to perform a NAND operation on its first and second data inputs as its data output at its output point coupling to the input point of its inverter 391. The inverter 391 may be configured to invert its data input associated with the data output of the NAND gate 390 as its data output at its output point acting as the data output S_Data_in of the small receiver 375 at an output point of the small receiver 375.

Referring to FIG. 5B, when the small receiver 375 has the first data input S_Inhibit at a logic level of "0", the data output of the NAND gate 390 is always at a logic level of "1" and the data output S_Data_in of the small receiver 375 is always at a logic level of "0". Thereby, the small receiver 375 is inhibited from generating its data output S_Data_in associated with its second data input at the node 381.

Referring to FIG. 5B, the small receiver 375 may be activated when the small receiver 375 has the first data input S_Inhibit at a logic level of "1". Meanwhile, if the small receiver 375 has the second data input at a logic level of "1" from circuits outside the semiconductor chip through said one of the I/O pads 372, the NAND gate 390 has its data output at a logic level of "0", and thereby the small receiver 375 may have its data output S_Data_in at a logic level of "1". If the small receiver 375 has the second data input at a logic level of "0" from circuits outside the semiconductor chip through said one of the I/O pads 372, the NAND gate 390 has its data output at a logic level of "1", and thereby the small receiver 375 may have its data output S_Data_in at a logic level of "0". Accordingly, the small receiver 375 may be activated by its first data input S_Inhibit to amplify or drive its second data input from circuits outside the semiconductor chip through said one of the I/O pads 372 as its data output S_Data_in.

Referring to FIG. 5B, the small driver 374 may have an output capacitance or driving capability or loading, for example, between 0.1 pF and 2 pF or between 0.1 pF and 1 pF, or smaller than 2 pF or 1 pF. The output capacitance of the small driver 374 can be used as driving capability of the small driver 374, which is the maximum loading at the output point of the small driver 374, measured from said one of the I/O pads 372 to loading circuits external of said one of the I/O pads 372. The size of the small ESD protection circuit or device 373 may be between 0.05 pF and 2 pF or between 0.05 pF and 1 pF. In some cases, no small ESD protection circuit or device 373 is provided in the small I/O circuit 203. In some cases, the small driver 374 or receiver 375 of the small I/O circuit 203 in FIG. 5B may be designed just like an internal driver or receiver, having no small ESD protection circuit or device 373 and having the same input and output capacitances as the internal driver or receiver. Said one of the I/O pads 372 may have an input capacitance, provided by the small ESD protection circuit or device 373 and small receiver 375 for example, between 0.15 pF and 4 pF or between 0.15 pF and 2 pF, or greater than 0.15 pF. The input capacitance is measured from said one of the I/O pads 372 to loading circuits internal of said one of the I/O pads 372.

Specification for Programmable Logic Blocks

Figure 6A:
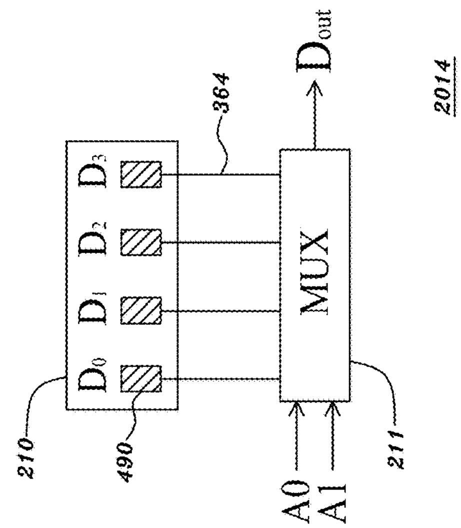
FIG. 6A is a schematic view showing a block diagram of a programmable logic cell in accordance with an embodiment of the present application.

FIG. 6A is a schematic view showing a block diagram of a programmable logic cell in accordance with an embodiment of the present application. Referring to FIG. 6A, a programmable logic block (LB) or element may include one or a plurality of programmable logic cells or elements (LCE) 1014 each configured to perform logic operation on its input data set at its input points. Each of the programmable logic cells or elements (LCE) 1014 may include multiple memory cells, i.e., configuration-programming-memory (CPM) cells, each configured to save or store one of resulting values of a look-up table (LUT) 210 and a multiplexer (MUXER) 211 having a first set of two input points arranged in parallel for a first input data set, e.g., A0 and A1 as illustrated in FIG. 4, and a second set of four input points arranged in parallel for a second input data set, e.g., D0, D1, D2 and D3 as illustrated in FIG. 4, each associated with one of the resulting values or programming codes for the look-up table (LUT) 210. The multiplexer (MUXER) 211 is configured to select, in accordance with its first input data set associated with the input data set of said each of the programmable logic cells or elements (LCE) 1014, a data input, e.g., D0, D1, D2 or D3 as illustrated in FIG. 4, from its second input data set as a data output Dout at its output point acting as a data output of said each of the programmable logic cells or elements (LCE) 1014 at an output point of said each of the programmable logic cells or elements (LCE) 1014.

Referring to FIG. 6A, each of the memory cells 490, i.e., configuration-programming-memory (CPM) cells, may be referred to the memory cell 446 as illustrated in FIG. 1A or 1B. The multiplexer (MUXER) 211 may have its second input data set, e.g., D0, D1, D2 and D3 as illustrated in FIG. 4, each associated with a data output, i.e., configuration-programming-memory (CPM) data, of one of the memory cells 490, e.g., one of the first and second data outputs Out1 and Out2 of the memory cell 446 as illustrated in FIG. 1A or 1B via non-programmable interconnects 364 configured not to be programmable for interconnection. Alternatively, each of the programmable logic cells or elements (LCE) 2014 may further include the second type of pass/no-pass switch or switch buffer 292 as seen in FIGS. 2B and 4 having the input point coupling to the output point of its multiplexer (MUXER) 211 to amplify the data output Dout of its multiplexer 211 as a data output of said each of the programmable logic cells or elements (LCE) 1014 at an output point of said each of the programmable logic cells or elements (LCE) 1014, wherein its second type of pass/no-pass switch or switch buffer 292 may have the data input SC-4 associated with a data output, i.e., configuration-programming-memory (CPM) data, of another of the memory cells 490, e.g., one of the first and second data outputs Out1 and Out2 of the memory cell 446 as illustrated in FIG. 1A or 1B.

Referring to FIG. 6A, each of the programmable logic cells or elements (LCE) 2014 may have the memory cells 490, i.e., configuration-programming-memory (CPM) cells, configured to be programed to store or save the resulting values or programing codes for the look-up table (LUT) 210 to perform the logic operation, such as AND operation, NAND operation, OR operation, NOR operation, EXOR operation or other Boolean operation, or an operation combining two or more of the above operations. For this case, each of the programmable logic cells or elements (LCE) 2014 may perform the logic operation on its input data set, e.g., A0 and A1, at its input points as a data output Dout at its output point. For more elaboration, each of the programmable logic cells or elements (LCE) 1014 may include the number $2^n$ of memory cells 490, i.e., configuration-programming-memory (CPM) cells, each configured to save or store one of resulting values of the look-up table (LUT) 210 and a multiplexer (MUXER) 211 having a first set of the number n of input points arranged in parallel for a first input data set, e.g., A0-A1, and a second set of the number $2^n$ of input points arranged in parallel for a second input data set, e.g., D0-D3, each associated with one of the resulting values or programming codes for the look-up table (LUT) 210, wherein the number n may range from 2 to 8, such as 2 for this case. The multiplexer (MUXER) 211 is configured to select, in accordance with its first input data set associated with the input data set of said each of the programmable logic cells or elements (LCE) 1014, a data input, e.g., one of D0-D3, from its second input data set as a data output Dout at its output point acting as a data output of said each of the programmable logic cells or elements (LCE) 1014 at an output point of said each of the programmable logic cells or elements (LCE) 1014.

Figure 6B:
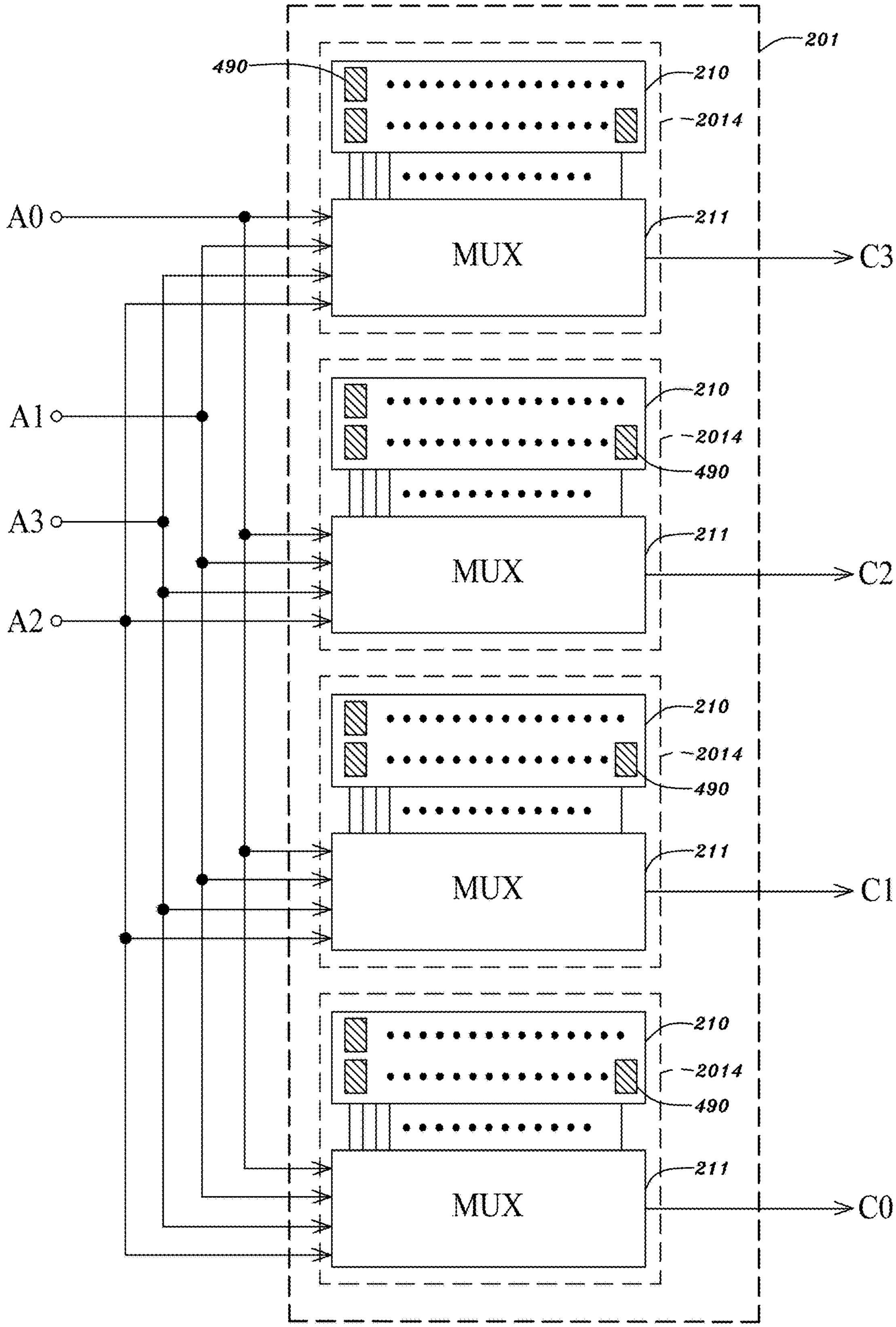
FIG. 6B is a block diagram illustrating a computation operator in accordance with an embodiment of the present application.
Figures 6C, 6D:
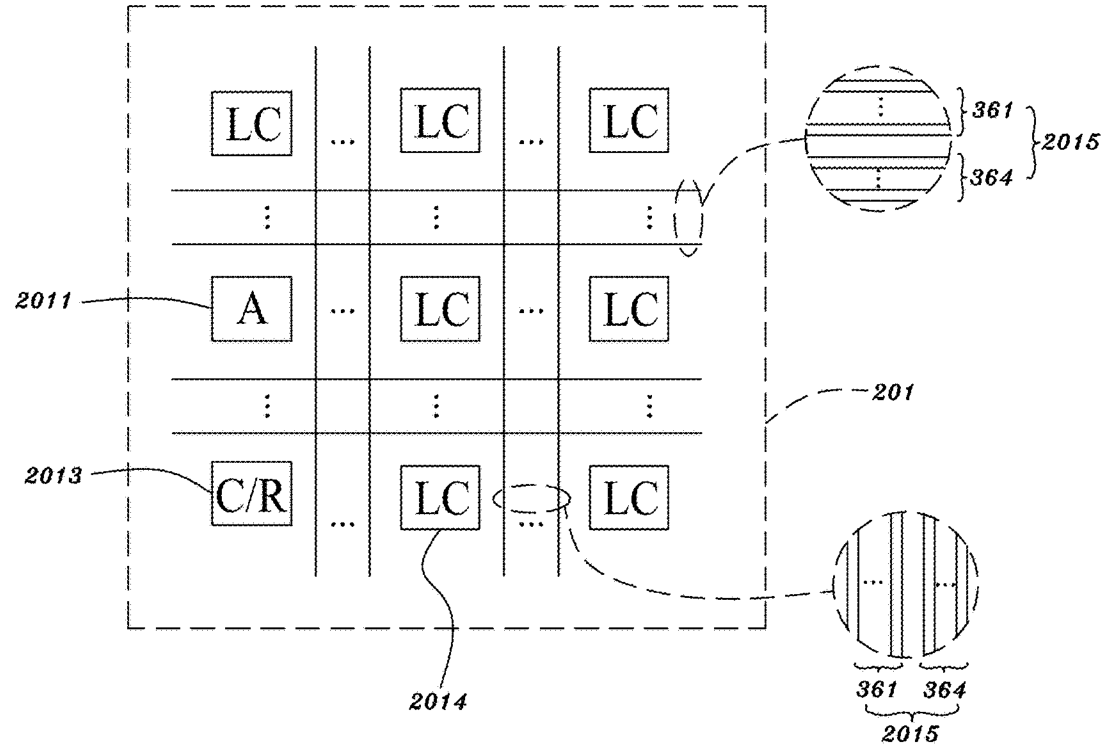
FIG. 6C shows a truth table for a logic operator as seen in FIG. 6B.
FIG. 6D is a block diagram illustrating a programmable logic block for a standard commodity FPGA IC chip in accordance with an embodiment of the present application.

Alternatively, a plurality of programmable logic cells or elements (LCE) 2014 as illustrated in FIG. 6A are configured to be programed to be integrated into a programmable logic block (LB) or element 201 as seen in FIG. 6B acting as a computation operator to perform computation operation, such as addition, subtraction, multiplication or division operation. The computation operator may be an adder, a multiplier, a multiplexer, a shift register, floating-point circuits and/or division circuits. FIG. 6B is a block diagram illustrating a computation operator in accordance with an embodiment of the present application. For example, the computation operator as seen in FIG. 6B may be configured to multiply two two-binary-digit data inputs, i.e., [A1, A0] and [A3, A2], into a four-binary-digit output data set, i.e., [C3, C2, C1, C0], as seen in FIG. 1C. FIG. 6C shows a truth table for a logic operator as seen in FIG. 6B.

Referring to FIGS. 6B and 6C, four programmable logic cells or elements (LCE) 2014, each of which may be referred to one as illustrated in FIG. 6A, may be programed to be integrated into the computation operator. Each of the four programmable logic cells or elements (LCE) 2014 may have its input data set at its four input points associated with an input data set [A1, A0, A3, A2] of the computation operator respectively. Each of the programmable logic cells or elements (LCE) 2014 of the computation operator may generate a data output, e.g., C0, C1, C2 or C3, of the four-binary-digit data output of the computation operator based on its input data set [A1, A0, A3, A2]. In the multiplication of the two-binary-digit number, i.e., [A1, A0], by the two-binary-digit number, i.e., [A3, A2], the programmable logic block (LB) 201 may generate its four-binary-digit output data set, i.e., [C3, C2, C1, C0], based on its input data set [A1, A0, A3, A2]. Each of the four programmable logic cells or elements (LCE) 2014 may have the memory cells 490, each of which may be referred to the memory cell 446 as illustrated in FIG. 1A or 1B, to be programed to save or store resulting values or programming codes of its look-up table 210, e.g., Table-0, Table-1, Table-2 or Table-3.

For example, referring to FIGS. 6B and 6C, a first one of the four programmable logic cells or elements (LCE) 2014 may have its memory cells 490, i.e., configuration-programming-memory (CPM) cells, configured to save or store the resulting values or programming codes of its look-up table (LUT) 210 of Table-0 and its multiplexer (MUXER) 211 configured to select, in accordance with the first input data set of its multiplexer (MUXER) 211 associated with the input data set [A1, A0, A3, A2] of the computation operator respectively, a data input from the second input data set D0-D15 of its multiplexer (MUXER) 211, each associated with the data output of one of its memory cells 490, e.g., one of the first and second data outputs Out1 and Out2 of the memory cell 446 as illustrated in FIG. 1A or 1B, associated with one of the resulting values or programming codes of its look-up table (LUT) 210 of Table-0, as its data output C0 acting as a binary-digit data output of the four-binary-digit output data set, i.e., [C3, C2, C1, C0], of the programmable logic block (LB) 201. A second one of the four programmable logic cells or elements (LCE) 2014 may have its memory cells 490, i.e., configuration-programming-memory (CPM) cells, configured to save or store the resulting values or programming codes of its look-up table (LUT) 210 of Table-1 and its multiplexer (MUXER) 211 configured to select, in accordance with the first input data set of its multiplexer (MUXER) 211 associated with the input data set [A1, A0, A3, A2] of the computation operator respectively, a data input from the second input data set D0-D15 of its multiplexer (MUXER) 211, each associated with the data output of one of its memory cells 490, e.g., one of the first and second data outputs Out1 and Out2 of the memory cell 446 as illustrated in FIG. 1A or 1B, associated with one of the resulting values or programming codes of its look-up table (LUT) 210 of Table-1, as its data output C1 acting as a binary-digit data output of the four-binary-digit output data set, i.e., [C3, C2, C1, C0], of the programmable logic block (LB) 201. A third one of the four programmable logic cells or elements (LCE) 2014 may have its memory cells 490, i.e., configuration-programming-memory (CPM) cells, configured to save or store the resulting values or programming codes of its look-up table (LUT) 210 of Table-2 and its multiplexer (MUXER) 211 configured to select, in accordance with the first input data set of its multiplexer (MUXER) 211 associated with the input data set [A1, A0, A3, A2] of the computation operator respectively, a data input from the second input data set D0-D15 of its multiplexer (MUXER) 211, each associated with the data output of one of its memory cells 490, e.g., one of the first and second data outputs Out1 and Out2 of the memory cell 446 as illustrated in FIG. 1A or 1B, associated with one of the resulting values or programming codes of its look-up table (LUT) 210 of Table-2, as its data output C2 acting as a binary-digit data output of the four-binary-digit output data set, i.e., [C3, C2, C1, C0], of the programmable logic block (LB) 201. A fourth one of the four programmable logic cells or elements (LCE) 2014 may have its memory cells 490, i.e., configuration-programming-memory (CPM) cells, configured to save or store the resulting values or programming codes of its look-up table (LUT) 210 of Table-3 and its multiplexer (MUXER) 211 configured to select, in accordance with the first input data set of its multiplexer (MUXER) 211 associated with the input data set [A1, A0, A3, A2] of the computation operator respectively, a data input from the second input data set D0-D15 of its multiplexer (MUXER) 211, each associated with the data output of one of its memory cells 490, e.g., one of the first and second data outputs Out1 and Out2 of the memory cell 446 as illustrated in FIG. 1A or 1B, associated with one of the resulting values or programming codes of its look-up table (LUT) 210 of Table-3, as its data output C3 acting as a binary-digit data output of the four-binary-digit output data set, i.e., [C3, C2, C1, C0], of the programmable logic block (LB) 201.

Thereby, referring to FIGS. 6B and 6C, the programmable logic block (LB) 201 acting as the computation operator may be composed of the four programmable logic cells or elements (LCE) 2014 to generate its four-binary-digit output data set, i.e., [C3, C2, C1, C0], based on its input data set [A1, A0, A3, A2].

Referring to FIGS. 6B and 6C, in a particular case for multiplication of 3 by 3, each of the four programmable logic cells or elements (LCE) 2014 may have its multiplexer (MUXER) 211 configured to select, in accordance with the first input data set of its multiplexer (MUXER) 211 associated with the input data set, i.e., [A1, A0, A3, A2]=[1, 1, 1, 1], of the computation operator respectively, a data input from the second input data set D0-D15 of its multiplexer (MUXER) 211, each associated with one of the resulting values or programming codes of its look-up table (LUT) 210, i.e., one of Table-0, Table-1, Table-2 and Table-3, as its data output, i.e., one of C0, C1, C2 and C3, acting as a binary-digit data output of the four-binary-digit output data set, i.e., [C3, C2, C1, C0]=[1, 0, 0, 1], of the programmable logic block (LB) 201. The first one of the four programmable logic cells or elements (LCE) 2014 may generate its data output C0 at a logic level of "1" based on its input data set, i.e., [A1, A0, A3, A2]=[1, 1, 1, 1]; the second one of the four programmable logic cells or elements (LCE) 2014 may generate its data output C1 at a logic level of "0" based on its input data set, i.e., [A1, A0, A3, A2]=[1, 1, 1, 1]; the third one of the four programmable logic cells or elements (LCE) 2014 may generate its data output C2 at a logic level of "0" based on its input data set, i.e., [A1, A0, A3, A2]=[1, 1, 1, 1]; the fourth one of the four programmable logic cells or elements (LCE) 2014 may generate its data output C3 at a logic level of "1" based on its input data set, i.e., [A1, A0, A3, A2]=[1, 1, 1, 1].

Figure 7:
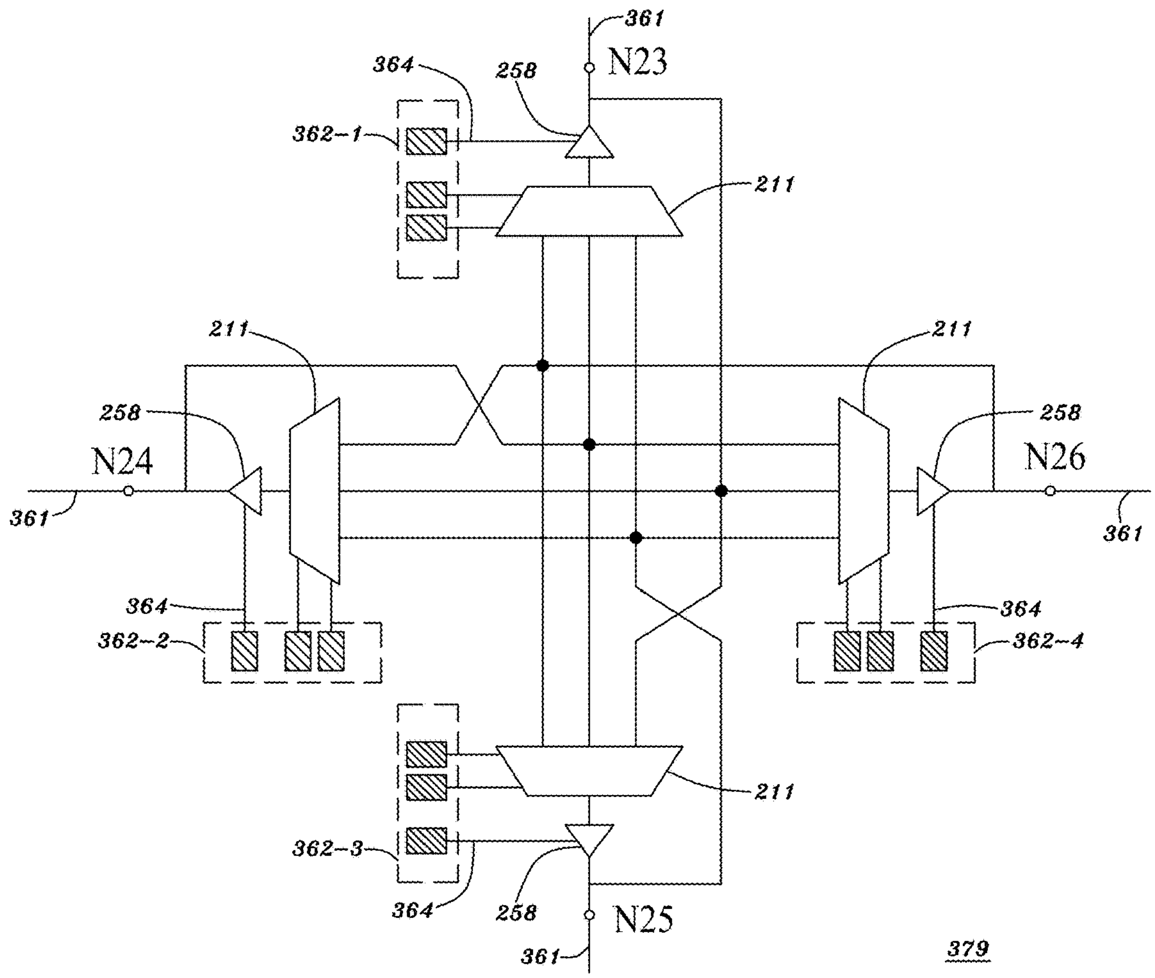
FIG. 7 is a circuit diagram illustrating programmable interconnects programmed by a third type of cross-point switch in accordance with an embodiment of the present application.

Alternatively, FIG. 6D is a block diagram illustrating a programmable logic block for a standard commodity FPGA IC chip in accordance with an embodiment of the present application. Referring to FIG. 6D, the programmable logic block (LB) 201 may include (1) one or more cells (A) 2011 for fixed-wired adders, having the number ranging from 1 to 16 for example, (2) one or more cells (C/R) 2013 for caches and registers, each having capacity ranging from 256 to 2048 bits for example, and (3) the programmable logic cells or elements (LCE) 2014 as illustrated in FIGS. 6A-6C having the number ranging from 64 to 2048 for example. The programmable logic block (LB) 201 may further include multiple intra-block interconnects 2015 each extending over spaces between neighboring two of its cells 2011, 2013 and 2014 arranged in an array therein. For the programmable logic block (LB) 201, its intra-block interconnects 2015 may be divided into programmable interconnects 361 configured to be programmed for interconnection by its memory cells 362 as seen in FIGS. 3A, 3B and 7 and non-programmable interconnects 364 as seen in FIGS. 6A and 7 configured not to be programmable for interconnection.

Referring to FIG. 6D, each of the programmable logic cells or elements (LCE) 2014 may have the memory cells 490, i.e., configuration-programming-memory (CPM) cells, having the number ranging from 4 to 256 for example, each configured to save or store one of the resulting values or programming codes of its look-up table 210 and the multiplexer (MUXER) 211 configured to select, in accordance with the first input data set of its multiplexer (MUXER) 211 having a bit-width ranging from 2 to 8 for example at its input points coupling to at least one of the programmable interconnects 361 and non-programmable interconnects 364 of the intra-block interconnects 2015, a data input from the second input data set of its multiplexer (MUXER) 211 having a bit-width ranging from 4 to 256 for example as its data output at its output point coupling to at least one of the programmable interconnects 361 and non-programmable interconnects 364 of the intra-block interconnects 2015.

Figure 6E:
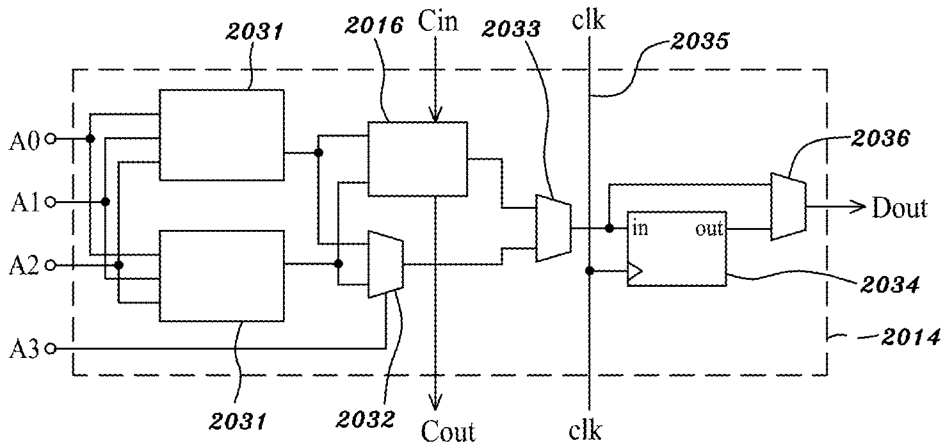
FIG. 6E is a schematic view showing a block diagram of a programmable logic cell or element in accordance with another embodiment of the present application.

FIG. 6E is a schematic view showing a block diagram of a programmable logic cell or element in accordance with another embodiment of the present application. For a first type, the programmable logic cell or element 2014 may have the structure as illustrated in FIG. 6A. Alternatively, for each embodiment in this paper, the first type of programmable logic cell or element 2014 may be replaced with a second type of programmable logic cell or element 2014 as illustrated in FIG. 6E. Referring to FIG. 6E, the second type of programmable logic cell or element 2014 may include (1) two logic gate or circuits 2031, each of which may be referred to one as illustrated in FIG. 6A and have three data inputs in a first data set thereof coupling respectively to three data inputs A0-A2 of the second type of programmable logic cell or element 2014, wherein each of its two logic gate or circuits 2031 may select, in accordance with the first data set thereof, an input data from multiple resulting values in a second data set thereof as a data output, (2) a fixed-wired adding unit 2016, i.e., full adder, having two-bit data inputs each coupling to a data output of one of its logic gate or circuits 2031, wherein the adding unit 2016 may be configured to take a carry-in data input thereof coupling to a data input Cin of the second type of programmable logic cell or element 2014 and passing from a carry-out data output of another adding unit 2016 of the previous stage into account to add the two-bit data inputs thereof as two data outputs thereof, one of which may be configured to be a first data output for a sum of addition and the other of which may be configured to be a second data output for a carry of addition coupling to a data output Cout of the second type of programmable logic cell or element 2014 and passing to a carry-in data input of another adding unit 2016 of the next stage, (3) a multiplexer 2032, i.e., LUT selection multiplexer, having a data input in a first input data set thereof coupling to a data input A3 of the second type of programmable logic cell or element 2014 and two data inputs in a second input data set thereof each coupling to the data output of one of its logic gate or circuits 2031, wherein its multiplexer 2032 may select, in accordance with the first input data set thereof, an input data from the second input data set thereof as a data output thereof, (4) a multiplexer 2033, i.e., addition-selection multiplexer, having a data input in a first input data set thereof coupling to a programming code stored in a memory cell (not shown) of the second type of programmable logic cell or element 2014 and two data inputs in a second input data set thereof, one of which may couple to the first data output of its fixed-wired adding unit 2016 and the other of which may couple to the data output of its multiplexer 2032, wherein its multiplexer 2033 may select, in accordance with the first input data set thereof, an input data from the second input data set thereof as a data output thereof that may be asynchronous, (5) a D-type flip-flop circuit 2034 having a first data input coupling to the data output of its multiplexer 2033 to be registered or stored therein and a second data input coupling to a clock signal clk on a clock bus 2035, wherein its D-type flip-flop circuit 2034 may synchronously generate, in accordance with the second data input thereof, a data output associated with the first data input thereof and the data output of its D-type flip-flop circuit 2034 may be synchronous with the clock signal clk, and (6) a multiplexer 2036, i.e., synchronization-selection multiplexer, having a data input in a first input data set thereof coupling to a memory cell (not shown) of the second type of programmable logic cell or element 2014 and two data inputs in a second input data set thereof, one of which may couple to the data output of its multiplexer 2033 and the other of which may couple to the data output of its D-type flip-flop circuit 2034, wherein its multiplexer 2036 may select, in accordance with the first input data set thereof, an input data from the second input data set thereof as a data output thereof, which may act as a data output Dout of the second type of programmable logic cell or element 2014. The memory cell for each of the multiplexers 2033 and 2036 may have two types, i.e., first and second types, mentioned as below. The first type of memory cells for each of the multiplexers 2033 and 2036 may be referred to the memory cell 398 as illustrated in FIG. 1A or 1B, configured to save or store the programming code for said each of the multiplexers 2033 and 2036. Each of the multiplexers 2033 and 2036 may have the data input in the first input data set thereof, which is associated with a data output, i.e., configuration-programming-memory (CPM) data, of the first type of memory cell for said each of the multiplexers 2033 and 2036, e.g., one of the first and second data outputs Out1 and Out2 of the memory cell 398 as illustrated in FIG. 1A or 1B.

Figure 6F:
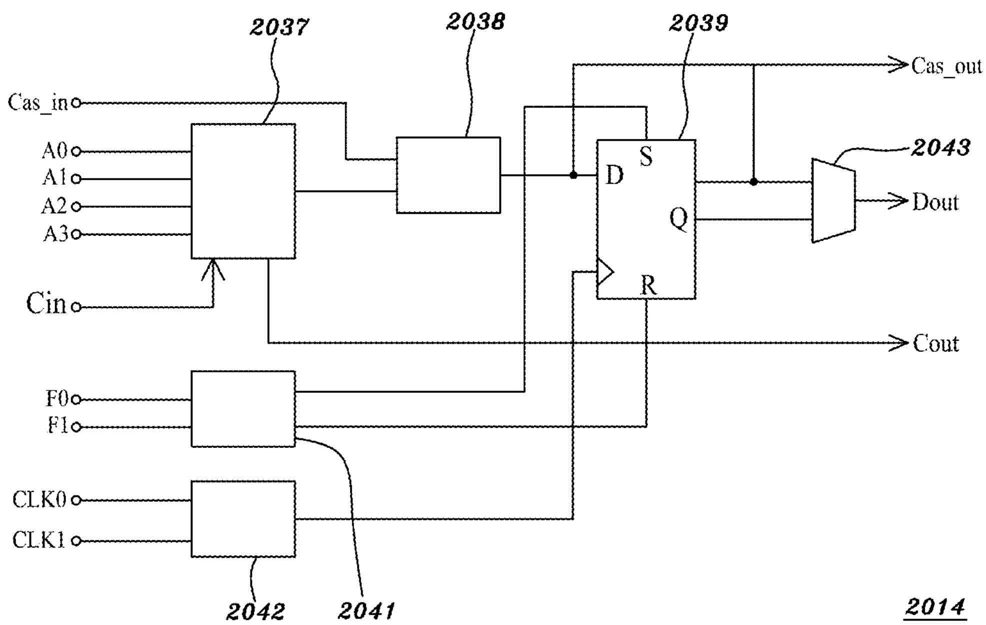
FIG. 6F is a schematic view showing a block diagram of a programmable logic cell or element in accordance with another embodiment of the present application.

FIG. 6F is a schematic view showing a block diagram of a programmable logic cell or element in accordance with another embodiment of the present application. Alternatively, for each embodiment in this paper, the first type of programmable logic cell or element 2014 may be replaced with a third type of programmable logic cell or element 2014 as illustrated in FIG. 6F. Referring to FIG. 6F, the third type of programmable logic cell or element 2014 may include a logic operator or circuit 2037 having four-bit data inputs in a first input data set thereof coupling respectively to four data inputs A0-A3 of the third type of programmable logic cell or element 2014 and a carry-in data input in the first input data set thereof coupling to a data input Cin of the third type of programmable logic cell or element 2014, wherein the logic operator or circuit 2037 is configured to select, in accordance with the first input data set thereof, a first data input from multiple resulting values in a second input data set thereof as a first data output thereof and select, in accordance with the first input data set thereof, a second data input from multiple resulting values in a third input data set thereof as a second data output thereof. In an example, when the logic operator or circuit 2037 performs an addition operation, the logic operator or circuit 2037 may be configured to take the carry-in data input thereof from a carry-out data output of another logic operator or circuit 2037 of the previous stage into account to add two of the four-bit data inputs thereof as the first data output thereof for a sum of addition and the second data output thereof for a carry of addition at a data output Cout of the third type of programmable logic cell or element 2014, which may be associated with a carry-in data input of another logic operator or circuit 2037 of the next stage. In another example, when the logic operator or circuit 2037 performs a logic operation, the logic operator or circuit 2037 may be configured to select, in accordance with the first input data set thereof, a data input from multiple resulting values in the second input data set thereof as the first data output thereof for the logic operation.

Referring to FIG. 6F, the third type of programmable logic cell or element 2014 may further include (1) a cascade circuit 2038 provided with a logic gate having a first data input associated with a data input Cas_in of the third type of programmable logic cell or element 2014 for cascade data passed through one or more hard wires from a data output Cas_out of another third type of programmable logic cell or element 2014 in a previous stage, which may have the same structure as illustrated in FIG. 6F, and a second data input associated with the first data output of its logic operator or circuit 2037, wherein the logic gate of its cascade circuit 2033 may perform AND or OR logic operation on the first and second data inputs thereof as a data output of its cascade circuit 2033, wherein the data output of its cascade circuit 2033 may be asynchronous, (2) a D-type flip-flop circuit 2039 having a first data input coupling to the data output of its cascade circuit 2038 to be registered or stored therein and a second data input coupling to a clock signal on a clock bus 2040 of the third type of programmable logic cell or element 2014, wherein its D-type flip-flop circuit 2039 may synchronously generate, in accordance with the second data input thereof, a data output associated with the first data input thereof and the data output of its D-type flip-flop circuit 2039 may be synchronous with the clock signal, (3) a set-reset control circuit 2041 coupling to its D-type flip-flop circuit 2039 to set, reset or unchange its D-type flip-flop circuit 2039 in accordance with two data inputs thereof coupling respectively to two data inputs F0 and F1 of the third type of programmable logic cell or element 2014, and (4) a clock control circuit 2042 coupling to its D-type flip-flop circuit 2039 through its clock bus 2040, wherein its clock control circuit 2042 is configured to generate, in accordance with two data inputs thereof coupling respectively to two data inputs CLK0 and CLK1 of the third type of programmable logic cell or element 2014, the clock signal in one of various modes. For example, its clock control circuit 2042 may be controlled to be enabled or disabled in accordance with the data input CLK0 thereof, and in a mode the clock signal may be controlled to be the same as a reference clock in accordance with the data input CLK1 of the third type of programmable logic cell or element 2014; in another mode the clock signal may be controlled to be inverted to the reference clock in accordance with the data input CLK1 of the third type of programmable logic cell or element 2014.

Referring to FIG. 6F, the third type of programmable logic cell or element 2014 may further include a multiplexer 2043, i.e., synchronization-selection multiplexer, having a data input in a first input data set thereof coupling to a memory cell (not shown) of the third type of programmable logic cell or element 2014 and two data inputs in a second input data set thereof, one of which may couple to the data output of its cascade circuit 2038 and the other of which may couple to the data output of its D-type flip-flop circuit 2039, wherein its multiplexer 2043 may select, in accordance with the first input data set thereof, an input data from the second input data set thereof as a data output thereof, which may act as a data output Dout of the third type of programmable logic cell or element 2014. The third type of programmable logic cell or element 2014 may further include a data output Cas_out for cascade data coupling to the data output of its cascade circuit 2038 and the data output Cas_out of the third type of programmable logic cell or element 2014 may further include a data output Cas_out may be passed through one or more hard wires to the data input Cas_in of another third type of programmable logic cell or element 2014 in a next stage, which may have the same structure as illustrated in FIG. 6F.

Specification for Programmable Interconnect

FIG. 7 is a circuit diagram illustrating programmable interconnects programmed by a third type of cross-point switch in accordance with an embodiment of the present application. Besides the first and second types of cross-point switches 379 as illustrated in FIGS. 3A and 3B, a third type of cross-point switch 379 may presented as seen in FIG. 7 to include the four multiplexers (MUXERs) 211 as seen in FIG. 4. Each of the four multiplexers (MUXERs) 211 may be configured to select, in accordance with its first input data set, e.g., A0 and A1, at its first set of input points, a data input from its second input data set, e.g., D0-D2, at its second set of input points as its data output. Each of the second set of three input points of one of the four multiplexers (MUXERs) 211 may couple to one of the second set of three input points of one of another two of the four multiplexers (MUXERs) 211 and to the output point of the other of the four multiplexers (MUXERs) 211. Thereby, each of the four multiplexers (MUXERs) 211 may select, in accordance with its first input data set, e.g., A0 and A1, a data input from its second input data set, e.g., D0-D2, at its second set of three input points coupling to three respective programmable interconnects 361 extending in three different directions and to the output points of the other respective three of the four multiplexers (MUXERs) 211 as its data output, e.g., Dout, at its output point at one of four nodes N23-N26 of the third type of cross-point switch 379 coupling to the other programmable interconnect 361 extending in a direction other than the three different directions. For example, the top one of the four multiplexers (MUXERs) 211 may select, in accordance with its first input data set, e.g., A0 and A1, a data input from its second input data set, e.g., D0-D2, at its second set of three input points at the nodes N24, N25 and N26 of the third type of cross-point switch 379 respectively, i.e., at the output points of the left, bottom and right ones of the four multiplexers 211 respectively, as its data output, e.g., Dout, at its output point at the node N23 of the third type of cross-point switch 379.

Referring to FIG. 7, the four programmable interconnects 361 may couple to the respective four nodes N23-N26 of the third type of cross-point switch 379. Thereby, data from one of the four programmable interconnects 361 may be switched by the third type of cross-point switch 379 to be passed to another one, two or three of the four programmable interconnects 361. For the third type of cross-point switch 379, each of its four multiplexers (MUXERs) 211, which may be referred to that as seen in FIG. 4, may have the data inputs, e.g., A0 and A1, of the first input data set each associated with a data output of one of its memory cells 362, i.e., configuration-programming-memory (CPM) cell, e.g., one of the first and second data outputs Out1 and Out2 of the memory cell 446 as illustrated in FIG. 1A or 1B.

Alternatively, referring to FIG. 7, the third type of cross-point switch 379 may further include four pass/no-pass switches or switch buffers 258 of the second type each having the input point coupling to the output point of one of the four multiplexers (MUXERs) 211 as seen in FIG. 4. For the third type of cross-point switch 379, each of its four pass/no-pass switch or switch buffer 258 is configured to be switched on or off in accordance with the data input SC-4 of said each of its four pass/no-pass switch or switch buffer 258 to pass or not to pass the data output, e.g., Dout, of one of its four multiplexers (MUXERs) 211 as its data output at its output point, i.e., at the node 23, 24, 25 or 26, coupling to one of the four programmable interconnects 361. For example, for the third type of cross-point switch 379, the top one of its four multiplexers (MUXERs) 211 may couple to the top one of its four pass/no-pass switch or switch buffers 258 configured to be switched on or off in accordance with the data input SC-4 of the top one of its four pass/no-pass switch or switch buffers 258 to pass or not to pass the data output, e.g., Dout, of the top one of its four multiplexers (MUXERs) 211 as the data output of the top one of its four pass/no-pass switch or switch buffers 258 at the output point of the top one of its four pass/no-pass switch or switch buffers 258, i.e., at the node 23, coupling to the top one of the four programmable interconnects 361. For the third type of cross-point switch 379, each of its four pass/no-pass switch or switch buffer 258 may have the data input SC-4 associated with a data output of another of its memory cells 362, i.e., configuration-programming-memory (CPM) cell, e.g., one of the first and second data outputs Out1 and Out2 of the memory cell 446 as illustrated in FIG. 1A or 1B.

Thereby, for the third type of cross-point switch 379, each of its memory cells 362, i.e., configuration-programming-memory (CPM) cell, is configured to be programmed to save or store a programming code to control data transmission between each of three of the four programmable interconnects 361 coupling respectively to the three input points of the second set of one of its four multiplexers (MUXERs) 211 and the other of the four programmable interconnects 361 coupling to the output point of said one of its four multiplexers (MUXERs) 211, that is, to pass or not to pass one of the data inputs, e.g., D0, D1 and D2, of the second input data set of said one of its four multiplexers (MUXERs) 211 at the respective three input points of the second set of said one of its four multiplexers (MUXERs) 211 coupling respectively to said three of the four programmable interconnects 361 as the data output, e.g., Dout, of said one of its four multiplexers (MUXERs) 211 at the output point of said one of its four multiplexers (MUXERs) 211 coupling to the other of the four programmable interconnects 361.

For example, referring to FIG. 7, for the third type of cross-point switch 379, the top one of its four multiplexers (MUXERs) 211 as seen in FIG. 4 may have the data inputs, e.g., A0 and A1, of the first input data set associated respectively with the data outputs, i.e., configuration-programming-memory (CPM) data, of two of its three memory cells 362-1, each of which may be referred to one of the data outputs Out1 and Out2 of the memory cell 446 as illustrated in FIG. 1A or 1B, and the top one of its four pass/no-pass switches or switch buffers 258 of the second type as seen in FIG. 4 may have the data input SC-4 associated with the data output, i.e., configuration-programming-memory (CPM) data, of the other of its three memory cells 362-1, which may be referred to one of the data outputs Out1 and Out2 of the memory cell 446 as illustrated in FIG. 1A or 1B; the left one of its four multiplexers (MUXERs) 211 as seen in FIG. 4 may have the data inputs, e.g., A0 and A1, of the first input data set associated respectively with the data outputs, i.e., configuration-programming-memory (CPM) data, of two of its three memory cells 362-2, each of which may be referred to one of the data outputs Out1 and Out2 of the memory cell 446 as illustrated in FIG. 1A or 1B, and the left one of its four pass/no-pass switches or switch buffers 258 of the second type as seen in FIG. 4 may have the data input SC-4 associated with the data output, i.e., configuration-programming-memory (CPM) data, of the other of its three memory cells 362-2, which may be referred to one of the data outputs Out1 and Out2 of the memory cell 446 as illustrated in FIG. 1A or 1B; the bottom one of its four multiplexers (MUXERs) 211 as seen in FIG. 4 may have the data inputs, e.g., A0 and A1, of the first input data set associated respectively with the data outputs, i.e., configuration-programming-memory (CPM) data, of two of its three memory cells 362-3, each of which may be referred to one of the data outputs Out1 and Out2 of the memory cell 446 as illustrated in FIG. 1A or 1B, and the bottom one of its four pass/no-pass switches or switch buffers 258 of the second type as seen in FIG. 4 may have the data input SC-4 associated with the data output, i.e., configuration-programming-memory (CPM) data, of the other of its three memory cells 362-3, which may be referred to one of the data outputs Out1 and Out2 of the memory cell 446 as illustrated in FIG. 1A or 1B; the right one of its four multiplexers (MUXERs) 211 as seen in FIG. 4 may have the data inputs, e.g., A0 and A1, of the first input data set associated respectively with the data outputs, i.e., configuration-programming-memory (CPM) data, of two of its three memory cells 362-4, each of which may be referred to one of the data outputs Out1 and Out2 of the memory cell 446 as illustrated in FIG. 1A or 1B, and the right one of its four pass/no-pass switches or switch buffers 258 of the second type as seen in FIG. 4 may have the data input SC-4 associated with the data output, i.e., configuration-programming-memory (CPM) data, of the other of its three memory cells 362-4, which may be referred to one of the data outputs Out1 and Out2 of the memory cell 446 as illustrated in FIG. 1A or 1B.

Referring to FIG. 7, for the third type of cross-point switch 379, before its memory cells 362-1, 362-2, 362-3 and 362-4, i.e., configuration-programming-memory (CPM) cells, are programmed or when its memory cells 362-1, 362-2, 362-3 and 362-4 are being programmed, the four programmable interconnects 361 may not be used for signal transmission. Its memory cells 362-1, 362-2, 362-3 and 362-4, i.e., configuration-programming-memory (CPM) cells, may be programmed to save or store programming codes, i.e., configuration-programming-memory (CPM) data, to pass data from one of the four programmable interconnects 361 to another, another two or the other three of the four programmable interconnects 361, that is, from one of the nodes N23-N26 to another, another two or the other three of the nodes N23-N26, for signal transmission in operation.

Alternatively, two programmable interconnects 361 may be controlled, by either of the first through third types of pass/no-pass switch 258 as seen in FIGS. 2A-2C, to pass or not to pass data therebetween. One of the programmable interconnects 361 may couple to the node N21 of the pass/no-pass switch 258, and another of the programmable interconnects 361 may couple to the node N22 of the pass/no-pass switch 258. Accordingly, either of the first through third types of pass/no-pass switch 258 may be switched on to pass data from said one of the programmable interconnects 361 to said another of the programmable interconnects 361; either of the first through third types of pass/no-pass switch 258 may be switched off not to pass data from said one of the programmable interconnects 361 to said another of the programmable interconnects 361.

Referring to FIG. 2A, the first type of pass/no-pass switch 258 may have the data input SC-3 associated with a data output, i.e., configuration-programming-memory (CPM) data, of a memory cell 362, i.e., configuration-programming-memory (CPM) cell, which may be referred to one of the data outputs Out1 and Out2 of the memory cell 446 as illustrated in FIG. 1A or 1B. Thereby, the memory cell 362 may be programmed to save or store a programming code to switch on or off the first type of pass/no-pass switch 258 to control data transmission between said one of the programmable interconnects 361 and said another of the programmable interconnects 361, that is, to pass or not to pass data from the node N21 of the first type of pass/no-pass switch 258 to the node N22 of the first type of pass/no-pass switch 258 or from the node N22 of the first type of pass/no-pass switch 258 to the node N21 of the first type of pass/no-pass switch 258.

Referring to FIG. 2B, the second type of pass/no-pass switch 258 may have the data input SC-4 associated with a data output, i.e., configuration-programming-memory (CPM) data, of a memory cell 362, i.e., configuration-programming-memory (CPM) cell, which may be referred to one of the data outputs Out1 and Out2 of the memory cell 446 as illustrated in FIG. 1A or 1B. Thereby, the memory cell 362 may be programmed to save or store a programming code to switch on or off the second type of pass/no-pass switch 258 to control data transmission between said one of the programmable interconnects 361 and said another of the programmable interconnects 361, that is, to pass or not to pass data from the node N21 of the second type of pass/no-pass switch 258 to the node N22 of the second type of pass/no-pass switch 258.

Referring to FIG. 2C, the third type of pass/no-pass switch 258 may have the data inputs SC-5 and SC-6 each associated with a data output, i.e., configuration-programming-memory (CPM) data, of a memory cell 362, i.e., configuration-programming-memory (CPM) cell, which may be referred to one of the data outputs Out1 and Out2 of the memory cell 446 as illustrated in FIG. 1A or 1B. Thereby, each of the memory cells 362 may be programmed to save or store a programming code to switch on or off the third type of pass/no-pass switch 258 to control data transmission between said one of the programmable interconnects 361 and said another of the programmable interconnects 361, that is, to pass or not to pass data from the node N21 of the third type of pass/no-pass switch 258 to the node N22 of the third type of pass/no-pass switch 258 or from the node N22 of the third type of pass/no-pass switch 258 to the node N21 of the third type of pass/no-pass switch 258.

Similarly, each of the first and second types of cross-point switches 379 as seen in FIGS. 3A and 3B may be composed of a plurality of pass/no-pass switches 258 of the first, second or third type, wherein each of the first, second or third type of pass/no-pass switches 258 may have the data input(s) SC-3, SC-4 or (SC-5 and SC-6) each associated with a data output, i.e., configuration-programming-memory (CPM) data, of a memory cell 362, i.e., configuration-programming-memory (CPM) cell, as mentioned above. Each of the memory cells 362 may be programmed to save or store a programming code to switch said each of the first and second types of cross-point switches 379 to pass data from one of the nodes N23-N26 of said each of the first and second types of cross-point switches 379 to another, another two or another three of the nodes N23-N26 of said each of the first and second types of cross-point switches 379 for signal transmission in operation. Four of the programmable interconnects 361 may couple respectively to the nodes N23-N26 of said each of the first and second types of cross-point switches 379 and thus may be controlled, by said each of the first and second types of cross-point switches 379, to pass data from one of said four of the programmable interconnects 361 to another one, two or three of said four of the programmable interconnects 361.

Figure 8A:
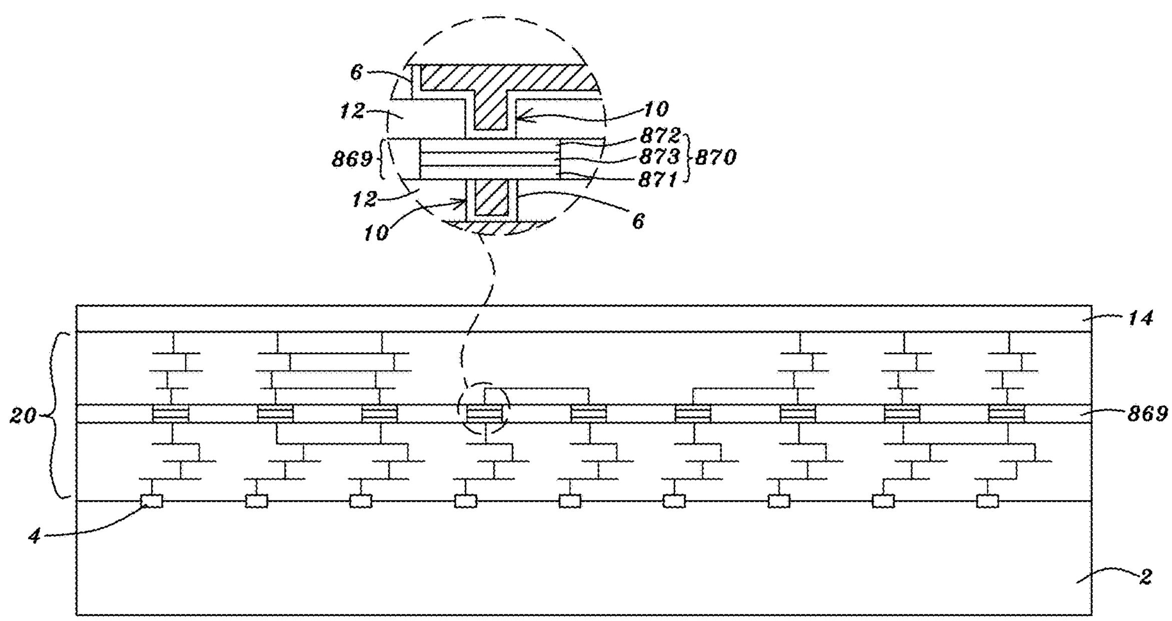
FIGS. 8A-8C are schematically cross-sectional views showing various structures of a first type of non-volatile memory cells for a semiconductor chip in accordance with an embodiment of the present application.
Figure 8B:
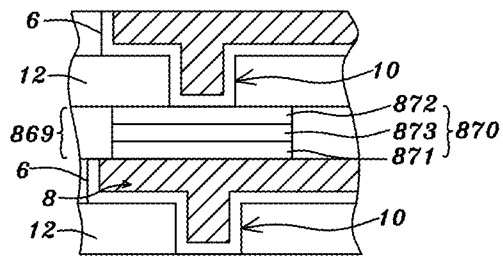
Figure 8C:
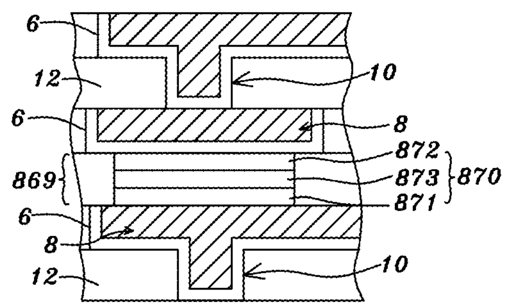

Specification for Non-Volatile Memory (NVM) Cells (1.1) First Type of Non-volatile Memory Cells for the First Alternative FIGS. 8A-8C are schematically cross-sectional views showing various structures of a first type of non-volatile memory cell for a semiconductor chip in accordance with an embodiment of the present application. The first type of non-volatile memory cells may be resistive random access memory (RRAM) cells, i.e., programmable resistors. Referring to FIG. 8A, a semiconductor integrated-circuit (IC) chip 100, used for the FPGA IC chip 200 for example, may include multiple resistive random access memory (RRAM) cells 870 formed in an RRAM layer 869 thereof over a semiconductor substrate 2 thereof, in a first interconnection scheme 20 for the semiconductor integrated-circuit (IC) chip 100 (FISC) and under a passivation layer 14 thereof. Multiple interconnection metal layers 6 in the FISC 20 and between the RRAM layer 869 and semiconductor substrate 2 may couple the resistive random access memory (RRAM) cells 870 to multiple semiconductor devices 4 on the semiconductor substrate 2. Multiple interconnection metal layers 6 in the FISC 20 and between the RRAM layer 869 and passivation layer 14 may couple the resistive random access memory (RRAM) cells 870 to external circuits outside the semiconductor integrated-circuit (IC) chip 100 and may have a line pitch less than 0.5 micrometers. Each of the interconnection metal layers 6 in the FISC 20 and over the RRAM layer 869 may have a thickness greater than each of the interconnection metal layers 6 in the FISC 20 and under the RRAM layer 869. The details for the semiconductor substrate 2, semiconductor devices, interconnection metal layers 6, FISC 20 and passivation layer 14 may be referred to the illustration in FIGS. 21A and 21B.

Referring to FIG. 8A, each of the resistive random access memory (RRAM) cells 870 may have (i) a bottom electrode 871 made of a layer of nickel, platinum, titanium, titanium nitride, tantalum nitride, copper or an aluminum alloy having a thickness between 1 and 20 nanometers, (ii) a top electrode 872 made of a layer of platinum, titanium nitride, tantalum nitride, copper or an aluminum alloy having a thickness between 1 and 20 nanometers, and (iii) a resistive layer 873 having a thickness between 1 and 20 nanometers between the bottom and top electrodes 871 and 872, wherein the resistive layer 873 may be composed of composite layers of various materials including a colossal magnetoresistance (CMR) material such as $La_{1-x}Ca_xMnO_3$ (0<x<1), $La_{1-x}Sr_xMnO_3$ (0<x<1) or $Pr_{0.7}Ca_{0.3}MnO_3$, a polymer material such as poly(vinylidene fluoride trifluoroethylene), i.e., P(VDF-TrFE), a conductive-bridging random-access-memory (CBRAM) material such as Ag—GeSe based material, a doped metal oxide such as Nb-doped $SrZrO_3$, or a binary metal oxide such as WOx (0<x<1), NiO, $TiO_2$ or $HfO_2$, or a metal such as titanium.

For example, referring to FIG. 8A, the resistive layer 873 may include an oxide layer on the bottom electrode 871, in which conductive filaments or paths may be formed depending on the applied electric voltages. The oxide layer of the resistive layer 873 may comprise, for example, hafnium dioxide ($HfO_2$) or tantalum oxide $Ta_2O_5$ having a thickness of 5 nm, 10 nm or 15 nm or between 1 nm and 30 nm, 3 nm and 20 nm, or 5 nm and 15 nm. The oxide layer of the resistive layer 873 may be formed by atomic-layer-deposition (ALD) methods. The resistive layer 873 may further include an oxygen reservoir layer, which may capture the oxygen atoms from the oxide layer, on its oxide layer. The oxygen reservoir layer may comprise titanium (Ti) or tantalum (Ta) to capture the oxygen atoms or ions from the oxide layer to form $TiO_x$ or $TaO_x$. The oxygen reservoir layer may have a thickness between 1 nm and 25 nm, or 3 nm and 15 nm, such as 2 nm, 7 nm or 12 nm. The oxygen reservoir layer may be formed by atomic-layer-deposition (ALD) methods. The top electrode 872 is formed on the oxygen reservoir layer of the resistive layer 873.

For example, referring to FIG. 8A, the resistive layer 873 may include a layer of $HfO_2$ having a thickness between 1 and 20 nanometers on the bottom electrode 871, a layer of titanium dioxide having a thickness between 1 and 20 nanometers on the layer of $HfO_2$ and a titanium layer having a thickness between 1 and 20 nanometers on the layer of titanium dioxide. The top electrode 872 is formed on the titanium layer of the resistive layer 873.

Figure 21A:
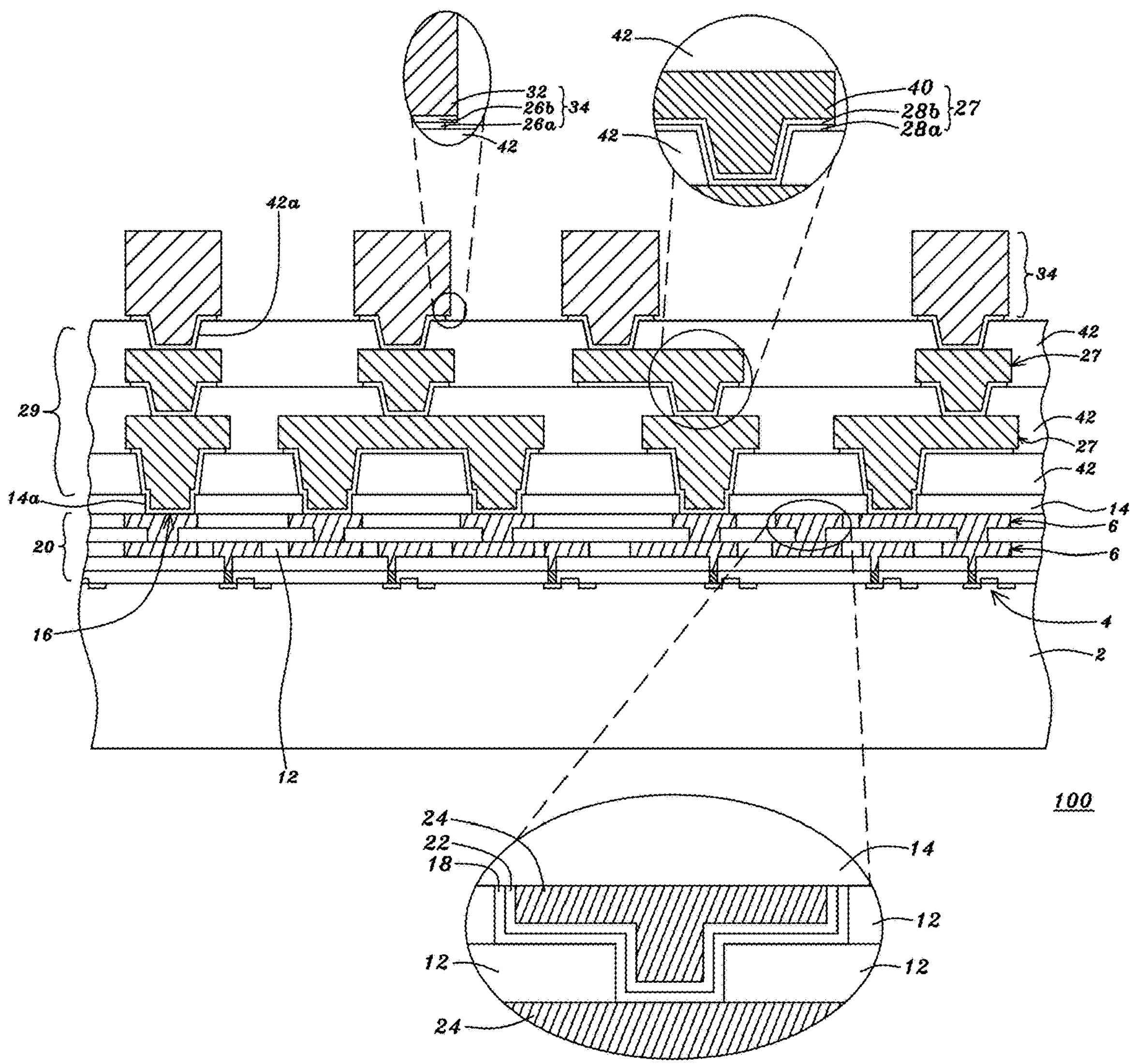
FIG. 21A is a schematically cross-sectional view showing a first type of semiconductor chip in accordance with an embodiment of the present application.
Figure 21B:
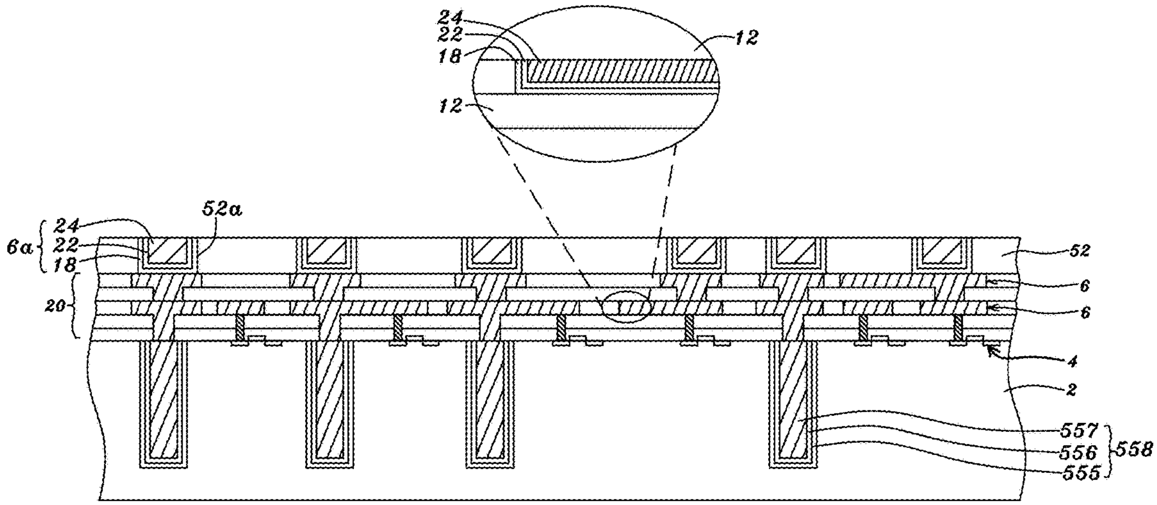
FIG. 21B is a schematically cross-sectional view showing a second type of semiconductor chip in accordance with an embodiment of the present application.

Referring to FIG. 8A, each of the resistive random access memory (RRAM) cells 870 may have its bottom electrode 871 formed on a top surface of one of the lower metal vias 10 of a lower one of the interconnection metal layers 6 as illustrated in FIGS. 21A and 21B and on a top surface of a lower one of the insulating dielectric layers 12 as illustrated in FIGS. 21A and 21B. An upper one of the insulating dielectric layers 12 as illustrated in FIGS. 21A and 21B may be formed on the top electrode 872 of said one of the resistive random access memory (RRAM) cells 870 and an upper one of the interconnection metal layers 6 as illustrated in FIGS. 21A and 21B may have the upper metal vias 10 each formed in the upper one of the insulating dielectric layers 12 and on the top electrode 872 of one of the resistive random access memory (RRAM) cells 870.

Alternatively, referring to FIG. 8B, each of the resistive random access memory (RRAM) cells 870 may have its bottom electrode 871 formed on a top surface of one of the lower metal pads 8 of a lower one of the interconnection metal layers 6 as illustrated in FIGS. 21A and 21B. An upper one of the insulating dielectric layers 12 as illustrated in FIGS. 21A and 21B may be formed on the top electrode 872 of said one of the resistive random access memory (RRAM) cells 870 and an upper one of the interconnection metal layers 6 as illustrated in FIGS. 21A and 21B may have the upper metal vias 10 each formed in the upper one of the insulating dielectric layers 12 and on the top electrode 872 of one of the resistive random access memory (RRAM) cells 870.

Alternatively, referring to FIG. 8C, each of the resistive random access memory (RRAM) cells 870 may have its bottom electrode 871 formed on a top surface of one of the lower metal pads 8 of a lower one of the interconnection metal layers 6 as illustrated in FIGS. 21A and 21B. An upper one of the interconnection metal layers 6 as illustrated in FIGS. 21A and 21B may have the upper metal pads 8 each formed in an upper one of the insulating dielectric layers 12 and on the top electrode 872 of one of the resistive random access memory (RRAM) cells 870.

Figure 8D:
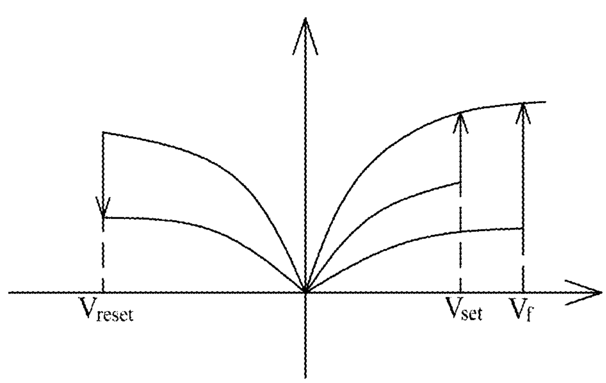
FIG. 8D is a plot showing various states of a resistive random access memory (RRAM) cell in accordance with an embodiment of the present application, wherein the x-axis indicates a voltage of a resistive random access memory and the y-axis indicates a log value of a current of a resistive random access memory.

FIG. 8D is a plot showing various states of a resistive random access memory (RRAM) cell in accordance with an embodiment of the present application, wherein the x-axis indicates a voltage of a resistive random access memory and the y-axis indicates a log value of a current of a resistive random access memory. Referring to FIGS. 8A and 8D, when the resistive random access memory (RRAM) cells 870 start to be first used before a resetting or setting step as illustrated in the following paragraphs, a forming step is performed to each of the resistive random access memory (RRAM) cells 870 to form vacancies in its resistive layer 873 for electrons capable of moving between its bottom and top electrodes 871 and 872 in a low resistant manner. When each of the resistive random access memory (RRAM) cells 870 is being formed, a forming voltage $V_f$ ranging from 0.25 to 3.3 volts is applied to its top electrode 872, and a voltage Vss of ground reference is applied to its bottom electrode 871 such that oxygen atoms or ions in the oxide layer, such as hafnium dioxide, of its resistive layer 873 may move toward the oxygen reservoir layer, such as titanium, of its resistive layer 873 by an absorption force from positive charges at its top electrode 872 and a repulsive force against negative charges at its bottom electrode 871 to react with the oxygen reservoir layer of the resistive layer 873 into a transition oxide, such as titanium oxide, at the interface between the oxide layer of the resistive layer 873 and the oxygen reservoir layer of the resistive layer 873. The sites where the oxygen atoms or ions are occupied in the oxide layer of the resistive layer 873 before the forming step become vacancies after the oxygen atoms or ions are left to move toward the oxygen reservoir layer of the resistive layer 873. The vacancies may form conductive filaments or paths in the oxide layer of the resistive layer 873 and thus said each of the resistive random access memory (RRAM) cells 870 may be formed to a low resistance between 100 and 100,000 ohms.

Referring to FIG. 8D, after the resistive random access memory (RRAM) cells 870 are formed in the forming step, a resetting step may be performed to one of the resistive random access memory (RRAM) cells 870. When said one of the resistive random access memory (RRAM) cells 870 is being reset, a resetting voltage $V_{RE}$ ranging from 0.25 to 3.3 volts may be applied to its bottom electrode 871, and a voltage Vss of ground reference is applied to its top electrode 872 such that the oxygen atoms or ions may move from the transition oxide at the interface between the oxide layer of the resistive layer 873 and the oxygen reservoir layer of the resistive layer 873 to the vacancies in the oxide layer of the resistive layer 873 to fill the vacancies such that the vacancies may be largely reduced in the oxide layer of the resistive layer 873. Also, the conductive filaments or paths may be reduced in the oxide layer of the resistive layer 873, and thereby said one of the resistive random access memory (RRAM) cells 870 may be reset to a high resistance between 1,000 and 100,000,000,000 ohms, greater than the low resistance. The forming voltage $V_f$ is greater than the resetting voltage $V_{RE}$.

Referring to FIG. 8D, after the resistive random access memory (RRAM) cells 870 are reset with the high resistance, a setting step may be performed to one of the resistive random access memory (RRAM) cells 870. When said one of the resistive random access memory (RRAM) cells 870 is being set, a setting voltage $V_{SE}$ ranging from 0.25 to 3.3 volts may applied to its top electrode 872, and a voltage Vss of ground reference may be applied to its bottom electrode 871 such that oxygen atoms or ions in the oxide layer, such as hafnium dioxide, of its resistive layer 873 may move toward the oxygen reservoir layer, such as titanium, of its resistive layer 873 by an absorption force from positive charges at its top electrode 872 and a repulsive force against negative charges at its bottom electrode 871 to react with the oxygen reservoir layer of the resistive layer 873 into a transition oxide, such as titanium oxide, at the interface between the oxide layer of the resistive layer 873 and the oxygen reservoir layer of the resistive layer 873. The sites where the oxygen atoms or ions are occupied in the oxide layer of the resistive layer 873 before the setting step become vacancies after the oxygen atoms or ions are left to move toward the oxygen reservoir layer of the resistive layer 873. The vacancies may form conductive filaments or paths in the oxide layer of the resistive layer 873 and thus said one of the resistive random access memory (RRAM) cells 870 may be set to the low resistance between 100 and 100,000 ohms. The forming voltage $V_f$ is greater than the setting voltage $V_{SE}$.

Figure 8E:
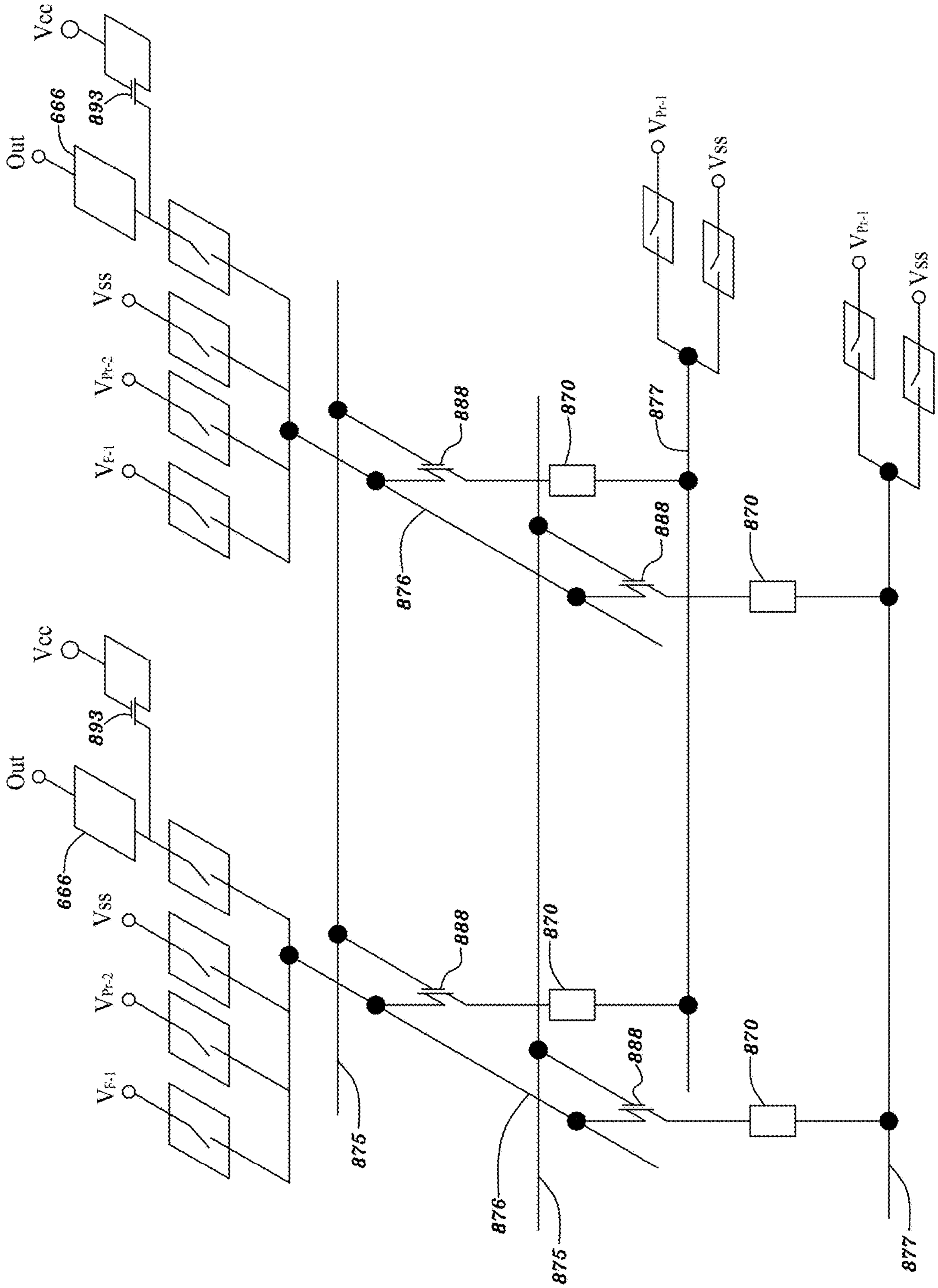
FIG. 8E is a circuit diagram showing an array of non-volatile memory cells for resistive random access memory (RRAM) cells operating with transistors in accordance with an embodiment of the present application.

FIG. 8E is a circuit diagram showing an array of non-volatile memory cells for resistive random access memory (RRAM) cells operating with transistors in accordance with an embodiment of the present application. Referring to FIG. 8E, multiple of the resistive random access memory (RRAM) cells 870 are formed in an array in the RRAM layer 869 as seen in FIG. 8A-8C. Multiple of the switches 888, e.g., N-type MOS transistors, are arranged in an array. Alternatively, each of the switches 888 may be a P-type MOS transistor. Each of the N-type MOS transistors 888 is configured to form a channel with two opposite terminals, one of which couples in series to one of the bottom and top electrodes 871 and 872 of one of the resistive random access memory (RRAM) cells 870 and the other of which couples to one of bit lines 876, and has a gate terminal coupling to one of word lines 875. Each of reference lines 877 may couple to the other of the bottom and top electrodes 871 and 872 of each of the resistive random access memory (RRAM) cells 870 arranged in a row. Each of the word lines 875 may couple to the gate terminals of the N-type MOS transistors 888 arranged in a row that couple in parallel to one another through said each of the word lines 875. Each of the bit lines 876 is configured to couple, one by one and in turn, to one of the bottom and top electrodes 871 and 872 of each of the resistive random access memory (RRAM) cells 870 in a column through one of the N-type MOS transistors 888 in a column.

In an alternative example, each of the N-type MOS transistors 888 is configured to form a channel with two opposite terminals, one of which couples in series to one of the bottom and top electrodes 871 and 872 of one of the resistive random access memory (RRAM) cells 870 and the other of which couples to one of the reference lines 877, and has a gate terminal coupling to one of the word lines 875. Each of the reference lines 877 is configured to couple to one of the bottom and top electrodes 871 and 872 of each of the resistive random access memory (RRAM) cells 870 arranged in a row through one of the N-type MOS transistors 888 in a row.

Referring to FIG. 8E, when the resistive random access memory (RRAM) cells 870 start to be first used before the resetting or setting step as illustrated in FIG. 8D, the forming step as illustrated in FIG. 8D is performed to each of the resistive random access memory (RRAM) cells 870 to form vacancies in its resistive layer 873 for electrons capable of moving between its bottom and top electrodes 871 and 872 in the low resistant manner. When each of the resistive random access memory (RRAM) cells 870 is being formed, (1) all of the bit lines 876 are switched to couple to a first activating voltage $V_{F\text{-}1}$ equal to or greater than the forming voltage $V_f$, wherein the first activating voltage $V_{F\text{-}1}$ may range from 0.25 to 3.3 volts, (2) all of the word lines 875 are switched to couple to the first activating voltage $V_{F\text{-}1}$ to turn on each of the N-type MOS transistors 888 to couple one of the bottom and top electrode 872 of one of the resistive random access memory (RRAM) cells 870 to one of the bit lines 876 or, in the alternative example, to couple one of the bottom and top electrode 872 of one of the resistive random access memory (RRAM) cells 870 to one of the reference lines 877 and (3) all of the reference lines 877 are switched to couple to the voltage Vss of ground reference. Alternatively, when each of the switches 888 is a P-type MOS transistor, all of the word lines 875 are switched to couple to the voltage Vss of ground reference to turn on each of the P-type MOS transistors 888 to couple one of the bottom and top electrode 872 of one of the resistive random access memory (RRAM) cells 870 to one of the bit lines 876 or, in the alternative example, to couple one of the bottom and top electrode 872 of one of the resistive random access memory (RRAM) cells 870 to one of the reference lines 877. Thereby, when each of the resistive random access memory (RRAM) cells 870 is being formed, the first activating voltage $V_{F\text{-}1}$ may be applied to said one of its bottom and top electrodes 871 and 872, and the voltage Vss of ground reference may be applied to the other of its bottom and top electrodes 871 and 872 such that said each of the resistive random access memory (RRAM) cells 870 may be formed to the low resistance between 100 and 100,000 ohms, and thus programmed to a logic level of "0".

Next, referring to FIG. 8E, a resetting step as illustrated in FIG. 8D may be performed, one row by one row and in turn, to a first group of the resistive random access memory (RRAM) cells 870 but not to a second group of the resistive random access memory (RRAM) cells 870, in which (1) each of the word lines 875 corresponding to the resistive random access memory (RRAM) cells 870 in a row may be selected one by one and in turn to be switched to couple to a first programming voltage $V_{Pr\text{-}1}$ to turn on the N-type MOS transistors 888 in a row to couple each of the resistive random access memory (RRAM) cells 870 in the row to one of the bit lines 876 or, in the alternative example, to couple all of the resistive random access memory (RRAM) cells 870 in the row to a same one of the reference lines 877, wherein the unselected word lines 875 corresponding to the resistive random access memory (RRAM) cells 870 in the other rows may be switched to couple to the voltage Vss of ground reference to turn off the N-type MOS transistors 888 in the other rows to decouple each of the resistive random access memory (RRAM) cells 870 in the other rows from any of the bit lines 876 or, in the alternative example, to decouple each of the resistive random access memory (RRAM) cells 870 in the other rows from any of the reference lines 877, wherein the first programming voltage $V_{Pr\text{-}1}$ may be between 0.25 and 3.3 volts, equal to or greater than the resetting voltage $V_{RE}$ of the resistive random access memory (RRAM) cells 870, (2) the reference lines 877 may be switched to couple to the first programming voltage $V_{Pr-1}$, (3) the bit lines 876 in a first group each for one of the resistive random access memory (RRAM) cells 870 in the first group in the row may be switched to couple to the voltage Vss of ground reference, and (4) the bit lines 876 in a second group each for one of the resistive random access memory (RRAM) cells 870 in the second group in the row may be switched to couple to the first programming voltage $V_{Pr-1}$. Alternatively, when each of the switches 888 is a P-type MOS transistor, each of the word lines 875 corresponding to the resistive random access memory (RRAM) cells 870 in the row may be selected one by one and in turn to be switched to couple to the voltage Vss of ground reference to turn on the P-type MOS transistors 888 in the row to couple each of the resistive random access memory (RRAM) cells 870 in the row to one of the bit lines 876 or, in the alternative example, to couple all of the resistive random access memory (RRAM) cells 870 in the row to the same one of the reference lines 877, wherein the unselected word lines 875 corresponding to the resistive random access memory (RRAM) cells 870 in the other rows may be switched to couple to the first programming voltage $V_{Pr-1}$ to turn off the P-type MOS transistors 888 in the other rows to decouple each of the resistive random access memory (RRAM) cells 870 in the other rows from any of the bit lines 876 or, in the alternative example, to decouple each of the resistive random access memory (RRAM) cells 870 in the other rows from any of the reference lines 877. Thereby, the resistive random access memory (RRAM) cells 870 in the first group may be reset to the high resistance between 1,000 and 100,000,000,000 ohms in the resetting step, and thus programmed to a logic level of "1". The resistive random access memory (RRAM) cells 870 in the second group may be kept in the previous state.

Referring to FIG. 8E, a setting step as illustrated in FIG. 8D may be performed, one row by one row and in turn, to the second group of the resistive random access memory (RRAM) cells 870 but not to the first group of the resistive random access memory (RRAM) cells 870, in which (1) each of the word lines 875 corresponding to the resistive random access memory (RRAM) cells 870 in the row may be selected one by one and in turn to be switched to couple to a second programming voltage $V_{Pr-2}$ to turn on the N-type MOS transistors 888 in the row to couple each of the resistive random access memory (RRAM) cells 870 in the row to one of the bit lines 876 or, in the alternative example, to couple all of the resistive random access memory (RRAM) cells 870 in the row to a same one of the reference lines 877, wherein the unselected word lines 875 corresponding to the resistive random access memory (RRAM) cells 870 in the other rows may be switched to couple to the voltage Vss of ground reference to turn off the N-type MOS transistors 888 in the other rows to decouple each of the resistive random access memory (RRAM) cells 870 in the other rows from any of the bit lines 876 or, in the alternative example, to decouple each of the resistive random access memory (RRAM) cells 870 in the other rows from any of the reference lines 877, wherein the second programming voltage $V_{Pr-2}$ may be between 0.25 and 3.3 volts, equal to or greater than the setting voltage $V_{SE}$ of the resistive random access memory (RRAM) cells 870, (2) the reference lines 877 may be switched to couple to the voltage Vss of ground reference, (3) the bit lines 876 in the first group each for one of the resistive random access memory (RRAM) cells 870 in the first group in the row may be switched to couple to the voltage Vss of ground reference, and (4) the bit lines 876 in the second group each for one of the resistive random access memory (RRAM) cells 870 in the second group in the row may be switched to couple to the second programming voltage $V_{Pr-2}$. Alternatively, when each of the switches 888 is a P-type MOS transistor, each of the word lines 875 corresponding to the resistive random access memory (RRAM) cells 870 in the row may be selected one by one and in turn to be switched to couple to the voltage Vss of ground reference to turn on the P-type MOS transistors 888 in the row to couple each of the resistive random access memory (RRAM) cells 870 in the row to one of the bit lines 876 or, in the alternative example, to couple all of the resistive random access memory (RRAM) cells 870 in the row to the same one of the reference lines 877, wherein the unselected word lines 875 corresponding to the resistive random access memory (RRAM) cells 870 in the other rows may be switched to couple to the second programming voltage $V_{Pr-2}$ to turn off the P-type MOS transistors 888 in the other rows to decouple each of the resistive random access memory (RRAM) cells 870 in the other rows from any of the bit lines 876 or, in the alternative example, to decouple each of the resistive random access memory (RRAM) cells 870 in the other rows from any of the reference lines 877. Thereby, the resistive random access memory (RRAM) cells 870 in the first group may be set to the low resistance between 100 and 100,000 ohms in the setting step, and thus programmed to a logic level of "0". The resistive random access memory (RRAM) cells 870 in the second group may be kept in the previous state.

Figure 8G:
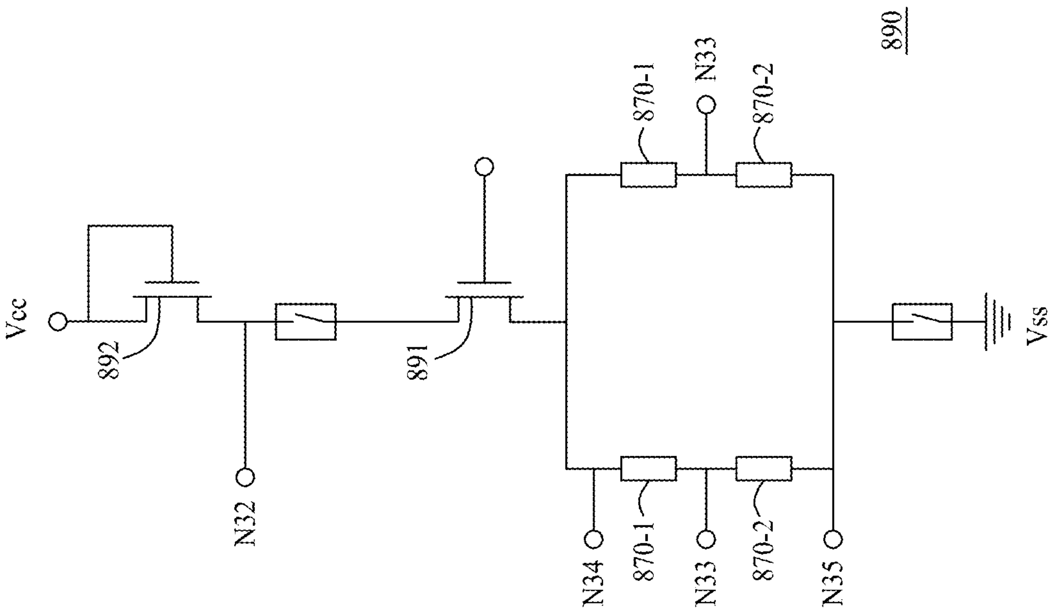
FIG. 8G is a circuit diagram showing a comparison-voltage generating circuit for resistive random access memory (RRAM) cells in accordance with an embodiment of the present application.
Figure 8F:
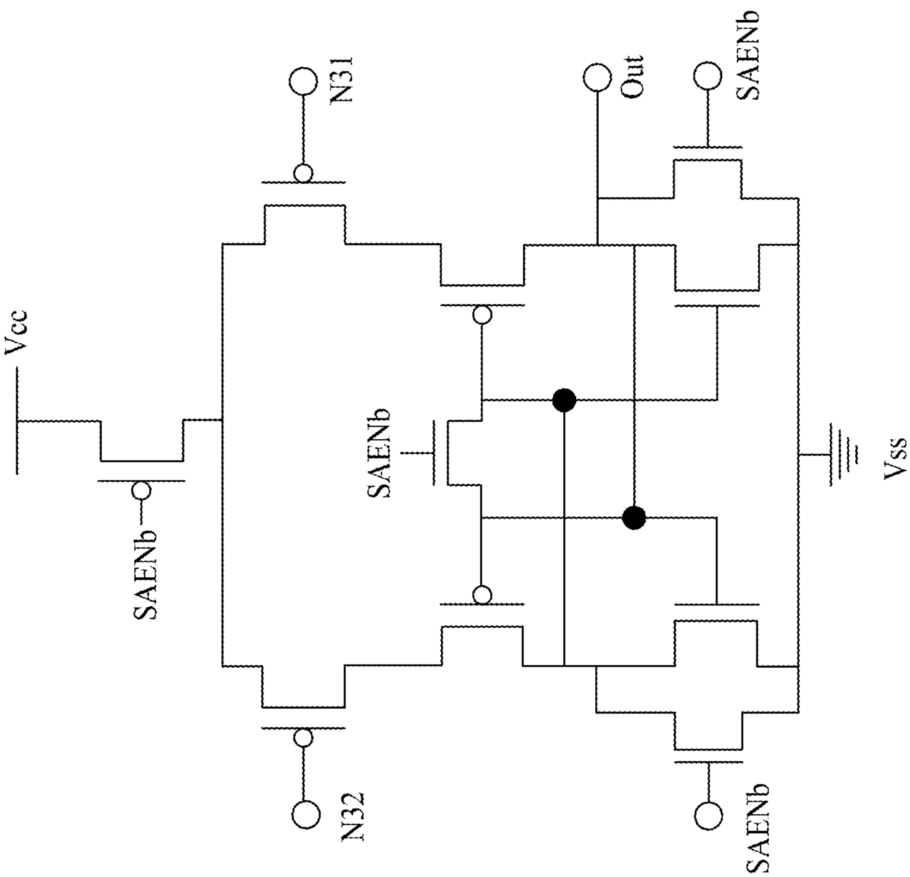
FIG. 8F is a circuit diagram showing a sense amplifier in accordance with an embodiment of the present application.

FIG. 8F is a circuit diagram showing a sense amplifier in accordance with an embodiment of the present application. In operation, referring to FIGS. 8E and 8F, (1) each of the bit lines 876 may be switched to couple to a node N31 of one of multiple sense amplifiers 666 as illustrated in FIG. 8F and to a source terminal of one of multiple N-type MOS transistors 893, (2) each of the reference lines 877 may be switched to couple to the voltage Vss of ground reference, and (3) each of the word lines 875 corresponding to the resistive random access memory (RRAM) cells 870 in a row may be selected one by one and in turn to be switched to couple to the voltage Vcc of power supply to turn on the N-type MOS transistors 888 in the row to couple each of the resistive random access memory (RRAM) cells 870 in the row to one of the bit lines 876 or, in the alternative example, to couple all of the resistive random access memory (RRAM) cells 870 in the row to a same one of the reference lines 877, wherein the unselected word lines 875 corresponding to the resistive random access memory (RRAM) cells 870 in the other rows may be switched to couple to the voltage Vss of ground reference to turn off the N-type MOS transistors 888 in the other rows to decouple each of the resistive random access memory (RRAM) cells 870 in the other rows from any of the bit lines 876 or, in the alternative example, to decouple each of the resistive random access memory (RRAM) cells 870 in the other rows from any of the reference lines 877. The N-type MOS transistor 893 may have a gate terminal coupling to the voltage Vcc of power supply and to a drain terminal of the N-type MOS transistor 893. Alternatively, when each of the switches 888 is a P-type MOS transistor, each of the word lines 875 corresponding to the resistive random access memory (RRAM) cells 870 in the row may be selected one by one and in turn to be switched to couple to the voltage Vss of ground reference to turn on the P-type MOS transistors 888 in the row to couple each of the resistive random access memory (RRAM) cells 870 in the row to one of the bit lines 876 or, in the alternative example, to couple all of the resistive random access memory (RRAM) cells 870 in the row to the same one of the reference lines 877, wherein the unselected word lines 875 corresponding to the resistive random access memory (RRAM) cells 870 in the other rows may be switched to couple to the voltage Vcc of power supply to turn off the P-type MOS transistors 888 in the other rows to decouple each of the resistive random access memory (RRAM) cells 870 in the other rows from any of the bit lines 876 or, in the alternative example, to decouple each of the resistive random access memory (RRAM) cells 870 in the other rows from any of the reference lines 877. Thereby, each of the sense amplifiers 666 may compare a voltage at one of the bit lines 876, i.e., at the node N31 as seen in FIG. 8F, with a comparison voltage at a comparison line, i.e., at the node N32 as seen in FIG. 8F, into a compared data and then generate an output "Out" of one of the resistive random access memory (RRAM) cells 870 coupling to said one of the bit lines 876 based on the compared data. For example, when the voltage at the node N31 is compared by said each of the sense amplifiers 666 to be smaller than the comparison voltage at the node N32, said each of the sense amplifiers 666 may generate the output "Out" at a logic level of "1" in the case that one of the resistive random access memory (RRAM) cells 870, which couples to said each of the sense amplifiers 666, has the low resistance. When the voltage at the node N31 is compared by said each of the sense amplifiers 666 to be greater than the comparison voltage at the node N32, said each of the sense amplifiers 666 may generate the output "Out" at a logic level of "0" in the case that one of the resistive random access memory (RRAM) cells 870, which couples to said each of the sense amplifiers 666, has the high resistance.

FIG. 8G is a circuit diagram showing a comparison-voltage generating circuit for resistive random access memory (RRAM) cells in accordance with an embodiment of the present application. Referring to FIGS. 8A-8G, a comparison-voltage generating circuit 890 includes two pairs of resistive random access memory (RRAM) cells 870-1 and 870-2 connected in serial to each other, wherein the pairs of resistive random access memory (RRAM) cells 870-1 and 870-2 are connected in parallel to each other. In each of the pairs of resistive random access memory (RRAM) cells 870-1 and 870-2, the resistive random access memory (RRAM) cell 870-1 may have its top electrode 872 coupling to the top electrode 872 of the resistive random access memory (RRAM) cell 870-2 and to a node N33, and the resistive random access memory (RRAM) cell 870-1 may have its bottom electrode 871 coupling to a node N34. The comparison-voltage generating circuit 890 may further include a N-type MOS transistors 891 having a source terminal, in operation, coupling to the bottom electrodes 871 of the resistive random access memory (RRAM) cells 870-1 in the pairs and to the node N34. The comparison-voltage generating circuit 890 may further include a N-type MOS transistor 892 having a gate terminal coupling to a drain terminal of the N-type MOS transistor 892 and to the voltage Vcc of power supply and a source terminal coupling to the node N32 of the sense amplifier 666 as seen in FIG. 8F via the comparison line. The bottom electrodes 871 of the resistive random access memory (RRAM) cells 870-2 in the pairs may couple to a node N35.

Referring to FIGS. 8A-8G, when the pairs of resistive random access memory (RRAM) cells 870-1 and 870-2 in the pairs are being formed in the forming step as illustrated in FIG. 8D, (1) the node N34 may be switched to couple to the voltage Vss of ground reference, (2) the node N33 may be switched to couple to the first activating voltage $V_{F\text{-}1}$, (3) the node N35 may be switched to couple to the voltage Vss of ground reference, and (4) the node N32 may be switched not to couple to the bottom electrodes 871 of the resistive random access memory (RRAM) cells 870-1 in the pairs. Thereby, the resistive random access memory (RRAM) cells 870-1 and 870-2 in the pairs may be formed to the low resistance.

Referring to FIGS. 8A-8G, after the resistive random access memory (RRAM) cells 870-1 and 870-2 in the pairs are formed in the forming step, the resetting step as illustrated in FIG. 8D may be performed to the resistive random access memory (RRAM) cells 870-1 and 870-2 in the pairs. When the pairs of resistive random access memory (RRAM) cells 870-1 and 870-2 are being reset in the resetting step, (1) the node N34 may be switched to couple to the first programming voltage $V_{Pr\text{-}1}$, (2) the node N33 may be switched to couple to the voltage Vss of ground reference, (3) the node N35 may be switched to couple to the first programming voltage $V_{Pr\text{-}1}$, and (4) the node N32 may be switched not to couple to the bottom electrodes 871 of the resistive random access memory (RRAM) cells 870-1 in the pairs. Thereby, the resistive random access memory (RRAM) cells 870-1 and 870-2 in the pairs may be reset to the high resistance.

Referring to FIGS. 8A-8G, after the resistive random access memory (RRAM) cells 870-1 and 870-2 in the pairs are reset in the resetting step, the setting step as illustrated in FIG. 8D may be performed to the resistive random access memory (RRAM) cells 870-2 in the pairs. When the resistive random access memory (RRAM) cells 870-2 are being set in the setting step, (1) the node N34 may be switched to couple to the second programming voltage $V_{Pr\text{-}2}$, (2) the node N33 may be switched to couple to the second programming voltage $V_{Pr\text{-}2}$, (3) the node N35 may be switched to couple to the voltage Vss of ground reference, and (4) the node N32 may be switched not to couple to the bottom electrodes 871 of the resistive random access memory (RRAM) cells 870-1 in the pairs. Thereby, the resistive random access memory (RRAM) cells 870-2 in the pairs may be set to the low resistance. Accordingly, the resistive random access memory (RRAM) cells 870-2 in the pairs may be programmed to the low resistance between 100 and 100,000 ohms, and the resistive random access memory (RRAM) cells 870-1 in the pairs may be programmed to the high resistance between 1,000 and 100,000,000,000 ohms, greater than the low resistance, for example.

Referring to FIGS. 8A-8G, in operation after the resistive random access memory (RRAM) cells 870-2 in the pairs may be programmed to the low resistance, and the resistive random access memory (RRAM) cells 870-1 in the pairs may be programmed to the high resistance, (1) the nodes N33, N34 and N35 may be switched to be floating, (2) the node N32 may be switched to couple to the bottom electrodes 871 of the resistive random access memory (RRAM) cells 870-1 in the pairs, and (3) the bottom electrodes 871 of the resistive random access memory (RRAM) cells 870-2 in the pairs may be switched to couple to the voltage Vss of ground reference. Thereby, the comparison line, i.e., node N32, of the sense amplifier 666 as seen in FIG. 8F may be at the comparison voltage between a voltage of the node N31 coupling to one of the resistive random access memory (RRAM) cells 870 programmed to the low resistance and selected by one of the word lines 875 and a voltage of the node N31 coupling to one of the resistive random access memory (RRAM) cells 870 programmed to the high resistance and selected by one of the word lines 875.

(1.2) First Type of Non-Volatile Memory Cells for the Second Alternative

Figure 9A:
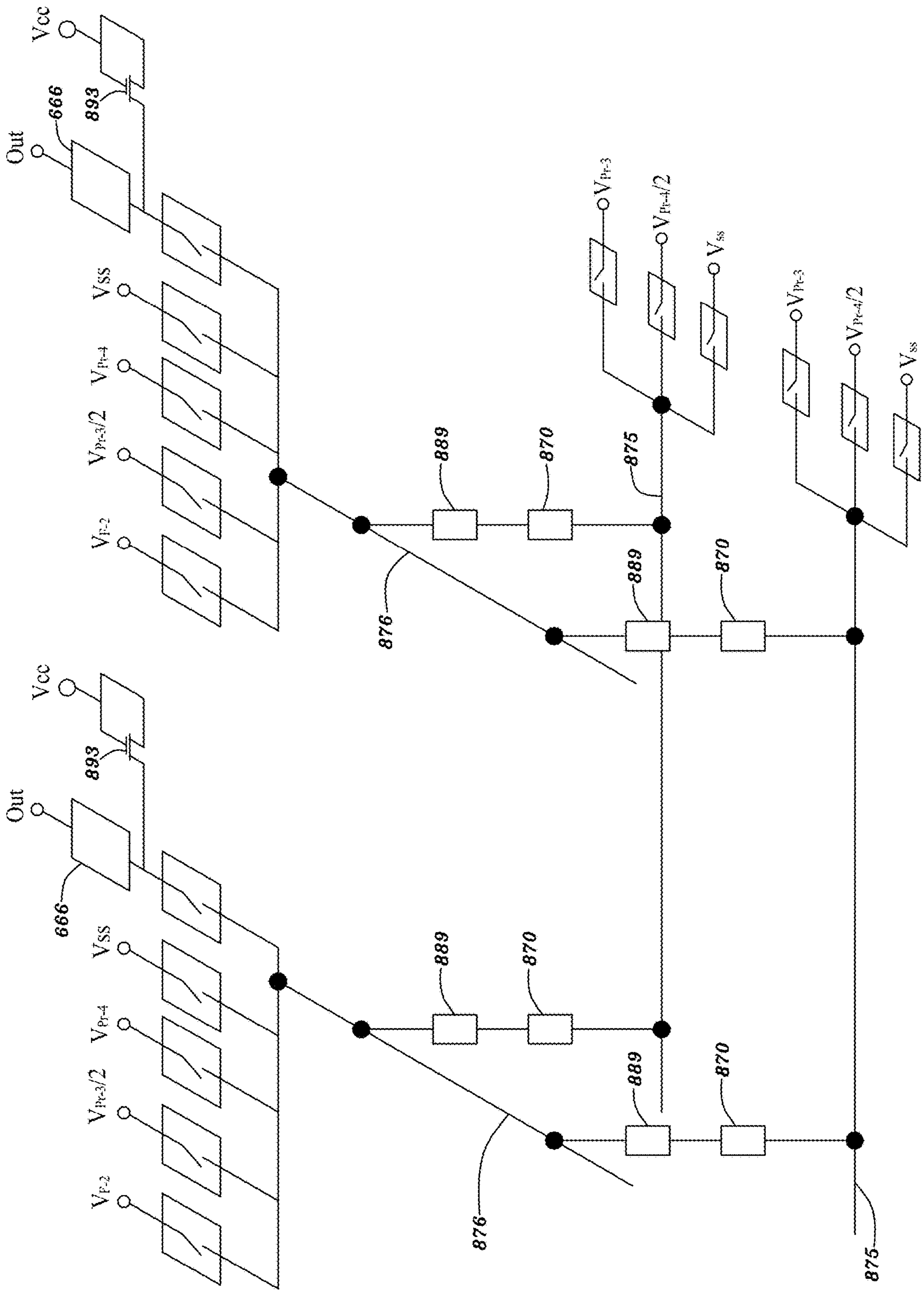
FIG. 9A is a circuit diagram showing an array of non-volatile memory cells for selective resistive random access memory (RRAM) cells in accordance with an embodiment of the present application.

FIG. 9A is a circuit diagram showing an array of non-volatile memory cells for selective resistive random access memory (RRAM) cells in accordance with an embodiment of the present application. The circuits as illustrated in FIG. 8H may be referred to those as illustrated in FIGS. 8A-8G, but the difference therebetween is that the switches 888 arranged in the array as seen in FIG. 8E may be replaced with multiple selectors 889 arranged in the array to couple in series to the resistive random access memory (RRAM) cells 870 respectively, and the reference lines 877 as illustrated in FIG. 8E are used as word lines 875. Referring to FIG. 9A, multiple of the resistive random access memory (RRAM) cells 870 may be selected by the selectors 889 in the forming, setting or resetting step and in operation. Each of the selectors 889 may be controlled to be turned on or off in accordance with the voltage bias between two opposite terminals of said each of the selectors 889. For said each of the selectors, the lower bias is applied to its two opposite terminals, the higher resistance it has; the larger bias is applied to its two opposite terminals, the lower resistance it has. Further, its resistance may change with nonlinearity based on the bias applied to its two opposite terminals.

Figure 9D:
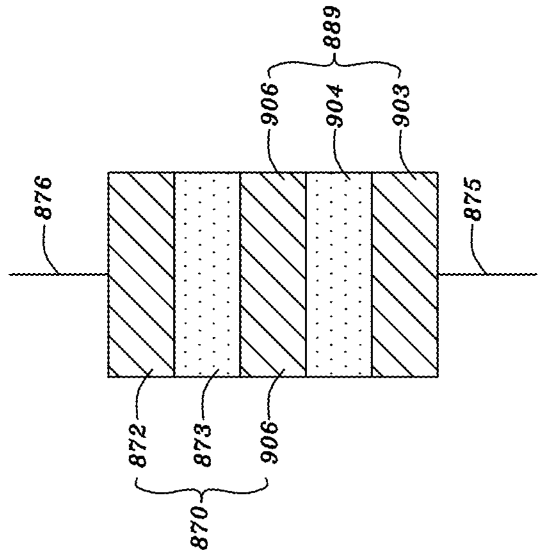
FIGS. 9C and 9D are schematically cross-sectional views showing various structures of selective resistive random access memory (RRAM) cells in accordance with an embodiment of the present application.
Figure 9C:
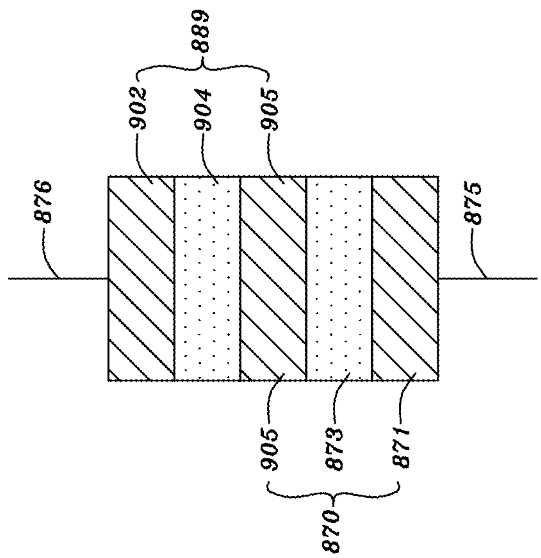
Figure 9B:
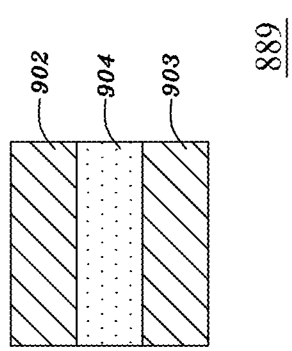
FIG. 9B is a schematically cross-sectional view showing a structure of a selector in accordance with the present application.

FIG. 9B is a schematically cross-sectional view showing a structure of a selector in accordance with the present application. Referring to FIG. 9B, each of the selectors 889 may be a current-tunneling device formed with a metal-insulator-metal (MIM) structure. Each of the selectors 889 may include (1) a top electrode 902, such as a layer of nickel, platinum or titanium, at one of the two opposite terminals thereof, (2) a bottom electrode 903, such as a layer of platinum, at the other of the two opposite terminals thereof and (3) a tunneling oxide layer 904 between its top and bottom electrodes 902 and 903. The tunneling oxide layer 904 may have a layer of $TiO_2$, $Al_2O_3$, or $HfO_2$ with a thickness between 5 nm and 20 nm, which may be formed by an atomic-layer-deposition (ALD) process.

FIGS. 9C and 9D are schematically cross-sectional views showing various structures of selective resistive random access memory (RRAM) cells in accordance with an embodiment of the present application. In an example, as seen in FIGS. 9A and 9C, each of the selectors 889 may be stacked on one of the resistive random access memory (RRAM) cells 870, and the bottom electrode 903 of said each of the selectors 889 and the top electrode 872 of said one of the resistive random access memory (RRAM) cells 870 may be made as a singal metal layer 905 such as a layer of platinum having a thickness between 1 and 20 nanometers, wherein said each of the selectors 889 may couple to the bit line 876 via its top electrode 902, and said one of the resistive random access memory (RRAM) cells 870 may couple to the word line 875 via its bottom electrode 871. In another example, as seen in FIG. 8D, each of the resistive random access memory (RRAM) cells 870 may be stacked on one of the selectors 889, and the bottom electrode 871 of said each of the resistive random access memory (RRAM) cells 870 and the top electrode 902 of said one of the selectors 889 may be made as a singal metal layer 906 such as a layer of nickel, platinum or titanium having a thickness between 1 and 20 nanometers, wherein said each of the resistive random access memory (RRAM) cells 870 may couple to the bit line 876 via its top electrode 872, and said one of the selectors 889 may couple to the word line 875 via its bottom electrode 903.

Referring to FIGS. 9A-9D, each of the selectors 889 may be a bipolar tunneling MIM device. For the bipolar tunneling MIM device, when a positive voltage bias applied to the two opposite terminals thereof increases by one volt, a current flowing through it in a forward direction may increase by $10^5$ times or greater than $10^5$ times, by $10^4$ times or greater than $10^4$ times, by $10^3$ times or greater than $10^3$ times or by $10^2$ times or greater than $10^2$ times; when a negative voltage bias applied to the two opposite terminals thereof increases by one volt, a current flowing through it in a backward direction, opposite to the forward direction, may increase by $10^5$ times or greater than $10^5$ times, by $10^4$ times or greater than $10^4$ times, by $10^3$ times or greater than $10^3$ times or by $10^2$ times or greater than $10^2$ times. The positive threshold-voltage bias to turn on the bipolar tunneling MIM device to allow a current flowing therethrough in the forward direction may range from 0.3 volts to 2.5 volts, 0.5 volts to 2 volts or 0.5 volts to 1.5 volts, and the negative threshold-voltage bias to turn on the bipolar tunneling MIM device to allow a current flowing therethrough in the backard direction may range from 0.3 volts to 2.5 volts, 0.5 volts to 2 volts or 0.5 volts to 1.5 volts.

Alternatively, referring to FIG. 9A, each of the selectors 889 may be composed of two unipolar tunneling MIM devices (not shown) arranged in parallel with two respective terminals coupling in series to one of the resistive random access memory (RRAM) cells 870. For the two unipolar tunneling MIM devices, when a positive voltage bias applied to the two opposite terminals of each of them increases by one volt, a current flowing through one of them in a forward direction may increase by $10^5$ times or greater than $10^5$ times, by $10^4$ times or greater than $10^4$ times, by $10^3$ times or greater than $10^3$ times or by $10^2$ times or greater than $10^2$ times; when a negative voltage bias applied to the two opposite terminals of each of them increases by one volt, a current flowing through the other of them in a backward direction, opposite to the forward direction, may increase by $10^5$ times or greater than $10^5$ times, by $10^4$ times or greater than $10^4$ times, by $10^3$ times or greater than $10^3$ times or by $10^2$ times or greater than $10^2$ times. The positive threshold-voltage bias to turn on said one of the unipolar tunneling MIM devices to allow a current flowing therethrough in the forward direction and to turn off said the other of the unipolar tunneling MIM devices may range from 0.3 volts to 2.5 volts, 0.5 volts to 2 volts or 0.5 volts to 1.5 volts, and the negative threshold-voltage bias to turn on said the other of the unipolar tunneling MIM devices to allow a current flowing therethrough in the backard direction and to turn off said one of the unipolar tunneling MIM devices may range from 0.3 volts to 2.5 volts, 0.5 volts to 2 volts or 0.5 volts to 1.5 volts.

Referring to FIGS. 9A-9D, when the resistive random access memory (RRAM) cells 870 start to be first used before the resetting or setting step as illustrated in FIG. 8D, the forming step as illustrated in FIG. 8D is performed to each of the resistive random access memory (RRAM) cells 870 to form vacancies in its resistive layer 873 for electric charges capable of moving between its bottom and top electrodes 871 and 872 in the low resistant manner. When each of the resistive random access memory (RRAM) cells 870 is being formed, (1) all of the bit lines 876 are switched to couple to a second activating voltage $V_{F-2}$ greater than or equal to the forming voltage $V_f$ of the resistive random access memory (RRAM) cells 870 plus the positive threshold-voltage bias of the selectors 889, wherein the second activating voltage $V_{F-2}$ may range from 0.25 to 3.3 volts, and (2) all of the word lines 875 are switched to couple to the voltage Vss of ground reference. Thereby, for the selective resistive random access memory (RRAM) cells provided with the stacked structure as seen in FIG. 9C, the second activating voltage $V_{F-2}$ may be applied to the top electrode 902 of each of the selectors 889 and a voltage Vss of ground reference may be applied to the bottom electrode 871 of each of the resistive random access memory (RRAM) cells 870 such that said each of the selectors 889 may be turned on to couple said each of the resistive random access memory (RRAM) cells 870 to one of the bit lines 876 and the forming step as illustrated in FIG. 8D may be performed to said each of the resistive random access memory (RRAM) cells 870 to be formed to the low resistance between 100 and 100,000 ohms, i.e., to a logic level of "0". For the selective resistive random access memory (RRAM) cells provided with the stacked structure as seen in FIG. 9D, the second activating voltage $V_{F-2}$ may be applied to the top electrode 872 of each of the resistive random access memory (RRAM) cells 870 and the voltage Vss of ground reference may be applied to the bottom electrode 903 of each of the selectors 889 such that said each of the selectors 889 may be turned on to couple said each of the resistive random access memory (RRAM) cells 870 to one of the word lines 875 and the forming step as illustrated in FIG. 8D may be performed to said each of the resistive random access memory (RRAM) cells 870 to be formed to the low resistance between 100 and 100,000 ohms, i.e., to a logic level of "0".

Figure 9E:
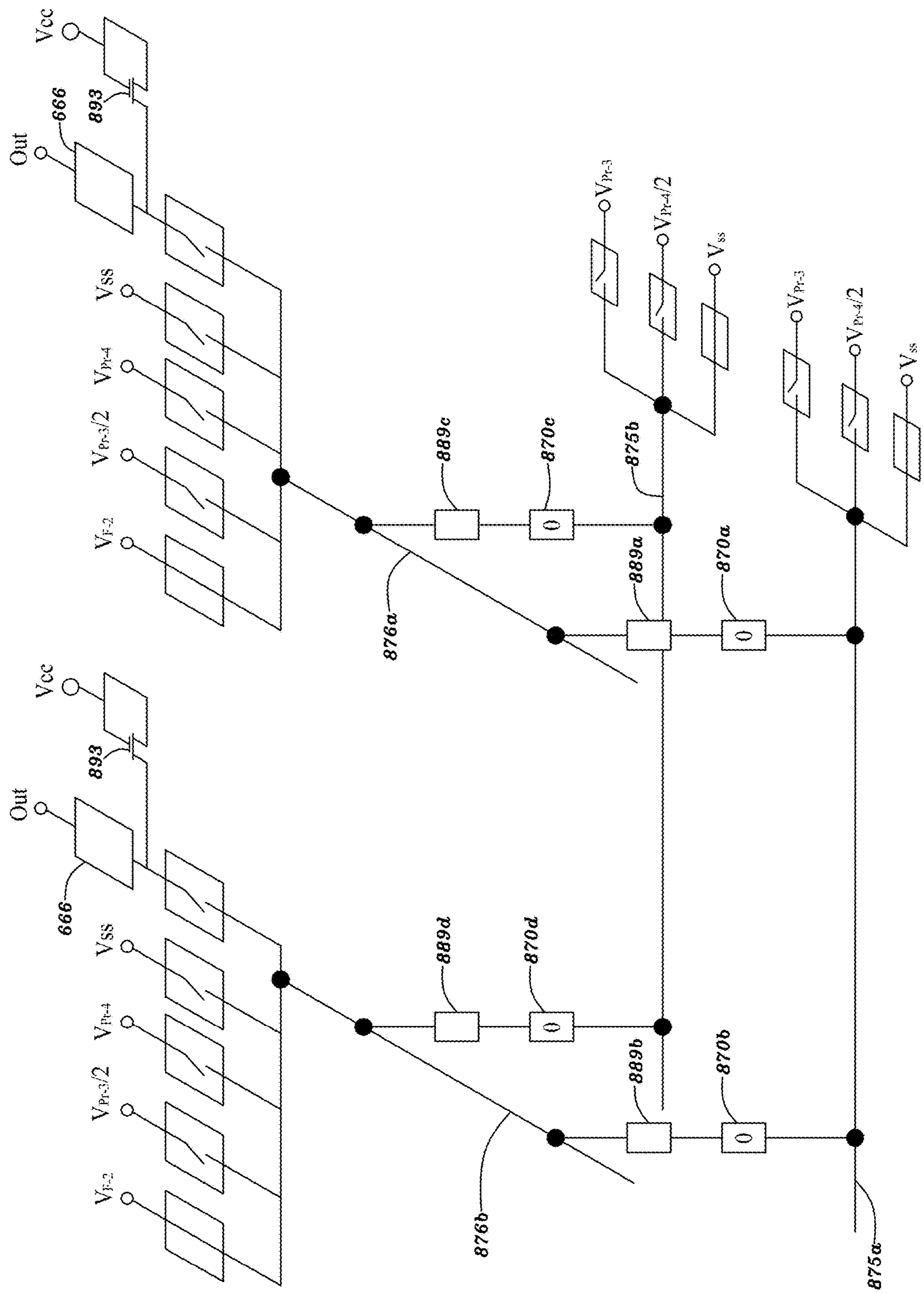
FIG. 9E is a circuit diagram showing selective resistive random access memory (RRAM) cells in a forming step in accordance with an embodiment of the present application.

For an example, FIG. 9E is a circuit diagram showing selective resistive random access memory (RRAM) cells in a forming step in accordance with an embodiment of the present application. Referring to FIG. 9E, the selective resistive random access memory (RRAM) cells may include a first one and second one arranged in a first row (y=y1) and a third one and fourth one arranged in a second row (y=y2). The first selective resistive random access memory (RRAM) cell at correspondence of (x1, y1) may include a first resistive random access memory (RRAM) cell 870*a* and a first selector 889*a* stacked as illustrated in FIG. 9C or 9D. The second selective resistive random access memory (RRAM) cell at correspondence of (x2, y1) may include a second resistive random access memory (RRAM) cell 870*b* and a second selector 889*b* stacked as illustrated in FIG. 9C or 9D. The third selective resistive random access memory (RRAM) cell at correspondence of (x1, y2) may include a third resistive random access memory (RRAM) cell 870*c* and a third selector 889*c* stacked as illustrated in FIG. 9C or 9D. The fourth selective resistive random access memory (RRAM) cell at correspondence of (x2, y2) may include a fourth resistive random access memory (RRAM) cell 870*d* and a fourth selector 889*d* stacked as illustrated in FIG. 9C or 9D.

Referring to FIG. 9E, if the first through fourth resistive random access memory (RRAM) cells 870*a*-870*d* are being formed, in the above forming step, to the low resistance, i.e., to a logic level of "0", (1) a first word line 875*a* corresponding to the first and second RRAM cells 870*a* and 870*b* and a second word line 875*b* corresponding to the third and fourth RRAM cells 870*c* and 870*d* are switched to couple to the voltage Vss of ground reference, and (2) a first bit line 876*a* for the first and third RRAM cells 870*a* and 870*c* and a second bit line 876*b* for the second and fourth RRAM cells 870*b* and 870*d* are switched to couple to the second activating voltage $V_{F-2}$.

Next, referring to FIGS. 9A-9D, a resetting step as illustrated in FIG. 8D may be performed, one row by one row and in turn, to a first group of the resistive random access memory (RRAM) cells 870 but not to a second group of the resistive random access memory (RRAM) cells 870, in which (1) each of the word lines 875 corresponding to the resistive random access memory (RRAM) cells 870 in a row may be selected one by one and in turn to be switched to couple to a third programming voltage $V_{Pr-3}$ greater than or equal to the resetting voltage $V_{RE}$ of the resistive random access memory (RRAM) cells 870 plus the negative threshold-voltage bias of the selectors 889, wherein the third programming voltage $V_{Pr-3}$ may range from 0.25 to 3.3 volts, wherein the unselected word lines 875 corresponding to the resistive random access memory (RRAM) cells 870 in the other rows may be switched to couple to the voltage Vss of ground reference, (2) the bit lines 876 in a first group each for one of the resistive random access memory (RRAM) cells 870 in the first group in the row may be switched to couple to the voltage Vss of ground reference, and (3) the bit lines 876 in a second group each for one of the resistive random access memory (RRAM) cells 870 in the second group in the row may be switched to couple to a voltage between one third and two thirds of the third programming voltage $V_{Pr-3}$, such as an half of the third programming voltage $V_{Pr-3}$. Thereby, for the selective resistive random access memory (RRAM) cells in the first group in the row provided with the stacked structure as seen in FIG. 9C, the voltage Vss of ground reference may be applied to the top electrode 902 of each of the selectors 889 in a first group in the row and the third programming voltage $V_{Pr-3}$ may be applied to the bottom electrode 871 of each of the resistive random access memory (RRAM) cells 870 in the first group in the row such that said each of the selectors 889 in the first group in the row may be turned on to couple said each of the resistive random access memory (RRAM) cells 870 in the first group in the row to one of the bit lines 876 and the resetting step as illustrated in FIG. 8D may be performed to said each of the resistive random access memory (RRAM) cells 870 in the first group in the row to be reset to the high resistance between 1,000 and 100,000,000,000 ohms, greater than the low resistance, in the resetting step, and thus programmed to a logic level of "1"; for the selective resistive random access memory (RRAM) cells in the second group in the row provided with the stacked structure as seen in FIG. 9C, between one third and two thirds of the third programming voltage $V_{Pr-3}$, such as an half of the third programming voltage $V_{Pr-3}$, may be applied to the top electrode 902 of each of the selectors 889 in a second group in the row and the third programming voltage $V_{Pr-3}$ may be applied to the bottom electrode 871 of each of the resistive random access memory (RRAM) cells 870 in the second group in the row such that said each of the selectors 889 in the second group in the row may be turned off to decouple said each of the resistive random access memory (RRAM) cells 870 in the second group in the row from any of the bit lines 876 and the resistive random access memory (RRAM) cells 870 in the second group in the row may be kept in the previous state; the current flowing through said each of the selectors 889 in the first group in the row is greater than that flowing through said each of the selectors 889 in the second group in the row by an order of equal to or greater than 5, 4, 3 or 2. For the selective resistive random access memory (RRAM) cells in the first group in the row provided with the stacked structure as seen in FIG. 9D, the voltage Vss of ground reference may be applied to the top electrode 872 of each of the resistive random access memory (RRAM) cells 870 in the first group in the row and the third programming voltage $V_{Pr-3}$ may be applied to the bottom electrode 903 of each of the selectors 889 in a first group in the row such that said each of the selectors 889 in the first group in the row may be turned on to couple said each of the resistive random access memory (RRAM) cells 870 in the first group in the row to one of the word lines 875 and the resetting step as illustrated in FIG. 8D may be performed to said each of the resistive random access memory (RRAM) cells 870 in the first group in the row to be reset to the high resistance between 1,000 and 100,000,000,000 ohms in the resetting step, and thus programmed to a logic level of "1"; for the selective resistive random access memory (RRAM) cells in the second group in the row provided with the stacked structure as seen in FIG. 9D, between one third and two thirds of the third programming voltage $V_{Pr\text{-}3}$, such as an half of the third programming voltage $V_{Pr\text{-}3}$, may be applied to the top electrode 872 of each of the resistive random access memory (RRAM) cells 870 in the second group in the row and the third programming voltage $V_{Pr\text{-}3}$ may be applied to the bottom electrode 903 of each of the selectors 889 in a second group in the row such that said each of the selectors 889 in the second group in the row may be turned off to decouple said each of the resistive random access memory (RRAM) cells 870 in the second group in the row from any of the word lines 875 and the resistive random access memory (RRAM) cells 870 in the second group in the row may be kept in the previous state; the current flowing through said each of the selectors 889 in the first group in the row is greater than that flowing through said each of the selectors 889 in the second group in the row by an order of equal to or greater than 5, 4, 3 or 2.

Figure 9F:
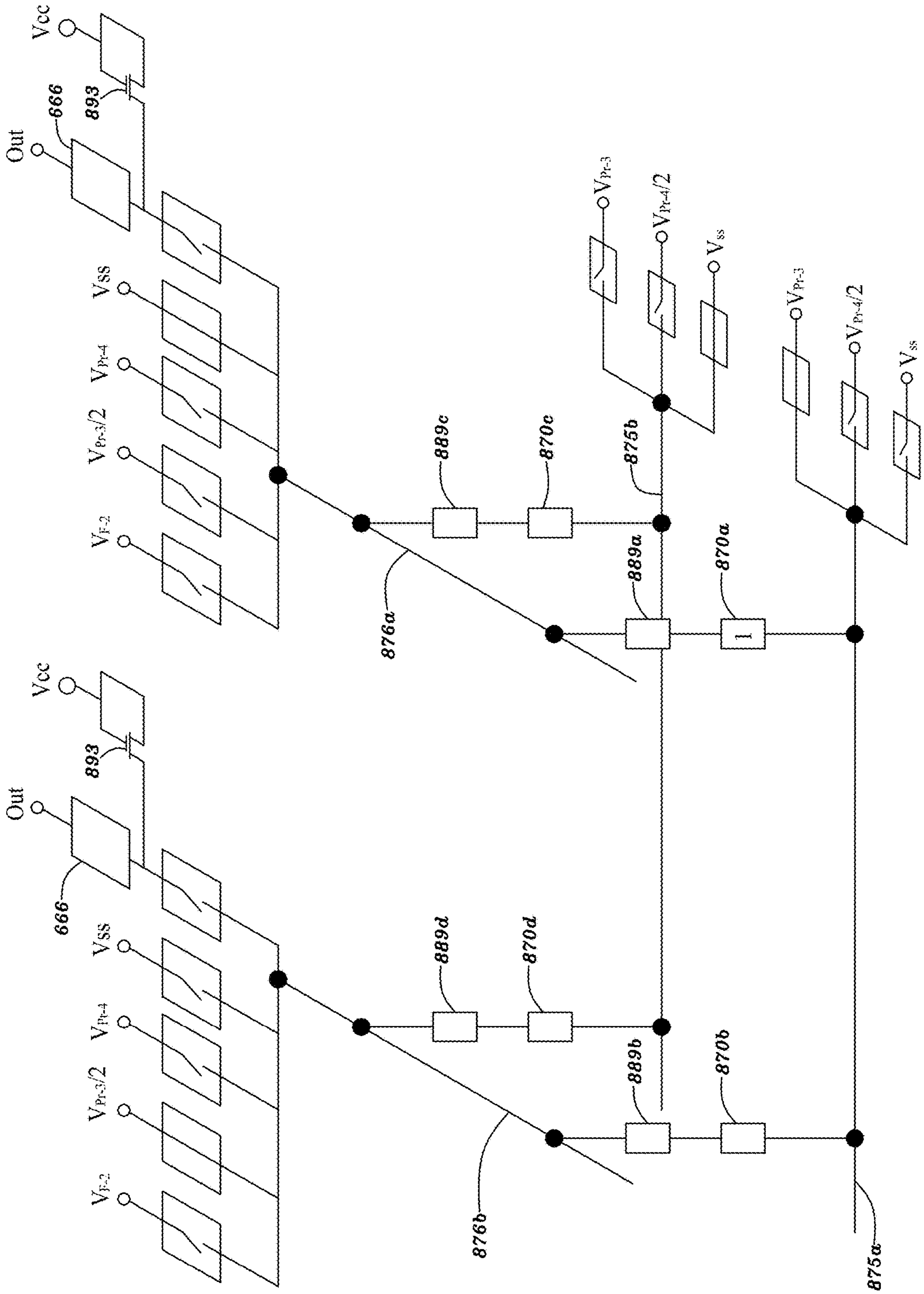
FIG. 9F is a circuit diagram showing selective resistive random access memory (RRAM) cells in a resetting step in accordance with an embodiment of the present application.

For the example, FIG. 9F is a circuit diagram showing selective resistive random access memory (RRAM) cells in a resetting step in accordance with an embodiment of the present application. Referring to FIG. 9F, if the first RRAM 870*a* is being reset, in the above resetting step, to a high-resistance (HR) state, i.e., programmed to a logic level of "1", and the second, third and fourth RRAM cells 870*b*, 870*c* and 870*d* are kept in the previous state, (1) the first word line 875*a* corresponding to the first and second RRAM cells 870*a* and 870*b* is selected and switched to couple to the third programming voltage $V_{Pr\text{-}3}$, (2) the first bit line 876*a* for the first RRAM 870*a* is switched to couple to the voltage Vss of ground reference, (3) the second bit line 876*b* for the second RRAM 870*b* is switched to couple to a voltage between one third and two thirds of the third programming voltage $V_{Pr\text{-}3}$, such as an half of the third programming voltage $V_{Pr\text{-}3}$, and (4) the second word line 875*b* corresponding to the third and fourth RRAM cells 870*c* and 870*d* is unselected and switched to couple to the voltage Vss of ground reference.

Referring to FIGS. 9A-9D, a setting step as illustrated in FIG. 8D may be performed, one row by one row and in turn, to the second group of the resistive random access memory (RRAM) cells 870 but not to the first group of the resistive random access memory (RRAM) cells 870, in which (1) each of the word lines 875 corresponding to the resistive random access memory (RRAM) cells 870 in the row may be selected one by one and in turn to be switched to couple to the voltage Vss of ground reference, wherein the unselected word lines 875 corresponding to the resistive random access memory (RRAM) cells 870 in the other rows may be switched to couple to a voltage between one third and two thirds of a fourth programming voltage $V_{Pr\text{-}4}$, such as an half of the fourth programming voltage $V_{Pr\text{-}4}$, wherein the fourth programming voltage $V_{Pr\text{-}4}$ may be greater than or equal to the setting voltage $V_{SE}$ of the resistive random access memory (RRAM) cells 870 plus the positive threshold-voltage bias of the selectors 889, wherein the fourth programming voltage $V_{Pr\text{-}4}$ may range from 0.25 to 3.3 volts, (2) the bit lines 876 in the first group each for one of the resistive random access memory (RRAM) cells 870 in the first group in the row may be switched to couple to the voltage Vss of ground reference, and (3) the bit lines 876 in the second group each for one of the resistive random access memory (RRAM) cells 870 in the second group in the row may be switched to couple to the fourth programming voltage $V_{Pr\text{-}4}$. Thereby, for the selective resistive random access memory (RRAM) cells in the second group in the row provided with the stacked structure as seen in FIG. 9C, the fourth programming voltage $V_{Pr\text{-}4}$ may be applied to the top electrode 902 of each of the selectors 889 in the second group in the row and the voltage Vss of ground reference may be applied to the bottom electrode 871 of each of the resistive random access memory (RRAM) cells 870 in the second group in the row such that said each of the selectors 889 in the second group in the row may be turned on to couple said each of the resistive random access memory (RRAM) cells 870 in the second group in the row to one of the bit lines 876 and the setting step as illustrated in FIG. 8D may be performed to said each of the resistive random access memory (RRAM) cells 870 in the second group in the row to be set to the low resistance between 100 and 100,000 ohms in the setting step, and thus programmed to a logic level of "0"; for the selective resistive random access memory (RRAM) cells in the first group in the row provided with the stacked structure as seen in FIG. 9C, the voltage Vss of ground reference may be applied to the top electrode 902 of each of the selectors 889 in the first group in the row and the voltage Vss of ground reference may be applied to the bottom electrode 871 of each of the resistive random access memory (RRAM) cells 870 in the first group in the row such that said each of the selectors 889 in the first group in the row may be turned off to decouple said each of the resistive random access memory (RRAM) cells 870 in the first group in the row from any of the bit lines 876 and the resistive random access memory (RRAM) cells 870 in the first group in the row may be kept in the previous state; the current flowing through said each of the selectors 889 in the second group in the row is greater than that flowing through said each of the selectors 889 in the first group in the row by an order of equal to or greater than 5, 4, 3 or 2. For the selective resistive random access memory (RRAM) cells in the second group in the row provided with the stacked structure as seen in FIG. 9D, the fourth programming voltage $V_{Pr\text{-}4}$ may be applied to the top electrode 872 of each of the resistive random access memory (RRAM) cells 870 in the second group in the row and the voltage Vss of ground reference may be applied to the bottom electrode 903 of each of the selectors 889 in the second group in the row such that said each of the selectors 889 in the second group in the row may be turned on to couple said each of the resistive random access memory (RRAM) cells 870 in the second group in the row to one of the word lines 875 and the setting step as illustrated in FIG. 8D may be performed to said each of the resistive random access memory (RRAM) cells 870 in the second group in the row to be set to the low resistance between 100 and 100,000 ohms in the setting step, and thus programmed to a logic level of "0"; for the selective resistive random access memory (RRAM) cells in the first group in the row provided with the stacked structure as seen in FIG. 9D, the voltage Vss of ground reference may be applied to the top electrode 872 of each of the resistive random access memory (RRAM) cells 870 in the first group in the row and the voltage Vss of ground reference may be applied to the bottom electrode 903 of each of the selectors 889 in the first group in the row such that said each of the selectors 889 in the first group in the row may be turned off to decouple said each of the resistive random access memory (RRAM) cells 870 in the first group in the row from any of the word lines 875 and the resistive random access memory (RRAM) cells 870 in the first group in the row may be kept in the previous state; the current flowing through said each of the selectors 889 in the second group in the row is greater than that flowing through said each of the selectors 889 in the first group in the row by an order of equal to or greater than 5, 4, 3 or 2.

Figure 9G:
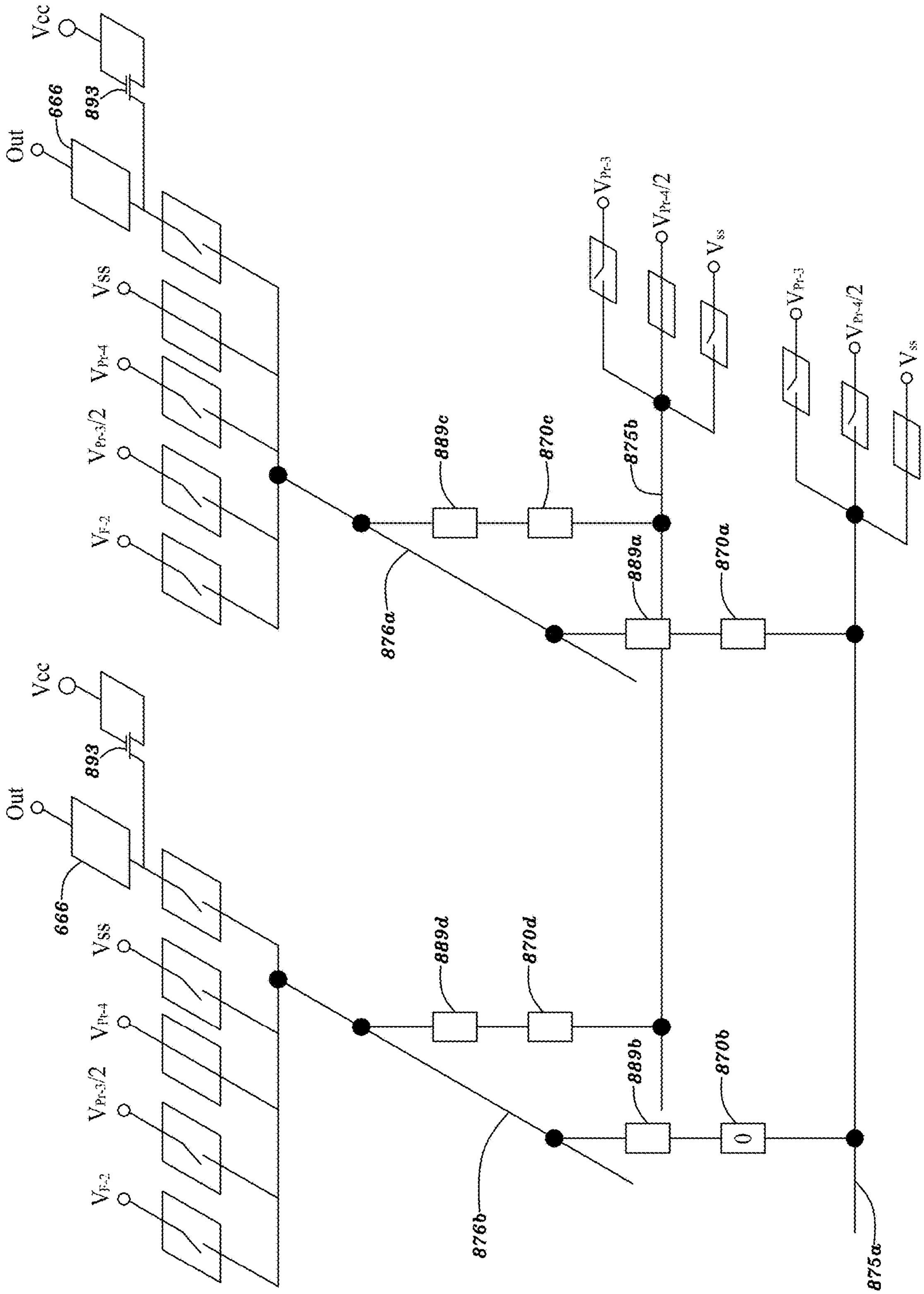
FIG. 9G is a circuit diagram showing selective resistive random access memory (RRAM) cells in a setting step in accordance with an embodiment of the present application.

For the example, FIG. 9G is a circuit diagram showing selective resistive random access memory (RRAM) cells in a setting step in accordance with an embodiment of the present application. Referring to FIG. 9G, if the second RRAM 870*b* is being set, in the above setting step, to a low-resistance (LR) state, i.e., programmed to a logic level of "0", and the first, third and fourth RRAM cells 870*a*, 870*c* and 870*d* are kept in the previous state, (1) the first word line 875*a* corresponding to the first and second RRAM cells 870*a* and 870*b* is selected and switched to couple to the voltage Vss of ground reference, (2) the second bit line 876*b* for the second RRAM 870*b* is switched to couple to the fourth programming voltage $V_{Pr-4}$, (3) the first bit line 876*a* for the first RRAM 870*a* is switched to couple to the voltage Vss of ground reference, and (4) the second word line 875*b* corresponding to the third and fourth RRAM cells 870*c* and 870*d* is unselected and switched to couple to a voltage between one third and two thirds of the fourth programming voltage $V_{Pr-4}$, such as an half of the fourth programming voltage $V_{Pr-4}$.

In operation, referring to FIGS. 9A-9D, (1) each of the bit lines 876 may be switched to couple to the node N31 of one of the sense amplifiers 666 as illustrated in FIG. 8F and to the source terminal of one of the N-type MOS transistors 893, and (2) each of the word lines 875 corresponding to the resistive random access memory (RRAM) cells 870 in a row may be selected one by one and in turn to be switched to couple to the voltage Vss of ground reference to turn on the selectors 889 in a row to couple each of the resistive random access memory (RRAM) cells 870 in the row to one of the bit lines 876 for the structure of the selective resistive random access memory (RRAM) cells as illustrated in FIG. 9C or to couple all of the resistive random access memory (RRAM) cells 870 in the row to a same one of the word lines 875 for the structure of the selective resistive random access memory (RRAM) cells as illustrated in FIG. 9D, wherein the unselected word lines 875 corresponding to the resistive random access memory (RRAM) cells 870 in the other rows may be switched to be floating to turn off the selectors 889 in the other rows to decouple each of the resistive random access memory (RRAM) cells 870 in the other rows from any of the bit lines 876 for the structure of the selective resistive random access memory (RRAM) cells as illustrated in FIG. 9C or to decouple each of the resistive random access memory (RRAM) cells 870 in the other rows from any of the word lines 875 for the structure of the selective resistive random access memory (RRAM) cells as illustrated in FIG. 9D. Thereby, each of the sense amplifiers 666 may compare a voltage at one of the bit lines 876, i.e., at the node N31 as seen in FIG. 8F, with a comparison voltage at a comparison line, i.e., at the node N32 as seen in FIG. 8F, into a compared data and then generate an output "Out" of one of the resistive random access memory (RRAM) cells 870 coupling to said one of the bit lines 876 based on the compared data. For example, when the voltage at the node N31 is compared by said each of the sense amplifiers 666 to be smaller than the comparison voltage at the node N32, said each of the sense amplifiers 666 may generate the output "Out" at a logic level of "1" in the case that one of the resistive random access memory (RRAM) cells 870, which couples to said each of the sense amplifiers 666, has the low resistance. When the voltage at the node N31 is compared by said each of the sense amplifiers 666 to be greater than the comparison voltage at the node N32, said each of the sense amplifiers 666 may generate the output "Out" at a logic level of "0" in the case that one of the resistive random access memory (RRAM) cells 870, which couples to said each of the sense amplifiers 666, has the high resistance.

Figure 9H:
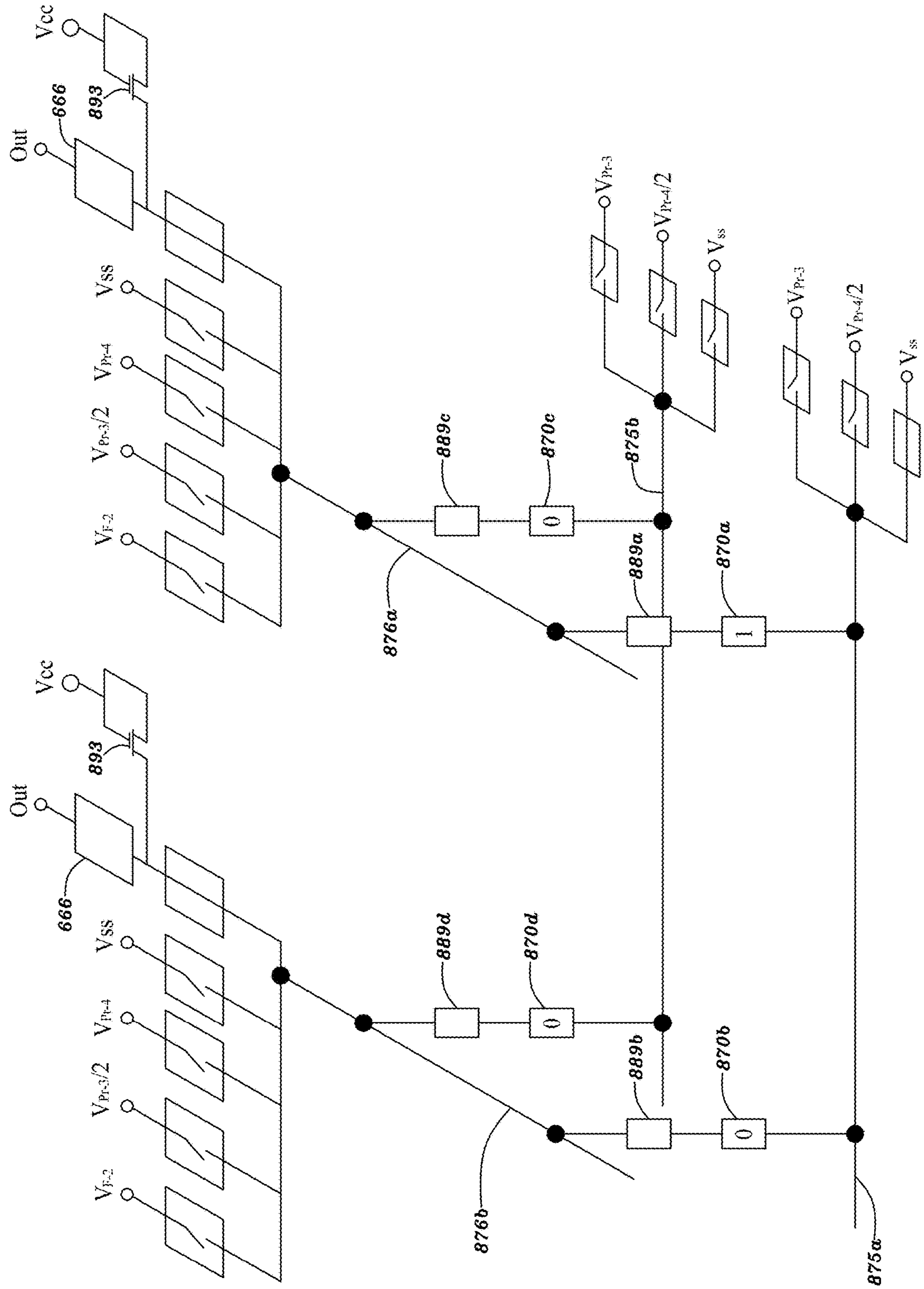
FIG. 9H is a circuit diagram showing selective resistive random access memory (RRAM) cells in operation in accordance with an embodiment of the present application.

For the example, FIG. 9H is a circuit diagram showing selective resistive random access memory (RRAM) cells in operation in accordance with an embodiment of the present application. Referring to FIG. 9H, if the first and second RRAM cells 870*a* and 870*b* are being read in operation and the third and fourth RRAM cells 870*c* and 870*d* are not being read, (1) the first word line 875*a* corresponding to the first and second RRAM cells 870*a* and 870*b* is selected and switched to couple to the voltage Vss of ground reference, (2) the first and second bit lines 876*a* and 876*b* for the first and second RRAM cells 870*a* and 870*b* are switched to couple to the sense amplifiers 666 respectively, and (3) the second word line 875*b* corresponding to the third and fourth RRAM cells 870*c* and 870*d* is unselected and switched to be floating.

Figure 9I:
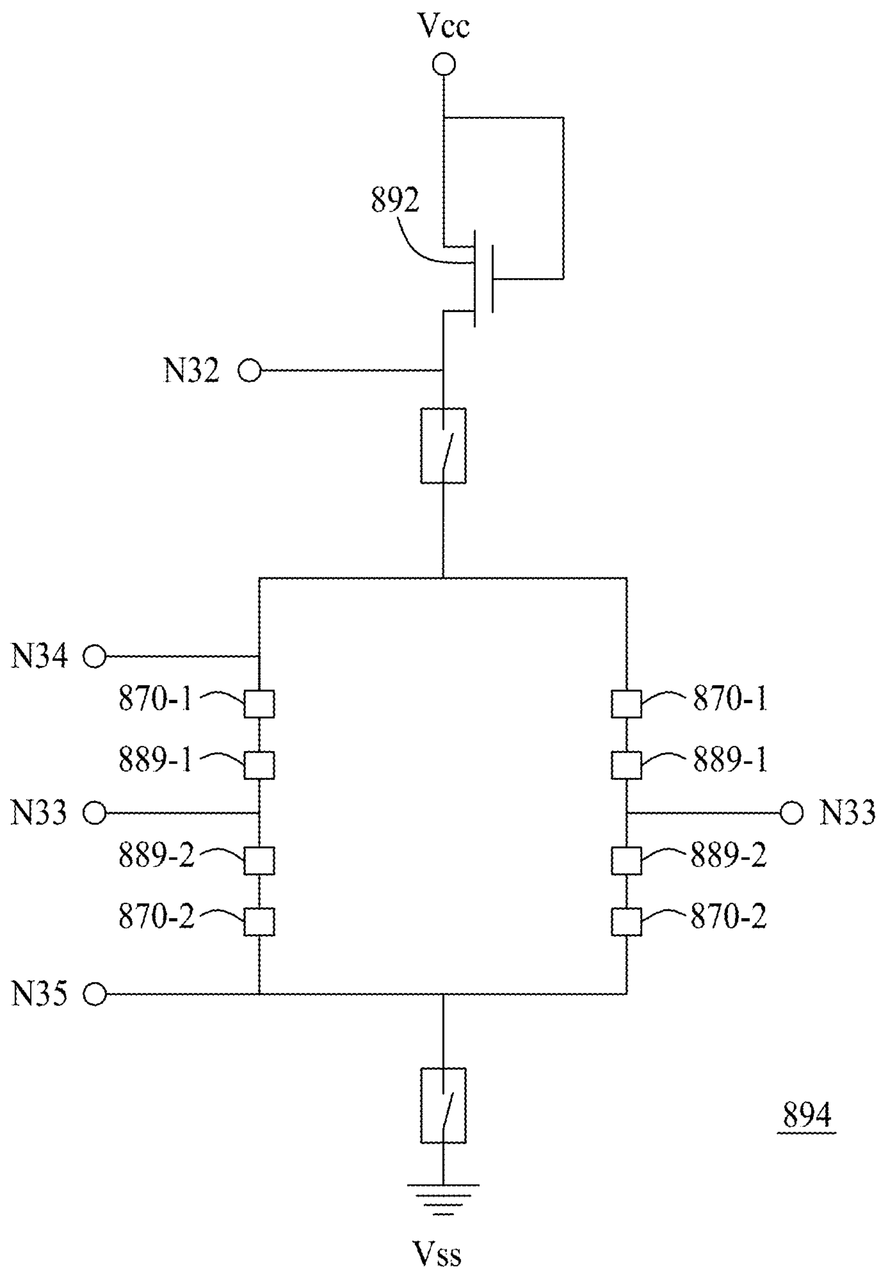
FIG. 9I is a circuit diagram showing a comparison-voltage generating circuit for selective resistive random access memory (RRAM) cells in accordance with an embodiment of the present application.

FIG. 9I is a circuit diagram showing a comparison-voltage generating circuit for selective resistive random access memory (RRAM) cells in accordance with an embodiment of the present application. Referring to FIGS. 9A-9C and 9E-9I, a comparison-voltage generating circuit 894 includes two pairs of a first combination of the resistive random access memory (RRAM) cell 870-1 and the selector 889-1 connected in serial to each other as seen in FIG. 9C and a second combination of the resistive random access memory (RRAM) cell 870-2 and the selector 889-2 connected in serial to each other as seen in FIG. 9C, wherein the pairs of the first and second combinations are connected in parallel to each other. In each of the pairs of the first and second combinations, the selector 889-1 may have its top electrode 902 coupling to the top electrode 902 of the selector 889-1 and to a node N33, and the resistive random access memory (RRAM) cell 870-1 may have its bottom electrode 871 coupling to a node N34. The comparison-voltage generating circuit 894 may include a N-type MOS transistor 892 having a gate terminal coupling to a drain terminal of the N-type MOS transistor 892 and to the voltage Vcc of power supply and a source terminal coupling to the node N32 of the sense amplifier 666 as seen in FIG. 8F via the comparison line. The bottom electrodes 871 of the resistive random access memory (RRAM) cells 870-2 in the pairs may couple to a node N35.

Referring to FIGS. 9A-9C and 9E-9I, when the resistive random access memory (RRAM) cells 870-1 and 870-2 in the pairs are being formed in the forming step as illustrated in FIG. 8D, (1) the node N34 may be switched to couple to the voltage Vss of ground reference, (2) the node N33 may be switched to couple to the second activating voltage $V_{F-2}$, (3) the node N35 may be switched to couple to the voltage Vss of ground reference, and (4) the node N32 may be switched not to couple to the bottom electrodes 871 of the resistive random access memory (RRAM) cells 870-1 in the pairs. Thereby, the resistive random access memory (RRAM) cells 870-1 and 870-2 in the pairs may be formed to the low resistance.

Referring to FIGS. 9A-9C and 9E-9I, after the resistive random access memory (RRAM) cells 870-1 and 870-2 in the pairs are formed in the forming step, the resetting step as illustrated in FIG. 8D may be performed to the resistive random access memory (RRAM) cells 870-1 and 870-2 in the pairs. When the pairs of resistive random access memory (RRAM) cells 870-1 and 870-2 are being reset in the resetting step, (1) the node N34 may be switched to couple to the third programming voltage $V_{Pr-3}$, (2) the node N33 may be switched to couple to the voltage Vss of ground reference, (3) the node N35 may be switched to couple to the third programming voltage $V_{Pr-3}$, and (4) the node N32 may be switched not to couple to the bottom electrodes 871 of the resistive random access memory (RRAM) cells 870-1 in the pairs. Thereby, the resistive random access memory (RRAM) cells 870-1 and 870-2 in the pairs may be reset to the high resistance.

Referring to FIGS. 9A-9C and 9E-9I, after the resistive random access memory (RRAM) cells 870-1 and 870-2 in the pairs are reset in the resetting step, the setting step as illustrated in FIG. 8D may be performed to the resistive random access memory (RRAM) cells 870-2 in the pairs. When the resistive random access memory (RRAM) cells 870-2 are being set in the setting step, (1) the node N34 may be switched to couple to the fourth programming voltage $V_{Pr-4}$, (2) the node N33 may be switched to couple to the fourth programming voltage $V_{Pr-4}$, (3) the node N35 may be switched to couple to the voltage Vss of ground reference, and (4) the node N32 may be switched not to couple to the bottom electrodes 871 of the resistive random access memory (RRAM) cells 870-1 in the pairs. Thereby, the resistive random access memory (RRAM) cells 870-2 in the pairs may be set to the low resistance. Accordingly, the resistive random access memory (RRAM) cells 870-2 in the pairs may be programmed to the low resistance between 100 and 100,000 ohms, and the resistive random access memory (RRAM) cells 870-1 in the pairs may be programmed to the high resistance between 1,000 and 100,000,000,000 ohms, greater than the low resistance, for example.

Referring to FIGS. 9A-9C and 9E-9I, in operation after the resistive random access memory (RRAM) cells 870-2 in the pairs may be programmed to the low resistance, and the resistive random access memory (RRAM) cells 870-1 in the pairs may be programmed to the high resistance, (1) the nodes N33, N34 and N35 may be switched to be floating, (2) the node N32 may be switched to couple to the bottom electrodes 871 of the resistive random access memory (RRAM) cells 870-1 in the pairs, and (3) the bottom electrodes 871 of the resistive random access memory (RRAM) cells 870-2 in the pairs may be switched to couple to the voltage Vss of ground reference. Thereby, the comparison line, i.e., node N32, of the sense amplifier 666 as seen in FIG. 8F may be at the comparison voltage between a voltage of the node N31 coupling to one of the resistive random access memory (RRAM) cells 870 programmed to the low resistance and selected by one of the word lines 875 and a voltage of the node N31 coupling to one of the resistive random access memory (RRAM) cells 870 programmed to the high resistance and selected by one of the word lines 875.

(1.3) First Type of Non-Volatile Memory Cells for the Third Alternative

Figure 10A:
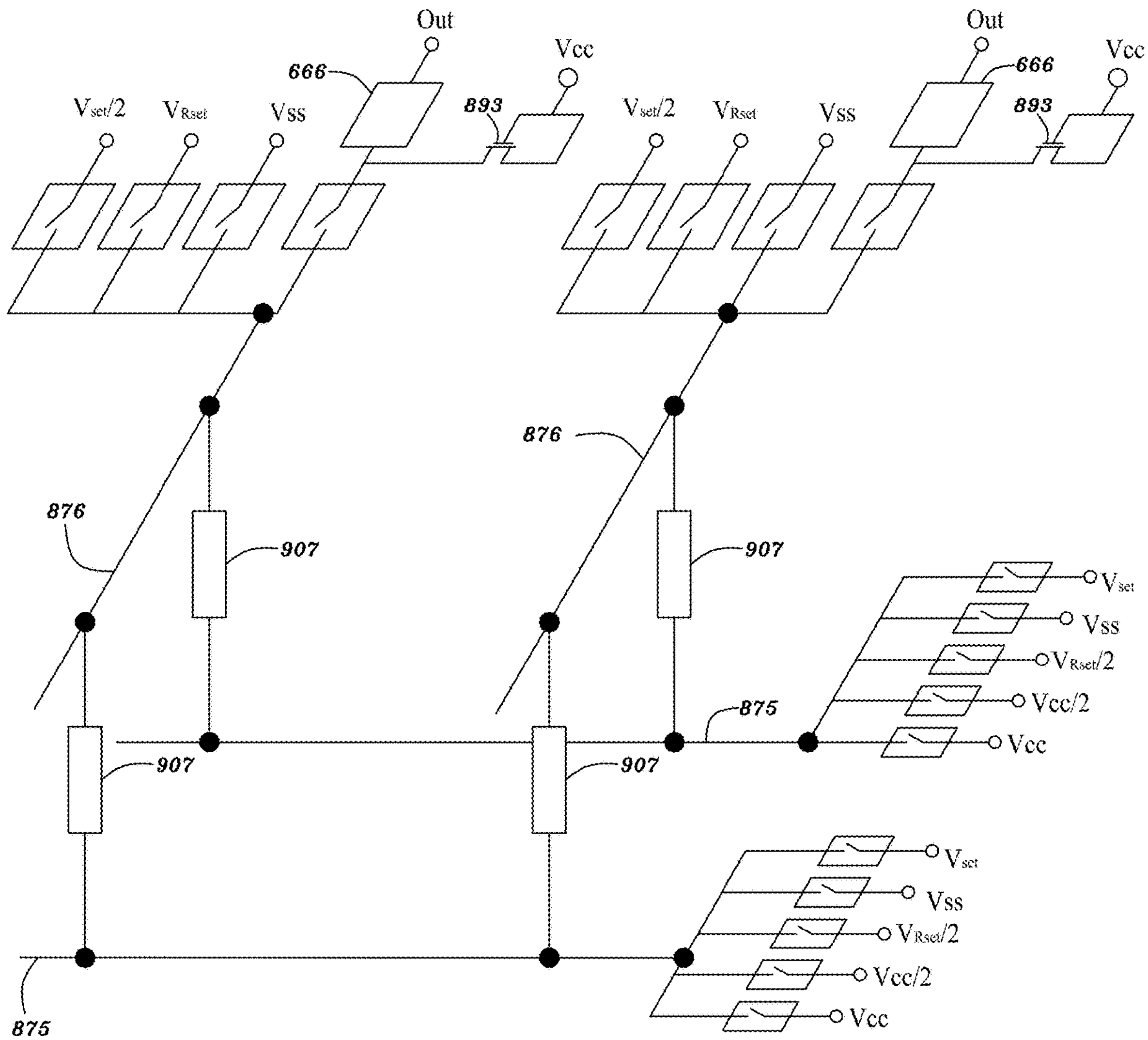
FIG. 10A is a circuit diagram showing an array of non-volatile memory cells for self-select (SS) resistive random access memory (RRAM) cells in accordance with an embodiment of the present application.
Figure 10B:
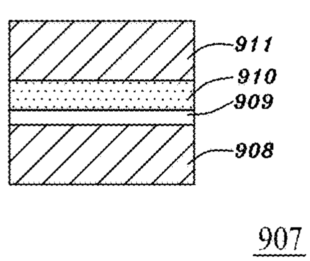
FIG. 10B is a schematically cross-sectional view showing a structure of a self-select (SS) resistive random access memory (RRAM) cell in accordance with the present application.

FIG. 10A is a circuit diagram showing an array of non-volatile memory cells for self-select (SS) resistive random access memory (RRAM) cells in accordance with an embodiment of the present application. The circuits as illustrated in FIG. 10A may be referred to those as illustrated in FIG. 9A, but the difference therebetween is that the selectors 889 and resistive random access memory (RRAM) cells 870 as illustrated in FIG. 9A may be replaced with self-select (SS) resistive random access memory (RRAM) cells 907, i.e., non-volatile memory cells. FIG. 10B is a schematically cross-sectional view showing a structure of a self-select (SS) resistive random access memory (RRAM) cell in accordance with the present application. Referring to FIGS. 10A and 10B, the self-select (SS) resistive random access memory (RRAM) cell 907 may include (1) a bottom electrode 908, such as a layer of nickel having a thickness between 20 nm and 200 nm, 50 nm and 150 nm, or 80 nm and 120 nm, wherein the layer of nickel may be formed by a sputtering process, (2) an oxide layer 909, such as a layer of hafnium oxide ($HfO_2$) having a thickness greater than 5 nm, 10 nm, or 15 nm or between 1 nm and 30 nm, 3 nm and 20 nm, or 5 nm and 15 nm, on the bottom electrode 908, wherein the layer of hafnium oxide may be formed by an atomic layer deposition (ALD) process or by a reactive magnetron direct-current (DC) sputtering process using hafnium as a target and using oxygen and/or argon as gas flow, (3) an insulting layer 910, such a layer of titanium dioxide having a thickness greater than 40 nm, 60 nm or 80 nm, or between 20 nm and 100 nm, 40 nm and 80 nm, or 50 nm and 70 nm, on the oxide layer 909, wherein the layer of titanium dioxide may be formed by an atomic layer deposition (ALD) process or by a reactive magnetron direct-current (DC) sputtering process using titamium as a target and using oxygen and/or argon as gas flow, and (4) a top electrode 911, such a layer of nickel having a thickness between 20 nm and 200 nm, 50 nm and 150 nm, or 80 nm and 120 nm, wherein the layer of nickel may be formed by a sputtering process. Oxygen vacancies or oxygen vacancy conductive filaments or paths may be formed in the oxide layer 909. The insulating layer 910 may have a conduction energy band energy lower (more positive) than that of the oxide layer 909 such that an energy barrier may be formed at an interface between the insulating layer 910 and oxide layer 909. Each of the self-select (SS) resistive random access memory (RRAM) cells 907 may couple to one of the bit lines 876 via the top electrode 911 thereof and couple to one of the word lines 875 via the bottom electrode 908 thereof.

Figure 10C:
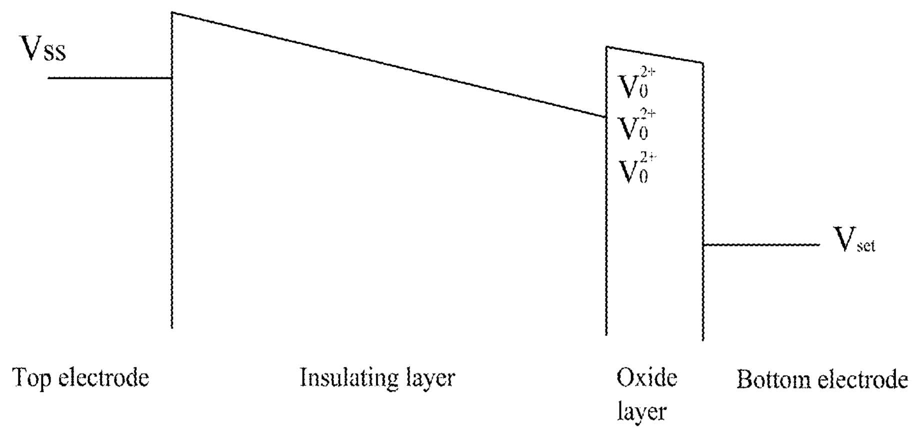
FIG. 10C is a band diagram of a self-select (SS) resistive random access memory (RRAM) cell in a setting step for setting a SS RRAM cell at a low-resistance (LR) state, i.e., at a logic level of "0", in accordance with an embodiment of the present application.

FIG. 10C is a band diagram of a self-select (SS) resistive random access memory (RRAM) cell in a setting step for setting the SS RRAM cell at a low-resistance (LR) state, i.e., at a logic level of "0", in accordance with an embodiment of the present application. Referring to FIGS. 10B and 10C, in the setting step, the top electrode 911 is biased at a voltage Vss of ground reference, and the bottom electrode is biased at a setting voltage $V_{set}$. Thereby, oxygen vacancies in the oxide layer 909 may move to and accumulate at the interface between the insulating layer 910 and the oxide layer 909.

Figure 10D:
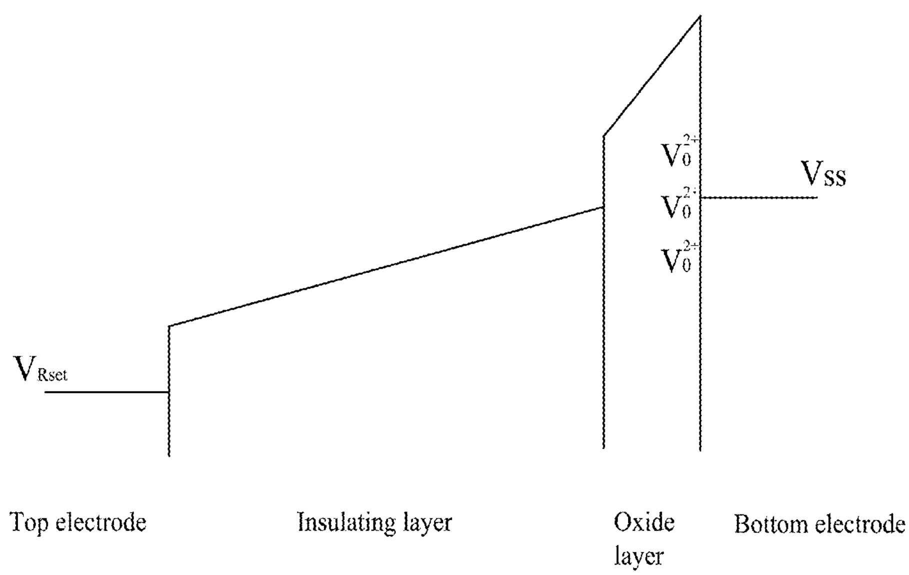
FIG. 10D is a band diagram of a SS RRAM cell in a resetting step for resetting a SS RRAM cell at a high-resistance (HR) state, i.e., at a logic level of "1", in accordance with an embodiment of the present application.

FIG. 10D is a band diagram of a SS RRAM cell in a resetting step for resetting the SS RRAM cell at a high-resistance (HR) state, i.e., at a logic level of "1", in accordance with an embodiment of the present application. Referring to FIGS. 10B and 10D, in the resetting step, the top electrode 911 is biased at a resetting voltage $V_{Rset}$, and the bottom electrode 908 is biased at the voltage Vss of ground reference. Oxygen vacancies in the oxide layer 909 may move to and accumulate at the interface between the oxide layer 909 and the bottom electrode 908.

Figure 10E:
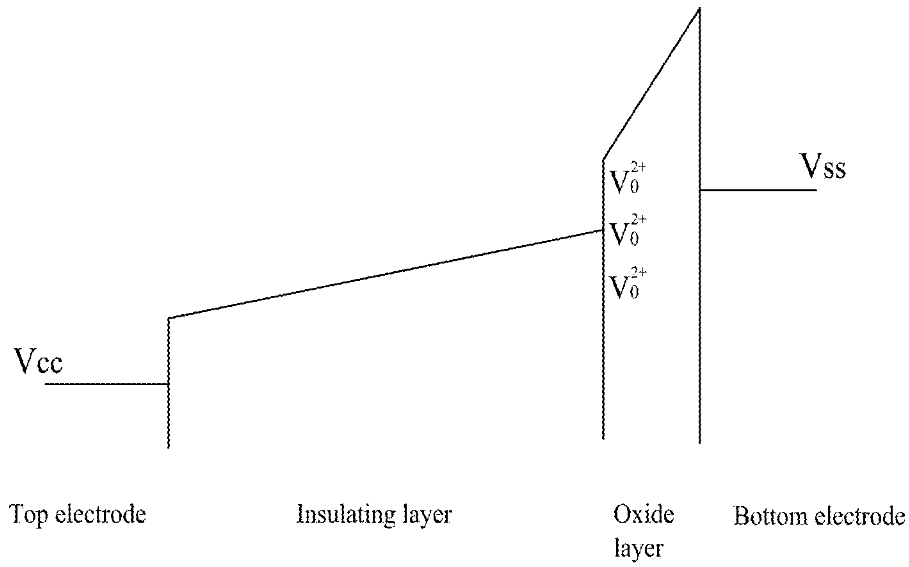
FIGS. 10E and 10F are band diagrams of a SS RRAM cell having low and high resistances respectively, when being selected for read in operation, in accordance with an embodiment of the present application.
Figure 10F:
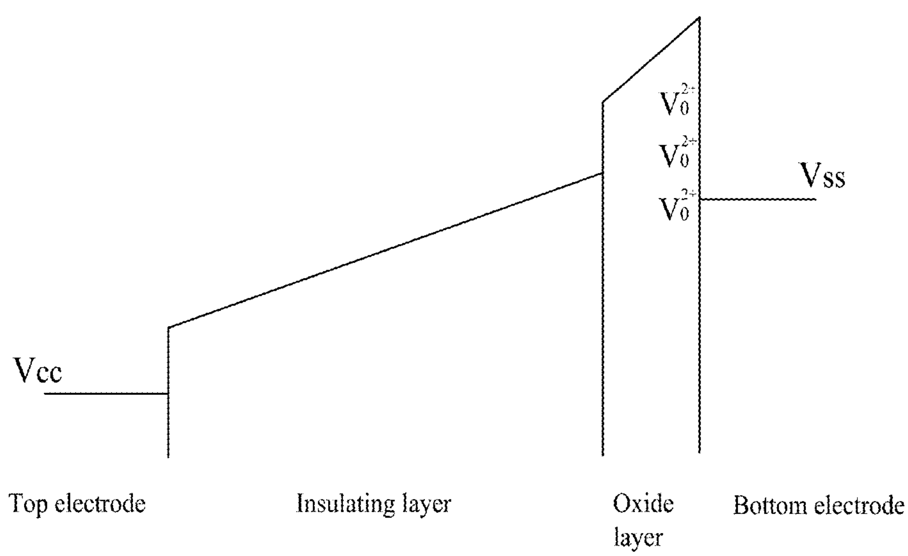

FIGS. 10E and 10F are band diagrams of a SS RRAM cell having low and high resistances respectively, when being selected for read in operation, in accordance with an embodiment of the present application. In the operation step, the top electrode 911 is biased at a voltage Vcc of power supply, and the bottom electrode is biased at the voltage Vss of ground reference. Based on the band diagram in FIG. 10E, the electrons may flow from the bottom electrode 908 to the top electrode 911 by (i) tunneling through the oxide layer 909 due to relatively large band bending, resulting in a relatively strong electric field, in the oxide layer 909, and then (ii) flowing through the insulating layer 910. Therefore, the SS RRAM cell 909 is operated at the LR state, i.e., at a logic level of “0”.

Based on the band diagram in FIG. 10F, the electrons may not be able to tunnel through the oxide layer 909 due to relatively small band bending, causing a relatively weak electric field, in the oxide layer 909. Therefore, the SS RRAM cells 907 is operated at the HR state, i.e., at a logic level of “1”.

For more elaboration, referring to FIG. 10A, a setting step may be performed, one row by one row and in turn, to a first group of the self-select resistive random access memory (RRAM) cells 907 but not to a second group of the self-select resistive random access memory (RRAM) cells 907. In the setting step for the self-select resistive random access memory (RRAM) cells 907, (1) each of the word lines 875 corresponding to the self-select resistive random access memory (RRAM) cells 907 in a row may be selected one by one and in turn to be switched to couple to a setting voltage $V_{set}$ between 2 volts and 10 volts, 4 volts and 8 volts, or 6 volts and 8 volts or equal to 8 volts, 7 volts or 6 volts, wherein the unselected word lines 875 may be switched to couple the self-select resistive random access memory (RRAM) cells 907 in the other rows to a voltage Vss of ground reference, (2) the bit lines 876 in a first group each for one of the self-select resistive random access memory (RRAM) cells 907 in the first group in the row may be switched to couple to the voltage Vss of ground reference, and (3) the bit lines 876 in a second group each for one of the self-select resistive random access memory (RRAM) cells 907 in the second group in the row may be switched to couple to a voltage between one third and two thirds of the setting voltage $V_{set}$, such as an half of the setting voltage $V_{set}$. Thereby, as seen in FIGS. 10A-10C, for one of the self-select resistive random access memory (RRAM) cells 907 in the first group in the row, multiple oxygen vacancies in its oxide layer 909 may move to and accumulate at an interface between its oxide layer 909 and its insulating layer 910. Thus, each of the self-select resistive random access memory (RRAM) cells 907 in the first group in the row may be set to a low resistance between 100 and 100,000 ohms in the setting step, and programmed to a logic level of “0”. Each of the self-select resistive random access memory (RRAM) cells 907 in the second group may be kept in the previous state.

Figure 10G:
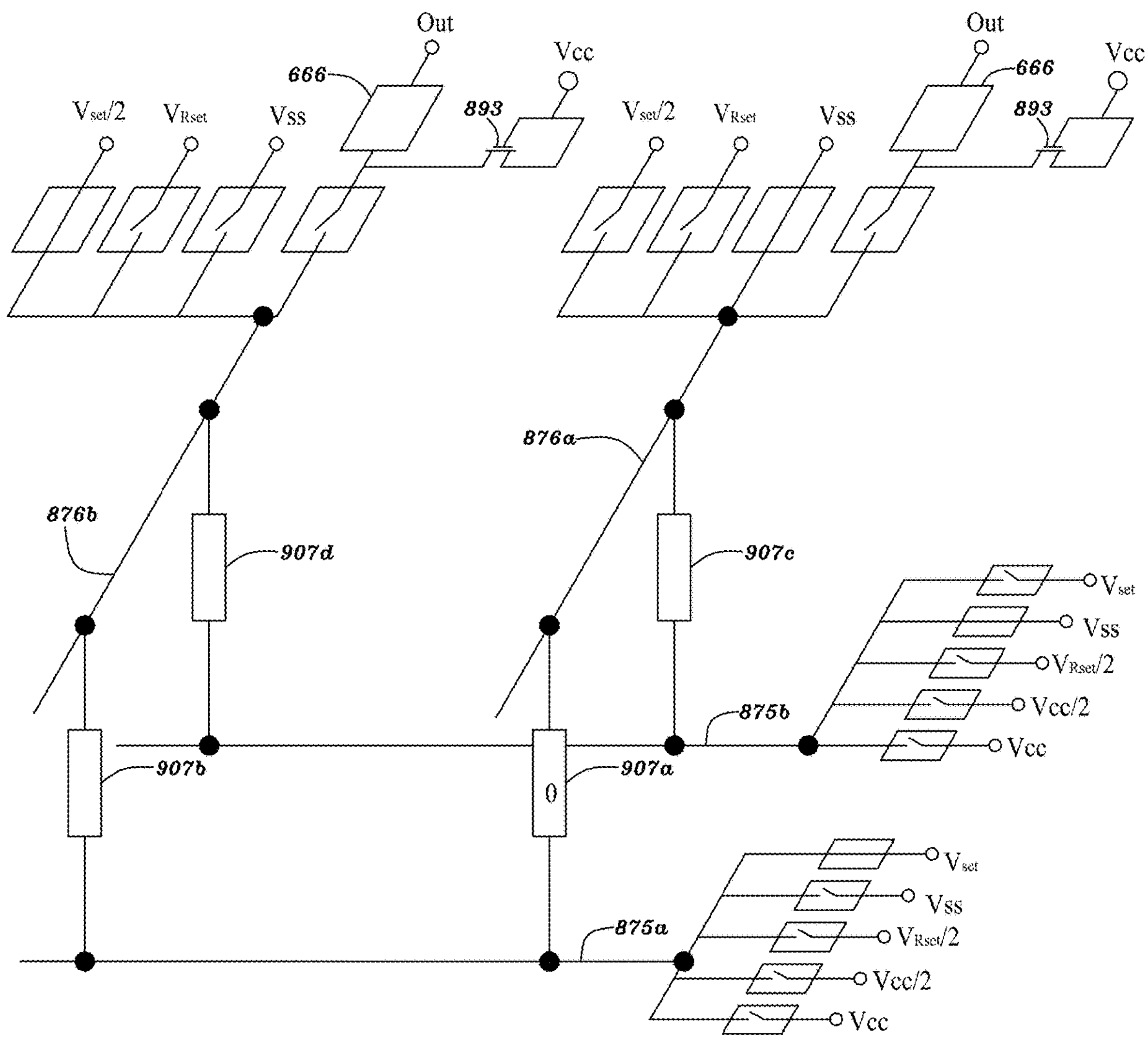
FIG. 10G is a circuit diagram showing SS RRAM cells in a setting step in accordance with an embodiment of the present application.

For an example, FIG. 10G is a circuit diagram showing SS RRAM cells in a setting step in accordance with an embodiment of the present application. Referring to FIG. 10G, the self-select resistive random access memory (RRAM) cells 907 may include a first one 907*a* and second one 907*b* arranged in a first row (y=y1) and a third one 907*c* and fourth one 907*d* arranged in a second row (y=y2). For correspondence, the first self-select resistive random access memory (RRAM) cell 907*a* is at a correspondence (x1, y1), the second self-select resistive random access memory (RRAM) cell 907*b* is at a correspondence (x2, y1), the third self-select resistive random access memory (RRAM) cell 907*c* is at a correspondence (x1, y2), and the fourth self-select resistive random access memory (RRAM) cell 907*d* is at a correspondence (x2, y2).

Referring to FIG. 10G, if the first SS RRAM cell 907*a* is being set, in the above setting step, to the low-resistance (LR) state, i.e., programmed to a logic level of “0”, and the second, third and fourth SS RRAM cells 907*b*, 907*c* and 907*d* are kept in the previous state, (1) a first word line 875*a* corresponding to the first and second SS RRAM cells 907*a* and 907*b* is selected and switched to couple to the setting voltage $V_{set}$, for example, between 2 volts and 10 volts, 4 volts and 8 volts, or 6 volts and 8 volts, or equal to 8 volts, 7 volts or 6 volts, (2) a first bit line 876*a* for the first SS RRAM cell 907*a* is switched to couple to the voltage Vss of ground reference, (3) a second bit line 876*b* for the second SS RRAM cell 907*b* is switched to couple to a voltage between one third and two thirds of $V_{set}$, such as at an half of $V_{set}$, and (4) a second word line 875*b* corresponding to the third and fourth SS RRAM cells 907*c* and 907*d* is unselected and switched to couple to the voltage Vss of ground reference.

Referring to FIG. 10A, a resetting step may be performed, one row by one row and in turn, to the second group of the self-select resistive random access memory (RRAM) cells 907 but not to the first group of the self-select resistive random access memory (RRAM) cells 907. In the resetting step for the self-select resistive random access memory (RRAM) cells 907, (1) each of the word lines 875 corresponding to the self-select resistive random access memory (RRAM) cells 907 in the row may be selected one by one and in turn to be switched to couple the self-select resistive random access memory (RRAM) cells 907 in a row to the voltage Vss of ground reference, wherein the unselected word lines 875 may be switched to couple the self-select resistive random access memory (RRAM) cells 907 in the other rows to a voltage between one third and two thirds of a resetting voltage $V_{Rset}$, such as an half of the resetting voltage $V_{Rset}$, wherein the resetting voltage $V_{Rset}$ may be between 2 volts and 8 volts, 4 volts and 8 volts, or 4 volts and 6 volts or equal to 6 volts, 5 volts or 4 volts, (2) the bit lines 876 in the second group each for one of the self-select resistive random access memory (RRAM) cells 907 in the second group in the row may be switched to couple to the resetting voltage $V_{Rset}$, and (3) the bit lines 876 in the first group each for one of the self-select resistive random access memory (RRAM) cells 907 in the first group in the row may be switched to couple to the voltage Vss of ground reference. Thereby, as seen in FIGS. 10A, 10B and 10D, for one of the self-select resistive random access memory (RRAM) cells 907 in the second group in the row, multiple oxygen vacancies in its oxide layer 909 may move to and accumulate at an interface between its oxide layer 909 and its bottom electrode 908. Thus, each of the self-select resistive random access memory (RRAM) cells 907 in the second group in the row may be reset to a high resistance between 1,000 and 100,000,000,000 ohms, greater than the low resistance, in the resetting step, and programmed to a logic level of “1”.

Figure 10H:
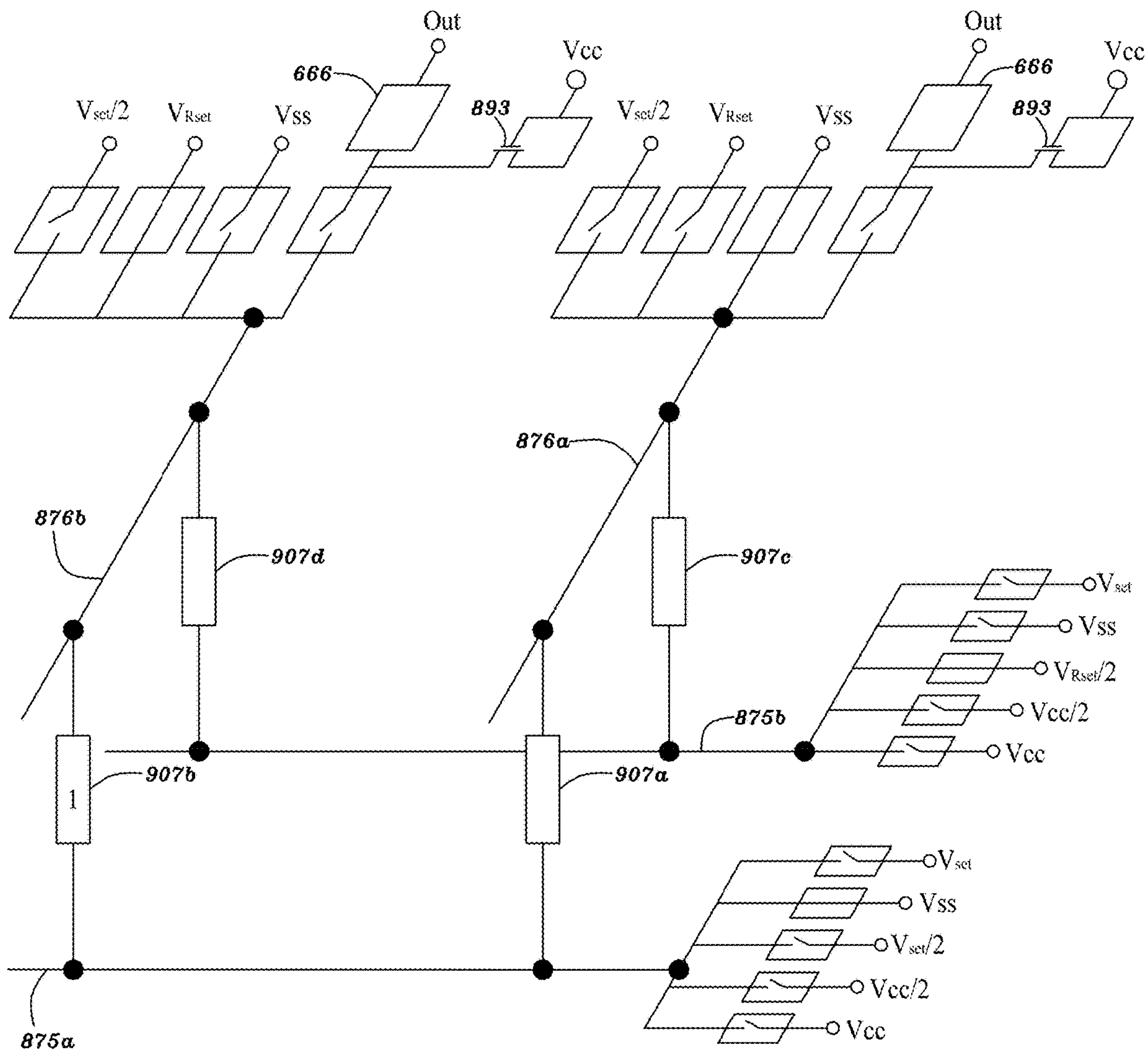
FIG. 10H is a circuit diagram showing SS RRAM cells in a resetting step in accordance with an embodiment of the present application.

For the example, FIG. 10H is a circuit diagram showing SS RRAM cells in a resetting step in accordance with an embodiment of the present application. Referring to FIG. 10H, if the second SS RRAM cell 907*b* is being reset, in the above resetting step, to the high-resistance (HR) state, i.e., programmed to a logic level of “1”, and the first, third and fourth SS RRAM cells 907*a*, 907*c* and 907*d* are kept in the previous state, (1) the first word line 875*a* corresponding to the first and second SS RRAM cells 907*a* and 907*b* is selected and switched to couple to the voltage Vss of ground reference, (2) the second bit line 876*b* for the second SS RRAM cell 907*b* is switched to couple to the resetting voltage $V_{Rset}$ between 2 volts and 8 volts, 4 volts and 8 volts, or 4 volts and 6 volts or equal to 6 volts, 5 volts or 4 volts, (3) the first bit line 876*a* for the first SS RRAM cell 907*a* is switched to couple to the voltage Vss of ground reference, and (4) the second word line 875*b* corresponding to the third and fourth SS RRAM cells 907*c* and 907*d* is unselected and switched to couple to a voltage between one third and two thirds of the resetting voltage $V_{Rset}$, such as an half of the resetting voltage $V_{Rset}$. In operation, referring to FIGS. 10A, 10B, 10E and 10F, (1) each of the bit lines 876 may be switched to couple to the node N31 of one of the sense amplifiers 666 as illustrated in FIG. 8F and to the source terminal of one of the N-type MOS transistors 893, and (2) each of the word lines 875 corresponding to the self-select resistive random access memory (RRAM) cells 907 in a row may be selected one by one and in turn to be switched to couple to the voltage Vss of ground reference to allow a tunneling current to pass through the self-select resistive random access memory (RRAM) cells 907 in the row, wherein the unselected word lines 875 corresponding to the self-select resistive random access memory (RRAM) cells 907 in the other rows may be switched to be floating to prevent a tunneling current from passing through the self-select resistive random access memory (RRAM) cells 907 in the other rows. Thereby, each of the sense amplifiers 666 may compare a voltage at one of the bit lines 876, i.e., at the node N31 as seen in FIG. 8F, with a comparison voltage at a comparison line, i.e., at the node N32 as seen in FIG. 8F, into a compared data and then generate an output "Out" of one of the self-select resistive random access memory (RRAM) cells 907 coupling to said one of the bit lines 876 based on the compared data. For example, when the voltage at the node N31 is compared by said each of the sense amplifiers 666 to be smaller than the comparison voltage at the node N32, said each of the sense amplifiers 666 may generate the output "Out" at a logic level of "1" in the case that one of the self-select resistive random access memory (RRAM) cells 907, which couples to said each of the sense amplifiers 666, has the low resistance. When the voltage at the node N31 is compared by said each of the sense amplifiers 666 to be greater than the comparison voltage at the node N32, said each of the sense amplifiers 666 may generate the output "Out" at a logic level of "0" in the case that one of the self-select resistive random access memory (RRAM) cells 907, which couples to said each of the sense amplifiers 666, has the high resistance.

Figure 10I:
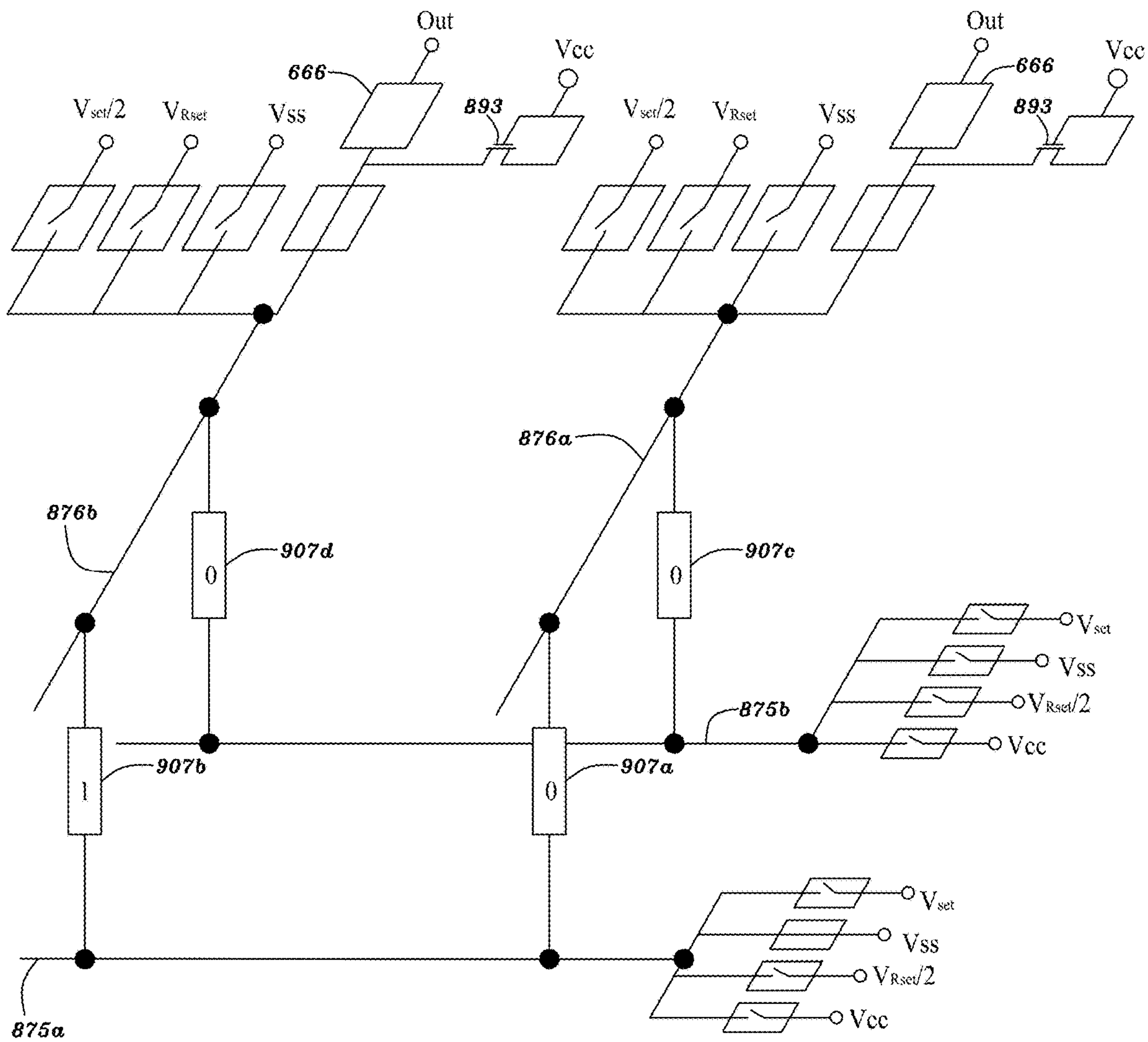
FIG. 10I is a circuit diagram showing SS RRAM cells in operation in accordance with an embodiment of the present application.

For the example, FIG. 10I is a circuit diagram showing SS RRAM cells in operation in accordance with an embodiment of the present application. Referring to FIG. 10I, if the first and second SS RRAM cells 907*a* and 907*b* are being read in operation and the third and fourth SS RRAM cells 907*c* and 907*d* are not being read, (1) the first word line 875*a* corresponding to the first and second SS RRAM cells 907*a* and 907*b* is selected and switched to couple to the voltage Vss of ground reference, (2) the first and second bit lines 876*a* and 876*b* for the first and second SS RRAM cells 907*a* and 907*b* are switched to couple to the sense amplifiers 666 respectively, and (3) the second word line 875*b* corresponding to the third and fourth SS RRAM cells 907*c* and 907*d* is unselected and switched to be floating.

Figure 10J:
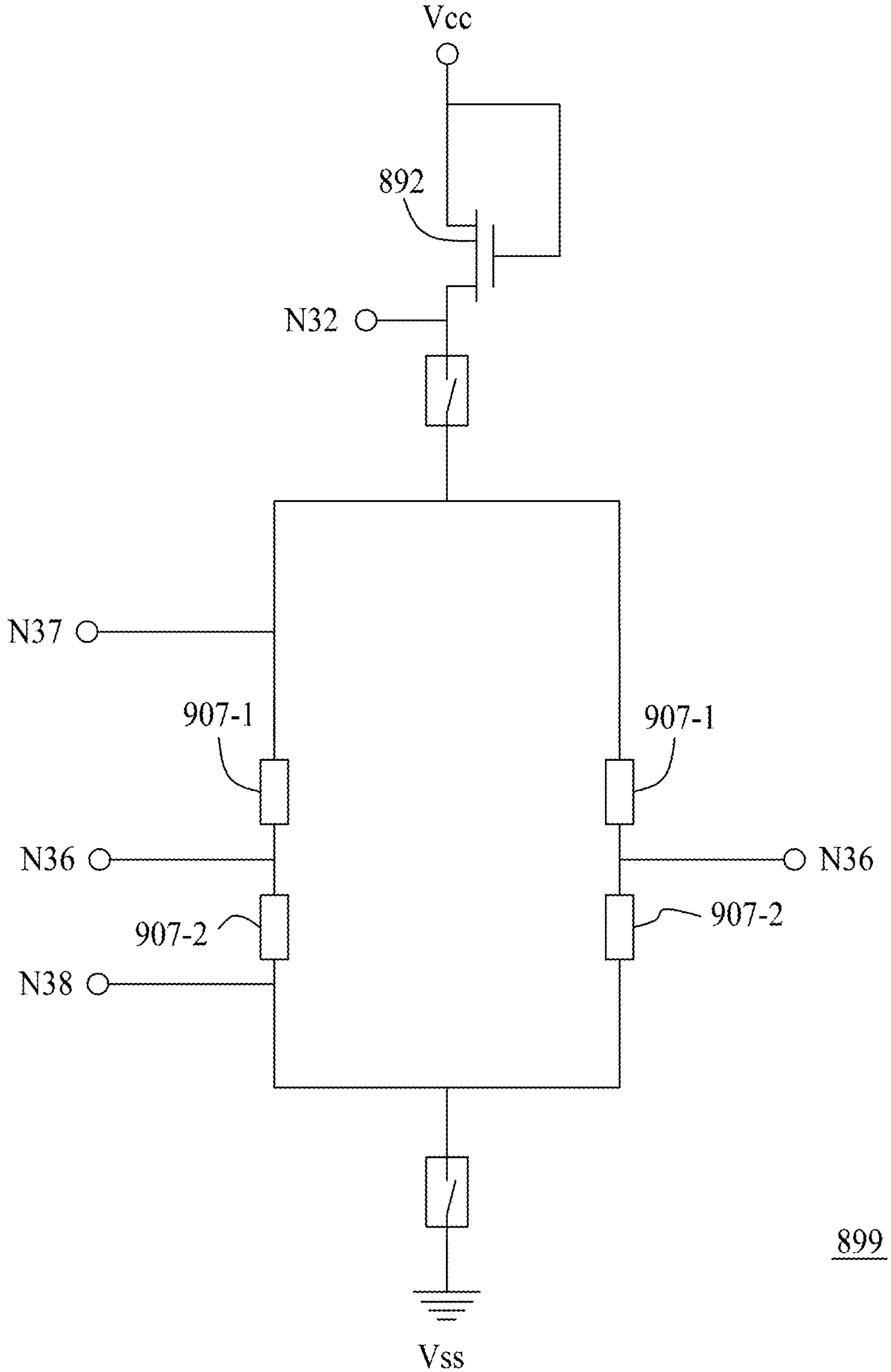
FIG. 10J is a circuit diagram showing a comparison-voltage generating circuit for self-select (SS) resistive random access memory (RRAM) cells in accordance with an embodiment of the present application.

FIG. 10J is a circuit diagram showing a comparison-voltage generating circuit for self-select (SS) resistive random access memory (RRAM) cells in accordance with an embodiment of the present application. Referring to FIGS. 10A-10J, a comparison-voltage generating circuit 899 includes two pairs of SS RRAM cells 907-1 and 907-2 connected in serial to each other. In each of the pairs of the SS RRAM cells 907-1 and 907-2, the SS RRAM cell 907-1 may have its top electrode 911 coupling to the top electrode 911 of the SS RRAM cell 907-2 and to a node N36, and the resistive random access memory (RRAM) cell 870-1 may have its bottom electrode 908 coupling to a node N37. The comparison-voltage generating circuit 899 may include a N-type MOS transistor 892 having a gate terminal coupling to a drain terminal of the N-type MOS transistor 892 and to the voltage Vcc of power supply and a source terminal coupling to the node N32 of the sense amplifier 666 as seen in FIG. 8F via the comparison line. The bottom electrodes 908 of the SS RRAM cells 907-2 in the pairs may couple to a node N38.

Referring to FIGS. 10A-10J, the resetting step may be performed to the SS RRAM cells 907-1 in the pairs. When the SS RRAM cells 907-1 in the pairs are being reset in the resetting step, (1) the node N37 may be switched to couple to the voltage Vss of ground reference, (2) the node N36 may be switched to couple to the resetting voltage $V_{Rset}$, (3) the node N38 may be switched to couple to the resetting voltage $V_{Rset}$, and (4) the node N32 may be switched not to couple to the bottom electrodes 908 of the SS RRAM cells 907-1 in the pairs. Thereby, the SS RRAM cells 907-1 in the pairs may be reset to the high resistance.

Referring to FIGS. 10A-10J, after the SS RRAM cells 907-1 in the pairs are reset in the resetting step, the setting step may be performed to the SS RRAM cells 907-2 in the pairs. When the SS RRAM cells 907-2 are being set in the setting step, (1) the node N37 may be switched to couple to the voltage Vss of ground reference, (2) the node N36 may be switched to couple to the voltage Vss of ground reference, (3) the node N38 may be switched to couple to the setting voltage $V_{set}$, and (4) the node N32 may be switched not to couple to the bottom electrodes 908 of the SS RRAM cells 907-1 in the pairs. Thereby, the SS RRAM cells 907-2 in the pairs may be set to the low resistance. Accordingly, the SS RRAM cells 907-2 in the pairs may be programmed to the low resistance between 100 and 100,000 ohms, and the SS RRAM cells 907-1 in the pairs may be programmed to the high resistance between 1,000 and 100,000,000,000 ohms, greater than the low resistance, for example.

Referring to FIGS. 10A-10J, in operation after the SS RRAM cells 907-2 in the pairs may be programmed to the low resistance, and the SS RRAM cells 907-1 in the pairs may be programmed to the high resistance, (1) the nodes N36, N37 and N38 may be switched to be floating, (2) the node N32 may be switched to couple to the bottom electrodes 908 of the SS RRAM cells 907-1 in the pairs, and (3) the bottom electrodes 908 of the SS RRAM cells 907-2 in the pairs may be switched to couple to the voltage Vss of ground reference. Thereby, the comparison line, i.e., node N32, of the sense amplifier 666 as seen in FIG. 8F may be at the comparison voltage between a voltage of the node N31 coupling to one of the SS RRAM cells 907 programmed to the low resistance and selected by one of the word lines 875 and a voltage of the node N31 coupling to one of the SS RRAM cells 907 programmed to the high resistance and selected by one of the word lines 875.

Figure 11A:
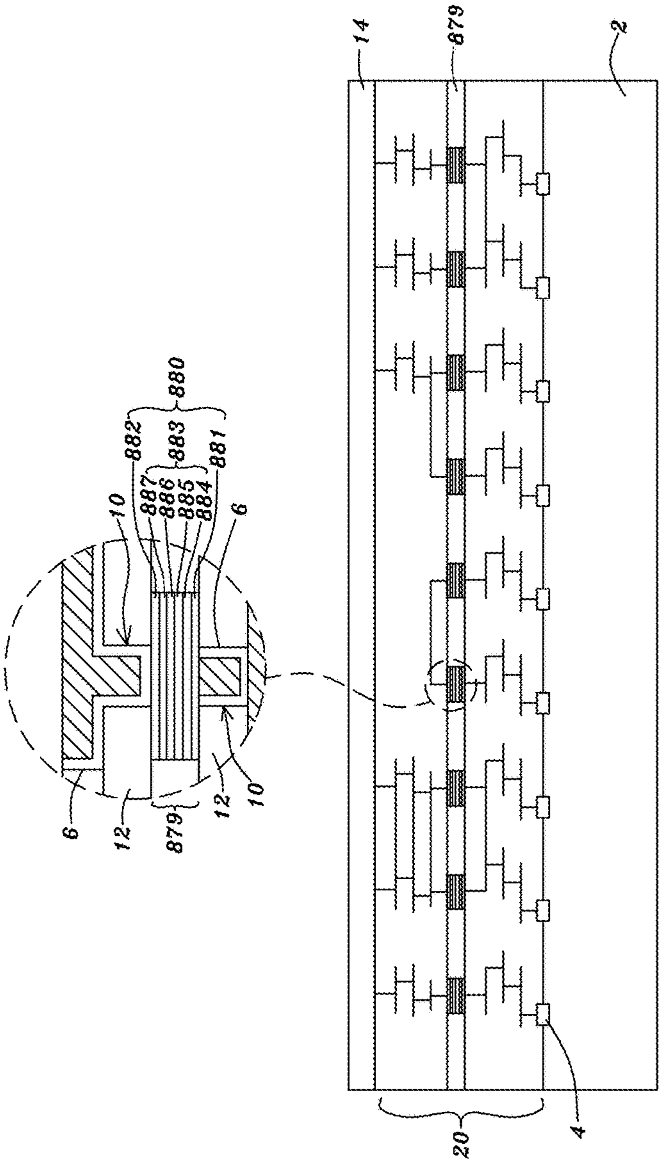
FIGS. 11A-11C are schematically cross-sectional views showing various structures of a second type of non-volatile memory cells for a first alternative for a semiconductor chip in accordance with an embodiment of the present application.
Figure 11C:
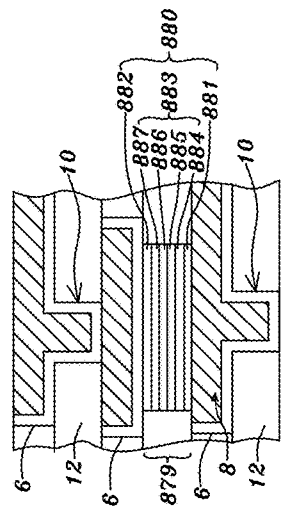
Figure 11B:
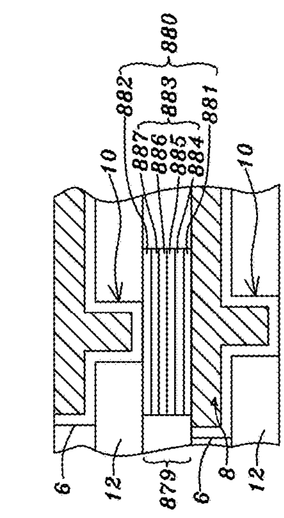

(2) Second Type of Non-Volatile Memory Cells (2.1) Second Type of Non-Volatile Memory Cell for the First Alternative FIGS. 11A-11C are schematically cross-sectional views showing various structures of a second type of non-volatile memory cells for a first alternative for a semiconductor chip in accordance with an embodiment of the present application. The second type of non-volatile memory cells may be magnetoresistive random access memory (MRAM) cells (MRAM), i.e., programmable resistors. Referring to FIG. 11A, a semiconductor integrated-circuit (IC) chip 100, used for the FPGA IC chip 200 for example, may include multiple magnetoresistive random access memory (MRAM) cells 880 for the first alternative formed in an MRAM layer 879 thereof over a semiconductor substrate 2 thereof, in a first interconnection scheme 20 for the semiconductor integrated-circuit (IC) chip 100 (FISC) and under a passivation layer 14 thereof. Multiple interconnection metal layers 6 in the FISC 20 and between the MRAM layer 879 and semiconductor substrate 2 may couple the magnetoresistive random access memory (MRAM) cells 880 for the first alternative to multiple semiconductor devices 4 on the semiconductor substrate 2. Multiple interconnection metal layers 6 in the FISC 20 and between the MRAM layer 879 and passivation layer 14 may couple the magnetoresistive random access memory (MRAM) cells 880 for the first alternative to external circuits outside the semiconductor integrated-circuit (IC) chip 100 and may have a line pitch less than 0.5 micrometers. Each of the interconnection metal layers 6 in the FISC 20 and over the MRAM layer 879 may have a thickness greater than each of the interconnection metal layers 6 in the FISC 20 and under the MRAM layer 879. The details for the semiconductor substrate 2, semiconductor devices, interconnection metal layers 6, FISC 20 and passivation layer 14 may be referred to the illustration in FIG. 17.

Referring to FIG. 11A, each of the magnetoresistive random access memory (MRAM) cells 880 for the first alternative may have a bottom electrode 881 made of titanium nitride, copper or an aluminum alloy having a thickness between 1 and 20 nanometers, a top electrode 882 made of titanium nitride, copper or an aluminum alloy having a thickness between 1 and 20 nanometers, and a magnetoresistive layer 883 having a thickness between 1 and 35 nanometers between the bottom and top electrodes 871 and 872. For a first alternative, the magnetoresistive layer 883 may be composed of (1) an antiferromagnetic (AF) layer 884, i.e., pinning layer, such as Cr, Fe—Mn alloy, NiO, FeS, Co/$[CoPt]_4$, having a thickness between 1 and 10 nanometers on the bottom electrode 881, (2) a pinned magnetic layer 885, such as a FeCoB alloy or $Co_2Fe_6B_2$, having a thickness between 1 and 10 nanometers, between 0.5 and 3.5 nanometers, or between 1 and 3 nanometers on the antiferromagnetic layer 884, (3) a tunneling oxide layer 886, i.e., tunneling barrier layer, such as MgO, having a thickness between 0.5 and 5 nanometers, between 0.3 and 2.5 nanometers or between 0.5 and 1.5 nanometers on the pinned magnetic layer 885 and (4) a free magnetic layer 887, such as a FeCoB alloy or $Co_2Fe_6B_2$, having a thickness between 1 and 10 nanometers, between 0.5 and 3.5 nanometers, or between 1 and 3 nanometers on the tunneling oxide layer 886. The top electrode 882 is formed on the free magnetic layer 887 of the magnetoresistive layer 883. The pinned magnetic layer 885 may have the same material as the free magnetic layer 887.

Referring to FIG. 11A, each of the magnetoresistive random access memory (MRAM) cells 880 for the first alternative may have its bottom electrode 881 formed on a top surface of one of the lower metal vias 10 of a lower one of the interconnection metal layers 6 as illustrated in FIGS. 21A and 21B and on a top surface of a lower one of the insulating dielectric layers 12 as illustrated in FIGS. 21A and 21B An upper one of the insulating dielectric layers 12 as illustrated in FIGS. 21A and 21B may be formed on the top electrode 882 of said one of the magnetoresistive random access memory (MRAM) cells 880 for the first alternative and an upper one of the interconnection metal layers 6 as illustrated in FIGS. 21A and 21B may have the upper metal vias 10 each formed in the upper one of the insulating dielectric layers 12 and on the top electrode 882 of one of the magnetoresistive random access memory (MRAM) cells 880 for the first alternative.

Alternatively, referring to FIG. 11B, each of the magnetoresistive random access memory (MRAM) cells 880 for the first alternative may have its bottom electrode 881 formed on a top surface of one of the lower metal pads 8 of a lower one of the interconnection metal layers 6 as illustrated in FIGS. 21A and 21B. An upper one of the insulating dielectric layers 12 as illustrated in FIGS. 21A and 21B may be formed on the top electrode 882 of said one of the magnetoresistive random access memory (MRAM) cells 880 for the first alternative and an upper one of the interconnection metal layers 6 as illustrated in FIGS. 21A and 21B may have the upper metal vias 10 each formed in the upper one of the insulating dielectric layers 12 and on the top electrode 882 of one of the magnetoresistive random access memory (MRAM) cells 880 for the first alternative.

Alternatively, referring to FIG. 11C, each of the magnetoresistive random access memory (MRAM) cells 880 for the first alternative may have its bottom electrode 881 formed on a top surface of one of the lower metal pads 8 of a lower one of the interconnection metal layers 6 as illustrated in FIGS. 21A and 21B. An upper one of the interconnection metal layers 6 as illustrated in FIGS. 21A and 21B may have the upper metal pads 8 each formed in an upper one of the insulating dielectric layers 12 and on the top electrode 882 of one of the magnetoresistive random access memory (MRAM) cells 880 for the first alternative.

Referring to FIGS. 11A-11C, the pinned magnetic layer 885 may have domains each provided with a magnetic field in a direction pinned by the antiferromagnetic layer 884, that is, hardly changed by a spin-transfer torque induced by an electron flow passing through the pinned magnetic layer 885. The free magnetic layer 887 may have domains each provided with a magnetic field in a direction easily changed by a spin-transfer torque induced by an electron flow passing through the free magnetic layer 887.

Referring to FIGS. 11A-11C, in a setting step for one of the magnetoresistive random access memory (MRAM) cells 880 for the first alternative, when a first setting voltage $V1_{MSE}$ ranging from 0.25 to 3.3 volts is applied to its top electrode 882 and the voltage Vss of ground reference is applied to its bottom electrode 881, electrons may flow from its pinned magnetic layer 885 to its free magnetic layer 887 through its tunneling oxide layer 886 such that the direction of the magnetic fields in each of the domains of its free magnetic layer 887 may be set to be the same as that in each of the domains of its pinned magnetic layer 885 by a spin-transfer torque (STT) effect induced by the electrons. Thus, said one of the magnetoresistive random access memory (MRAM) cells 880 for the first alternative may be set to a low resistance between 10 and 100,000,000,000 ohms. In a resetting step for said one of the magnetoresistive random access memory (MRAM) cells 880 for the first alternative, when a first resetting voltage $V_{MRE}$ ranging from 0.25 to 3.3 volts is applied to its bottom electrode 881 and the voltage Vss of ground reference is applied to its top electrode 882, electrons may flow from its free magnetic layer 887 to its pinned magnetic layer 885 through its tunneling oxide layer 886 such that the direction of the magnetic fields in each of the domains of its free magnetic layer 887 may be reset to be opposite to that in each of the domains of its pinned magnetic layer 885. Thus, said one of the magnetoresistive random access memory (MRAM) cells 880 for the first alternative may be reset to a high resistance between 15 and 500,000,000,000 ohms greater than the low resistance.

Figure 11D:
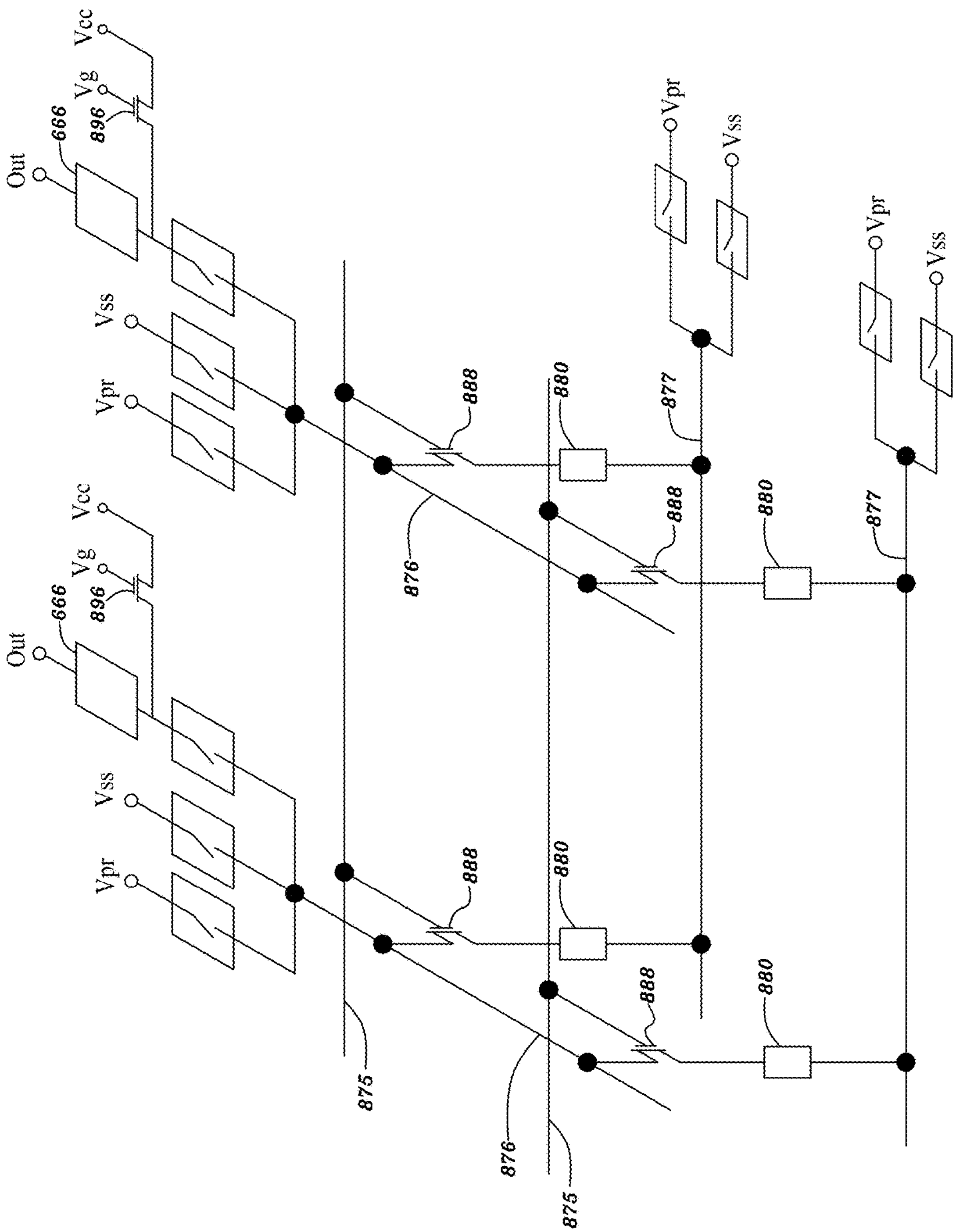
FIG. 11D is a circuit diagram showing an array of non-volatile memory cells for magnetoresistive random access memory (MRAM) cells for first and second alternatives operating with transistors in accordance with an embodiment of the present application.

FIG. 11D is a circuit diagram showing an array of non-volatile memory cells for magnetoresistive random access memory (MRAM) cells for first and second alternatives operating with transistors in accordance with an embodiment of the present application. Referring to FIG. 11D, multiple of the magnetoresistive random access memory (MRAM) cells 880 for the first alternative are formed in an array in the MRAM layer 879 as seen in FIG. 11A-11C. Multiple of the switches 888, e.g., N-type MOS transistors, are arranged in an array. Alternatively, each of the switches 888 may be a P-type MOS transistor.

Referring to FIGS. 11A-11D, each of the N-type MOS transistors 888 is configured to form a channel with two opposite terminals, one of which couples in series to the top electrode 882 of one of the magnetoresistive random access memory (MRAM) cells 880 for the first alternative and the other of which couples to one of bit lines 876, and has a gate terminal coupling to one of word lines 875. Each of reference lines 877 may couple to the bottom electrodes 881 of the magnetoresistive random access memory (MRAM) cells 880 for the first alternative arranged in a row. Each of the word lines 875 may couple to the gate terminals of the N-type or P-type MOS transistors 888 arranged in a row that couple in parallel to one another through said each of the word lines 875. Each of the bit lines 876 is configured to couple, one by one and in turn, to the top electrode 882 of each of the magnetoresistive random access memory (MRAM) cells 880 for the first alternative arranged in a column through one of the N-type or P-type MOS transistors 888 arranged in a column.

In an alternative example, each of the N-type MOS transistors 888 is configured to form a channel with two opposite terminals, one of which couples in series to one of the bottom and top electrodes 881 and 882 of one of the magnetoresistive random access memory (MRAM) cells 880 for the first alternative and the other of which couples to one of reference lines 877, and has a gate terminal coupling to one of word lines 875. Each of the reference lines 877 is configured to couple to the bottom or top electrodes 881 and 882 of the magnetoresistive random access memory (MRAM) cells 880 for the first alternative in a row through the N-type MOS transistors 888 in a row.

Referring to FIG. 11D, for programming the magnetoresistive random access memory (MRAM) cells 880 for the first alternative as illustrated in FIGS. 11A-11C, a resetting step may be first performed to all of the magnetoresistive random access memory (MRAM) cells 880 for the first alternative, in which (1) all of the bit lines 876 may be switched to couple to the voltage Vss of ground reference, (2) all of the word lines 875 may be switched to couple to a programming voltage $V_{Pr}$, between 0.25 and 3.3 volts, equal to or greater than the first resetting voltage $\mathbf{V1}_{MRE}$ of the magnetoresistive random access memory (MRAM) cells 880 for the first alternative, to turn on each of the N-type MOS transistors 888 to couple the top electrode 872 of one of the magnetoresistive random access memory (MRAM) cells 880 for the first alternative to one of the bit lines 876 and (3) all of the reference lines 877 may be switched to couple to the programming voltage $V_{Pr}$, between 0.25 and 3.3 volts, equal to or greater than the first resetting voltage $\mathbf{V1}_{MRE}$ of the magnetoresistive random access memory (MRAM) cells 880 for the first alternative. Alternatively, when each of the switches 888 is a P-type MOS transistor, all of the word lines 875 may be switched to couple to the voltage Vss of ground reference to turn on each of the P-type MOS transistors 888 to couple the top electrode 872 of one of the magnetoresistive random access memory (MRAM) cells 880 for the first alternative to one of the bit lines 876. Thereby, an electron current may pass from the top electrode 882 of each of the magnetoresistive random access memory (MRAM) cells 880 for the first alternative to the bottom electrode 881 of said each of the magnetoresistive random access memory (MRAM) cells 880 for the first alternative to set the direction of the magnetic field in each domain of the free magnetic layer 887 of said each of the magnetoresistive random access memory (MRAM) cells 880 for the first alternative to be opposite to that in each domain of the pinned magnetic layer 885 of said each of the magnetoresistive random access memory (MRAM) cells 880 for the first alternative. Thus, said each of the magnetoresistive random access memory (MRAM) cells 880 for the first alternative may be reset with the high resistance between 15 and 500,000,000,000 ohms in the resetting step, and thus programmed to a logic level of "1".

Next, referring to FIG. 11D, a setting step may be performed, one row by one row and in turn, to a first group of the magnetoresistive random access memory (MRAM) cells 880 for the first alternative as illustrated in FIGS. 11A-11C but not to a second group of the magnetoresistive random access memory (MRAM) cells 880 for the first alternative as illustrated in FIGS. 11A-11C, in which, (1) each of the word lines 875 corresponding to the magnetoresistive random access memory (MRAM) cells 880 for the first alternative in a row may be selected one by one and in turn to be switched to couple to the programming voltage $V_{Pr}$ to turn on the N-type MOS transistors 888 in a row to couple each of the magnetoresistive random access memory (MRAM) cells 880 for the first alternative in the row to one of the bit lines 876 or, in the alternative example, to couple all of the magnetoresistive random access memory (MRAM) cells 880 for the first alternative in the row to a same one of the reference lines 877, wherein the unselected word lines 875 corresponding to the magnetoresistive random access memory (MRAM) cells 880 for the first alternative in the other rows may be switched to couple to the voltage Vss of ground reference to turn off the N-type MOS transistors 888 in the other rows to decouple each of the magnetoresistive random access memory (MRAM) cells 880 for the first alternative in the other rows from any of the bit lines 876 or, in the alternative example, to decouple each of the magnetoresistive random access memory (MRAM) cells 880 for the first alternative in the other rows from any of the reference lines 877, wherein the programming voltage $V_{Pr}$ may be between 0.25 and 3.3 volts, equal to or greater than the first setting voltage $\mathbf{V1}_{MSE}$ of the magnetoresistive random access memory (MRAM) cells 880 for the first alternative, (2) the reference lines 877 may be switched to couple to the voltage Vss of ground reference, (3) the bit lines 876 in a first group each for one of the magnetoresistive random access memory (MRAM) cells 880 for the first alternative in the first group in the row may be switched to couple to the programming voltage $V_{Pr}$, between 0.25 and 3.3 volts, equal to or greater than the first setting voltage $\mathbf{V1}_{MSE}$ of the magnetoresistive random access memory (MRAM) cells 880 for the first alternative, and (4) the bit lines 876 in a second group each for one of the magnetoresistive random access memory (MRAM) cells 880 for the first alternative in the second group in the row may be switched to couple to the voltage Vss of ground reference. Alternatively, when each of the switches 888 is a P-type MOS transistor, each of the word lines 875 corresponding to the magnetoresistive random access memory (MRAM) cells 880 for the first alternative in the row may be selected one by one and in turn to be switched to couple to the voltage Vss of ground reference to turn on the P-type MOS transistors 888 in the row to couple each of the magnetoresistive random access memory (MRAM) cells 880 for the first alternative in the row to one of the bit lines 876 or, in the alternative example, to couple all of the magnetoresistive random access memory (MRAM) cells 880 for the first alternative in the row to the same one of the reference lines 877, wherein the unselected word lines 875 corresponding to the magnetoresistive random access memory (MRAM) cells 880 for the first alternative in the other rows may be switched to couple to the programming voltage $V_{Pr}$ to turn off the P-type MOS transistors 888 in the other rows to decouple each of the magnetoresistive random access memory (MRAM) cells 880 for the first alternative in the other rows from any of the bit lines 876 or, in the alternative example, to decouple each of the magnetoresistive random access memory (MRAM) cells 880 for the first alternative in the other rows from any of the reference lines 877, wherein the programming voltage $V_{Pr}$ may be between 0.25 and 3.3 volts, equal to or greater than the first setting voltage $V1_{MSE}$ of the magnetoresistive random access memory (MRAM) cells 880 for the first alternative. Thereby, an electron current may pass from the bottom electrode 881 of each of the magnetoresistive random access memory (MRAM) cells 880 for the first alternative in the first group in the row to the top electrode 882 of said each of the magnetoresistive random access memory (MRAM) cells 880 for the first alternative in the first group in the row to set the direction of the magnetic field in each domain of the free magnetic layer 887 of said each of the magnetoresistive random access memory (MRAM) cells 880 for the first alternative in the first group in the row to be the same as that in each domain of the pinned magnetic layer 885 of said each of the magnetoresistive random access memory (MRAM) cells 880 for the first alternative in the first group in the row. Thus, said each of the magnetoresistive random access memory (MRAM) cells 880 for the first alternative in the first group may be set to the low resistance between 10 and 100,000,000,000 ohms in the setting step, and thus programmed to a logic level of “0”.

In operation, referring to FIGS. 8F and 11D, (1) each of the bit lines 876 may be switched to couple to the node N31 of the sense amplifier 666 as illustrated in FIG. 8F and to a source terminal of a N-type MOS transistor 896, (2) each of the reference lines 877 may be switched to couple to the voltage Vss of ground reference, and (3) each of the word lines 875 corresponding to the magnetoresistive random access memory (MRAM) cells 880 for the first alternative in a row may be selected one by one and in turn to be switched to couple to the voltage Vcc of power supply to turn on the N-type MOS transistors 888 in a row to couple each of the magnetoresistive random access memory (MRAM) cells 880 for the first alternative in the row to one of the bit lines 876 or, in the alternative example, to couple all of the magnetoresistive random access memory (MRAM) cells 880 for the first alternative in the row to a same one of the reference lines 877, wherein the unselected word lines 875 corresponding to the magnetoresistive random access memory (MRAM) cells 880 for the first alternative in the other rows may be switched to couple to the voltage Vss of ground reference to turn off the N-type MOS transistors 888 in the other rows to decouple each of the magnetoresistive random access memory (MRAM) cells 880 for the first alternative in the other rows from any of the bit lines 876 or, in the alternative example, to decouple each of the magnetoresistive random access memory (MRAM) cells 880 for the first alternative in the other rows from any of the reference lines 877. The N-type MOS transistor 896 may have a gate terminal coupling to a voltage Vg and a drain terminal coupling to the voltage Vcc of power supply. The N-type MOS transistor 896 may be considered as a current source. In operation, the voltage Vg may be applied to the gate of the N-type MOS transistor 896 to control an electric current at a substantially constant level passing through the N-type MOS transistor 896. Alternatively, when each of the switches 888 is a P-type MOS transistor, each of the word lines 875 corresponding to the magnetoresistive random access memory (MRAM) cells 880 for the first alternative in the row may be selected one by one and in turn to be switched to couple to the voltage Vss of ground reference to turn on the P-type MOS transistors 888 in the row to couple each of the magnetoresistive random access memory (MRAM) cells 880 for the first alternative in the row to one of the bit lines 876 or, in the alternative example, to couple all of the magnetoresistive random access memory (MRAM) cells 880 for the first alternative in the row to a same one of the reference lines 877, wherein the unselected word lines 875 corresponding to the magnetoresistive random access memory (MRAM) cells 880 for the first alternative in the other rows may be switched to couple to the voltage Vcc of power supply to turn off the P-type MOS transistors 888 in the other rows to decouple each of the magnetoresistive random access memory (MRAM) cells 880 for the first alternative in the other rows from any of the bit lines 876 or, in the alternative example, to decouple each of the magnetoresistive random access memory (MRAM) cells 880 for the first alternative in the other rows from any of the reference lines 877. Thereby, each of the sense amplifiers 666 may compare a voltage at one of the bit lines 876, i.e., at the node N31 as seen in FIG. 8F, and a comparison voltage at a comparison line, i.e., at the node N32 as seen in FIG. 8F, into a compared data and then generate an output “Out” of one of the magnetoresistive random access memory (MRAM) cells 880 for the first alternative coupling to said one of the bit lines 876 via one of the switches 888 based on the compared data. For example, when the voltage at the node N31 is compared by said each of the sense amplifiers 666 to be smaller than the voltage at the node N32, said each of the sense amplifiers 666 may generate the output “Out” at a logic level of “1” in the case that one of the magnetoresistive random access memory (MRAM) cells 880 for the first alternative, which couples to said each of the sense amplifiers 666, has the low resistance. When the voltage at the node N31 is compared by said each of the sense amplifiers 666 to be greater than the voltage at the node N32, said each of the sense amplifiers 666 may generate the output “Out” at a logic level of “0” in the case that one of the magnetoresistive random access memory (MRAM) cells 880 for the first alternative, which couples to said each of the sense amplifiers 666, has the high resistance.

Figure 11E:
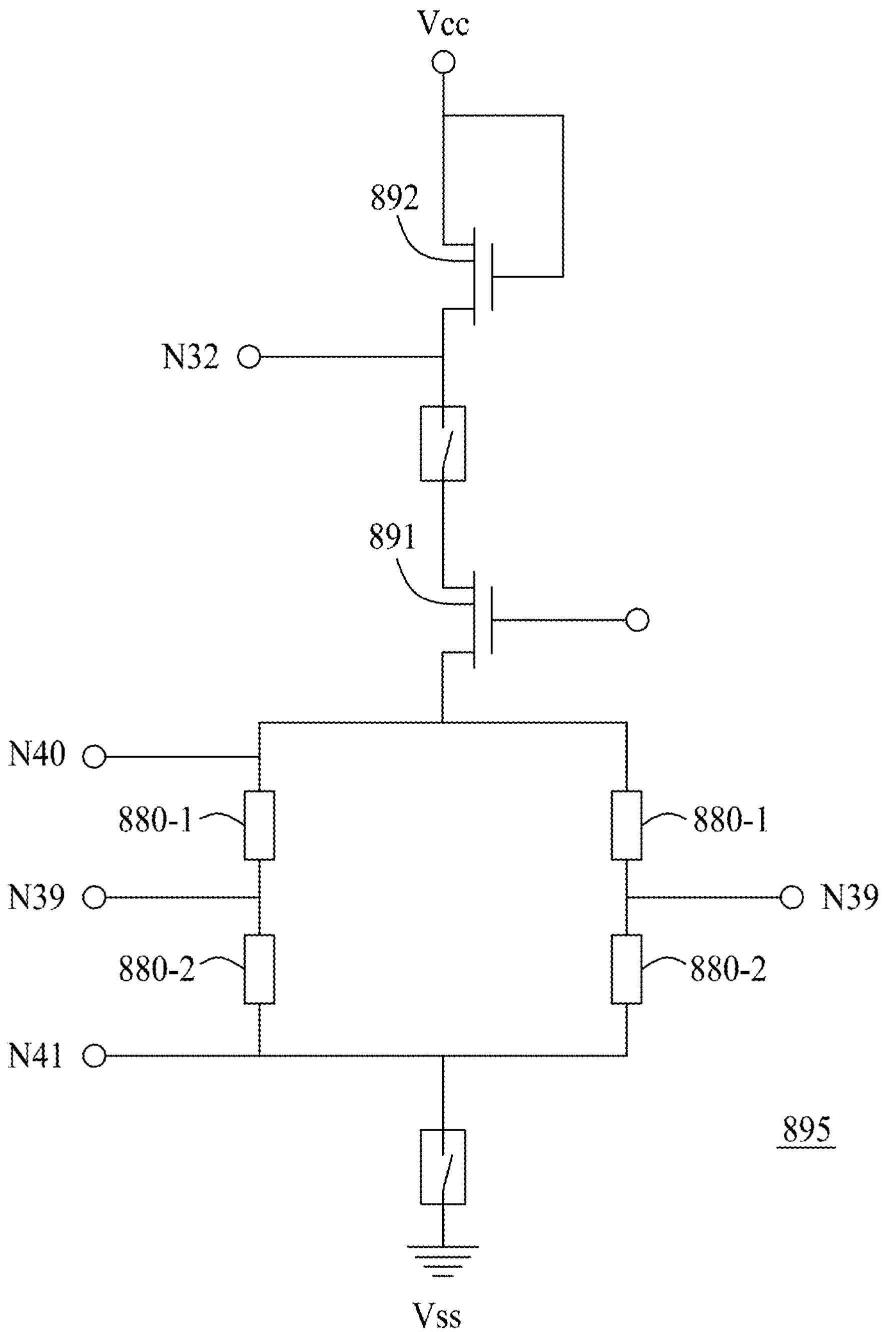
FIG. 11E is a circuit diagram showing a comparison-voltage generating circuit for magnetoresistive random access memory (MRAM) cells in accordance with an embodiment of the present application.

FIG. 11E is a circuit diagram showing a comparison-voltage generating circuit in accordance with an embodiment of the present application. Referring to FIGS. 11A-11E, a comparison-voltage generating circuit 895 includes two pairs of magnetoresistive random access memory (MRAM) cells 880-1 and 880-2 for the first alternative connected in serial to each other, wherein the pairs of magnetoresistive random access memory (MRAM) cells 880-1 and 880-2 for the first alternative are connected in parallel to each other. In each of the pairs of magnetoresistive random access memory (MRAM) cells 880-1 and 880-2 for the first alternative, the magnetoresistive random access memory (MRAM) cell 880-1 for the first alternative may have its top electrode 882 coupling to the top electrode 882 of the magnetoresistive random access memory (MRAM) cell 880-2 for the first alternative and to a node N39, and the magnetoresistive random access memory (MRAM) cell 880-1 for the first alternative may have its bottom electrode 881 coupling to a node N40. The comparison-voltage generating circuit 895 may further include a N-type MOS transistors 891 having a source terminal, in operation, coupling to the bottom electrodes 881 of the magnetoresistive random access memory (MRAM) cells 880-1 for the first alternative in the pairs and to the node N40. The comparison-voltage generating circuit 895 may further include a N-type MOS transistor 892 having a gate terminal coupling to a drain terminal of the N-type MOS transistor 892 and to the voltage Vcc of power supply and a source terminal coupling to the node N32 of the sense amplifier 666 as seen in FIG. 8F via the comparison line. The bottom electrodes 881 of the magnetoresistive random access memory (MRAM) cells 880-2 for the first alternative in the pairs may couple to a node N41.

Referring to FIGS. 11A-11E, the resetting step may be performed to the magnetoresistive random access memory (MRAM) cells 880-1 for the first alternative in the pairs. When the magnetoresistive random access memory (MRAM) cells 880-1 for the first alternative in the pairs are being reset in the resetting step, (1) the node N40 may be switched to couple to the programming voltage $V_{Pr}$, (2) the node N39 may be switched to couple to the voltage Vss of ground reference, (3) the node N41 may be switched to couple to the voltage Vss of ground reference, and (4) the node N32 may be switched not to couple to the bottom electrodes 881 of the magnetoresistive random access memory (MRAM) cells 880-1 for the first alternative in the pairs. Thereby, the magnetoresistive random access memory (MRAM) cells 880-1 for the first alternative in the pairs may be reset to the high resistance.

Referring to FIGS. 11A-11E, the setting step may be performed to the magnetoresistive random access memory (MRAM) cells 880-2 for the first alternative in the pairs. When the magnetoresistive random access memory (MRAM) cells 880-2 for the first alternative in the pairs are being set in the setting step, (1) the node N40 may be switched to couple to the programming voltage $V_{Pr}$, (2) the node N39 may be switched to couple to the programming voltage $V_{Pr}$, (3) the node N41 may be switched to couple to the voltage Vss of ground reference, and (4) the node N32 may be switched not to couple to the bottom electrodes 881 of the magnetoresistive random access memory (MRAM) cells 880-1 for the first alternative in the pairs. Thereby, the magnetoresistive random access memory (MRAM) cells 880-2 for the first alternative in the pairs may be set to the low resistance. Accordingly, the magnetoresistive random access memory (MRAM) cells 880-2 for the first alternative in the pairs may be programmed to the low resistance between 10 and 100,000,000,000 ohms, and the magnetoresistive random access memory (MRAM) cells 880-1 for the first alternative in the pairs may be programmed to the high resistance between 15 and 500,000,000,000 ohms, greater than the low resistance, for example.

Referring to FIGS. 11A-11E, in operation after the magnetoresistive random access memory (MRAM) cells 880-2 for the first alternative in the pairs may be programmed to the low resistance, and the magnetoresistive random access memory (MRAM) cells 880-1 for the first alternative in the pairs may be programmed to the high resistance, (1) the nodes N39, N40 and N41 may be switched to be floating, (2) the node N32 may be switched to couple to the bottom electrodes 881 of the magnetoresistive random access memory (MRAM) cells 880-1 for the first alternative in the pairs, and (3) the bottom electrodes 881 of the magnetoresistive random access memory (MRAM) cells 880-2 for the first alternative in the pairs may be switched to couple to the voltage Vss of ground reference. Thereby, the comparison line, i.e., node N32, of the sense amplifier 666 as seen in FIG. 8F may be at the comparison voltage between a voltage of the node N31 coupling to one of the magnetoresistive random access memory (MRAM) cells 880 for the first alternative programmed to the low resistance and selected by one of the word lines 875 and a voltage of the node N31 coupling to one of the magnetoresistive random access memory (MRAM) cells 880 for the first alternative programmed to the high resistance and selected by one of the word lines 875.

(2.2) Second Type of Non-Volatile Memory Cell for the Second Alternative

Figure 11F:
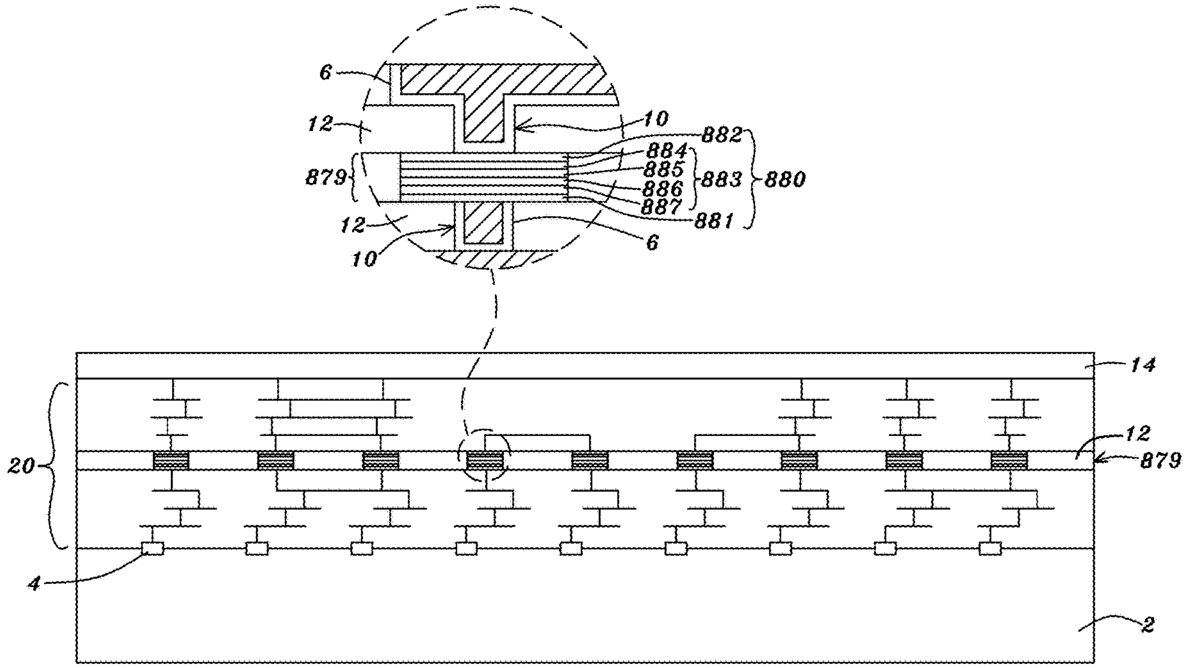
FIG. 11F is a schematically cross-sectional view showing a structure of a second type of non-volatile memory cell for a second alternative for a semiconductor chip in accordance with an embodiment of the present application.

For a second alternative, FIG. 11F is a schematically cross-sectional view showing a structure of a second type of non-volatile memory cell for a second alternative for a semiconductor chip in accordance with an embodiment of the present application. The scheme of the semiconductor chip as illustrated in FIG. 11F is similar to that as illustrated in FIG. 11A except for the composition of the magnetoresistive layer 883. Referring to FIG. 11F, the magnetoresistive layer 883 may be composed of the free magnetic layer 887 on the bottom electrode 881, the tunneling oxide layer 886 on the free magnetic layer 887, the pinned magnetic layer 885 on the tunneling oxide layer 886 and the antiferromagnetic layer 884 on the pinned magnetic layer 885. The top electrode 882 is formed on the antiferromagnetic layer 884. The materials and thicknesses of the free magnetic layer 887, tunneling oxide layer 886, pinned magnetic layer 885 and antiferromagnetic layer 884 for the second alternative may be referred to those for the first alternative. The magnetoresistive random access memory (MRAM) cells 880 for the second alternative may have its bottom electrode 881 formed on a top surface of one of the lower metal vias 10 of a lower one of the interconnection metal layers 6 as illustrated in FIGS. 21A and 21B and on a top surface of a lower one of the insulating dielectric layers 12 as illustrated in FIGS. 21A and 21B. An upper one of the insulating dielectric layers 12 as illustrated in FIGS. 21A and 21B may be formed on the top electrode 882 of said one of the magnetoresistive random access memory (MRAM) cells 880 for the second alternative and an upper one of the interconnection metal layers 6 as illustrated in FIGS. 21A and 21B may have the upper metal vias 10 each formed in the upper one of the insulating dielectric layers 12 and on the top electrode 882 of one of the magnetoresistive random access memory (MRAM) cells 880 for the second alternative.

Alternatively, the magnetoresistive random access memory (MRAM) cells 880 for the second alternative in FIG. 11F may be provided between a lower metal pad 8 and an upper metal via 10 as seen in FIG. 11B. Referring to FIGS. 11B and 11F, each of the magnetoresistive random access memory (MRAM) cells 880 for the second alternative may have its bottom electrode 881 formed on a top surface of one of the lower metal pads 8 of a lower one of the interconnection metal layers 6 as illustrated in FIGS. 21A and 21B. An upper one of the insulating dielectric layers 12 as illustrated in FIGS. 21A and 21B may be formed on the top electrode 882 of said one of the magnetoresistive random access memory (MRAM) cells 880 for the second alternative and an upper one of the interconnection metal layers 6 as illustrated in FIGS. 21A and 21B may have the upper metal vias 10 each formed in the upper one of the insulating dielectric layers 12 and on the top electrode 882 of one of the magnetoresistive random access memory (MRAM) cells 880 for the second alternative.

Alternatively, the magnetoresistive random access memory (MRAM) cells 880 for the second alternative in FIG. 11F may be provided between a lower metal pad 8 and an upper metal pad 8 as seen in FIG. 11C. Referring to FIGS. 11C and 11F, each of the magnetoresistive random access memory (MRAM) cells 880 for the second alternative may have its bottom electrode 881 formed on a top surface of one of the lower metal pads 8 of a lower one of the interconnection metal layers 6 as illustrated in FIGS. 21A and 21B. An upper one of the interconnection metal layers 6 as illustrated in FIGS. 21A and 21B may have the upper metal pads 8 each formed in an upper one of the insulating dielectric layers 12 and on the top electrode 882 of one of the magnetoresistive random access memory (MRAM) cells 880 for the second alternative.

Referring to FIG. 11F, the pinned magnetic layer 885 may have domains each provided with a magnetic field in a direction pinned by the antiferromagnetic layer 884, that is, hardly changed by a spin-transfer torque induced by an electron flow passing through the pinned magnetic layer 885. The free magnetic layer 887 may have domains each provided with a magnetic field in a direction easily changed by a spin-transfer torque induced by an electron flow passing through the free magnetic layer 887.

Referring to FIG. 11F, in a setting step for one of the magnetoresistive random access memory (MRAM) cells 880 for the second alternative, when the first setting voltage $V1_{MSE}$ ranging from 0.25 to 3.3 volts is applied to its bottom electrode 881 and the voltage Vss of ground reference is applied to its top electrode 882, electrons may flow from its pinned magnetic layer 885 to its free magnetic layer 887 through its tunneling oxide layer 886 such that the direction of the magnetic fields in each of the domains of its free magnetic layer 887 may be set to be the same as that in each of the domains of its pinned magnetic layer 885 by a spin-transfer torque (STT) effect induced by the electrons. Thus, said one of the magnetoresistive random access memory (MRAM) cells 880 for the second alternative may be set to the low resistance between 10 and 100,000,000,000 ohms. In a resetting step for said one of the magnetoresistive random access memory (MRAM) cells 880 for the second alternative, when the first resetting voltage $V1_{MRE}$ ranging from 0.25 to 3.3 volts is applied to its top electrode 882 and the voltage Vss of ground reference is applied to its bottom electrode 881, electrons may flow from its free magnetic layer 887 to its pinned magnetic layer 885 through its tunneling oxide layer 886 such that the direction of the magnetic fields in each of the domains of its free magnetic layer 887 may be reset to be opposite to that in each of the domains of its pinned magnetic layer 885. Thus, said one of the magnetoresistive random access memory (MRAM) cells 880 for the second alternative may be reset to the high resistance between 15 and 500,000,000,000 ohms.

Referring to FIGS. 11D and 11F, each of the N-type MOS transistors 888 is configured to form a channel with two opposite terminals, one of which couples in series to the top electrode 882 of one of the magnetoresistive random access memory (MRAM) cells 880 for the second alternative and the other of which couples to one of bit lines 876, and has a gate terminal coupling to one of word lines 875. Each of reference lines 877 may couple to the bottom electrodes 881 of the magnetoresistive random access memory (MRAM) cells 880 for the second alternative arranged in a row. Each of the word lines 875 may couple to the gate terminals of the N-type or P-type MOS transistors 888 arranged in a row that couple in parallel to one another through said each of the word lines 875. Each of the bit lines 876 is configured to couple, one by one and in turn, to the top electrode 882 of each of the magnetoresistive random access memory (MRAM) cells 880 for the second alternative arranged in a column through one of the N-type or P-type MOS transistors 888 arranged in a column.

In an alternative example, each of the N-type MOS transistors 888 is configured to form a channel with two opposite terminals, one of which couples in series to one of the bottom and top electrodes 881 and 882 of one of the magnetoresistive random access memory (MRAM) cells 880 for the second alternative and the other of which couples to one of reference lines 877, and has a gate terminal coupling to one of word lines 875. Each of the reference lines 877 is configured to couple to the bottom or top electrodes 881 and 882 of the magnetoresistive random access memory (MRAM) cells 880 for the second alternative in a row through the N-type MOS transistors 888 in a row.

Referring to FIG. 11D, for programming the magnetoresistive random access memory (MRAM) cells 880 for the second alternative as illustrated in FIG. 11F, a resetting step may be first performed to all of the magnetoresistive random access memory (MRAM) cells 880 for the second alternative, in which (1) all of the bit lines 876 may be switched to couple to the programming voltage $V_{Pr}$, between 0.25 and 3.3 volts, equal to or greater than the first resetting voltage $V1_{MRE}$ of the magnetoresistive random access memory (MRAM) cells 880 for the second alternative, (2) all of the word lines 875 may be switched to couple to the programming voltage $V_{Pr}$, between 0.25 and 3.3 volts, equal to or greater than the first resetting voltage $V1_{MRE}$ of the magnetoresistive random access memory (MRAM) cells 880 for the second alternative, to turn on each of the N-type MOS transistors 888 to couple the top electrode 872 of one of the magnetoresistive random access memory (MRAM) cells 880 for the second alternative to one of the bit lines 876 and (3) all of the reference lines 877 may be switched to couple to the voltage Vss of ground reference. Alternatively, when each of the switches 888 is a P-type MOS transistor, all of the word lines 875 may be switched to couple to the voltage Vss of ground reference to turn on each of the P-type MOS transistors 888 to couple the top electrode 872 of one of the magnetoresistive random access memory (MRAM) cells 880 for the second alternative to one of the bit lines 876. Thereby, an electron current may pass from the bottom electrode 881 of each of the magnetoresistive random access memory (MRAM) cells 880 for the second alternative to the top electrode 882 of said each of the magnetoresistive random access memory (MRAM) cells 880 for the second alternative to set the direction of the magnetic field in each domain of the free magnetic layer 887 of said each of the magnetoresistive random access memory (MRAM) cells 880 for the second alternative to be opposite to that in each domain of the pinned magnetic layer 885 of said each of the magnetoresistive random access memory (MRAM) cells 880 for the second alternative. Thus, said each of the magnetoresistive random access memory (MRAM) cells 880 for the second alternative may be reset with the high resistance between 15 and 500,000,000,000 ohms in the resetting step, and thus programmed to a logic level of "1".

Next, referring to FIG. 11D, a setting step may be performed to a first group of the magnetoresistive random access memory (MRAM) cells 880 for the second alternative as illustrated in FIG. 11F but not to a second group of the magnetoresistive random access memory (MRAM) cells 880 for the second alternative as illustrated in FIG. 11F, in which (1) each of the word lines 875 corresponding to the magnetoresistive random access memory (MRAM) cells 880 for the second alternative in a row may be selected one by one and in turn to be switched to couple to the programming voltage $V_{Pr}$ to turn on the N-type MOS transistors 888 in a row to couple each of the magnetoresistive random access memory (MRAM) cells 880 for the second alternative in the row to one of the bit lines 876 or, in the alternative example, to couple all of the magnetoresistive random access memory (MRAM) cells 880 for the second alternative in the row to a same one of the reference lines 877, wherein the unselected word lines 875 corresponding to the magnetoresistive random access memory (MRAM) cells 880 for the second alternative in the other rows may be switched to couple to the voltage Vss of ground reference to turn off the N-type MOS transistors 888 in the other rows to decouple each of the magnetoresistive random access memory (MRAM) cells 880 for the second alternative in the other rows from any of the bit lines 876 or, in the alternative example, to decouple each of the magnetoresistive random access memory (MRAM) cells 880 for the second alternative in the other rows from any of the reference lines 877, wherein the programming voltage $V_{Pr}$ may be between 0.25 and 3.3 volts, equal to or greater than the first setting voltage $V1_{MSE}$ of the magnetoresistive random access memory (MRAM) cells 880 for the second alternative, (2) the reference lines 877 may be switched to couple to the programming voltage $V_{Pr}$, between 0.25 and 3.3 volts, equal to or greater than the first setting voltage $V1_{MSE}$ of the magnetoresistive random access memory (MRAM) cells 880 for the second alternative, (3) the bit lines 876 in a first group each for one of the magnetoresistive random access memory (MRAM) cells 880 for the second alternative in the first group in the row may be switched to couple to the voltage Vss of ground reference, and (4) the bit lines 876 in a second group each for one of the magnetoresistive random access memory (MRAM) cells 880 for the second alternative in the second group in the row may be switched to couple to the programming voltage $V_{Pr}$, between 0.25 and 3.3 volts, equal to or greater than the first setting voltage $V1_{MSE}$ of the magnetoresistive random access memory (MRAM) cells 880 for the second alternative. Alternatively, when each of the switches 888 is a P-type MOS transistor, each of the word lines 875 corresponding to the magnetoresistive random access memory (MRAM) cells 880 for the second alternative in the row may be selected one by one and in turn to be switched to couple to the voltage Vss of ground reference to turn on the P-type MOS transistors 888 in the row to couple each of the magnetoresistive random access memory (MRAM) cells 880 for the second alternative in the row to one of the bit lines 876 or, in the alternative example, to couple all of the magnetoresistive random access memory (MRAM) cells 880 for the second alternative in the row to the same one of the reference lines 877, wherein the unselected word lines 875 corresponding to the magnetoresistive random access memory (MRAM) cells 880 for the second alternative in the other rows may be switched to couple to the programming voltage $V_{Pr}$ to turn off the P-type MOS transistors 888 in the other rows to decouple each of the magnetoresistive random access memory (MRAM) cells 880 for the second alternative in the other rows from any of the bit lines 876 or, in the alternative example, to decouple each of the magnetoresistive random access memory (MRAM) cells 880 for the second alternative in the other rows from any of the reference lines 877, wherein the programming voltage $V_{Pr}$ may be between 0.25 and 3.3 volts, equal to or greater than the first setting voltage $V1_{MSE}$ of the magnetoresistive random access memory (MRAM) cells 880 for the second alternative. Thereby, an electron current may pass from the top electrode 882 of each of the magnetoresistive random access memory (MRAM) cells 880 for the second alternative in the first group in the row to the bottom electrode 881 of said each of the magnetoresistive random access memory (MRAM) cells 880 for the second alternative in the first group in the row to set the direction of the magnetic field in each domain of the free magnetic layer 887 of said each of the magnetoresistive random access memory (MRAM) cells 880 for the second alternative in the first group in the row to be the same as that in each domain of the pinned magnetic layer 885 of said each of the magnetoresistive random access memory (MRAM) cells 880 for the second alternative in the first group in the row. Thus, said each of the magnetoresistive random access memory (MRAM) cells 880 for the second alternative in the first group may be set to the low resistance between 10 and 100,000,000,000 ohms in the setting step, and thus programmed to a logic level of "0". Each of the magnetoresistive random access memory (MRAM) cells 880 for the second alternative in the second group may be kept at the high resistance and at a logic level of "1".

In operation, referring to FIGS. 8F and 11D, (1) each of the bit lines 876 may be switched to couple to the node N31 of the sense amplifier 666 as illustrated in FIG. 8F and to the source terminal of the N-type MOS transistor 896, (2) each of the reference lines 877 may be switched to couple to the voltage Vss of ground reference, and (3) each of the word lines 875 corresponding to the magnetoresistive random access memory (MRAM) cells 880 for the second alternative in a row may be selected one by one and in turn to be switched to couple to the voltage Vcc of power supply to turn on the N-type MOS transistors 888 in a row to couple each of the magnetoresistive random access memory (MRAM) cells 880 for the second alternative in the row to one of the bit lines 876 or, in the alternative example, to couple all of the magnetoresistive random access memory (MRAM) cells 880 for the second alternative in the row to a same one of the reference lines 877, wherein the unselected word lines 875 corresponding to the magnetoresistive random access memory (MRAM) cells 880 for the second alternative in the other rows may be switched to couple to the voltage Vss of ground reference to turn off the N-type MOS transistors 888 in the other rows to decouple each of the magnetoresistive random access memory (MRAM) cells 880 for the second alternative in the other rows from any of the bit lines 876 or, in the alternative example, to decouple each of the magnetoresistive random access memory (MRAM) cells 880 for the second alternative in the other rows from any of the reference lines 877. The N-type MOS transistor 896 may have a gate terminal coupling to a voltage Vg and a drain terminal coupling to the voltage Vcc of power supply. The N-type MOS transistor 896 may be considered as a current source. In operation, the voltage Vg may be applied to the gate of the N-type MOS transistor 896 to control an electric current at a substantially constant level passing through the N-type MOS transistor 896. Alternatively, when each of the switches 888 is a P-type MOS transistor, each of the word lines 875 corresponding to the magnetoresistive random access memory (MRAM) cells

880 for the second alternative in the row may be selected one by one and in turn to be switched to couple to the voltage Vss of ground reference to turn on the P-type MOS transistors 888 in the row to couple each of the magnetoresistive random access memory (MRAM) cells 880 for the second alternative in the row to one of the bit lines 876 or, in the alternative example, to couple all of the magnetoresistive random access memory (MRAM) cells 880 for the second alternative in the row to a same one of the reference lines 877, wherein the unselected word lines 875 corresponding to the magnetoresistive random access memory (MRAM) cells 880 for the second alternative in the other rows may be switched to couple to the voltage Vcc of power supply to turn off the P-type MOS transistors 888 in the other rows to decouple each of the magnetoresistive random access memory (MRAM) cells 880 for the second alternative in the other rows from any of the bit lines 876 or, in the alternative example, to decouple each of the magnetoresistive random access memory (MRAM) cells 880 for the second alternative in the other rows from any of the reference lines 877. Thereby, each of the sense amplifiers 666 may compare a voltage at one of the bit lines 876, i.e., at the node N31 as seen in FIG. 8F, and a voltage at a comparison line, i.e., at the node N32 as seen in FIG. 8F, into a compared data and then generate an output "Out" of one of the magnetoresistive random access memory (MRAM) cells 880 for the second alternative coupling to said one of the bit lines 876 via one of the switches 888 based on the compared data. For example, when the voltage at the node N31 is compared by said each of the sense amplifiers 666 to be smaller than the voltage at the node N32, said each of the sense amplifiers 666 may generate the output "Out" at a logic level of "1" in the case that one of the magnetoresistive random access memory (MRAM) cells 880 for the second alternative, which couples to said each of the sense amplifiers 666, has the low resistance. When the voltage at the node N31 is compared by said each of the sense amplifiers 666 to be greater than the voltage at the node N32, said each of the sense amplifiers 666 may generate the output "Out" at a logic level of "0" in the case that one of the magnetoresistive random access memory (MRAM) cells 880 for the second alternative, which couples to said each of the sense amplifiers 666, has the high resistance.

The comparison-voltage generating circuit 895 as illustrated in FIG. 11E may be applied hereto, but the magnetoresistive random access memory (MRAM) cells 880-1 and 880-2 for the first alternative as illustrated in FIG. 11E are changed to ones for the second alternative. Referring to FIGS. 11D-11F, the comparison-voltage generating circuit 895 includes two pairs of magnetoresistive random access memory (MRAM) cells 880-1 and 880-2 for the second alternative connected in serial to each other, wherein the pairs of magnetoresistive random access memory (MRAM) cells 880-1 and 880-2 for the second alternative are connected in parallel to each other. In each of the pairs of magnetoresistive random access memory (MRAM) cells 880-1 and 880-2 for the second alternative, the magnetoresistive random access memory (MRAM) cell 880-1 for the second alternative may have its top electrode 882 coupling to the top electrode 882 of the magnetoresistive random access memory (MRAM) cell 880-2 for the second alternative and to a node N39, and the magnetoresistive random access memory (MRAM) cell 880-1 for the second alternative may have its bottom electrode 881 coupling to the node N40. The N-type MOS transistors 891 may have its source terminal, in operation, coupling to the bottom electrodes 881 of the magnetoresistive random access memory (MRAM) cells 880-1 for the second alternative in the pairs and to the node N40. The N-type MOS transistor 892 may have its gate terminal coupling to its drain terminal and to the voltage Vcc of power supply and its source terminal coupling to the node N32 of the sense amplifier 666 as seen in FIG. 8F via the comparison line. The bottom electrodes 881 of the magnetoresistive random access memory (MRAM) cells 880-2 for the second alternative in the pairs may couple to a node N41.

Referring to FIGS. 11D-11F, the resetting step may be performed to the magnetoresistive random access memory (MRAM) cells 880-1 for the second alternative in the pairs. When the magnetoresistive random access memory (MRAM) cells 880-1 for the second alternative in the pairs are being reset in the resetting step, (1) the node N40 may be switched to couple to the voltage Vss of ground reference, (2) the node N39 may be switched to couple to the programming voltage $V_{Pr}$, (3) the node N41 may be switched to couple to the programming voltage $V_{Pr}$, and (4) the node N32 may be switched not to couple to the bottom electrodes 881 of the magnetoresistive random access memory (MRAM) cells 880-1 for the second alternative in the pairs. Thereby, the magnetoresistive random access memory (MRAM) cells 880-1 for the second alternative in the pairs may be reset to the high resistance.

Referring to FIGS. 11D-11F, the setting step may be performed to the magnetoresistive random access memory (MRAM) cells 880-2 for the second alternative in the pairs. When the magnetoresistive random access memory (MRAM) cells 880-2 for the second alternative in the pairs are being set in the setting step, (1) the node N40 may be switched to couple to the voltage Vss of ground reference, (2) the node N39 may be switched to couple to the voltage Vss of ground reference, (3) the node N41 may be switched to couple to the programming voltage $V_{Pr}$, and (4) the node N32 may be switched not to couple to the bottom electrodes 881 of the magnetoresistive random access memory (MRAM) cells 880-1 for the second alternative in the pairs. Thereby, the magnetoresistive random access memory (MRAM) cells 880-2 for the second alternative in the pairs may be set to the low resistance. Accordingly, the magnetoresistive random access memory (MRAM) cells 880-2 for the second alternative in the pairs may be programmed to the low resistance between 10 and 100,000,000,000 ohms, and the magnetoresistive random access memory (MRAM) cells 880-1 for the second alternative in the pairs may be programmed to the high resistance between 15 and 500,000,000,000 ohms, greater than the low resistance, for example.

Referring to FIGS. 11D-11F, in operation after the magnetoresistive random access memory (MRAM) cells 880-2 for the second alternative in the pairs may be programmed to the low resistance, and the magnetoresistive random access memory (MRAM) cells 880-1 for the second alternative in the pairs may be programmed to the high resistance, (1) the nodes N39, N40 and N41 may be switched to be floating, (2) the node N32 may be switched to couple to the bottom electrodes 881 of the magnetoresistive random access memory (MRAM) cells 880-1 for the second alternative in the pairs, and (3) the bottom electrodes 881 of the magnetoresistive random access memory (MRAM) cells 880-2 for the second alternative in the pairs may be switched to couple to the voltage Vss of ground reference. Thereby, the comparison line, i.e., node N32, of the sense amplifier 666 as seen in FIG. 8F may be at the comparison voltage between a voltage of the node N31 coupling to one of the magnetoresistive random access memory (MRAM) cells 880 for the second alternative programmed to the low resistance and selected by one of the word lines 875 and a voltage of the node N31 coupling to one of the magnetoresistive random access memory (MRAM) cells 880 for the second alternative programmed to the high resistance and selected by one of the word lines 875.

(2.3) Second Type of Non-Volatile Memory Cell for the Third Alternative

Figure 12A:
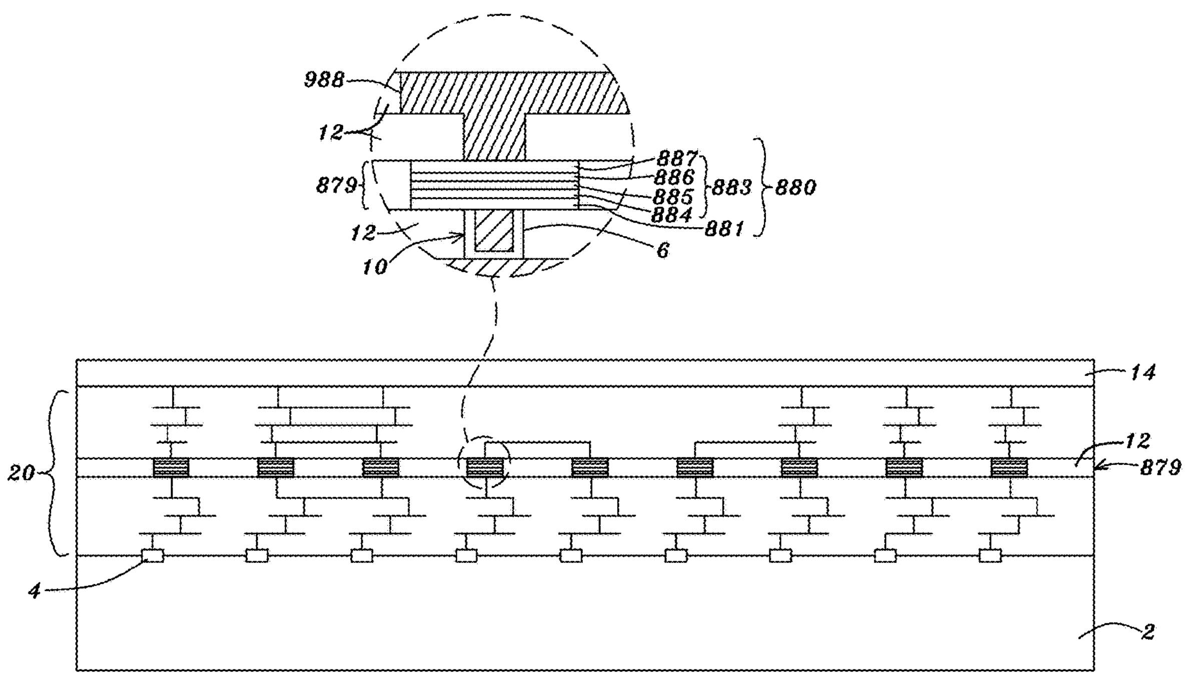
FIGS. 12A-12C are schematically cross-sectional views showing various structures for a spin-orbit-torque (SOT) based magnetoresistive random access memory (MRAM) cell for a third alternative in accordance with an embodiment of the present application.
Figure 12B:
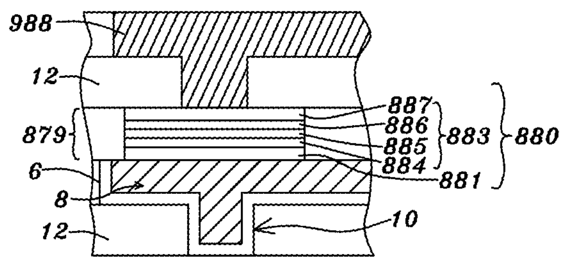
Figure 12C:
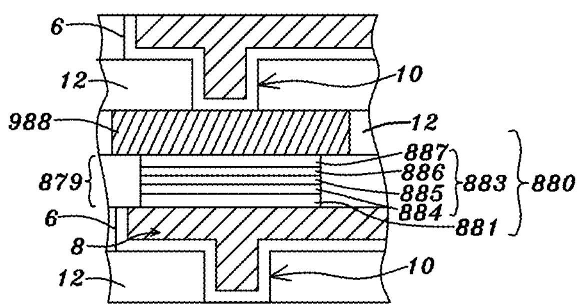

For a third alternative, FIGS. 12A-12C are schematically cross-sectional views showing various structures for a spin-orbit-torque (SOT) based magnetoresistive random access memory (MRAM) cell for a third alternative in accordance with an embodiment of the present application. The scheme of the semiconductor chip as illustrated in FIGS. 12A-12C is similar to that as illustrated in FIGS. 11A-11C respectively except for the composition of the MRAM layer 879 and a spin-accumulation induced layer 988, i.e., spin-orbit-torque (SOT) layer, further provided on the free magnetic layer 887 of the magnetoresistive layer 883 of the MRAM layer 879. For an spin-orbit-torque (SOT) based magnetoresistive random access memory (MRAM) cell 880 for a third alternative, its spin-accumulation induced layer 988, i.e., spin-orbit-torque (SOT) layer, may provide spin orbit torque (SOT) via the spin Hall effect (one of the anomalous Hall effects) and may simultaneously be configured to provide a magnetic bias field on its free magnetic layer 887 in the magnetoresistive layer 883 of the MRAM layer 879 of the semiconductor integrated-circuit (IC) chip 100. The spin Hall effect is a transport phenomenon consisting of the appearance of spin accumulation at opposing top and bottom surface boundaries of its spin-accumulation induced layer 988, i.e., spin-orbit-torque (SOT) layer, carrying electric current. The opposing top and bottom surface boundaries will have spins of opposite sign. No magnetic field is needed for the spin Hall effect which is a purely spin-based phenomenon. For an element indicated by the same reference number shown in FIGS. 11A-11C and 12A-12C, the specification of the element as seen in FIGS. 12A-12C may be referred to that of the element as illustrated in FIGS. 11A-11C. Referring to FIGS. 12A-12C, for the MRAM layer 879, the structure and specification for its magnetoresistive layer 883 as seen in FIGS. 12A-12C is the same as those as illustrated in FIGS. 11A-11C and may be referred to those as illustrated in FIGS. 11A-11C. Referring to FIGS. 12A-12C, the semiconductor integrated-circuit (IC) chip 100 may include the spin-accumulation induced layer 988, i.e., spin-orbit-torque (SOT) layer, such as platinum (Pt) layer, tantalum (Ta) layer, gold (Au) layer, tungsten (W) layer, palladium (Pd) layer or precious or heavy metal layer, having a thickness between 0.5 and 50 nanometers or between 0.5 and 10 nanometers in an upper one of the insulating dielectric layers 12 of the semiconductor integrated-circuit (IC) chip 100 as illustrated in FIGS. 21A and 21B. For the MRAM layer 879 of the semiconductor integrated-circuit (IC) chip 100, its top electrode 882 as seen in FIGS. 11A-11C may be skipped such that the spin-orbit-torque (SOT) based magnetoresistive random access memory (MRAM) cell 880 for the third alternative may have the spin-accumulation induced layer 988 formed on the free magnetic layer 887 thereof in the magnetoresistive layer 883 of the MRAM layer 879 of the semiconductor integrated-circuit (IC) chip 100 as seen in FIGS. 12A-12C.

Referring to FIGS. 12A and 12B, for each of the magnetoresistive random access memory (MRAM) cells 880 for the third alternative, an upper one of the insulating dielectric layers 12 as illustrated in FIGS. 21A and 21B may be formed on a top surface of its free magnetic layer 887 in the magnetoresistive layer 883 of the MRAM layer 879 of the semiconductor integrated-circuit (IC) chip 100 and its spin-accumulation induced layer 988 may be formed with a metal via and metal line both in the upper one of the insulating dielectric layers 12 of the semiconductor integrated-circuit (IC) chip 100, wherein the metal via of its spin-accumulation induced layer 988 may be formed on the top surface of its free magnetic layer 887 in the magnetoresistive layer 883 of the MRAM layer 879 of the semiconductor integrated-circuit (IC) chip 100 to couple the metal line of its spin-accumulation induced layer 988 to its free magnetic layer 887 in the magnetoresistive layer 883 of the MRAM layer 879 of the semiconductor integrated-circuit (IC) chip 100.

Alternatively, referring to FIG. 12C, for each of the magnetoresistive random access memory (MRAM) cells 880 for the third alternative, its spin-accumulation induced layer 988 may be formed in an upper one of the insulating dielectric layers 12 of the semiconductor integrated-circuit (IC) chip 100, on a top surface of its free magnetic layer 887 in the magnetoresistive layer 883 of the MRAM layer 879 of the semiconductor integrated-circuit (IC) chip 100 and on a top surface of the insulating dielectric layer 12 of the MRAM layer 879 of the semiconductor integrated-circuit (IC) chip 100.

Figure 12D:
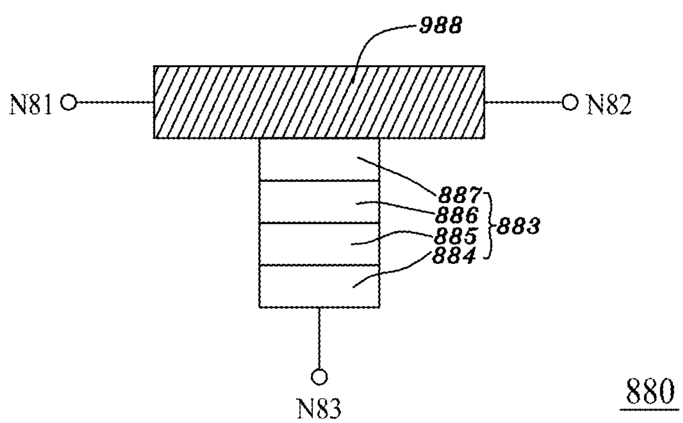
FIG. 12D is a simplified cross-sectional view illustrating a programming step for setting or resetting a spin-orbit-torque (SOT) based magnetoresistive random access memory (MRAM) cell for a third alternative in accordance with an embodiment of the present application.
Figures 1, 12D:
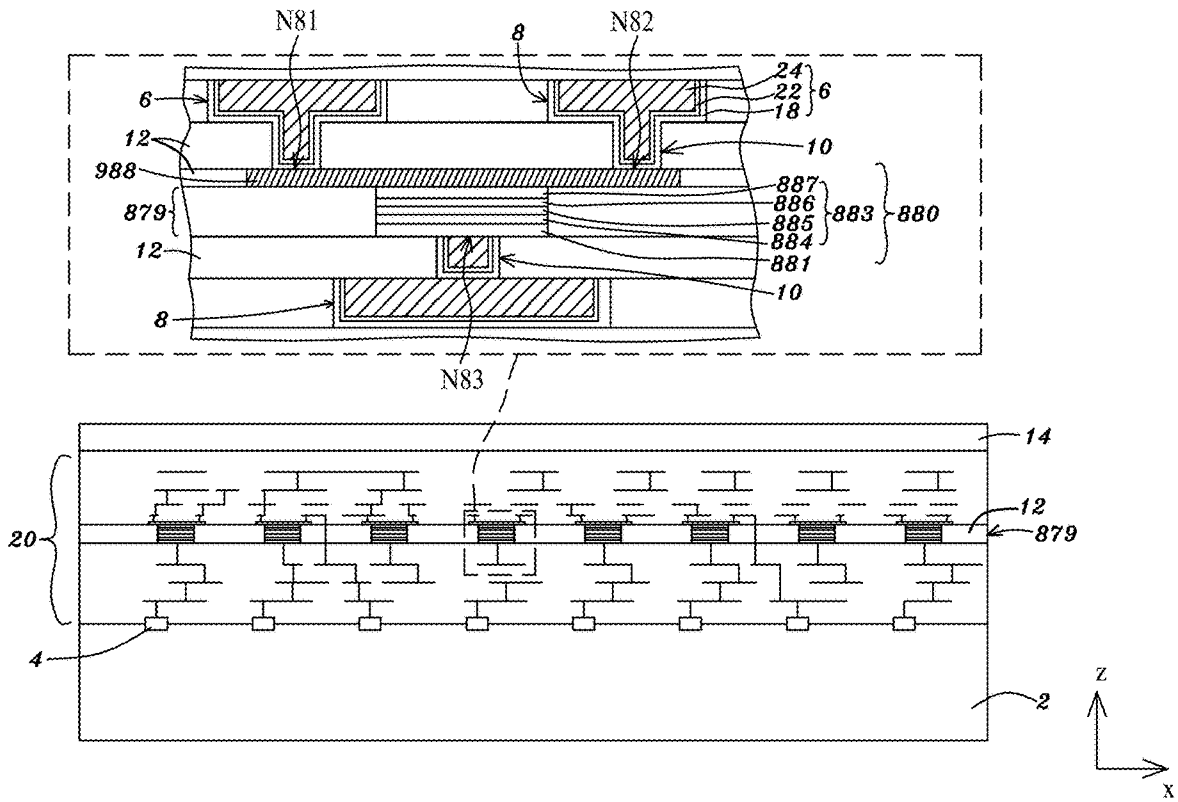
Figures 2, 12D:
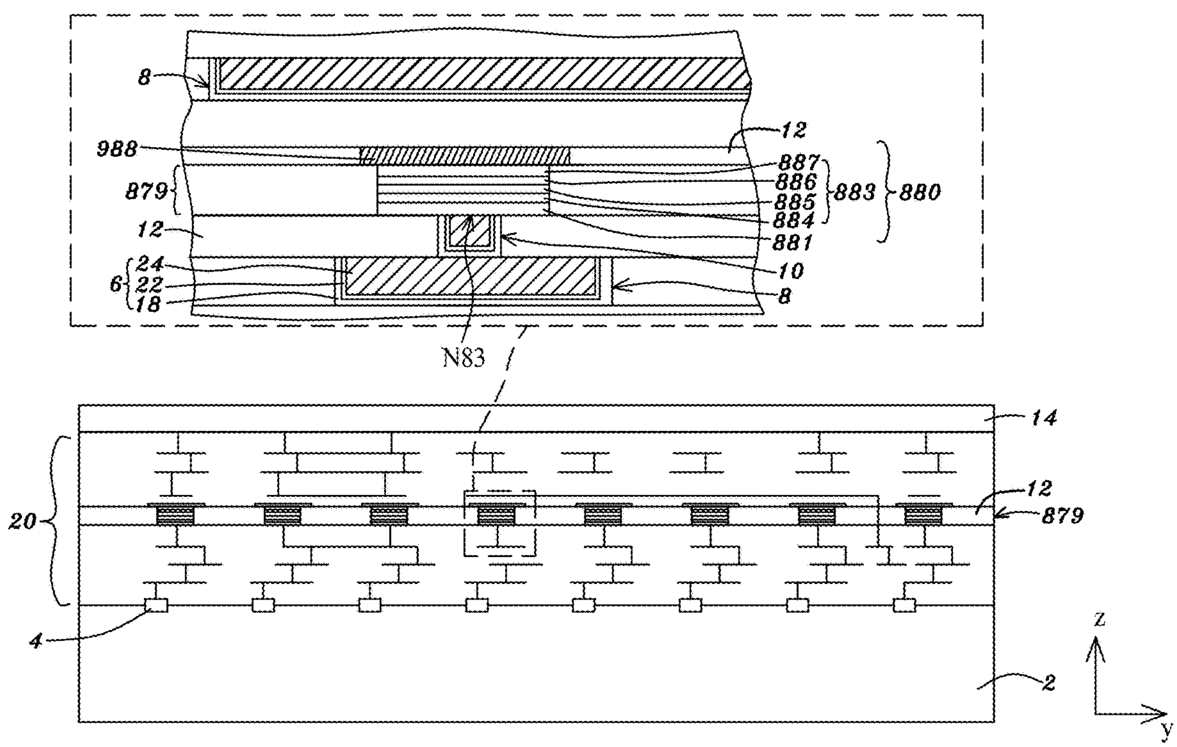

FIG. 12D is a simplified cross-sectional view illustrating a programming step for setting or resetting a spin-orbit-torque (SOT) based magnetoresistive random access memory (MRAM) cell for a third alternative in accordance with an embodiment of the present application. FIG. 12D-1 is a schematically cross-sectional view in an x-z plane showing spin-orbit-torque (SOT) based magnetoresistive random access memory (MRAM) cells for a third alternative in a semiconductor integrated-circuit (IC) chip in accordance with an embodiment of the present application, wherein an upper side of FIG. 12D-1 is a schematically enlarged cross-sectional view in an x-z plane showing a spin-orbit-torque (SOT) based magnetoresistive random access memory (MRAM) cells for a third alternative. FIG. 12D-2 is a schematically cross-sectional view in an y-z plane showing spin-orbit-torque (SOT) based magnetoresistive random access memory (MRAM) cells for a third alternative in a semiconductor integrated-circuit (IC) chip in accordance with an embodiment of the present application, wherein an upper side of FIG. 12D-2 is a schematically enlarged cross-sectional view in an y-z plane showing a spin-orbit-torque (SOT) based magnetoresistive random access memory (MRAM) cells for a third alternative. The scheme of the spin-orbit-torque (SOT) based magnetoresistive random access memory (MRAM) cells for the third alternative as illustrated in FIGS. 12D-1 and 12D-2 is similar to that as illustrated in FIG. 12C except for the number and position of the upper metal via 10. For an element indicated by the same reference number shown in FIGS. 11A-11C and 12C, 12D, 12D-1 and 12D-1, the specification of the element as seen in FIGS. 12D, 12D-1 and 12D-2 may be referred to that of the element as illustrated in FIGS. 11A-11C and 12C. Referring to FIGS. 12D, 12D-1 and 12D-2, for the spin-orbit-torque (SOT) based magnetoresistive random access memory (MRAM) cell 880 for the third alternative, two upper metal vias 10 may be provided to contact two respective ends of a top surface of its spin-accumulation induced layer 988 acting as its two respective nodes N81 and N82, wherein the two ends of the top surface of its spin-accumulation induced layer 988 are not vertically over its free magnetic layer 887 in the magnetoresistive layer 883 of the MRAM layer 879 of the semiconductor integrated-circuit (IC) chip 100. Its bottom electrode 881 may act as its node N83. Its spin-accumulation induced layer 988, i.e., spin-orbit-torque (SOT) layer, may be arranged in an upper one of the insulating dielectric layers 12 of the semiconductor integrated-circuit (IC) chip 100 and with a bottom surface in contact with a top surface of its free magnetic layer 887. For more elaboration, two of the metal vias 10 of an upper one of the interconnection metal layers 6 of the semiconductor integrated-circuit (IC) chip 100 each may have the adhesion layer 18 at a bottom thereof provided with a bottom surface in contact with one of its nodes N81 and N82, i.e., the two respective ends of the top surface of its spin-accumulation induced layer 988. The metal via 10 of a lower one of the interconnection metal layers 6 of the semiconductor integrated-circuit (IC) chip 100 may have the copper layer 24 provided with a top surface in contact with its node N83, i.e., a bottom surface of its bottom electrode 881. Each of its nodes N81 and N82 may couple to a transistor 4 of the semiconductor integrated-circuit (IC) chip 100 through, in sequence, one or more of the interconnection metal layers 6 of the semiconductor integrated-circuit (IC) chip 100, as seen in FIGS. 21A and 21B, over the MRAM layer 879 of the semiconductor integrated-circuit (IC) chip 100, a metal via of the MRAM layer 879 of the semiconductor integrated-circuit (IC) chip 100 and one or more of the interconnection metal layers 6 of the semiconductor integrated-circuit (IC) chip 100, as seen in FIGS. 21A and 21B, under the MRAM layer 879 of the semiconductor integrated-circuit (IC) chip 100. Its node N83 may couple to a transistor 4 of the semiconductor integrated-circuit (IC) chip 100 through one or more of the interconnection metal layers 6 of the semiconductor integrated-circuit (IC) chip 100, as seen in FIGS. 21A and 21B, under the MRAM layer 879 of the semiconductor integrated-circuit (IC) chip 100.

Referring to FIGS. 12A-12D, 12D-1 and 12D-2, in a setting step for one of the magnetoresistive random access memory (MRAM) cells 880 for the third alternative, in a case that its pinned magnetic layer 885 has domains each provided with a magnetic field or magnetization therein in a first direction, e.g., out of the paper, pinned by the antiferromagnetic layer 884, when a node N82 at a right side of the spin-accumulation induced layer 988 is switched to couple to a second setting voltage $V\mathbf{2}_{MSE}$ ranging from 0.25 to 3.3 volts, a node N81 at a left side of the spin-accumulation induced layer 988 is switched to couple to the voltage of ground reference and a node N83 coupling to its antiferromagnetic layer 884 is switched to be floating, electrons may flow or pass from the node N81 to the node N82, wherein the electrons with spin angular momentum in the first direction, e.g. out of the paper, may be deflected downwards to a bottom side of the spin-accumulation induced layer 988, i.e., spin-orbit-torque layer, by spin orbital interaction. The spin angular momentum of the electrons in the first direction at the bottom side of the spin-accumulation induced layer 988, i.e., spin-orbit-torque layer, may induce a magnetic field in the first direction in its free magnetic layer 887 to change a magnetic field or magnetization in each domain of its free magnetic layer 887 to the first direction, e.g., out of the paper, to be substantially in parallel to and in the same direction as the magnetic field or magnetization in each domain of its pined magnetic layer 885. In other words, spin accumulation of electrons may be induced at the bottom side of the spin-accumulation induced layer 988 by an electron current passing from the node N81 to the node N82 to change the magnetic field or magnetization in each domain of its free magnetic layer 887 to the first direction, e.g., out of the paper, to be substantially in parallel to and in the same direction as the magnetic field or magnetization in each domain of its pined magnetic layer 885. Thus, said one of the magnetoresistive random access memory (MRAM) cells 880 may be set to a low resistance between 10 and 100,000,000,000 ohms. In a resetting step for said one of the magnetoresistive random access memory (MRAM) cells 880 for the third alternative, when the node N81 is switched to couple to a second resetting voltage $V\mathbf{2}_{MRE}$ ranging from 0.25 to 3.3 volts, wherein the second resetting voltage $V\mathbf{2}_{MRE}$ may be substantially equal to the second setting voltage $V\mathbf{2}_{MSE}$, the node N82 is switched to couple to the voltage of ground reference and the node N83 is switched to be floating, electrons may flow or pass from the node N82 to the node N81, wherein the electrons with spin angular momentum in a second direction, e.g. into the paper, may be deflected downwards to the bottom side of the spin-accumulation induced layer 988, i.e., spin-orbit-torque layer, by spin orbital interaction. The spin angular momentum of the electrons in the second direction at the bottom side of the spin-accumulation induced layer 988, i.e., spin-orbit-torque layer, may induce a magnetic field in the second direction in its free magnetic layer 887 to change a magnetic field or magnetization in each domain of its free magnetic layer 887 to the second direction, e.g., into the paper, to be opposite to the magnetic field or magnetization in each domain of its pined magnetic layer 885. In other words, spin accumulation of electrons may be induced at the bottom side of the spin-accumulation induced layer 988 by an electron current passing from the node N82 to the node N81 to change the magnetic field or magnetization in each domain of its free magnetic layer 887 to the second direction, e.g., into the paper, to be opposite to the magnetic field or magnetization in each domain of its pined magnetic layer 885. Thus, said one of the magnetoresistive random access memory (MRAM) cells 880 for the third alternative may be reset to a high resistance between 15 and 500,000,000,000 ohms greater than the low resistance, wherein the high resistance may be equal to between 1.5 and 10 times of the low resistance.

Figure 12E:
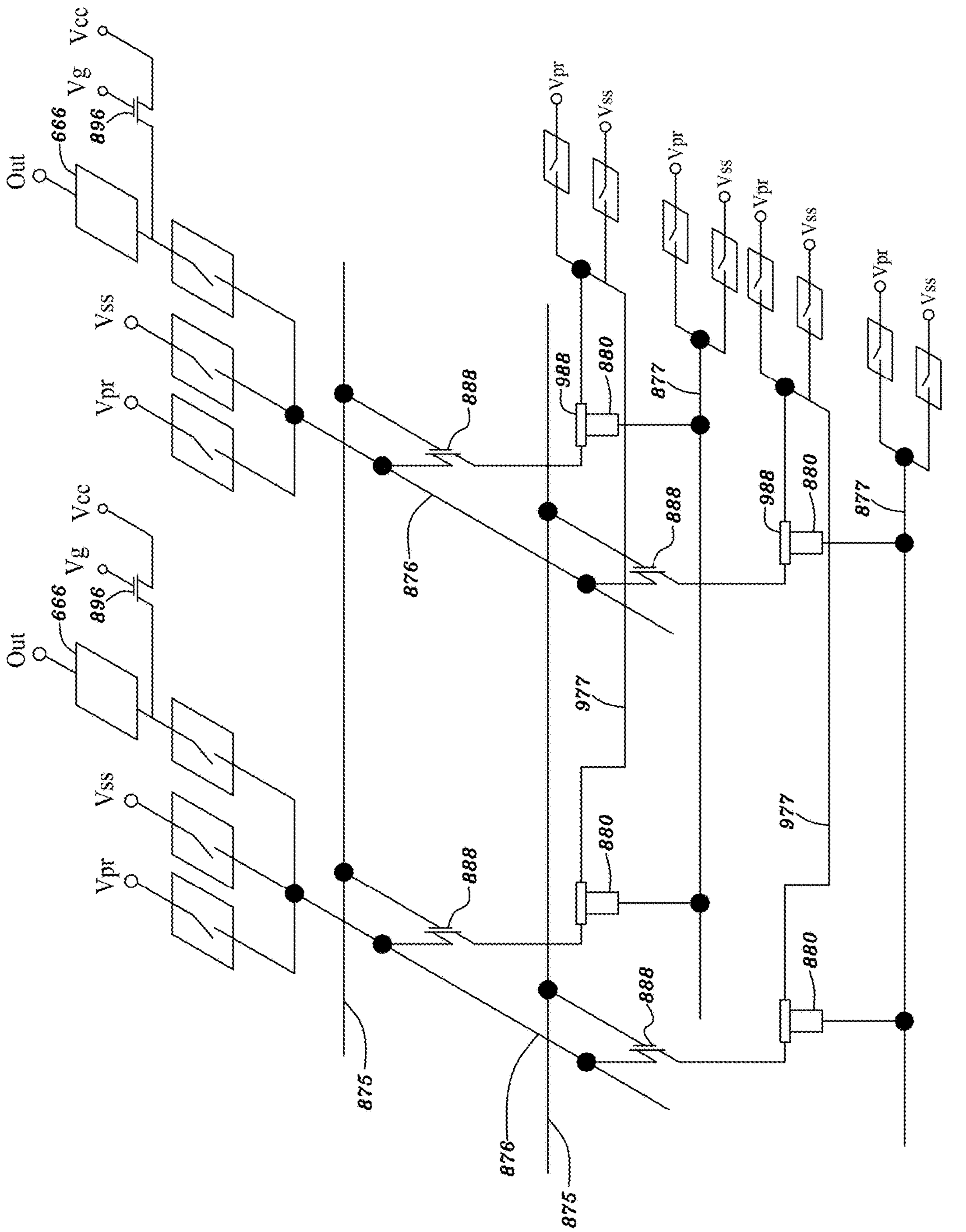
FIG. 12E is a circuit diagram showing an array of non-volatile memory cells for spin-orbit-torque (SOT) based magnetoresistive random access memory (MRAM) cells for a third alternative operating with transistors in accordance with an embodiment of the present application.

FIG. 12E is a circuit diagram showing an array of non-volatile memory cells for spin-orbit-torque (SOT) based magnetoresistive random access memory (MRAM) cells for a third alternative operating with transistors in accordance with an embodiment of the present application. Referring to FIG. 12E, multiple of the magnetoresistive random access memory (MRAM) cells 880 for the third alternative are formed in an array in the MRAM layer 879 as seen in FIG. 12A-12C. Multiple of the switches 888, e.g., N-type MOS transistors, are arranged in an array. Alternatively, each of the switches 888 may be a P-type MOS transistor.

Referring to FIGS. 12A-12E, each of the N-type MOS transistors 888 is configured to form a channel with two opposite terminals, one of which couples in series to a first end of the spin-accumulation induced layer 988 on the top of one of the magnetoresistive random access memory (MRAM) cells 880 for the third alternative, i.e., the node N81, and the other of which couples to one of bit lines 876, and has a gate terminal coupling to one of word lines 875. Each of programming lines 977 may couple to second ends of the spin-accumulation induced layers 988 respectively on the tops of the magnetoresistive random access memory (MRAM) cells 880 for the third alternative arranged in a row, i.e., the respective nodes N82. Each of reference lines 877 may couple to the bottom electrodes 881 of the magnetoresistive random access memory (MRAM) cells 880 for the third alternative arranged in a row, i.e., the respective nodes N83. Each of the word lines 875 may couple to the gate terminals of the N-type or P-type MOS transistors 888 arranged in a row that couple in parallel to one another through said each of the word lines 875. Each of the bit lines

876 is configured to couple, one by one and in turn, to the first end of the spin-accumulation induced layer 988 on the top of each of the magnetoresistive random access memory (MRAM) cells 880 for the third alternative arranged in a column, i.e., the node N81, through one of the N-type or P-type MOS transistors 888 arranged in a column.

Referring to FIG. 12E, for programming each of the magnetoresistive random access memory (MRAM) cells 880 for the third alternative as illustrated in FIGS. 12A-12D, in a case that its pinned magnetic layer 885 may have domains each provided with a magnetic field or magnetization in the first direction, e.g., out of the paper, pinned by its antiferromagnetic layer 884, a resetting step may be first performed to all of the magnetoresistive random access memory (MRAM) cells 880 for the third alternative, in which (1) each of the bit lines 876 may be switched to couple to a programming voltage $V_{Pr}$, between 0.25 and 3.3 volts, equal to or greater than the second resetting voltage V2 of the magnetoresistive random access memory (MRAM) cells 880 for the third alternative, (2) each of the programming lines 977 may be switched to couple to the voltage Vss of ground reference, (3) each of the word lines 875 may be switched to couple to the programming voltage $V_{Pr}$ to turn on each of the N-type MOS transistors 888 to couple the spin-accumulation induced layer 988 on the top of each of the magnetoresistive random access memory (MRAM) cells 880 for the third alternative to one of the bit lines 876 and (4) each of the reference lines 877 may be switched to be floating. Alternatively, when each of the switches 888 is a P-type MOS transistor, all of the word lines 875 may be switched to couple to the voltage Vss of ground reference to turn on each of the P-type MOS transistors 888 to couple the spin-accumulation induced layer 988 on the top of each of the magnetoresistive random access memory (MRAM) cells 880 for the third alternative to one of the bit lines 876. Thereby, electrons may flow or pass from one of the programming lines 977 to one of the bit lines 876, wherein the electrons with spin angular momentum in the second direction, e.g. into the paper, may be deflected downwards to a bottom side of the spin-accumulation induced layer 988, i.e., spin-orbit-torque layer, by spin orbital interaction. The spin angular momentum of the electrons in the second direction at the bottom side of the spin-accumulation induced layer 988, i.e., spin-orbit-torque layer, on the top of each of the magnetoresistive random access memory (MRAM) cells 880 for the third alternative may induce a magnetic field in the second direction in the free magnetic layer 887 of said each of the magnetoresistive random access memory (MRAM) cells 880 for the third alternative to change a magnetic field or magnetization in each domain of the free magnetic layer 887 of said each of the magnetoresistive random access memory (MRAM) cells 880 for the third alternative to the second direction, e.g., into the paper, to be opposite to the magnetic field or magnetization in each domain of the pined magnetic layer 885 of said each of the magnetoresistive random access memory (MRAM) cells 880 for the third alternative. In other words, spin accumulation of electrons may be induced at the bottom side of the spin-accumulation induced layer 988 on the top of said each of the magnetoresistive random access memory (MRAM) cells 880 for the third alternative by an electron current passing from said one of the programming lines 977 to said one of the bit lines 876 to change the magnetic field or magnetization in each domain of the free magnetic layer 887 of said each of the magnetoresistive random access memory (MRAM) cells 880 for the third alternative to the second direction, e.g., into the paper, to be opposite to the magnetic field or magnetization in each domain of the pined magnetic layer 885 of said each of the magnetoresistive random access memory (MRAM) cells 880 for the third alternative. Thus, said each of the magnetoresistive random access memory (MRAM) cells 880 for the third alternative may be reset with the high resistance between 15 and 500,000,000,000 ohms in the resetting step, and thus programmed to a logic level of "1".

Next, referring to FIG. 12E, a setting step may be performed, one row by one row and in turn, to a first group of the magnetoresistive random access memory (MRAM) cells 880 for the third alternative as illustrated in FIGS. 12A-12D but not to a second group of the magnetoresistive random access memory (MRAM) cells 880 for the third alternative as illustrated in FIGS. 12A-12D, in which, (1) each of the word lines 875 corresponding to the magnetoresistive random access memory (MRAM) cells 880 for the third alternative in a row may be selected one by one and in turn to be switched to couple to the programming voltage $V_{Pr}$ to turn on the N-type MOS transistors 888 in a row to couple the spin-accumulation induced layer 988 on the top of each of the magnetoresistive random access memory (MRAM) cells 880 for the third alternative in the row to one of the bit lines 876, wherein the unselected word lines 875 corresponding to the magnetoresistive random access memory (MRAM) cells 880 for the third alternative in the other rows may be switched to couple to the voltage Vss of ground reference to turn off the N-type MOS transistors 888 in the other rows to decouple the spin-accumulation induced layer 988 on the top of each of the magnetoresistive random access memory (MRAM) cells 880 for the third alternative in the other rows from any of the bit lines 876, wherein the programming voltage $V_{Pr}$ may be between 0.25 and 3.3 volts, equal to or greater than the second setting voltage $V2_{MSE}$ of the magnetoresistive random access memory (MRAM) cells 880 for the third alternative, (2) each of the reference lines 877 may be switched to be floating, (3) each of the programming lines 877 may be switched to couple to the programming voltage $V_{Pr}$, (4) the bit lines 876 in a first group each for one of the magnetoresistive random access memory (MRAM) cells 880 for the third alternative in the first group in the row may be switched to couple to the voltage Vss of ground reference, and (5) the bit lines 876 in a second group each for one of the magnetoresistive random access memory (MRAM) cells 880 for the third alternative in the second group in the row may be switched to couple to the programming voltage $V_{Pr}$. Alternatively, when each of the switches 888 is a P-type MOS transistor, each of the word lines 875 corresponding to the magnetoresistive random access memory (MRAM) cells 880 for the third alternative in the row may be selected one by one and in turn to be switched to couple to the voltage Vss of ground reference to turn on the P-type MOS transistors 888 in the row to couple the spin-accumulation induced layer 988 on the top of each of the magnetoresistive random access memory (MRAM) cells 880 for the third alternative in the row to one of the bit lines 876, wherein the unselected word lines 875 corresponding to the magnetoresistive random access memory (MRAM) cells 880 for the third alternative in the other rows may be switched to couple to the programming voltage $V_{Pr}$ to turn off the P-type MOS transistors 888 in the other rows to decouple the spin-accumulation induced layer 988 on the top of each of the magnetoresistive random access memory (MRAM) cells 880 for the third alternative in the other rows from any of the bit lines 876. Thereby, electrons may flow or pass from one of the bit lines 876 to one of the programming lines 977, wherein the electrons with spin angular momentum in the first direction, e.g. out of the paper, may be deflected downwards to the bottom side of the spin-accumulation induced layer 988, i.e., spin-orbit-torque layer, on the top of each of the magnetoresistive random access memory (MRAM) cells 880 for the third alternative in the first group in the row by spin orbital interaction. The spin angular momentum of the electrons in the first direction at the bottom side of the spin-accumulation induced layer 988, i.e., spin-orbit-torque layer, may induce a magnetic field in the first direction in the free magnetic layer 887 of said each of the magnetoresistive random access memory (MRAM) cells 880 for the third alternative in the first group in the row to change a magnetic field or magnetization in each domain of the free magnetic layer 887 of said each of the magnetoresistive random access memory (MRAM) cells 880 for the third alternative in the first group in the row to the first direction, e.g., out of the paper, to be substantially in parallel to and in the same direction as the magnetic field or magnetization in each domain of the pined magnetic layer 885 of said each of the magnetoresistive random access memory (MRAM) cells 880 for the third alternative in the first group in the row. In other words, spin accumulation of electrons may be induced at the bottom side of the spin-accumulation induced layer 988 on the top of said each of the magnetoresistive random access memory (MRAM) cells 880 for the third alternative in the first group in the row by an electron current passing from said one of the bit lines 876 to said one of the programming lines 977 to change the magnetic field or magnetization in each domain of the free magnetic layer 887 of said each of the magnetoresistive random access memory (MRAM) cells 880 for the third alternative in the first group in the row to the first direction, e.g., out of the paper, to be substantially in parallel to and in the same direction as the magnetic field or magnetization in each domain of the pined magnetic layer 885 of said each of the magnetoresistive random access memory (MRAM) cells 880 for the third alternative in the first group in the row. Thus, said each of the magnetoresistive random access memory (MRAM) cells 880 for the third alternative in the first group may be set to the low resistance between 10 and 100,000,000,000 ohms in the setting step, and thus programmed to a logic level of "0". Each of the magnetoresistive random access memory (MRAM) cells 880 for the third alternative in the second group may be kept in the previous state.

In operation, referring to FIGS. 8F and 12E, (1) each of the bit lines 876 may be switched to couple to the node N31 of the sense amplifier 666 as illustrated in FIG. 8F and to the source terminal of the N-type MOS transistor 896, (2) each of the reference lines 877 may be switched to couple to the voltage Vss of ground reference, and (3) each of the word lines 875 corresponding to the magnetoresistive random access memory (MRAM) cells 880 for the third alternative in a row may be selected one by one and in turn to be switched to couple to the voltage Vcc of power supply to turn on the N-type MOS transistors 888 in a row to couple each of the magnetoresistive random access memory (MRAM) cells 880 for the third alternative in the row to one of the bit lines 876, wherein the unselected word lines 875 corresponding to the magnetoresistive random access memory (MRAM) cells 880 for the third alternative in the other rows may be switched to couple to the voltage Vss of ground reference to turn off the N-type MOS transistors 888 in the other rows to decouple each of the magnetoresistive random access memory (MRAM) cells 880 for the third alternative in the other rows from any of the bit lines 876. The N-type MOS transistor 896 may have a gate terminal coupling to a voltage Vg and a drain terminal coupling to the voltage Vcc of power supply. The N-type MOS transistor 896 may be considered as a current source. In operation, the voltage Vg may be applied to the gate of the N-type MOS transistor 896 to control an electric current at a substantially constant level passing through the N-type MOS transistor 896. Alternatively, when each of the switches 888 is a P-type MOS transistor, each of the word lines 875 corresponding to the magnetoresistive random access memory (MRAM) cells 880 for the third alternative in the row may be selected one by one and in turn to be switched to couple to the voltage Vss of ground reference to turn on the P-type MOS transistors 888 in the row to couple each of the magnetoresistive random access memory (MRAM) cells 880 for the third alternative in the row to one of the bit lines 876, wherein the unselected word lines 875 corresponding to the magnetoresistive random access memory (MRAM) cells 880 for the third alternative in the other rows may be switched to couple to the voltage Vcc of power supply to turn off the P-type MOS transistors 888 in the other rows to decouple each of the magnetoresistive random access memory (MRAM) cells 880 for the third alternative in the other rows from any of the bit lines 876. Thereby, each of the sense amplifiers 666 may compare a voltage at one of the bit lines 876, i.e., at the node N31 as seen in FIG. 8F, and a voltage at a comparison line, i.e., at the node N32 as seen in FIG. 8F, into a compared data and then generate an output "Out" of one of the magnetoresistive random access memory (MRAM) cells 880 for the third alternative coupling to said one of the bit lines 876 via one of the switches 888 based on the compared data. For example, when the voltage at the node N31 is compared by said each of the sense amplifiers 666 to be smaller than the voltage at the node N32, said each of the sense amplifiers 666 may generate the output "Out" at a logic level of "1" in the case that one of the magnetoresistive random access memory (MRAM) cells 880 for the third alternative, which couples to said each of the sense amplifiers 666, has the low resistance. When the voltage at the node N31 is compared by said each of the sense amplifiers 666 to be greater than the voltage at the node N32, said each of the sense amplifiers 666 may generate the output "Out" at a logic level of "0" in the case that one of the magnetoresistive random access memory (MRAM) cells 880 for the third alternative, which couples to said each of the sense amplifiers 666, has the high resistance.

(2.4) Second Type of Non-Volatile Memory Cell for the Fourth Alternative

Figure 12F:
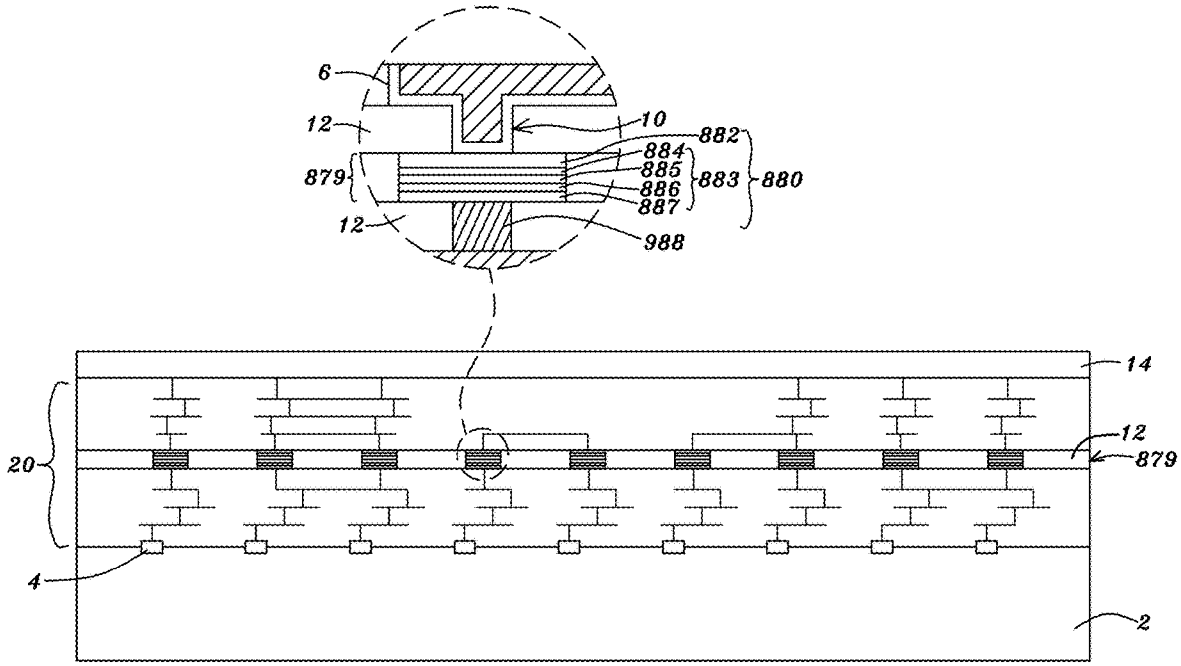
FIGS. 12F-12H are schematically cross-sectional views showing a spin-orbit-torque (SOT) based magnetoresistive random access memory (MRAM) cell for a fourth alternative in accordance with an embodiment of the present application.
Figure 12G:
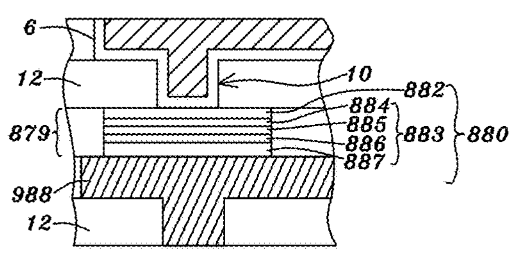
Figure 12H:
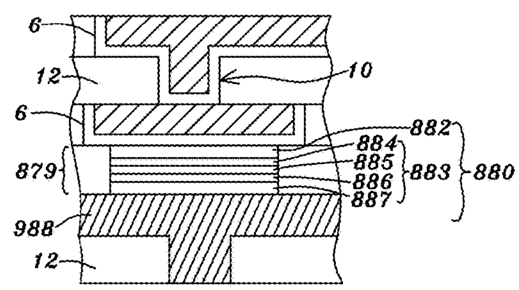

For a fourth alternative, FIGS. 12F-12H are schematically cross-sectional views showing a spin-orbit-torque (SOT) based magnetoresistive random access memory (MRAM) cell for a fourth alternative in accordance with an embodiment of the present application. The scheme of the semiconductor chip as illustrated in FIGS. 12F-12H is similar to that as illustrated in FIG. 11F except for the composition of the MRAM layer 879 and a spin-accumulation induced layer 988, i.e., spin-orbit-torque (SOT) layer, further provided under and in contact with the free magnetic layer 887 of the magnetoresistive layer 883 of the MRAM layer 879. For an spin-orbit-torque (SOT) based magnetoresistive random access memory (MRAM) cell 880 for a fourth alternative, its spin-accumulation induced layer 988, i.e., spin-orbit-torque (SOT) layer, may provide spin orbit torque (SOT) via the spin Hall effect (one of the anomalous Hall effects) and may simultaneously be configured to provide a magnetic bias field on its free magnetic layer 887 in the magnetoresistive layer 883 of the MRAM layer 879 of the semiconductor integrated-circuit (IC) chip 100. The spin Hall effect is a transport phenomenon consisting of the appearance of spin accumulation at opposing top and bottom surface boundaries of its spin-accumulation induced layer 988, i.e., spin-orbit-torque (SOT) layer, carrying electric current. The opposing top and bottom surface boundaries will have spins of opposite sign. No magnetic field is needed for the spin Hall effect which is a purely spin-based phenomenon. For an element indicated by the same reference number shown in FIGS. 11A-11C and 11F and 12F-12H, the specification of the element as seen in FIGS. 12F-12H may be referred to that of the element as illustrated in FIGS. 11A-11C and 11F. Referring to FIGS. 12F-12H, for the MRAM layer 879, the structure and specification for its magnetoresistive layer 883 as seen in FIGS. 12F-12H is the same as those as illustrated in FIG. 11F and may be referred to those as illustrated in FIG. 11F. Referring to FIGS. 12F-12H, the semiconductor integrated-circuit (IC) chip 100 may include the spin-accumulation induced layer 988, i.e., spin-orbit-torque (SOT) layer, such as platinum (Pt) layer, tantalum (Ta) layer, gold (Au) layer, tungsten (W) layer, palladium (Pd) layer or precious or heavy metal layer, having a thickness between 0.5 and 50 nanometers or between 0.5 and 10 nanometers in a lower one of the insulating dielectric layers 12 of the semiconductor integrated-circuit (IC) chip 100 as illustrated in FIGS. 21A and 21B. For the MRAM layer 879 of the semiconductor integrated-circuit (IC) chip 100, its bottom electrode 882 as seen in FIG. 11F may be skipped such that the spin-orbit-torque (SOT) based magnetoresistive random access memory (MRAM) cell 880 for the fourth alternative may have the free magnetic layer 887, which is in the magnetoresistive layer 883 of the MRAM layer 879 of the semiconductor integrated-circuit (IC) chip 100 as seen in FIGS. 12A-12C, formed on the spin-accumulation induced layer 988 thereof.

Referring to FIG. 12F, for each of the magnetoresistive random access memory (MRAM) cells 880 for the fourth alternative, its free magnetic layer 887 in the magnetoresistive layer 883 of the MRAM layer 879 of the semiconductor integrated-circuit (IC) chip 100 may be formed on a top surface of its spin-accumulation induced layer 988 in a lower one of the insulating dielectric layers 12 of the semiconductor integrated-circuit (IC) chip 100 as illustrated in FIGS. 21A and 21B and on a top surface of the lower one of the insulating dielectric layers 12 of the semiconductor integrated-circuit (IC) chip 100.

Alternatively, referring to FIGS. 12G and 12H, for each of the magnetoresistive random access memory (MRAM) cells 880 for the fourth alternative, its free magnetic layer 887 in the magnetoresistive layer 883 of the semiconductor integrated-circuit (IC) chip 100 may be formed on a top surface of its spin-accumulation induced layer 988 in a lower one of the insulating dielectric layers 12 of the semiconductor integrated-circuit (IC) chip 100 as illustrated in FIGS. 21A and 21B and the insulating dielectric layer 12 of the MRAM layer 879 of the semiconductor integrated-circuit (IC) chip 100 may be further formed on the top surface of its spin-accumulation induced layer 988.

Figure 12I:
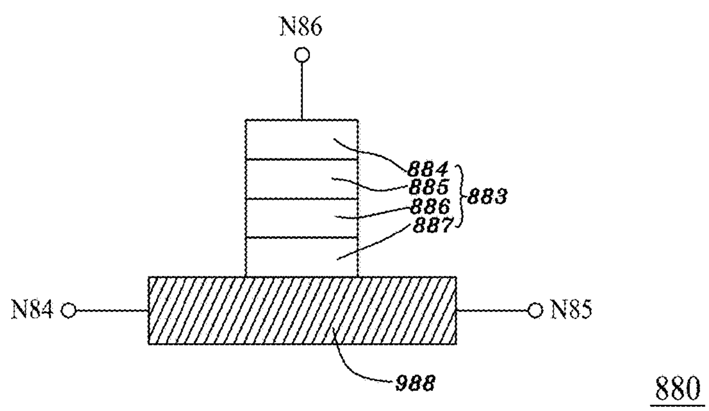
FIG. 12I is a simplified cross-sectional view illustrating a programming step for setting or resetting a spin-orbit-torque (SOT) based magnetoresistive random access memory (MRAM) cell for a fourth alternative in accordance with an embodiment of the present application.
Figures 1, 12I:
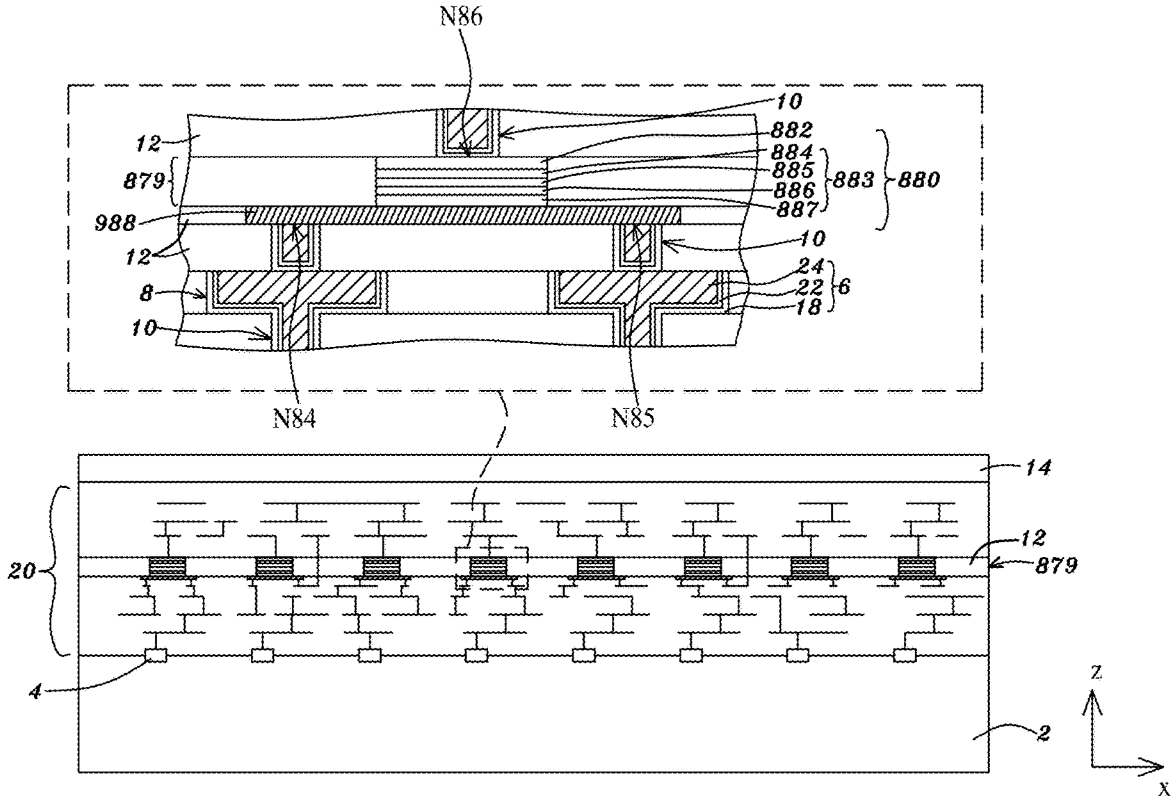
Figures 2, 12I:
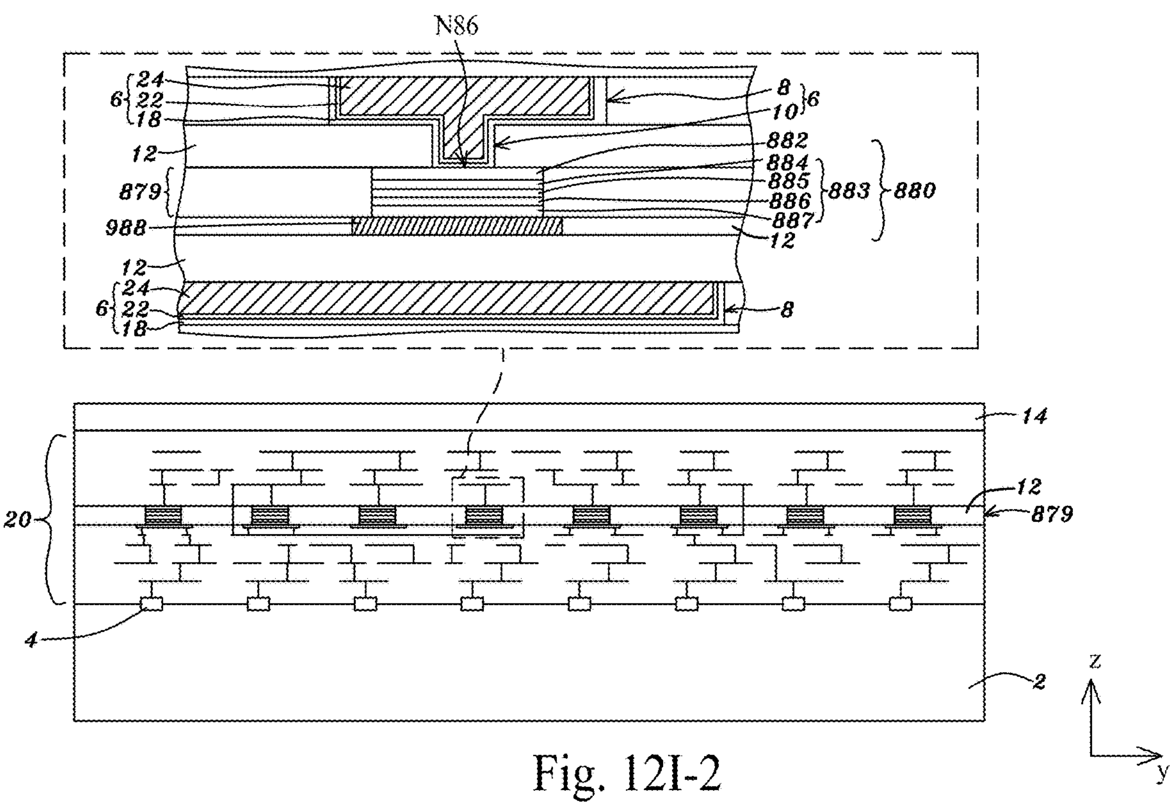

FIG. 12I is a simplified cross-sectional view illustrating a programming step for setting or resetting a spin-orbit-torque (SOT) based magnetoresistive random access memory (MRAM) cell for a fourth alternative in accordance with an embodiment of the present application. FIG. 12I-1 is a schematically cross-sectional view in an x-z plane showing spin-orbit-torque (SOT) based magnetoresistive random access memory (MRAM) cells for a fourth alternative in a semiconductor integrated-circuit (IC) chip in accordance with an embodiment of the present application, wherein an upper side of FIG. 12I-1 is a schematically enlarged cross-sectional view in an x-z plane showing a spin-orbit-torque (SOT) based magnetoresistive random access memory (MRAM) cells for a fourth alternative. FIG. 12I-2 is a schematically cross-sectional view in an y-z plane showing spin-orbit-torque (SOT) based magnetoresistive random access memory (MRAM) cells for a fourth alternative in a semiconductor integrated-circuit (IC) chip in accordance with an embodiment of the present application, wherein an upper side of FIG. 12I-2 is a schematically enlarged cross-sectional view in an y-z plane showing a spin-orbit-torque (SOT) based magnetoresistive random access memory (MRAM) cells for a fourth alternative. The scheme of the spin-orbit-torque (SOT) based magnetoresistive random access memory (MRAM) cells for the fourth alternative as illustrated in FIGS. 12I-1 and 12I-2 is similar to that as illustrated in FIG. 12G except that two lower metal vias 10 as illustrated in FIGS. 21A and 21B may be provided to contact two respective ends of a bottom surface of its spin-accumulation induced layer 988 acting as its two respective nodes N84 and N85, wherein the two ends of the bottom surface of its spin-accumulation induced layer 988 are not vertically under its free magnetic layer 887 in the magnetoresistive layer 883 of the MRAM layer 879 of the semiconductor integrated-circuit (IC) chip 100 and its top electrode 882 may act as its node N86. For an element indicated by the same reference number shown in FIGS. 11F and 12G, 12I, 12I-1 and 12I-1, the specification of the element as seen in FIGS. 12I, 12I-1 and 12I-2 may be referred to that of the element as illustrated in FIGS. 11F and 12G. Referring to FIGS. 12I, 12I-1 and 12I-2, for the spin-orbit-torque (SOT) based magnetoresistive random access memory (MRAM) cell 880 for the fourth alternative, its spin-accumulation induced layer 988, i.e., spin-orbit-torque (SOT) layer, may be arranged in a lower one of the insulating dielectric layers 12 of the semiconductor integrated-circuit (IC) chip 100 and with a top surface in contact with a bottom surface of its free magnetic layer 887. For more elaboration, two of the metal vias 10 of a lower one of the interconnection metal layers 6 of the semiconductor integrated-circuit (IC) chip 100 each may have the copper layer 24 provided with a top surface in contact with one of its nodes N84 and N85, i.e., the two respective ends of the bottom surface of its spin-accumulation induced layer 988. The metal via 10 of an upper one of the interconnection metal layers 6 of the semiconductor integrated-circuit (IC) chip 100 may have the adhesion layer 18 at a bottom thereof provided with a bottom surface in contact with its node N86 i.e., a top surface of its top electrode 882. Each of its nodes N84 and N85 may couple to a transistor 4 of the semiconductor integrated-circuit (IC) chip 100 through one or more of the interconnection metal layers 6 of the semiconductor integrated-circuit (IC) chip 100, as seen in FIGS. 21A and 21B, under the MRAM layer 879 of the semiconductor integrated-circuit (IC) chip 100. Its node N86 may couple to a transistor 4 of the semiconductor integrated-circuit (IC) chip 100 through, in sequence, one or more of the interconnection metal layers 6 of the semiconductor integrated-circuit (IC) chip 100, as seen in FIGS. 21A and 21B, over the MRAM layer 879 of the semiconductor integrated-circuit (IC) chip 100, a metal via of the MRAM layer 879 of the semiconductor integrated-circuit (IC) chip 100 and one or more of the interconnection metal layers 6 of the semiconductor integrated-circuit (IC) chip 100, as seen in FIGS. 21A and 21B, under the MRAM layer 879 of the semiconductor integrated-circuit (IC) chip 100.

Referring to FIGS. 12F-12I, 12I-1 and 12I-2, in a setting step for one of the magnetoresistive random access memory (MRAM) cells 880 for the fourth alternative, in a case that its pinned magnetic layer 885 has domains each provided with a magnetic field or magnetization therein in the first direction, e.g., out of the paper, pinned by the antiferromagnetic layer 884, when a node N84 at a left side of the spin-accumulation induced layer 988 is switched to couple to the second setting voltage $V2_{MSE}$, a node N85 at a right side of the spin-accumulation induced layer 988 is switched to couple to the voltage of ground reference and a node N86 coupling to its antiferromagnetic layer 884 is switched to be floating, electrons may flow or pass from the node N85 to the node N84, wherein the electrons with spin angular momentum in the first direction, e.g. out of the paper, may be deflected upwards to a top side of the spin-accumulation induced layer 988, i.e., spin-orbit-torque layer, by spin orbital interaction. The spin angular momentum of the electrons in the first direction at the top side of the spin-accumulation induced layer 988, i.e., spin-orbit-torque layer, may induce a magnetic field in the first direction in its free magnetic layer 887 to change a magnetic field or magnetization in each domain of its free magnetic layer 887 to the first direction, e.g., out of the paper, to be substantially in parallel to and in the same direction as the magnetic field or magnetization in each domain of its pined magnetic layer 885. In other words, spin accumulation of electrons may be induced at the top side of the spin-accumulation induced layer 988 by an electron current passing from the node N85 to the node N84 to change the magnetic field or magnetization in each domain of its free magnetic layer 887 to the first direction, e.g., out of the paper, to be substantially in parallel to and in the same direction as the magnetic field in each domain of its pined magnetic layer 885. Thus, said one of the magnetoresistive random access memory (MRAM) cells 880 for the fourth alternative may be set to a low resistance between 10 and 100,000,000,000 ohms. In a resetting step for said one of the magnetoresistive random access memory (MRAM) cells 880 for the fourth alternative, when the node N85 is switched to couple to the second resetting voltage V2, the node N84 is switched to couple to the voltage of ground reference and the node N86 is switched to be floating, electrons may flow or pass from the node N84 to the node N85, wherein the electrons with spin angular momentum in the second direction, e.g. into the paper, may be deflected upwards to the top side of the spin-accumulation induced layer 988, i.e., spin-orbit-torque layer, by spin orbital interaction. The spin angular momentum of the electrons in the second direction at the top side of the spin-accumulation induced layer 988, i.e., spin-orbit-torque layer, may induce a magnetic field in the second direction in its free magnetic layer 887 to change a magnetic field or magnetization in each domain of its free magnetic layer 887 to the second direction, e.g., into the paper, to be opposite to the magnetic field or magnetization in each domain of its pined magnetic layer 885. In other words, spin accumulation of electrons may be induced at the top side of the spin-accumulation induced layer 988 by an electron current passing from the node N84 to the node N85 to change the magnetic field or magnetization in each domain of its free magnetic layer 887 to the second direction, e.g., into the paper, to be opposite to the magnetic field or magnetization in each domain of its pined magnetic layer 885. Thus, said one of the magnetoresistive random access memory (MRAM) cells 880 for the fourth alternative may be reset to a high resistance between 15 and 500,000,000,000 ohms greater than the low resistance, wherein the high resistance may be equal to between 1.5 and 10 times of the low resistance.

Figure 12J:
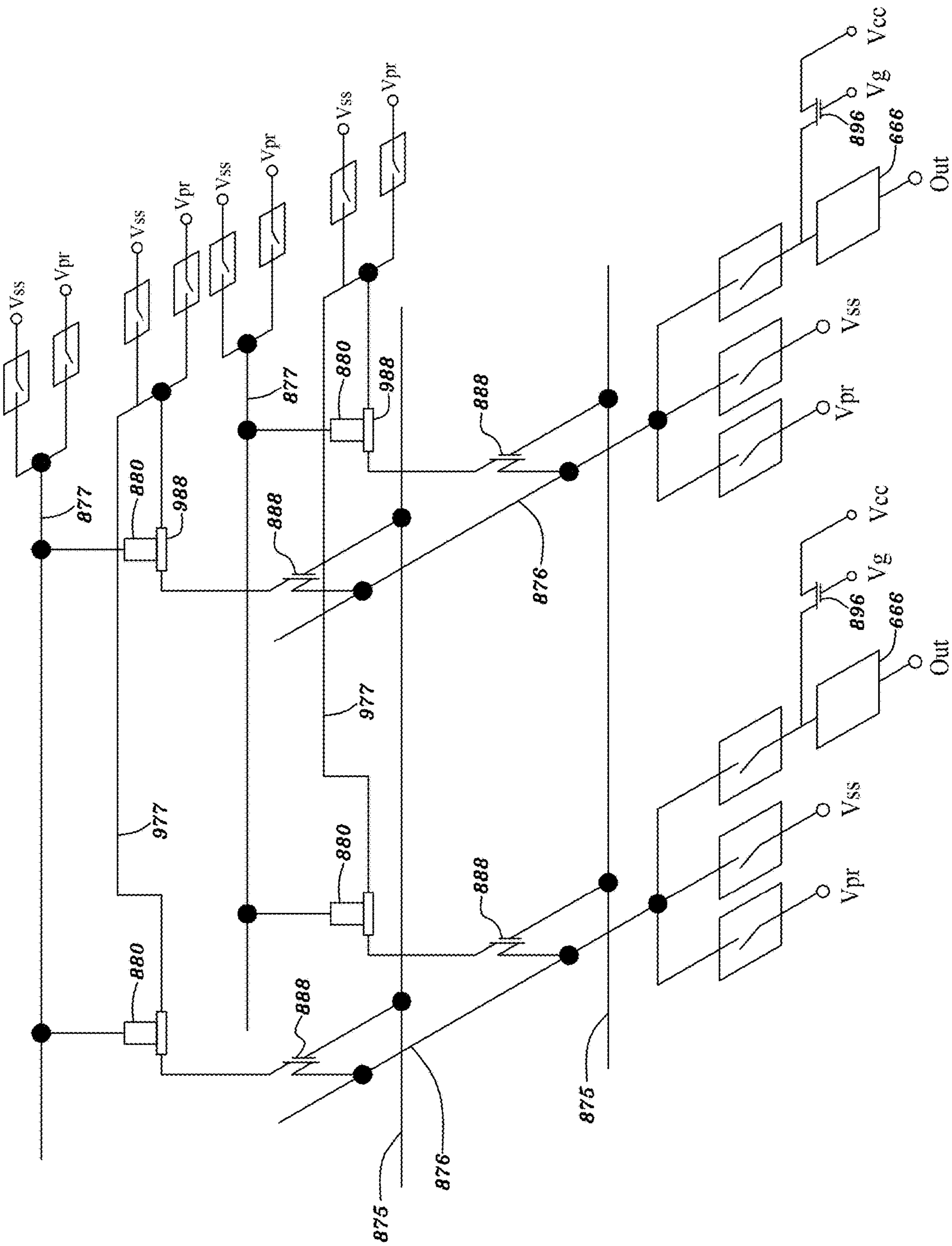
FIG. 12J is a circuit diagram showing an array of non-volatile memory cells for spin-orbit-torque (SOT) based magnetoresistive random access memory (MRAM) cells for a fourth alternative operating with transistors in accordance with an embodiment of the present application.

FIG. 12J is a circuit diagram showing an array of non-volatile memory cells for spin-orbit-torque (SOT) based magnetoresistive random access memory (MRAM) cells for a fourth alternative operating with transistors in accordance with an embodiment of the present application. Referring to FIG. 12J, multiple of the magnetoresistive random access memory (MRAM) cells 880 for the fourth alternative are formed in an array in the MRAM layer 879 as seen in FIG. 12F-12H. Multiple of the switches 888, e.g., N-type MOS transistors, are arranged in an array. Alternatively, each of the switches 888 may be a P-type MOS transistor.

Referring to FIGS. 12F-12J, each of the N-type MOS transistors 888 is configured to form a channel with two opposite terminals, one of which couples in series to a first end of the spin-accumulation induced layer 988 at the bottom of one of the magnetoresistive random access memory (MRAM) cells 880 for the fourth alternative, i.e., the node N84, and the other of which couples to one of bit lines 876, and has a gate terminal coupling to one of word lines 875. Each of programming lines 977 may couple to second ends of the spin-accumulation induced layers 988 respectively at the bottoms of the magnetoresistive random access memory (MRAM) cells 880 for the fourth alternative arranged in a row, i.e., the respective nodes N85. Each of reference lines 877 may couple to the top electrodes 882 of the magnetoresistive random access memory (MRAM) cells 880 for the fourth alternative arranged in a row, i.e., the respective nodes N83. Each of the word lines 875 may couple to the gate terminals of the N-type or P-type MOS transistors 888 arranged in a row that couple in parallel to one another through said each of the word lines 875. Each of the bit lines 876 is configured to couple, one by one and in turn, to the first end of the spin-accumulation induced layer 988 at the bottom of each of the magnetoresistive random access memory (MRAM) cells 880 for the fourth alternative arranged in a column, i.e., the node N84, through one of the N-type or P-type MOS transistors 888 arranged in a column.

Referring to FIG. 12J, for programming each of the magnetoresistive random access memory (MRAM) cells 880 for the fourth alternative as illustrated in FIGS. 12F-12I, in a case that its pinned magnetic layer 885 may have domains each provided with a magnetic field or magnetization in the first direction, e.g., out of the paper, pinned by its antiferromagnetic layer 884 for the fourth alternative, a resetting step may be first performed to all of the magnetoresistive random access memory (MRAM) cells 880 for the fourth alternative, in which (1) each of the bit lines 876 may be switched to couple to the voltage Vss of ground reference, (2) each of the programming lines 977 may be switched to couple to a programming voltage $V_{Pr}$, between 0.25 and 3.3 volts, equal to or greater than the second resetting voltage V2 of the magnetoresistive random access memory (MRAM) cells 880 for the fourth alternative, (3) each of the word lines 875 may be switched to couple to the programming voltage $V_{Pr}$ to turn on each of the N-type MOS transistors 888 to couple the spin-accumulation induced layer 988 at the bottom of each of the magnetoresistive random access memory (MRAM) cells 880 for the fourth alternative to one of the bit lines 876 and (4) each of the reference lines 877 may be switched to be floating. Alternatively, when each of the switches 888 is a P-type MOS transistor, all of the word lines 875 may be switched to couple to the voltage Vss of ground reference to turn on each of the P-type MOS transistors 888 to couple the spin-accumulation induced layer 988 at the bottom of each of the magnetoresistive random access memory (MRAM) cells 880 for the fourth alternative to one of the bit lines 876. Thereby, electrons may flow or pass from one of the bit lines 876 to one of the programming lines 977, wherein the electrons with spin angular momentum in the second direction, e.g. into the paper, may be deflected upwards to a top side of the spin-accumulation induced layer 988, i.e., spin-orbit-torque layer, by spin orbital interaction. The spin angular momentum of the electrons in the second direction at the top side of the spin-accumulation induced layer 988, i.e., spin-orbit-torque layer, at the bottom of each of the magnetoresistive random access memory (MRAM) cells 880 for the fourth alternative may induce a magnetic field in the second direction in the free magnetic layer 887 of said each of the magnetoresistive random access memory (MRAM) cells 880 for the fourth alternative to change a magnetic field or magnetization in each domain of the free magnetic layer 887 of said each of the magnetoresistive random access memory (MRAM) cells 880 for the fourth alternative to the second direction, e.g., into the paper, to be opposite to the magnetic field or magnetization in each domain of the pined magnetic layer 885 of said each of the magnetoresistive random access memory (MRAM) cells 880 for the fourth alternative. In other words, spin accumulation of electrons may be induced at the top side of the spin-accumulation induced layer 988 at the bottom of said each of the magnetoresistive random access memory (MRAM) cells 880 for the fourth alternative by an electron current passing from said one of the bit lines 876 to said one of the programming lines 977 to change the magnetic field or magnetization in each domain of the free magnetic layer 887 of said each of the magnetoresistive random access memory (MRAM) cells 880 for the fourth alternative to the second direction, e.g., into the paper, to be opposite to the magnetic field or magnetization in each domain of the pined magnetic layer 885 of said each of the magnetoresistive random access memory (MRAM) cells 880 for the fourth alternative. Thus, said each of the magnetoresistive random access memory (MRAM) cells 880 for the fourth alternative may be reset with the high resistance between 15 and 500,000,000,000 ohms in the resetting step, and thus programmed to a logic level of “1”.

Next, referring to FIG. 12J, a setting step may be performed, one row by one row and in turn, to a first group of the magnetoresistive random access memory (MRAM) cells 880 for the fourth alternative as illustrated in FIGS. 12F-12I but not to a second group of the magnetoresistive random access memory (MRAM) cells 880 for the fourth alternative as illustrated in FIGS. 12F-12I, in which, (1) each of the word lines 875 corresponding to the magnetoresistive random access memory (MRAM) cells 880 for the fourth alternative in a row may be selected one by one and in turn to be switched to couple to the programming voltage $V_{Pr}$ to turn on the N-type MOS transistors 888 in a row to couple the spin-accumulation induced layer 988 at the bottom of each of the magnetoresistive random access memory (MRAM) cells 880 for the fourth alternative in the row to one of the bit lines 876, wherein the unselected word lines 875 corresponding to the magnetoresistive random access memory (MRAM) cells 880 for the fourth alternative in the other rows may be switched to couple to the voltage Vss of ground reference to turn off the N-type MOS transistors 888 in the other rows to decouple the spin-accumulation induced layer 988 at the bottom of each of the magnetoresistive random access memory (MRAM) cells 880 for the fourth alternative in the other rows from any of the bit lines 876, wherein the programming voltage $V_{Pr}$ may be between 0.25 and 3.3 volts, equal to or greater than the second setting voltage $V2_{MSE}$ of the magnetoresistive random access memory (MRAM) cells 880 for the fourth alternative, (2) each of the reference lines 877 may be switched to be floating, (3) each of the programming lines 877 may be switched to couple to the voltage Vss of ground reference, (4) the bit lines 876 in a first group each for one of the magnetoresistive random access memory (MRAM) cells 880 for the fourth alternative in the first group in the row may be switched to couple to the programming voltage $V_{Pr}$, and (5) the bit lines 876 in a second group each for one of the magnetoresistive random access memory (MRAM) cells 880 for the fourth alternative in the second group in the row may be switched to couple to the voltage Vss of ground reference. Alternatively, when each of the switches 888 is a P-type MOS transistor, each of the word lines 875 corresponding to the magnetoresistive random access memory (MRAM) cells 880 for the fourth alternative in the row may be selected one by one and in turn to be switched to couple to the voltage Vss of ground reference to turn on the P-type MOS transistors 888 in the row to couple the spin-accumulation induced layer 988 at the bottom of each of the magnetoresistive random access memory (MRAM) cells 880 for the fourth alternative in the row to one of the bit lines 876, wherein the unselected word lines 875 corresponding to the magnetoresistive random access memory (MRAM) cells 880 for the fourth alternative in the other rows may be switched to couple to the programming voltage $V_{Pr}$ to turn off the P-type MOS transistors 888 in the other rows to decouple the spin-accumulation induced layer 988 at the bottom of each of the magnetoresistive random access memory (MRAM) cells 880 for the fourth alternative in the other rows from any of the bit lines 876. Thereby, electrons may flow or pass from one of the programming lines 977 to one of the bit lines 876, wherein the electrons with spin angular momentum in the first direction, e.g. out of the paper, may be deflected upwards to the top side of the spin-accumulation induced layer 988, i.e., spin-orbit-torque layer, at the bottom of each of the magnetoresistive random access memory (MRAM) cells 880 for the fourth alternative in the first group in the row by spin orbital interaction. The spin angular momentum of the electrons in the first direction at the top side of the spin-accumulation induced layer 988, i.e., spin-orbit-torque layer, may induce a magnetic field in the first direction in the free magnetic layer 887 of said each of the magnetoresistive random access memory (MRAM) cells 880 for the fourth alternative in the first group in the row to change a magnetic field or magnetization in each domain of the free magnetic layer 887 of said each of the magnetoresistive random access memory (MRAM) cells 880 for the fourth alternative in the first group in the row to the first direction, e.g., out of the paper, to be substantially in parallel to and in the same direction as the magnetic field or magnetization in each domain of the pined magnetic layer 885 of said each of the magnetoresistive random access memory (MRAM) cells 880 for the fourth alternative in the first group in the row. In other words, spin accumulation of electrons may be induced at the top side of the spin-accumulation induced layer 988 at the bottom of said each of the magnetoresistive random access memory (MRAM) cells 880 for the fourth alternative in the first group in the row by an electron current passing from one of the programming lines 977 to one of the bit lines 876 to change the magnetic field or magnetization in each domain of the free magnetic layer 887 of said each of the magnetoresistive random access memory (MRAM) cells 880 for the fourth alternative in the first group in the row to the first direction, e.g., out of the paper, to be substantially in parallel to and in the same direction as the magnetic field or magnetization in each domain of the pined magnetic layer 885 of said each of the magnetoresistive random access memory (MRAM) cells 880 for the fourth alternative in the first group in the row. Thus, said each of the magnetoresistive random access memory (MRAM) cells 880 for the fourth alternative in the first group may be set to the low resistance between 10 and 100,000,000,000 ohms in the setting step, and thus programmed to a logic level of "0". Each of the magnetoresistive random access memory (MRAM) cells 880 for the fourth alternative in the second group may be kept in the previous state.

In operation, referring to FIGS. 8F and 12J, (1) each of the bit lines 876 may be switched to couple to the node N31 of the sense amplifier 666 as illustrated in FIG. 8F and to the source terminal of the N-type MOS transistor 896, (2) each of the reference lines 877 may be switched to couple to the voltage Vss of ground reference, and (3) each of the word lines 875 corresponding to the magnetoresistive random access memory (MRAM) cells 880 for the fourth alternative in a row may be selected one by one and in turn to be switched to couple to the voltage Vcc of power supply to turn on the N-type MOS transistors 888 in a row to couple each of the magnetoresistive random access memory (MRAM) cells 880 for the fourth alternative in the row to one of the bit lines 876, wherein the unselected word lines 875 corresponding to the magnetoresistive random access memory (MRAM) cells 880 for the fourth alternative in the other rows may be switched to couple to the voltage Vss of ground reference to turn off the N-type MOS transistors 888 in the other rows to decouple each of the magnetoresistive random access memory (MRAM) cells 880 for the fourth alternative in the other rows from any of the bit lines 876. The N-type MOS transistor 896 may have a gate terminal coupling to a voltage Vg and a drain terminal coupling to the voltage Vcc of power supply. The N-type MOS transistor 896 may be considered as a current source. In operation, the voltage Vg may be applied to the gate of the N-type MOS transistor 896 to control an electric current at a substantially constant level passing through the N-type MOS transistor 896. Alternatively, when each of the switches 888 is a P-type MOS transistor, each of the word lines 875 corresponding to the magnetoresistive random access memory (MRAM) cells 880 for the fourth alternative in the row may be selected one by one and in turn to be switched to couple to the voltage Vss of ground reference to turn on the P-type MOS transistors 888 in the row to couple each of the magnetoresistive random access memory (MRAM) cells 880 for the fourth alternative in the row to one of the bit lines 876, wherein the unselected word lines 875 corresponding to the magnetoresistive random access memory (MRAM) cells 880 for the fourth alternative in the other rows may be switched to couple to the voltage Vcc of power supply to turn off the P-type MOS transistors 888 in the other rows to decouple each of the magnetoresistive random access memory (MRAM) cells 880 for the fourth alternative in the other rows from any of the bit lines 876. Thereby, each of the sense amplifiers 666 may compare a voltage at one of the bit lines 876, i.e., at the node N31 as seen in FIG. 8F, and a voltage at a comparison line, i.e., at the node N32 as seen in FIG. 8F, into a compared data and then generate an output "Out" of one of the magnetoresistive random access memory (MRAM) cells 880 for the fourth alternative coupling to said one of the bit lines 876 via one of the switches 888 based on the compared data. For example, when the voltage at the node N31 is compared by said each of the sense amplifiers 666 to be smaller than the voltage at the node N32, said each of the sense amplifiers 666 may generate the output "Out" at a logic level of "1" in the case that one of the magnetoresistive random access memory (MRAM) cells 880 for the fourth alternative, which couples to said each of the sense amplifiers 666, has the low resistance. When the voltage at the node N31 is compared by said each of the sense amplifiers 666 to be greater than the voltage at the node N32, said each of the sense amplifiers 666 may generate the output "Out" at a logic level of "0" in the case that one of the magnetoresistive random access memory (MRAM) cells 880 for the fourth alternative, which couples to said each of the sense amplifiers 666, has the high resistance.

Referring to FIGS. 12A-12J, the pinned magnetic layer 885 may have domains each provided with a magnetic field or magnetization in a direction pinned by the antiferromagnetic layer 884, that is, hardly changed by a spin-transfer torque induced by an electron flow passing through the pinned magnetic layer 885. The free magnetic layer 887 may have domains each provided with a magnetic field or magnetization in a direction easily changed by spin accumulation of electrons at a lateral side of the spin-accumulation induced layer 988 adjacent to the free magnetic layer 887, which is induced by an electron flow passing in the spin-accumulation induced layer 988 and across over the free magnetic layer 887 for the third alternative or under the free magnetic layer 887 for the fourth alternative.

Figure 13:
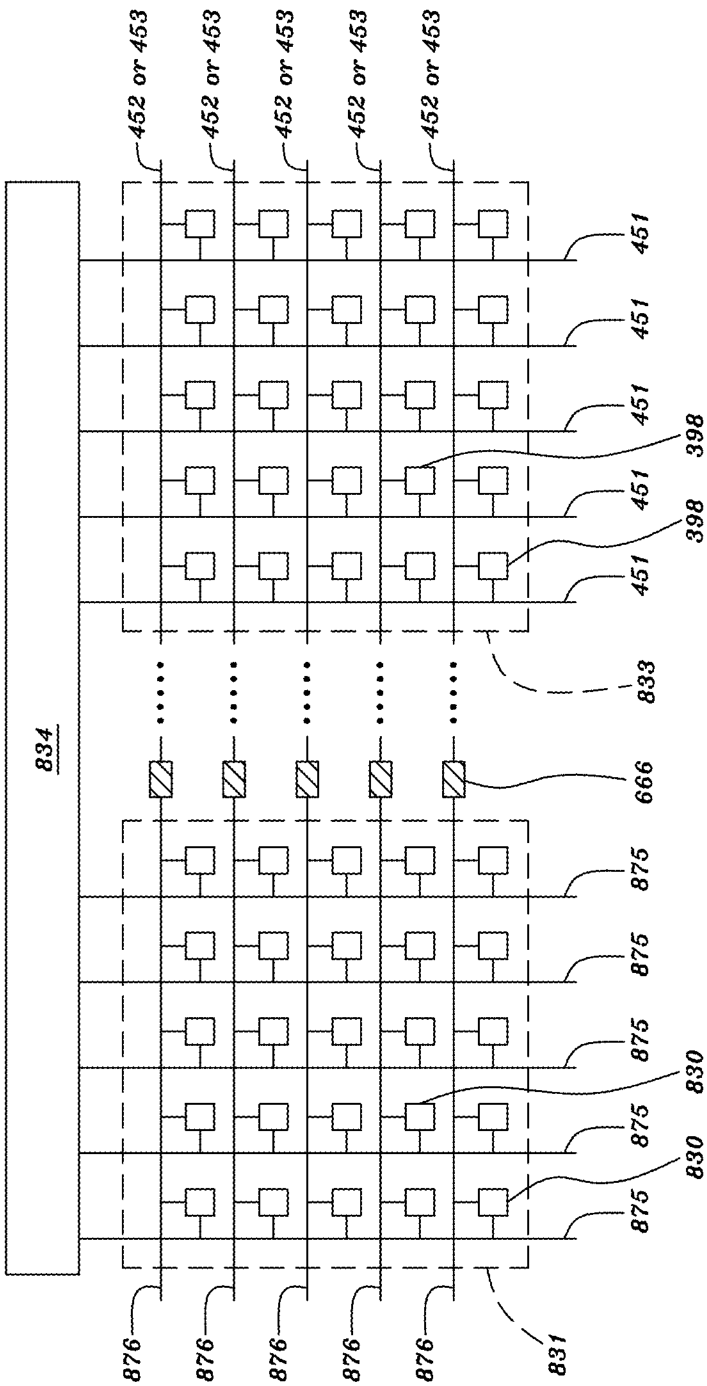
FIG. 13 is a schematic diagram illustrating a data loading scheme for loading data from an array of non-volatile memory cells to an array of static-random-access-memory (SRAM) cells in according with an embodiment of the present application.

Loading Data from Non-Volatile Memory Cells to Static-Random-Access-Memory (SRAM) Cells FIG. 13 is a schematic diagram illustrating a data loading scheme for loading data from an array of non-volatile memory cells to an array of static-random-access-memory (SRAM) cells in according with an embodiment of the present application. Referring to FIG. 13, multiple non-volatile storage units 830 may be arranged in an array 831, wherein for the first type of non-volatile memory cells for the first alternative, each of the non-volatile storage units 830 may include one of the resistive random access memory (RRAM) cells 870 and one of the switches 888 coupling in series to said one of the resistive random access memory (RRAM) cells 870 as illustrated in FIG. 8E, each of the word lines 875 as illustrated in FIG. 8E, i.e., non-programmable interconnects, may couple in parallel to the switches 888, i.e., the gate terminals of the N-type MOS transistors in the case that the switches 888 are the N-type MOS transistors or the gate terminals of the P-type MOS transistors in the case that the switches 888 are the P-type MOS transistors, of the non-volatile storage units 830 arranged in a column as seen in FIG. 13 and each of the bit lines 876 as illustrated in FIG. 8E, i.e., non-programmable interconnects, is configured to couple in parallel to the resistive random access memory (RRAM) cells 870 of the non-volatile storage units 830 arranged in a row as seen in FIG. 13 through the switches 888 of the non-volatile storage units 830 arranged in the row; for the first type of non-volatile memory cells for the second alternative, each of the non-volatile storage units 830 may include one of the resistive random access memory (RRAM) cells 870 and one of the selectors 889 coupling in series to said one of the resistive random access memory (RRAM) cells 870 as illustrated in FIG. 9A, each of the word lines 875 as illustrated in FIG. 9A, i.e., non-programmable interconnects, may couple in parallel to the resistive random access memory (RRAM) cells 870 of the non-volatile storage units 830 arranged in a column as seen in FIG. 13 and each of the bit lines 876 as illustrated in FIG. 8E, i.e., non-programmable interconnects, is configured to couple in parallel to the resistive random access memory (RRAM) cells 870 of the non-volatile storage units 830 arranged in a row as seen in FIG. 13 through the selectors 889 of the non-volatile storage units 830 arranged in the row; for the first type of non-volatile memory cells for the third alternative, each of the non-volatile storage units 830 may include one of the self-select (SS) resistive random access memory (RRAM) cells 907 as illustrated in FIG. 10A, each of the word lines 875 as illustrated in FIG. 10A, i.e., non-programmable interconnects, may couple in parallel to the self-select (SS) resistive random access memory (RRAM) cells 907 of the non-volatile storage units 830 arranged in a column as seen in FIG. 13 and each of the bit lines 876 as illustrated in FIG. 8E, i.e., non-programmable interconnects, is configured to couple in parallel to the self-select (SS) resistive random access memory (RRAM) cells 907 of the non-volatile storage units 830 arranged in a row; for the second type of non-volatile memory cells for the first, second, third and fourth alternatives, each of the non-volatile storage units 830 may include one of the magnetoresistive random access memory (MRAM) cells 880 and one of the switches 888 coupling in series to said one of the magnetoresistive random access memory (MRAM) cells 880 as illustrated in FIG. 11D, 12E or 12J, each of the word lines 875 as illustrated in FIG. 11D, 12E or 12J, i.e., non-programmable interconnects, may couple in parallel to the switches 888, i.e., the gate terminals of the N-type MOS transistors in the case that the switches 888 are the N-type MOS transistors or the gate terminals of the P-type MOS transistors in the case that the switches 888 are the P-type MOS transistors, of the non-volatile storage units 830 arranged in a column as seen in FIG. 13 and each of the bit lines 876 as illustrated in FIG. 11D, 12E or 12J, i.e., non-programmable interconnects, is configured to couple in parallel to the magnetoresistive random access memory (MRAM) cells 880 of the non-volatile storage units 830 arranged in a row as seen in FIG. 13 through the switches 888 of the non-volatile storage units 830 arranged in the row.

Referring to FIG. 13, each of the bit lines 876 may be switched to couple to one of the sense amplifiers 666 as illustrated in FIGS. 8E, 9A, 10A, 11D, 12E and 12J. A control unit 834, e.g., address controller or decoder unit, couples to the word lines 875 to control the non-volatile storage units 830 in the array 831.

Referring to FIG. 13, multiple volatile storage units 398, which may be the first or second type as illustrated in FIGS. 1A and 1B, may be arranged in an array 833, wherein each of the volatile storage units 398 may include one of the memory cells 446 and one or two of the switches 449 coupling in series to said one of the memory cells 446 as illustrated in FIGS. 1A and 1B, each of the word lines 451 as illustrated in FIGS. 1A and 1B, i.e., non-programmable interconnects, may couple in parallel to the switches 449, i.e., the gate terminals of the N-type MOS transistors in the case that the switches 449 are the N-type MOS transistors or the gate terminals of the P-type MOS transistors in the case that the switches 449 are the P-type MOS transistors, of the volatile storage units 398 arranged in a column as seen in FIG. 13 and each of the bit lines 452 or 453 as illustrated in FIGS. 1A and 1B, i.e., non-programmable interconnects, is configured to couple in parallel to the memory cells 446 of the volatile storage units 398 arranged in a row as seen in FIG. 13 through the switches 449 of the volatile storage units 398 arranged in the row. Each of the memory cells 446 may be used for the memory cells 490 configured to be programed to store resulting values or programming codes for the look-up table 210 of the programmable logic cells or element (LCE) 2014 as illustrated in FIG. 6A-6F or for the memory cells 362 configured to be programed to store programming codes to control the cross-point switches 379 as illustrated in FIGS. 3A, 3B and 7 or pass/no-pass switches 258 as illustrated in FIGS. 2A-2F. For example, each of the memory cells 446 in the columns in a first group may be used for the memory cells 490 configured to be programed to store resulting values or programming codes for the look-up table 210 of the programmable logic cells or element (LCE) 2014 as illustrated in FIGS. 6A-6F, and each of the memory cells 446 in the columns in a second group may be used for the memory cells 362 configured to be programed to store programming codes to control the cross-point switches 379 as illustrated in FIGS. 3A, 3B and 7 or pass/no-pass switches 258 as illustrated in FIGS. 2A-2F, wherein the memory cells 446 of the volatile storage units 389 used for the memory cells 490 in each neighboring two of the columns in the first group may be the memory cells 446 used for the memory cells 362 of the volatile storage units 389 in one of the columns in the second group.

Referring to FIG. 13, each of the bit lines 452 or 453 may couple to the output "Out" of one of the sense amplifiers 666 as illustrated in FIGS. 8E, 9A, 10A, 11D, 12E and 12J. The control unit 834 couples to the word lines 451 to control the volatile storage units 398 in the array 833.

In operation, the control unit 834 is configured to select, one column by one column in turn, a first group of ones in a first column from the non-volatile storage units 830 such that each of the sense amplifiers 666 may receive data from one of the non-volatile storage units 830 in the first column and to select, one column by one column in turn, a second group of ones in a second column from the volatile storage units 398 such that each of the sense amplifiers 666 may generate the output "Out" to one of the volatile storage units 398 in the second column.

Figure 14A:
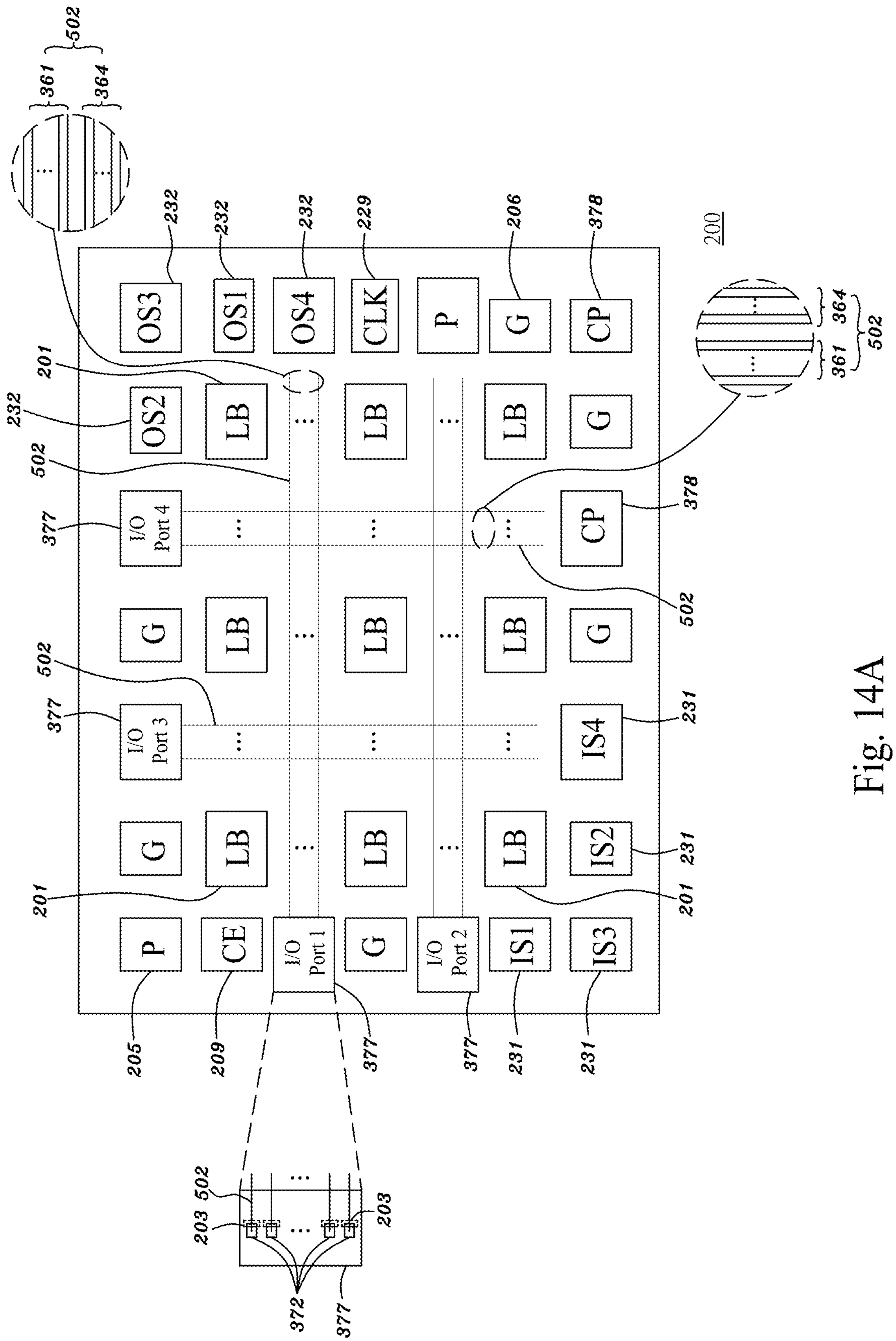
FIG. 14A is a schematically top view showing a block diagram of a standard commodity FPGA IC chip in accordance with an embodiment of the present application.

Specification for Standard Commodity Field-Programmable-Gate-Array (FPGA) Integrated-Circuit (IC) Chip FIG. 14A is a schematically top view showing a block diagram of a standard commodity FPGA IC chip in accordance with an embodiment of the present application. Referring to FIG. 14A, the standard commodity FPGA IC chip 200 may include (1) a plurality of programmable logic blocks (LB) 201 as illustrated in FIGS. 6A-6F arranged in an array in a central region thereof, (2) a plurality of cross-point switches 379 as illustrated in FIGS. 3A, 3B and 7 arranged around each of the programmable logic blocks (LB) 201, (3) a plurality of memory cells 362 as illustrated in FIGS. 3A, 3B and 7 configured to be programmed to control its cross-point switches 379, (4) a plurality of non-volatile memory cells 870, 880 or 907 as illustrated in FIG. 8A-8F, 9A-9H, 10A-10I, 11A-11F or 12A-12J, (5) a data loading scheme as illustrated in FIG. 13 configured to load data from its plurality of non-volatile memory cells 870, 880 or 907 to its memory cells 362 and its memory cells 490 for the look-up tables 210 of its programmable logic blocks (LB) 201, (6) a plurality of intra-chip interconnects 502 each extending over spaces between neighboring two of the programmable logic blocks (LB) 201, wherein the intra-chip interconnects 502 may include the programmable interconnects 361 as seen in FIGS. 3A, 3B and 7 configured to be programmed for interconnection by its memory cells 362 and the non-programmable interconnects 364 as illustrated in FIGS. 6A and 7 configured not to be programmable for interconnection, and (7) a plurality of small input/output (I/O) circuits 203 as illustrated in FIG. 5B each providing the small driver 374 with the second data input S_Data_out at the second input point of the small driver 374 configured to couple to its programmable interconnects 361 or non-programmable interconnects 364 and providing the small receiver 375 with the data output S_Data_in at the output point of the small receiver 375 configured to couple to its programmable interconnects 361 or non-programmable interconnects 364.

Referring to FIG. 14A, the programmable interconnects 361 of the intra-chip interconnects 502 may couple to the programmable interconnects 361 of the intra-block interconnects 2015 of each of the programmable logic blocks (LB) 201 as seen in FIG. 6D. The non-programmable interconnects 364 of the intra-chip interconnects 502 may couple to the non-programmable interconnects 364 of the intra-block interconnects 2015 of each of the programmable logic blocks (LB) 201 as seen in FIG. 6D.

Referring to FIG. 14A, each of the programmable logic blocks (LB) 201 may include one or more programmable logic cells or elements (LCE) 2014 as illustrated in FIGS. 6A-6F. Each of the one or more programmable logic cells or elements (LCE) 2014 may have the input data set at its input points each coupling to one of the programmable and non-programmable interconnects 361 and 364 of the intra-chip interconnects 502 and may be configured to perform logic operation or computation operation on its input data set into its data output coupling to another of the programmable and non-programmable interconnects 361 and 364 of the intra-chip interconnects 502, wherein the computation operation may include an addition, subtraction, multiplication or division operation, and the logic operation may include a Boolean operation such as AND, NAND, OR or NOR operation.

Referring to FIG. 14A, the standard commodity FPGA IC chip 200 may include multiple I/O pads 372 as seen in FIG. 5B each vertically over one of its small input/output (I/O) circuits 203. For example, in a first clock cycle, for one of the small input/output (I/O) circuits 203 of the standard commodity FPGA IC chip 200, its small driver 374 may be enabled by the first data input S_Enable of its small driver 374 and its small receiver 375 may be inhibited by the first data input S_Inhibit of its small receiver 375. Thereby, its small driver 374 may amplify the second data input S_Data_out of its small driver 374, associated with the data output of one of the programmable logic cells or elements (LCE) 2014 of the standard commodity FPGA IC chip 200 as illustrated in FIGS. 6A-6F through first one or more of the programmable interconnects 361 of the standard commodity FPGA IC chip 200 and/or one or more of the cross-point switches 379 of the standard commodity FPGA IC chip 200 each coupled between two of said first one or more of the programmable interconnects 361, as the data output of its small driver 374 to be transmitted to one of the I/O pads 372 vertically over said one of the small input/output (I/O) circuits 203 for external connection to circuits outside the standard commodity FPGA IC chip 200, such as non-volatile memory (NVM) integrated-circuit (IC) chip.

In a second clock cycle, for said one of the small input/output (I/O) circuits 203 of the standard commodity FPGA IC chip 200, its small driver 374 may be disabled by the first data input S_Enable of its small driver 374 and its small receiver 375 may be activated by the first data input S_Inhibit of its small receiver 375. Thereby, its small receiver 375 may amplify the second data input of its small receiver 375 transmitted from circuits outside the standard commodity FPGA IC chip 200 through said one of the I/O pads 372 as the data output S_Data_in of its small receiver 375 to be associated with a data input of the input data set of one of the programmable logic cells or elements (LCE) 2014 of the standard commodity FPGA IC chip 200 as illustrated in FIGS. 6A-6F through second one or more of the programmable interconnects 361 of the standard commodity FPGA IC chip 200 and/or one or more of the cross-point switches 379 of the standard commodity FPGA IC chip 200 each coupled between two of said second one or more of the programmable interconnects 361.

Referring to FIG. 14A, the standard commodity FPGA IC chip 200 may include multiple I/O ports 377 having the number ranging from 2 to 64 for example, such as I/O Port 1, I/O Port 2, I/O Port 3 and I/O Port 4 for this case. Each of the I/O ports 377 may include (1) the small I/O circuits 203 as seen in FIG. 5B having the number ranging from 4 to 256, such as 64 for this case, arranged in parallel for data transmission with bit width ranging from 4 to 256, such as 64 for this case, and (2) the I/O pads 372 as seen in FIG. 5B having the number ranging from 4 to 256, such as 64 for this case, arranged in parallel and vertically over the small I/O circuits 203 respectively.

Referring to FIG. 14A, the standard commodity FPGA IC chip 200 may further include a chip-enable (CE) pad 209 configured for enabling or disabling the standard commodity FPGA IC chip 200. For example, when the chip-enable (CE) pad 209 is at a logic level of "0", the standard commodity FPGA IC chip 200 may be enabled to process data and/or operate with circuits outside of the standard commodity FPGA IC chip 200; when the chip-enable (CE) pad 209 is at a logic level of "1", the standard commodity FPGA IC chip 200 may be disabled not to process data and/or operate with circuits outside of the standard commodity FPGA IC chip 200.

Referring to FIG. 14A, the standard commodity FPGA IC chip 200 may include multiple input selection (IS) pads 231, e.g., IS1, IS2, IS3 and IS4 pads, each configured to receive data to be associated with the first data input S_Inhibit of the small receiver 375 of each of the small I/O circuits 203 of one of its I/O ports 377, e.g., I/O Port 1, I/O Port 2, I/O Port 3 and I/O Port 4. For more elaboration, the IS1 pad 231 may receive data to be associated with the first data input S_Inhibit of the small receiver 375 of each of the small I/O circuits 203 of I/O Port 1; the IS2 pad 231 may receive data to be associated with the first data input S_Inhibit of the small receiver 375 of each of the small I/O circuits 203 of I/O Port 2; the IS3 pad 231 may receive data to be associated with the first data input S_Inhibit of the small receiver 375 of each of the small I/O circuits 203 of I/O Port 3; and the IS4 pad 231 may receive data to be associated with the first data input S_Inhibit of the small receiver 375 of each of the small I/O circuits 203 of I/O Port 4. The standard commodity FPGA IC chip 200 may select, in accordance with logic levels at the input selection (IS) pads 231, e.g., IS1, IS2, IS3 and IS4 pads, one or more from its I/O ports 377, e.g., I/O Port 1, I/O Port 2, I/O Port 3 and I/O Port 4 to pass data for its input operation. For each of the small I/O circuits 203 of one or more of the I/O ports 377 selected in accordance with the logic levels at the input selection (IS) pads 231, its small receiver 375 may be activated by the first data input S_Inhibit of its small receiver 375 associated with the logic level at one or more of the input selection (IS) pads 231 to amplify or pass the second data input of its small receiver 375, transmitted from circuits outside the standard commodity FPGA IC chip 200 through one of the I/O pads 372 of said one of the I/O ports 377 selected in accordance with the logic level at said one or more of the input selection (IS) pads 231, as the data output S_Data_in of its small receiver 375 to be associated with a data input of the input data set of one of the programmable logic cells or elements (LCE) 2014 as seen in FIGS. 6A-6F of the standard commodity FPGA IC chip 200 through one or more of the programmable interconnects 361 as seen in FIGS. 3A, 3B and 7 of the standard commodity FPGA IC chip 200, for example. For each of the small I/O circuits 203 of the other one or more of the I/O ports 377, not selected in accordance with the logic levels at the input selection (IS) pads 231, of the standard commodity FPGA IC chip 200, its small receiver 375 may be inhibited by the first data input S_Inhibit of its small receiver 375 associated with the logic level at the other one or more of the input selection (IS) pads 231.

For example, referring to FIG. 14A, provided that the standard commodity FPGA IC chip 200 may have (1) the chip-enable (CE) pad 209 at a logic level of "0", (2) the IS1 pad 231 at a logic level of "1", (3) the IS2 pad 231 at a logic level of "0", (4) the IS3 pad 231 at a logic level of "0" and (5) the IS4 pad 231 at a logic level of "0", the standard commodity FPGA IC chip 200 may be enabled in accordance with the logic level at its chip-enable (CE) pad 209 and may select, in accordance with the logic levels at its IS1, IS2, IS3 and IS4 pads 231, one or more I/O port, i.e., I/O Port 1, from its I/O ports 377, i.e., I/O Port 1, I/O Port 2, I/O Port 3 and I/O Port 4, to pass data for the input operation. For each of the small I/O circuits 203 of the selected I/O port 377, i.e., I/O Port 1, of the standard commodity FPGA IC chip 200, its small receiver 375 may be activated by the first data input S_Inhibit of its small receiver 375 associated with the logic level at the IS1 pad 231 of the standard commodity FPGA IC chip 200. For each of the small I/O circuits 203 of the unselected I/O ports, i.e., I/O Port 2, I/O Port 3 and I/O Port 4, of the standard commodity FPGA IC chip 200, its small receiver 375 may be inhibited by the first data input S_Inhibit of its small receiver 375 associated respectively with the logic levels at the IS2, IS3 and IS4 pads 231 of the standard commodity FPGA IC chip 200.

For example, referring to FIG. 14A, provided that the standard commodity FPGA IC chip 200 may have (1) the chip-enable (CE) pad 209 at a logic level of "0", (2) the IS1 pad 231 at a logic level of "1", (3) the IS2 pad 231 at a logic level of "1", (4) the IS3 pad 231 at a logic level of "1" and (5) the IS4 pad 231 at a logic level of "1", the standard commodity FPGA IC chip 200 may be enabled in accordance with the logic level at its chip-enable (CE) pad 209 and may select, in accordance with the logic levels at its IS1, IS2, IS3 and IS4 pads 231, all from its I/O ports 377, i.e., I/O Port 1, I/O Port 2, I/O Port 3 and I/O Port 4, to pass data for the input operation at the same clock cycle. For each of the small I/O circuits 203 of the selected I/O ports 377, i.e., I/O Port 1, I/O Port 2, I/O Port 3 and I/O Port 4, of the standard commodity FPGA IC chip 200, its small receiver 375 may be activated by the first data input S_Inhibit of its small receiver 375 associated respectively with the logic levels at the IS1, IS2, IS3 and IS4 pads 231 of the standard commodity FPGA IC chip 200.

Referring to FIG. 14A, the standard commodity FPGA IC chip 200 may include multiple output selection (OS) pads 232, e.g., OS1, OS2, OS3 and OS4 pads, each configured to receive data to be associated with the first data input S_Enable of the small driver 374 of each of the small I/O circuits 203 of one of its I/O ports 377, e.g., I/O Port 1, I/O Port 2, I/O Port 3 and I/O Port 4. For more elaboration, the OS1 pad 232 may receive data to be associated with the first data input S_Enable of the small driver 374 of each of the small I/O circuits 203 of I/O Port 1; the OS2 pad 232 may receive data to be associated with the first data input S_Enable of the small driver 374 of each of the small I/O circuits 203 of I/O Port 2; the OS3 pad 232 may receive data to be associated with the first data input S_Enable of the small driver 374 of each of the small I/O circuits 203 of I/O Port 3; the OS4 pad 232 may receive data to be associated with the first data input S_Enable of the small driver 374 of each of the small I/O circuits 203 of I/O Port 4. The standard commodity FPGA IC chip 200 may select, in accordance with logic levels at the output selection (OS) pads 232, e.g., OS1, OS2, OS3 and OS4 pads, one or more from its I/O ports 377, e.g., I/O Port 1, I/O Port 2, I/O Port 3 and I/O Port 4 to pass data for its output operation. For each of the small I/O circuits 203 of each of the one or more I/O ports 377 selected in accordance with the logic levels at the output selection (OS) pads 232, its small driver 374 may be enabled by the first data input S_Enable of its small driver 374 associated with the logic level at one of the output selection (OS) pads 232 to amplify or pass the second data input S_Data_out of its small driver 374, associated with the data output of one of the programmable logic cells or elements (LCE) 2014 as seen in FIGS. 6A-6F of the standard commodity FPGA IC chip 200 through one or more of the programmable interconnects 361 as seen in FIGS. 3A, 3B and 7 of the standard commodity FPGA IC chip 200, into the data output of its small driver 374 to be transmitted to circuits outside the standard commodity FPGA IC chip 200 through one of the I/O pads 372 of said each of the one or more I/O ports 377, for example. For each of the small I/O circuits 203 of each of the I/O ports 377, not selected in accordance with in accordance with the logic levels at the output selection (OS) pads 232, of the standard commodity FPGA IC chip 200, its small driver 374 may be disabled by the first data input S_Enable of its small driver 374 associated with the logic level at one of the output selection (OS) pads 232.

For example, referring to FIG. 14A, provided that the standard commodity FPGA IC chip 200 may have (1) the chip-enable (CE) pad 209 at a logic level of "0", (2) the OS1 pad 232 at a logic level of "0", (3) the OS2 pad 232 at a logic level of "1", (4) the OS3 pad 232 at a logic level of "1" and (5) the OS4 pad 232 at a logic level of "1", the standard commodity FPGA IC chip 200 may be enabled in accordance with the logic level at its chip-enable (CE) pad 209 and may select, in accordance with the logic levels at its OS1, OS2, OS3 and OS4 pads 232, one or more I/O port, i.e., I/O Port 1, from its I/O ports 377, i.e., I/O Port 1, I/O Port 2, I/O Port 3 and I/O Port 4, to pass data for the output operation. For each of the small I/O circuits 203 of the selected I/O port 377, i.e., I/O Port 1, of the standard commodity FPGA IC chip 200, its small driver 374 may be enabled by the first data input S_Enable of its small driver 374 associated with the logic level at the OS1 pad 232 of the standard commodity FPGA IC chip 200. For each of the small I/O circuits 203 of the unselected I/O ports, i.e., I/O Port 2, I/O Port 3 and I/O Port 4, of the standard commodity FPGA IC chip 200, its small driver 374 may be disabled by the first data input S_Enable of its small driver 374 associated respectively with the logic levels at the OS2, OS3 and OS4 pads 232 of the standard commodity FPGA IC chip 200.

For example, referring to FIG. 14A, provided that the standard commodity FPGA IC chip 200 may have (1) the chip-enable (CE) pad 209 at a logic level of "0", (2) the OS1 pad 232 at a logic level of "0", (3) the OS2 pad 232 at a logic level of "0", (4) the OS3 pad 232 at a logic level of "0" and (5) the OS4 pad 232 at a logic level of "0", the standard commodity FPGA IC chip 200 may be enabled in accordance with the logic level at its chip-enable (CE) pad 209 and may select, in accordance with the logic levels at its OS1, OS2, OS3 and OS4 pads 232, all from its I/O ports 377, i.e., I/O Port 1, I/O Port 2, I/O Port 3 and I/O Port 4, to pass data for the output operation. For each of the small I/O circuits 203 of the selected I/O port 377, i.e., I/O Port 1, I/O Port 2, I/O Port 3 and I/O Port 4, of the standard commodity FPGA IC chip 200, its small driver 374 may be enabled by the first data input S_Enable of its small driver 374 associated respectively with the logic levels at the OS1, OS2, OS3 and OS4 pads 232 of the standard commodity FPGA IC chip 200.

Thereby, referring to FIG. 14A, in a clock cycle, one or more of the I/O ports 377, e.g., I/O Port 1, I/O Port 2, I/O Port 3 and I/O Port 4, may be selected, in accordance with the logic levels at the IS1, IS2, IS3 and IS4 pads 231, to pass data for the input operation, while another one or more of the I/O ports 377, e.g., I/O Port 1, I/O Port 2, I/O Port 3 and I/O Port 4, may be selected, in accordance with the logic levels at the OS1, OS2, OS3 and OS4 pads 232, to pass data for the output operation. The input selection (IS) pads 231 and output selection (OS) pads 232 may be provided as I/O-port selection pads.

Referring to FIG. 14A, the standard commodity FPGA IC chip 200 may further include (1) multiple power pads 205 configured for applying the voltage Vcc of power supply to its non-volatile memory cells 870, 880 or 907 as illustrated in FIG. 8A-8F, 9A-9H, 10A-10I, 11A-11F or 12A-12J, its memory cells 490 for the look-up tables (LUT) 210 of its programmable logic cells or elements (LCE) 2014 as illustrated in FIGS. 6A-6F, the multiplexers (MUXERs) 211 of its programmable logic cells or elements (LCE) 2014, its memory cells 362 for its cross-point switches 379 as illustrated in FIGS. 3A, 3B and 7, its cross-point switches 379 and/or the small drivers 374 and receivers 375 of its small I/O circuits 203 as seen in FIG. 5B through one or more of its non-programmable interconnects 364, wherein the voltage Vcc of power supply may be between 0.2V and 2.5V, between 0.2V and 2V, between 0.2V and 1.5V, between 0.1V and 1V, or between 0.2V and 1V, or, smaller or lower than or equal to 2.5V, 2V, 1.8V, 1.5V or 1V, and (2) multiple ground pads 206 configured for providing the voltage Vss of ground reference to its non-volatile memory cells 870, 880 or 907 as illustrated in FIG. 8A-8F, 9A-9H, 10A-10I, 11A-11F or 12A-12J, its memory cells 490 for the look-up tables (LUT) 210 of its programmable logic cells or elements (LCE) 2014 as illustrated in FIGS. 6A-6F, the multiplexers (MUXERs) 211 of its programmable logic cells or elements (LCE) 2014, its memory cells 362 for its cross-point switches 379 as illustrated in FIGS. 3A, 3B and 7, its cross-point switches 379 and/or the small drivers 374 and receivers 375 of its small I/O circuits 203 as seen in FIG. 5B through one or more of its non-programmable interconnects 364.

Referring to FIG. 14A, the standard commodity FPGA IC chip 200 may further include a clock pad (CLK) 229 configured to receive a clock signal from circuits outside of the standard commodity FPGA IC chip 200 and multiple control pads (CP) 378 configured to receive control commands to control the standard commodity FPGA IC chip 200.

Referring to FIG. 14A, for the standard commodity FPGA IC chip 200, its programmable logic cells or elements (LCE) 2014 as seen in FIGS. 6A-6F may be reconfigurable for artificial-intelligence (AI) application. For example, in a clock cycle, one of the programmable logic cells or elements (LCE) 2014 of the standard commodity FPGA IC chip 200 may have its memory cells 490 to be programmed to perform OR operation; however, after one or more events happen, in another clock cycle said one of its programmable logic cells or elements (LCE) 2014 of the standard commodity FPGA IC chip 200 may have its memory cells 490 to be programmed to perform NAND operation for better AI performance.

Figure 14B:
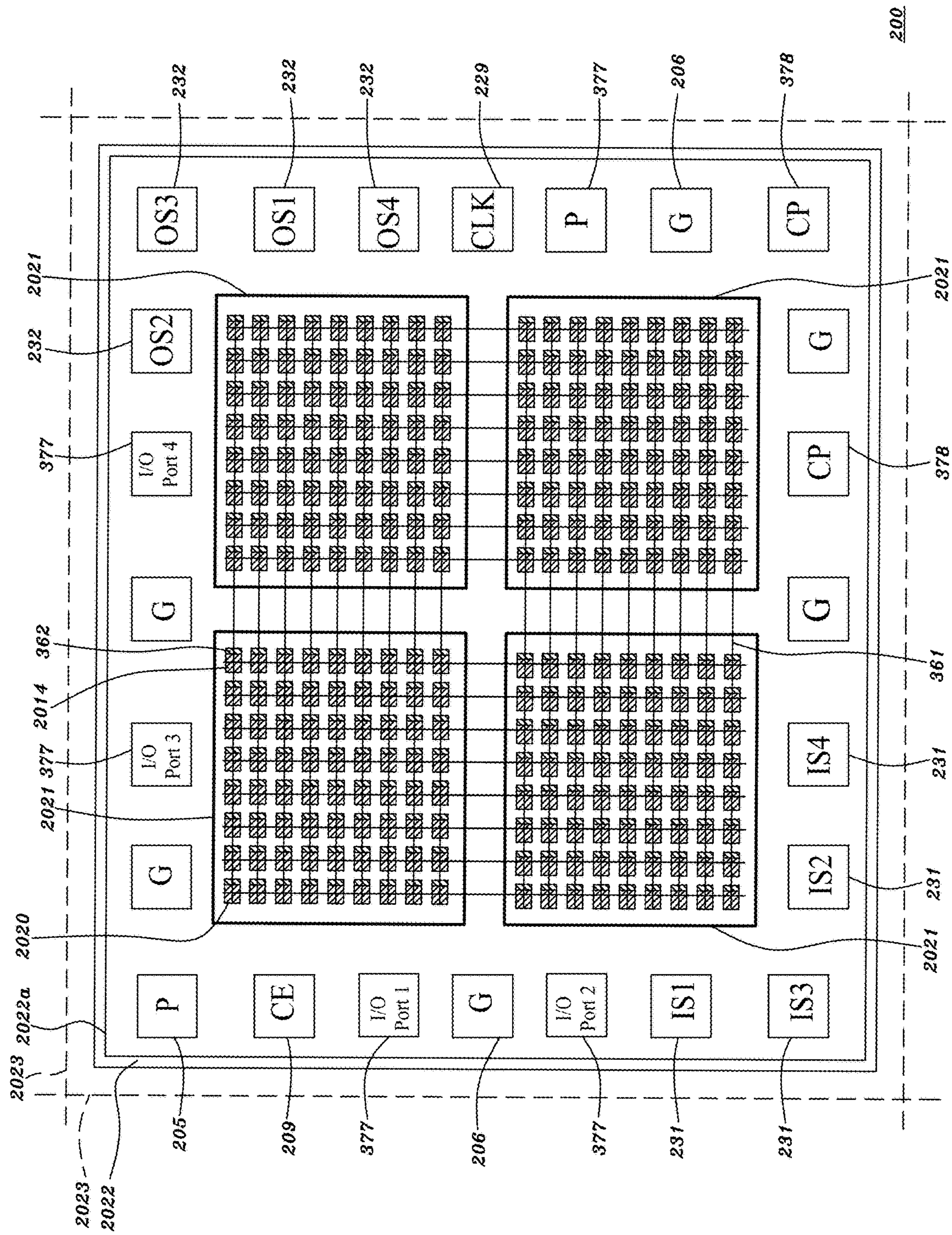
FIG. 14B is a top view showing a layout of a standard commodity FPGA IC chip in accordance with an embodiment of the present application.

FIG. 14B is a top view showing a layout of a standard commodity FPGA IC chip in accordance with an embodiment of the present application. Referring to FIG. 14B, the standard commodity FPGA IC chip 200 may include multiple repetitive circuit arrays 2021 arranged in an array therein, and each of the repetitive circuit arrays 2021 may include multiple repetitive circuit units 2020 arranged in an array therein. Each of the repetitive circuit units 2020 may include a programmable logic cells or element (LCE) 2014 as illustrated in FIGS. 6A, 6E and 6F, and/or the memory cells 362 for the programmable interconnection as illustrated in FIGS. 2A-2C, 3A, 3B and 7. The programmable logic cells or elements (LCE) 2014 may be programmed or configured as functions of, for example, digital-signal processor (DSP), microcontroller, adders, and/or multipliers. For the standard commodity FPGA IC chip 200, its programmable interconnects 361 may couple neighboring two of its repetitive circuit units 2020 and the repetitive circuit units 2020 in neighboring two of its repetitive circuit units 2020. The standard commodity FPGA IC chip 200 may include a seal ring 2022 at its four edges, enclosing its repetitive circuit arrays 2021, its I/O ports 277 and its various circuits as illustrated in FIG. 14A, and a scribe line, kerf or die-saw area 2023 at its border and outside and around the seal ring 2022. For example, for the standard commodity FPGA IC chip 200, greater than 85%, 90%, 95% or 99% area (not counting its seal ring 2022 and scribe line 2023, that is, only including an area within an inner boundary **2022*a* of its seal ring 2022) is used for its repetitive circuit arrays 2021; alternatively, all or most of its transistors are used for its repetitive circuit arrays 2021. Alternatively, for the standard commodity FPGA IC chip 200, none or minimal area may be provided for its control circuits, I/O circuits or hard macros, for example, less than 15%, 10%, 5%, 2% or 1% of its area (not counting its seal ring 2022 and scribe line 2023, that is, only including an area within an inner boundary 2022*a* of its seal ring 2022**) is used for its control circuits, I/O circuits or hard macros; alternatively, none or minimal transistors may be provided for its control circuits, I/O circuits or hard macros, for example, less than 15%, 10%, 5%, 2% or 1% of the total number of its transistors are used for its control circuits, I/O circuits or hard macros.

The standard commodity plural FPGA IC chip 200 may have standard common features, counts or specifications: (1) its regular repetitive logic array may have the number of programmable logic arrays or sections equal to or greater than 2, 4, 8, 10 or 16, wherein its regular repetitive logic array may include programmable logic blocks or elements 201 as illustrated in FIGS. 6A-6F with the count equal to or greater than 128K, 512K, 1M, 4M, 8M, 16M, 32M or 80M; (2) its regular memory array may have the number of memory banks equal to or greater than 2, 4, 8, 10 or 16, wherein its regular memory array may include memory cells with the bit count equal to or greater than 1M, 10M, 50M, 100M, 200M or 500M bits; (3) the number of data inputs to each of its programmable logic blocks or elements 201 may be greater than or equal to 4, 8, 16, 32, 64, 128 or 256; (4) its applied voltage may be between 0.1V and 1.5V, between 0.1V and 1.0V, between 0.1V and 0.7V, or between 0.1V and 0.5V; and (4) its I/O pads 372 as seen in FIG. 14A may be arranged in terms of layout, location, number and function.

Figure 15:
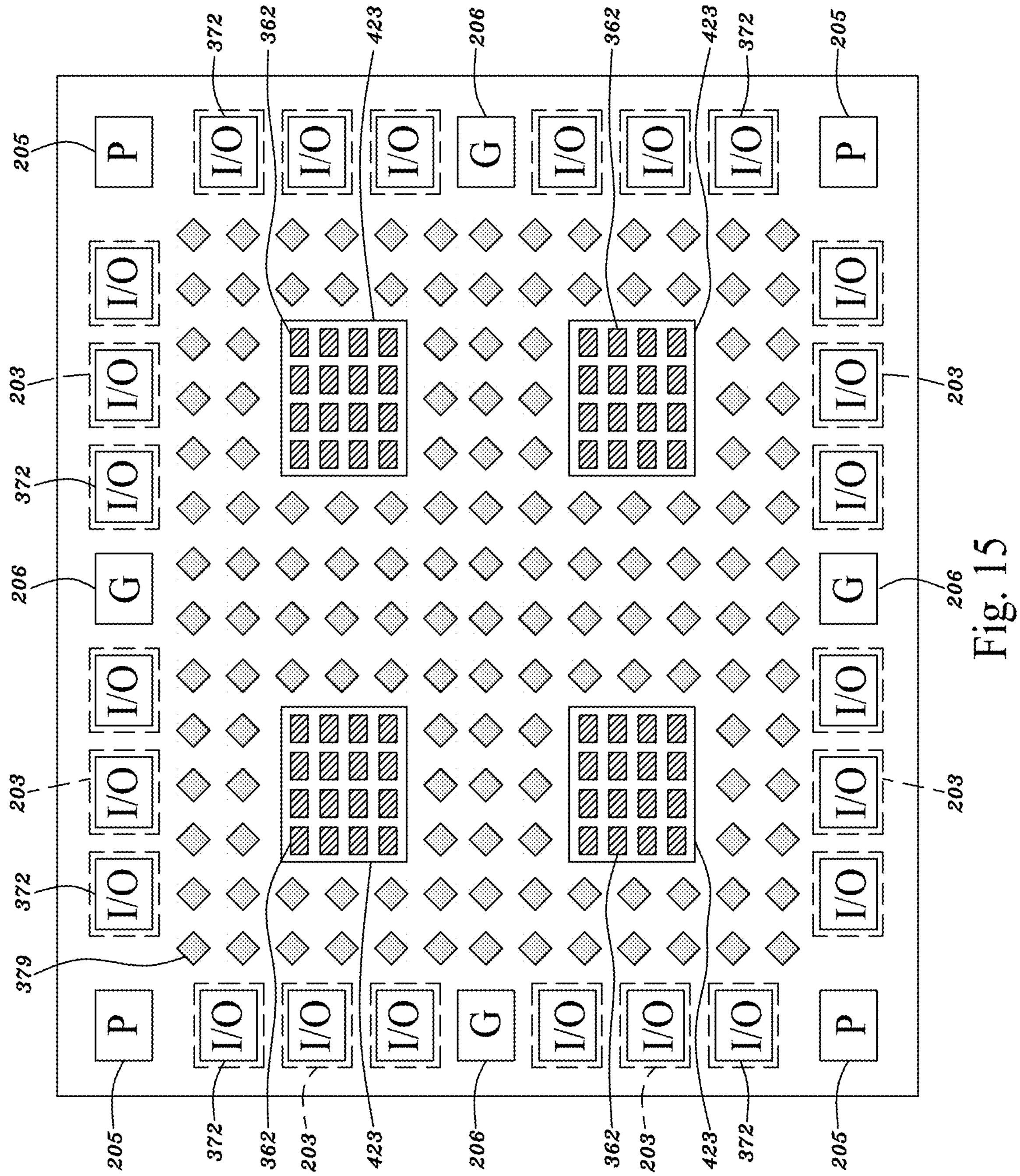
FIG. 15 is a schematically top view showing a block diagram of a dedicated programmable interconnection (DPI) integrated-circuit (IC) chip in accordance with an embodiment of the present application.

Specification for Dedicated Programmable Interconnection (DPI) Integrated-Circuit (IC) Chip FIG. 15 is a schematically top view showing a block diagram of a dedicated programmable interconnection (DPI) integrated-circuit (IC) chip in accordance with an embodiment of the present application.

Referring to FIG. 15, the DPIIC chip 410 may include (1) a plurality of memory-array blocks 423 arranged in an array in a central region thereof, wherein each of the memory-array blocks 423 may include a plurality of memory cells 362 as illustrated in FIGS. 3A, 3B and 7 arranged in an array, (2) a plurality of groups of cross-point switches 379 as illustrated in FIGS. 3A, 3B and 7, each group of which is arranged in one or more rings around one of the memory-array blocks 423, wherein each of its memory cells 362 in one of its memory-array blocks 423 is configured to be programmed to control its cross-point switches 379 around said one of its memory-array blocks 423, (3) a plurality of non-volatile memory cells 870, 880 or 907 as illustrated in FIG. 8A-8F, 9A-9H, 10A-10I, 11A-11F or 12A-12J, (4) a data loading scheme as illustrated in FIG. 13 configured to load data from its plurality of non-volatile memory cells 870, 880 or 907 to its memory cells 362, (5) a plurality of intra-chip interconnects including the programmable interconnects 361 as seen in FIGS. 3A, 3B and 7 configured to be programmed for interconnection by its memory cells 362 and the non-programmable interconnects 364 as illustrated in FIG. 7 configured not to be programmable for interconnection, and (6) a plurality of small input/output (I/O) circuits 203 as illustrated in FIG. 5B each providing the small receiver 375 with the data output S_Data_in associated with a data input at one of the nodes N23-N26 of one of its cross-point switches 379 as illustrated in FIGS. 3A, 3B and 8 through one or more of its programmable interconnects 361 and providing the small driver 374 with the data input S_Data_out associated with a data output at one of the nodes N23-N26 of another of its cross-point switches 379 as illustrated in FIGS. 3A, 3B and 8 through another one or more of its programmable interconnects 361.

Referring to FIG. 15, each of the memory cells 362 may be referred to a memory cell 446 as illustrated in FIGS. 1A and 1B. The DPIIC chip 410 may provide the first type of pass/no-pass switches 258 for its first or second type of cross-point switches 379 as illustrated in FIGS. 3A and 3B close to one of its memory-array blocks 423, each of which may have the data input SC-3 as seen in FIG. 2A associated with a data output, i.e., configuration-programming-memory (CPM) data, of one of its memory cells 362, i.e., configuration-programming-memory (CPM) cells, in said one of its memory-array blocks 423, which may be referred to one of the data outputs Out1 and Out2 of the memory cell 446 as illustrated in FIGS. 1A and 1B. Alternatively, the DPIIC chip 410 may provide the third type of pass/no-pass switches 258 for its first or second type of cross-point switches 379 as illustrated in FIGS. 3A and 3B close to one of the memory-array blocks 423, each of which may have the data inputs SC-5 and SC-6 as seen in FIG. 2C each associated with a data output, i.e., configuration-programming-memory (CPM) data, of one of its memory cells 362, i.e., configuration-programming-memory (CPM) cells, in said one of its memory-array blocks 423, which may be referred to one of the data outputs Out1 and Out2 of the memory cell 446 as illustrated in FIGS. 1A and 1B. Alternatively, the DPIIC chip 410 may provide the multiplexers 211 for its third type of cross-point switches 379 as illustrated in FIG. 7 close to one of the memory-array blocks 423, each of which may have the first set of input points for multiple data inputs of the first input data set of said each of its multiplexers 211 each associated with a data output, i.e., configuration-programming-memory (CPM) data, of one of its memory cells 362, i.e., configuration-programming-memory (CPM) cells, in said one of its memory-array blocks 423, which may be referred to one of the data outputs Out1 and Out2 of the memory cell 446 as illustrated in FIGS. 1A and 1B.

Referring to FIG. 15, the DPIIC chip 410 may include multiple intra-chip interconnects (not shown) each extending over spaces between neighboring two of the memory-array blocks 423, wherein said each of the intra-chip interconnects may be the programmable interconnect 361, coupling to one of the nodes N23-N26 of one of its cross-point switches 379 as illustrated in FIGS. 3A, 3B and 7. For the DPIIC chip 410, each of its small input/output (I/O) circuits 203, as illustrated in FIG. 5B, may provide the small receiver 375 with the data output S_Data_in to be passed through one or more of its programmable interconnects 361 and the first data input S_Inhibit passed through another one or more of its programmable interconnects 361 and provide the small driver 374 with the first data input S_Enable passed through another one or more of its programmable interconnects 361 and the second data input S_Data_out passed through another one or more of its programmable interconnects.

Referring to FIG. 15, the DPIIC chip 410 may include multiple of the I/O pads 372 as seen in FIG. 5B, each vertically over one of its small input/output (I/O) circuits 203, coupling to the node 381 of said one of its small input/output (I/O) circuits 203. For the DPIIC chip 410, in a first clock cycle, data from one of the nodes N23-N26 of one of its cross-point switches 379 as illustrated in FIGS. 3A, 3B and 7 may be associated with the second data input S_Data_out of the small driver 374 of one of its small input/output (I/O) circuits 203 through one or more of the programmable interconnects 361 programmed by a first group of its memory cells 362, and then the small driver 374 of said one of its small input/output (I/O) circuits 203 may amplify or pass the second data input S_Data_out of the small driver 374 of said one of its small input/output (I/O) circuits 203 into the data output of the small driver 374 of said one of its small input/output (I/O) circuits 203 to be transmitted to one of its I/O pads 372 vertically over said one of its small input/output (I/O) circuits 203 for external connection to circuits outside the DPIIC chip 410. In a second clock cycle, data from circuits outside the DPIIC chip 410 may be associated with the second data input of the small receiver 375 of said one of its small input/output (I/O) circuits 203 through said one of its I/O pads 372, and then the small receiver 375 of said one of the small input/output (I/O) circuits 203 may amplify or pass the second data input of the small receiver 375 of said one of its small input/output (I/O) circuits 203 into the data output S_Data_in of the small receiver 375 of said one of its small input/output (I/O) circuits 203 to be associated with one of the nodes N23-N26 of another of its cross-point switches 379 as illustrated in FIGS. 3A, 3B and 7 through another one or more of the programmable interconnects 361 programmed by a second group of its memory cells 362.

Referring to FIG. 15, the DPIIC chip 410 may further include (1) multiple power pads 205 for applying the voltage Vcc of power supply to its memory cells 362 for its cross-point switches 379 as illustrated in FIGS. 3A, 3B and 7 and/or its cross-point switches 379, wherein the voltage Vcc of power supply may be between 0.2V and 2.5V, between 0.2V and 2V, between 0.2V and 1.5V, between 0.1V and 1V, or between 0.2V and 1V, or, smaller or lower than or equal to 2.5V, 2V, 1.8V, 1.5V or 1V, and (2) multiple ground pads 206 for providing the voltage Vss of ground reference to its memory cells 362 for its cross-point switches 379 as illustrated in FIGS. 3A, 3B and 7 and/or its cross-point switches 379.

Referring to FIG. 15, the DPIIC chip 410 may further include multiple volatile storage units 398 of the first type as illustrated in FIG. 1A used as cache memory for data latch or storage. Each of the volatile storage units 398 may include two switches 449, such as N-type or P-type MOS transistors, for bit and bit-bar data transfer, and two pairs of P-type and N-type MOS transistors 447 and 448 for data latch or storage nodes. For each of the volatile storage units 398 acting as the cache memory of the DPIIC chip 410, its two switches 449 may perform control of writing data into each of its memory cells 446 and reading data stored in each of its memory cells 446. The DPIIC chip 410 may further include a sense amplifier for reading, amplifying or detecting data from the memory cells 446 of its volatile storage units 398 acting as the cache memory.

Specification for Standard Commodity Logic Drive

Figure 16:
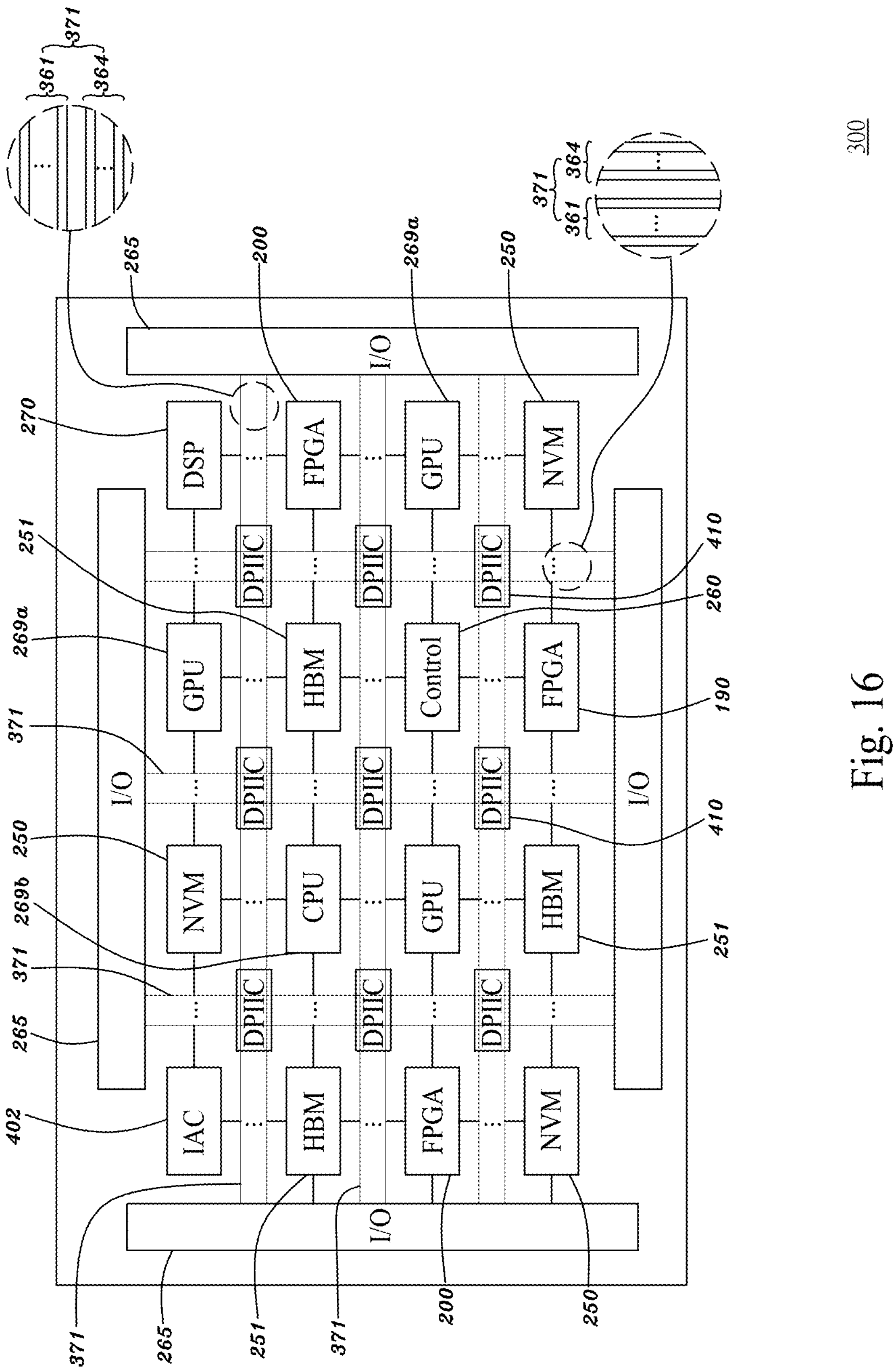
FIG. 16 is a schematically top view showing arrangement for various chips packaged in a standard commodity logic drive in accordance with an embodiment of the present application.

FIG. 16 is a schematically top view showing arrangement for various chips packaged in a standard commodity logic drive in accordance with an embodiment of the present application. Referring to FIG. 16, a standard commodity logic drive 300 may be packaged with multiple graphic-processing unit (GPU) chips 269*a*, a central-processing-unit (CPU) chip 269*b* and a digital-signal-processing (DSP) chip 270. Further, the logic drive 300 may be packaged with multiple high-bandwidth-memory (HBM) integrated-circuit (IC) chips 251 each arranged next to one of the GPU chips 269*a* for communication with said one of the GPU chips 269*a* in a high speed, high bandwidth and wide bitwidth. Each of the HBM IC chips 251 in the logic drive 300 may be a high speed, high bandwidth, wide bitwidth dynamic-random-access-memory (DRAM) IC chip, high speed, high bandwidth, wide bitwidth cache static-random-access-memory (SRAM) chip, high speed, high bandwidth, wide bitwidth magnetoresistive random-access-memory (MRAM) chip or high speed, high bandwidth, wide bitwidth resistive random-access-memory (RRAM) chip. The logic drive 300 may be further packaged with a plurality of the standard commodity FPGA IC chip 200 and one or more of the non-volatile memory (NVM) IC chips 250 configured to store data from data information memory (DIM) cells of the HBM IC chips 251. Each of the non-volatile memory (NVM) IC chips 250 may be a NAND flash memory chip or another memory chip for spin-orbit-torque (SOT) based magnetoresistive random access memory (MRAM) or resistive random access memory (RRAM). The logic drive 300 may be further packaged with an innovated application-specific-IC (ASIC) or customer-owned-tooling (COT) (abbreviated as IAC below) chip 402 for intellectual-property (IP) circuits, application-specific (AS) circuits, analog circuits, mixed-mode signal circuits, radio-frequency (RF) circuits, and/or transmitter, receiver or transceiver circuits, etc. The logic drive 300 may be further packaged with a dedicated control and input/output (I/O) chip 260 to control data transmission between any two of its CPU chip 269*b*, DSP chip 270, standard commodity FPGA IC chips 200, GPU chips 269*a*, NVM IC chips 250, IAC chip 402 and HBMIC chips 251. The dedicated control and input/output (I/O) chip 260 may be replaced with a dedicated control chip. The CPU chip 269*b*, DSP chip 270, dedicated control and input/output (I/O) chip 260, standard commodity FPGA IC chips 200, GPU chips 269*a*, NVM IC chips 250, IAC chip 402 and HBMIC chips 251 may be arranged in an array, wherein the CPU chip 269*b* and dedicated control and input/output (I/O) chip 260 may be arranged in a center region surrounded by a periphery region having the standard commodity FPGA IC chips 200, DSP chip 270, GPU chips 269*a*, NVM IC chips 250, IAC chip 402 and HBMIC chips 251 mounted thereto.

Referring to FIG. 16, the logic drive 300 may include the inter-chip interconnects 371 each extending under spaces between neighboring two of the standard commodity FPGA IC chips 200, NVM IC chips 250, dedicated control and input/output (I/O) chip 260, GPU chips 269*a*, CPU chip 269*b*, DSP chip 270, IAC chip 402 and HBMIC chips 251. The logic drive 300 may include a plurality of the DPIIC chip 410 aligned with a cross of a vertical bundle of inter-chip interconnects 371 and a horizontal bundle of inter-chip interconnects 371. Each of the DPIIC chips 410 is at corners of four of the standard commodity FPGA IC chips 200, NVM IC chips 250, dedicated control and input/output (I/O) chip 260, GPU chips 269*a*, CPU chip 269*b*, DSP chip 270, IAC chip 402 and HBMIC chips 251 around said each of the DPIIC chips 410. The inter-chip interconnects 371 may be formed for the programmable interconnect 361. Data transmission may be built (1) between one of the programmable interconnects 361 of the inter-chip interconnects 371 and one of the programmable interconnects 361 of one of the standard commodity FPGA IC chips 200 via one of the small input/output (I/O) circuits 203 of said one of the standard commodity FPGA IC chips 200, and (2) between one of the programmable interconnects 361 of the inter-chip interconnects 371 and one of the programmable interconnects 361 one of the DPIIC chips 410 via one of the small input/output (I/O) circuits 203 of said one of the DPIIC chips 410.

Referring to FIG. 16, one or more of the programmable interconnects 361 of the inter-chip interconnects 371 may couple from each of the standard commodity FPGA IC chips 200 to all of the DPIIC chips 410. One or more of the programmable interconnects 361 of the inter-chip interconnects 371 may couple from each of the standard commodity FPGA IC chips 200 to the dedicated control and input/output (I/O) chip 260. One or more of the programmable interconnects 361 of the inter-chip interconnects 371 may couple from each of the standard commodity FPGA IC chips 200 to both of the NVM IC chips 250. One or more of the programmable interconnects 361 of the inter-chip interconnects 371 may couple from each of the standard commodity FPGA IC chips 200 to all of the GPU chips 269*a*. One or more of the programmable interconnects 361 of the inter-chip interconnects 371 may couple from each of the standard commodity FPGA IC chips 200 to the CPU chip 269*b*. One or more of the programmable interconnects 361 of the inter-chip interconnects 371 may couple from each of the standard commodity FPGA IC chips 200 to the DSP chip 270. One or more of the programmable interconnects 361 of the inter-chip interconnects 371 may couple from one of the standard commodity FPGA IC chips 200 to one of the HBMIC chips 251 next to said one of the standard commodity FPGA IC chips 200 and the communication between said one of the standard commodity FPGA IC chips 200 and said one of the HBMIC chips 251 may have a data bit width of equal to or greater than 64, 128, 256, 512, 1024, 2048, 4096, 8K, or 16K. One or more of the programmable interconnects 361 of the inter-chip interconnects 371 may couple from each of the standard commodity FPGA IC chips 200 to the other of the standard commodity FPGA IC chips 200. One or more of the programmable interconnects 361 of the inter-chip interconnects 371 may couple from each of the standard commodity FPGA IC chips 200 to the IAC chip 402. One or more of the programmable interconnects 361 of the inter-chip interconnects 371 may couple from each of the DPIIC chips 410 to the dedicated control and input/output (I/O) chip 260. One or more of the programmable interconnects 361 of the inter-chip interconnects 371 may couple from each of the DPIIC chips 410 to both of the NVM IC chips 250. One or more of the programmable interconnects 361 of the inter-chip interconnects 371 may couple from each of the DPIIC chips 410 to all of the GPU chips 269*a*. One or more of the programmable interconnects 361 of the inter-chip interconnects 371 may couple from each of the DPIIC chips 410 to the CPU chip 269*b*. One or more of the programmable interconnects 361 of the inter-chip interconnects 371 may couple from each of the DPIIC chips 410 to the DSP chip 270. One or more of the programmable interconnects 361 of the inter-chip interconnects 371 may couple from each of the DPIIC chips 410 to all of the HBM IC chips 251. One or more of the programmable interconnects 361 of the inter-chip interconnects 371 may couple from each of the DPIIC chips 410 to the others of the DPIIC chips 410. One or more of the programmable interconnects 361 of the inter-chip interconnects 371 may couple from each of the DPIIC chips 410 to the IAC chip 402. One or more of the programmable interconnects 361 of the inter-chip interconnects 371 may couple from the CPU chip 269*b* to all of the GPU chips 269*a*. One or more of the programmable interconnects 361 of the inter-chip interconnects 371 may couple from the DSP chip 270 to all of the GPU chips 269*a*. One or more of the programmable interconnects 361 of the inter-chip interconnects 371 may couple from the CPU chip 269*b* to both of the NVM IC chips 250. One or more of the programmable interconnects 361 of the inter-chip interconnects 371 may couple from the DSP chip 270 to both of the NVM IC chips 250. One or more of the programmable interconnects 361 of the inter-chip interconnects 371 may couple from the CPU chip 269*b* to one of the HBM IC chips 251 next to the CPU chip 269*b* and the communication between the CPU chip 269*b* and said one of the HBM IC chips 251 may have a data bit width of equal to or greater than 64, 128, 256, 512, 1024, 2048, 4096, 8K, or 16K. One or more of the programmable interconnects 361 of the inter-chip interconnects 371 may couple from the CPU chip 269*b* to the IAC chip 402. One or more of the programmable interconnects 361 of the inter-chip interconnects 371 may couple from the DSP chip 270 to the IAC chip 402. One or more of the programmable interconnects 361 of the inter-chip interconnects 371 may couple from the CPU chip 269*b* to the DSP chip 270. One or more of the programmable interconnects 361 of the inter-chip interconnects 371 may couple from one of the GPU chips 269*a* to one of the HBM IC chips 251 next to said one of the GPU chips 269*a* and the communication between said one of the GPU chips 269*a* and said one of the HBM IC chips 251 may have a data bit width of equal to or greater than 64, 128, 256, 512, 1024, 2048, 4096, 8K, or 16K. One or more of the programmable interconnects 361 of the inter-chip interconnects 371 may couple from each of the GPU chips 269*a* to both of the NVM IC chips 250. One or more of the programmable interconnects 361 of the inter-chip interconnects 371 may couple from each of the GPU chips 269*a* to the others of the GPU chips 269*a*. One or more of the programmable interconnects 361 of the inter-chip interconnects 371 may couple from each of the GPU chips 269*a* to the IAC chip 402. One or more of the programmable interconnects 361 of the inter-chip interconnects 371 may couple from each of the NVM IC chips 250 to the dedicated control and input/output (I/O) chip 260. One or more of the programmable interconnects 361 of the inter-chip interconnects 371 may couple from each of the HBM IC chips 251 to the dedicated control and input/output (I/O) chip 260. One or more of the programmable interconnects 361 of the inter-chip interconnects 371 may couple from each of the GPU chips 269*a* to the dedicated control and input/output (I/O) chip 260. One or more of the programmable interconnects 361 of the inter-chip interconnects 371 may couple from the CPU chip 269*b* to the dedicated control and input/output (I/O) chip 260. One or more of the programmable interconnects 361 of the inter-chip interconnects 371 may couple from the DSP chip 270 to the dedicated control and input/output (I/O) chip 260. One or more of the programmable interconnects 361 of the inter-chip interconnects 371 may couple from each of the NVM IC chips 250 to all of the HBM IC chips 251. One or more of the programmable interconnects 361 of the inter-chip interconnects 371 may couple from each of the NVM IC chips 250 to the IAC chip 402. One or more of the programmable interconnects 361 of the inter-chip interconnects 371 may couple from each of the HBM IC chips 251 to the IAC chip 402. One or more of the programmable interconnects 361 of the inter-chip interconnects 371 may couple from each of the IAC chip 402 to the dedicated control and input/output (I/O) chip 260. One or more of the programmable interconnects 361 of the inter-chip interconnects 371 may couple from each of the NVM IC chips 250 to the other of the NVM IC chips 250. One or more of the programmable interconnects 361 of the inter-chip interconnects 371 may couple from each of the HBM IC chips 251 to the others of the HBM IC chips 251.

Referring to FIG. 16, the standard commodity logic drive 300 may include multiple dedicated input/output (I/O) chips 265 in a peripheral region thereof surrounding a central region thereof having the standard commodity FPGA IC chips 200, NVM IC chips 250, dedicated control and input/output (I/O) chip 260, GPU chips 269*a*, CPU chip 269*b*, DSP chip 270, HBM IC chips 251, IAC chip 402 and DPIIC chips 410 located therein. One or more of the programmable interconnects 361 of the inter-chip interconnects 371 may couple from each of the standard commodity FPGA IC chips 200 to all of the dedicated input/output (I/O) chips 265. One or more of the programmable interconnects 361 of the inter-chip interconnects 371 may couple from each of the DPIIC chips 410 to all of the dedicated input/output (I/O) chips 265. One or more of the programmable interconnects 361 of the inter-chip interconnects 371 may couple from each of the NVM IC chips 250 to all of the dedicated input/output (I/O) chips 265. One or more of the programmable interconnects 361 of the inter-chip interconnects 371 may couple from the dedicated control and input/output (I/O) chip 260 to all of the dedicated input/output (I/O) chips 265. One or more of the programmable interconnects 361 of the inter-chip interconnects 371 may couple from each of the GPU chips 269*a* to all of the dedicated input/output (I/O) chips 265. One or more of the programmable interconnects 361 of the inter-chip interconnects 371 may couple from the CPU chip 269*b* to all of the dedicated input/output (I/O) chips 265. One or more of the programmable interconnects 361 of the inter-chip interconnects 371 may couple from the DSP chip 270 to all of the dedicated input/output (I/O) chips 265. One or more of the programmable interconnects 361 of the inter-chip interconnects 371 may couple from each of the HBM IC chips 251 to all of the dedicated input/output (I/O) chips 265. One or more of the programmable interconnects 361 of the inter-chip interconnects 371 may couple from the IAC chip 402 to all of the dedicated input/output (I/O) chips 265. For the standard commodity logic drive 300, its dedicated control and input/output (I/O) chip 260 is configured to control data transmission between each of its dedicated input/output (I/O) chips 265 and one of its CPU chip 269*b*, DSP chip 270, standard commodity FPGA IC chips 200, GPU chips 269*a*, NVM IC chips 250, IAC chip 402 and HBMIC chips 251.

Referring to FIG. 16, for the standard commodity logic drive 300 being in operation, each of its DPIIC chip 410 may be arranged with the volatile storage units 398, as seen in FIG. 1A, each having the memory cell 446 acting as cache memory to store data from any of the CPU chip 269*b*, DSP chip 270, dedicated control and input/output (I/O) chip 260, standard commodity FPGA IC chips 200, GPU chips 269*a*, NVM IC chips 250, IAC chip 402 and HBMIC chips 251.

Interconnection for Standard Commodity Logic Drive

Figure 17:
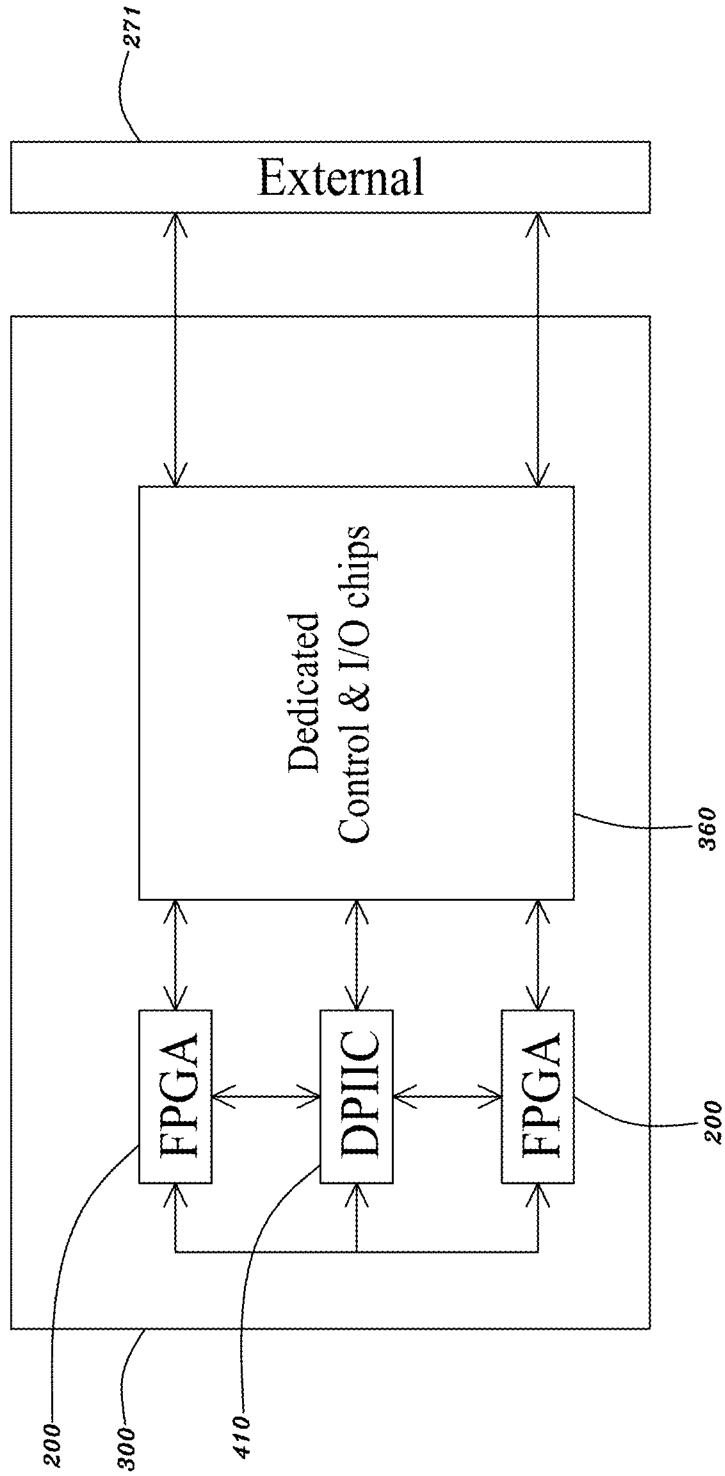
FIG. 17 is a block diagram showing interconnection between chips in a standard commodity logic drive in accordance with an embodiment of the present application.

FIG. 17 is a block diagram showing interconnection between chips in a standard commodity logic drive in accordance with an embodiment of the present application. Referring to FIG. 17, two blocks 200 may be two different groups of the standard commodity FPGA IC chips 200 in the logic drive 300 illustrated in FIG. 16; a block 410 may be a combination of the DPIIC chips 410 in the logic drive 300 illustrated in FIG. 16; a block 360 may be a combination of the dedicated I/O chips 265 and dedicated control and input/output (I/O) chip 260 in the logic drive 300 illustrated in FIG. 16.

Referring to FIGS. 16 and 17, for the standard commodity logic drive 300, one or more of the programmable interconnects 361 of its inter-chip interconnects 371 may couple one or more of the small I/O circuits 203 of each of its dedicated I/O chips 265 in the block 360 to one or more of the small I/O circuits 203 of one of its standard commodity FPGA IC chips 200. One or more of the programmable interconnects 361 of its inter-chip interconnects 371 may couple one or more of the small I/O circuits 203 of each of its dedicated I/O chips 265 in the block 360 to one or more of the small I/O circuits 203 of one of its DPIIC chips 410. One or more of the non-programmable interconnects 364 of the inter-chip interconnects 371 may couple one or more of the small I/O circuits 203 of each of its dedicated I/O chips 265 in the block 360 to one or more of the small I/O circuits 203 of one of its standard commodity FPGA IC chips 200. One or more of the non-programmable interconnects 364 of the inter-chip interconnects 371 may couple one or more of the small I/O circuits 203 of each of its dedicated I/O chips 265 in the block 360 to one or more of the small I/O circuits 203 of one of its DPIIC chips 410.

Referring to FIGS. 16 and 17, for the standard commodity logic drive 300, one or more of the programmable interconnects 361 of its inter-chip interconnects 371 may couple one or more of the small I/O circuits 203 of each of its DPIIC chips 410 to one or more of the small I/O circuits 203 of one of the standard commodity FPGA IC chips 200. One or more of the programmable interconnects 361 of its inter-chip interconnects 371 may couple one or more of the small I/O circuits 203 of each of its DPIIC chips 410 to one or more of the small I/O circuits 203 of another of the DPIIC chips 410. One or more of the non-programmable interconnects 364 of the inter-chip interconnects 371 may couple one or more of the small I/O circuits 203 of each of its DPIIC chips 410 to one or more of the small I/O circuits 203 of one of its standard commodity FPGA IC chips 200. One or more of the non-programmable interconnects 364 of the inter-chip interconnects 371 may couple one or more of the small I/O circuits 203 of each of its DPIIC chips 410 to one or more of the small I/O circuits 203 of another of its DPIIC chips 410.

Referring to FIGS. 16 and 17, for the standard commodity logic drive 300, one or more of the programmable interconnects 361 of its inter-chip interconnects 371 may couple one or more of the small I/O circuits 203 of each of its standard commodity FPGA IC chips 200 to one or more of the small I/O circuits 203 of another of the standard commodity FPGA IC chips 200. One or more of the non-programmable interconnects 364 of its inter-chip interconnects 371 may couple one or more of the small I/O circuits 203 of each of its standard commodity FPGA IC chips 200 to one or more of the small I/O circuits 203 of another of its standard commodity FPGA IC chips 200.

Referring to FIGS. 16 and 17, for the standard commodity logic drive 300, one or more of the programmable interconnects 361 of its inter-chip interconnects 371 may couple one or more of the small I/O circuits 203 of the dedicated control and I/O chip 260 in the block 360 to one or more of the small I/O circuits 203 of each of the standard commodity FPGA IC chips 200. One more of the non-programmable interconnects 364 of its inter-chip interconnects 371 may couple one or more of the small I/O circuits 203 of its dedicated control and I/O chip 260 in the block 360 to one or more of the small I/O circuits 203 of each of its standard commodity FPGA IC chips 200. One or more of the programmable interconnects 361 of its inter-chip interconnects 371 may couple one or more of the small I/O circuits 203 of its dedicated control and I/O chip 260 in the block 360 to one or more of the small I/O circuits 203 of each of the DPIIC chips 410. One more of the non-programmable interconnects 364 of its inter-chip interconnects 371 may couple one or more of the small I/O circuits 203 of the dedicated control and I/O chip 260 in the block 360 to one or more of the small I/O circuits 203 of each of its DPIIC chips 410. One or more of the non-programmable interconnects 364 of its inter-chip interconnects 371 may couple one or more of the large I/O circuits 341 of the dedicated control and I/O chip 260 in the block 360 to one or more of the large I/O circuits 341 of each of the dedicated I/O chips 265. One or more of the large I/O circuits 341 of its dedicated control and I/O chip 260 in the block 360 may couple to the external circuitry 271 outside the standard commodity logic drive 300.

Referring to FIGS. 16 and 17, for the standard commodity logic drive 300, one or more of the large I/O circuits 341 of each of its dedicated I/O chips 265 in the block 360 may couple to the external circuitry 271 outside the standard commodity logic drive 300.

(1) Interconnection for Operation

Referring to FIGS. 16 and 17, for the standard commodity logic drive 300, each of its standard commodity FPGA IC chips 200 may reload resulting values or first programming codes from its non-volatile memory (NVM) IC chip 250 to the memory cells 490 of said each of its standard commodity FPGA IC chips 200 via one or more of the non-programmable interconnects 364 of its intra-chip interconnects 502, and thereby the resulting values or first programming codes may be stored or latched in the memory cells 490 of said each of its standard commodity FPGA IC chips 200 to program its programmable logic cells or elements (LCE) 2014 as illustrated in FIG. 6A-6F. Said each of its standard commodity FPGA IC chips 200 may reload second programming codes from its non-volatile memory (NVM) IC chip 250 to the memory cells 362 of said each of its standard commodity FPGA IC chips 200 via one or more of the non-programmable interconnects 364 of its intra-chip interconnects 502, and thereby the second programming codes may be stored or latched in the memory cells 362 of said each of its standard commodity FPGA IC chips 200 to program the pass/no-pass switches 258 or cross-point switches 379 of said each of its standard commodity FPGA IC chips 200 as illustrated in FIGS. 2A-2C, 3A, 3B and 7. Said each of its DPIIC chips 410 may reload third programming codes from its non-volatile memory (NVM) IC chip 250 to the memory cells 362 of said each of its DPIIC chips 410, and thereby the third programming codes may be stored or latched in the memory cells 362 of said each of its DPIIC chips 410 to program the pass/no-pass switches 258 or cross-point switches 379 of said each of its DPIIC chips 410 as illustrated in FIGS. 2A-2C, 3A, 3B, 7 and 15.

Thereby, referring to FIGS. 16 and 17, one of the dedicated I/O chips 265 of the standard commodity logic drive 300 may have one of its large I/O circuits 341 to drive data from the external circuitry 271 outside the logic drive 300 to one of its small I/O circuits 203. For said one of the dedicated I/O chips 265, said one of its small I/O circuits 203 may drive the data to a first one of the small I/O circuits 203 of one of the DPIIC chips 410 of the standard commodity logic drive 300 via one or more of the programmable interconnects 361 of the inter-chip interconnects 371 of the standard commodity logic drive 300. For said one of the dedicated DPIIC chips 410, the first one of its small I/O circuits 203 may drive the data to one of its cross-point switches 379 via a first one of the programmable interconnects 361 of its intra-chip interconnects; said one of its cross-point switches 379 may pass the data from the first one of the programmable interconnects 361 of its intra-chip interconnects to a second one of the programmable interconnects 361 of its intra-chip interconnects to be passed to a second one of its small I/O circuits 203; the second one of its small I/O circuits 203 may drive the data to one of the small I/O circuits 203 of one of the standard commodity FPGA IC chips 200 of the standard commodity logic drive 300 via one or more of the programmable interconnects 361 of the inter-chip interconnects 371 of the standard commodity logic drive 300. For said one of the standard commodity FPGA IC chips 200, said one of its small I/O circuits 203 may drive the data to one of its cross-point switches 379 through a first group of programmable interconnects 361 of its intra-chip interconnects 502 as seen in FIG. 14A; said one of its cross-point switches 379 may pass the data from the first group of programmable interconnects 361 of its intra-chip interconnects 502 to a second group of programmable interconnects 361 of its intra-chip interconnects 502 to be associated with a data input of the first input set of one of its programmable logic cells or elements (LCE) 201 as seen in FIGS. 6A-6F.

Referring to FIGS. 16 and 17, in another aspect, for a first one of the standard commodity FPGA IC chips 200 of the standard commodity logic drive 300, one of its programmable logic cells or elements (LCE) 2014 as seen in FIGS. 6A-6F may have the data output to be passed to one of its cross-point switches 379 via a first group of programmable interconnects 361 of its intra-chip interconnects 502; said one of its cross-point switches 379 may pass the data output of said one of its programmable logic cells or elements (LCE) 2014 from the first group of programmable interconnects 361 of its intra-chip interconnects 502 to a second group of programmable interconnects 361 of its intra-chip interconnects 502 to be passed to one of its small I/O circuits 203; said one of its small I/O circuits 203 may drive the data output of said one of its programmable logic cells or elements (LCE) 2014 to a first one of the small I/O circuits 203 of one of the DPIIC chips 410 of the standard commodity logic drive 300 via one or more of programmable interconnects 361 of the inter-chip interconnects 371 of the standard commodity logic drive 300. For said one of the DPIIC chips 410, the first one of its small I/O circuits 203 may drive the data output of said one of its programmable logic cells or elements (LCE) 2014 to one of its cross-point switches 379 via a first group of programmable interconnects 361 of its intra-chip interconnects; said one of its cross-point switches 379 may pass the data output of said one of its programmable logic cells or elements (LCE) 2014 from the first group of programmable interconnects 361 of its intra-chip interconnects to a second group of programmable interconnects 361 of its intra-chip interconnects to be passed to a second one of its small I/O circuits 203; the second one of its small I/O circuits 203 may drive the data output of said one of its programmable logic cells or elements (LCE) 2014 to one of the small I/O circuits 203 of a second one of the standard commodity FPGA IC chips 200 of the standard commodity logic drive 300 via one or more of the programmable interconnects 361 of the inter-chip interconnects 371 of the standard commodity logic drive 300. For the second one of the FPGA IC chips 200, said one of its small I/O circuits 203 may drive the data output of said one of its programmable logic cells or elements (LCE) 2014 to one of its cross-point switches 379 through a first group of programmable interconnects 361 of its intra-chip interconnects 502; said one of its cross-point switches 379 may pass the data output of said one of its programmable logic cells or elements (LCE) 2014 from the first group of programmable interconnects 361 of its intra-chip interconnects 502 to a second group of programmable interconnects 361 of its intra-chip interconnects 502 to be associated with a data input of the input data set of one of its programmable logic cells or elements (LCE) 2014 as seen in FIGS. 6A-6F.

Referring to FIGS. 16 and 17, in another aspect, for one of the standard commodity FPGA IC chips 200 of the standard commodity logic drive 300, one of its programmable logic cells or elements (LCE) 2014 as seen in FIGS. 6A-6F may have a data output to be passed to one of its cross-point switches 379 via a first group of programmable interconnects 361 of its intra-chip interconnects 502; said one of its cross-point switches 379 may pass the data output of said one of its programmable logic cells or elements (LCE) 2014 from the first group of programmable interconnects 361 of its intra-chip interconnects 502 to a second group of programmable interconnects 361 of its intra-chip interconnects 502 to be passed to one of its small I/O circuits 203; said one of its small I/O circuits 203 may drive the data output of said one of its programmable logic cells or elements (LCE) 2014 to a first one of the small I/O circuits 203 of one of the DPIIC chips 410 of the standard commodity FPGA IC chips 200 via one or more of the programmable interconnects 361 of the inter-chip interconnects 371 of the standard commodity FPGA IC chips 200. For said one of the DPIIC chips 410, the first one of its small I/O circuits 203 may drive the data output of said one of its programmable logic cells or elements (LCE) 2014 to one of its cross-point switches 379 via a first group of programmable interconnects 361 of its intra-chip interconnects; said one of its cross-point switches 379 may pass the data output of said one of its programmable logic cells or elements (LCE) 2014 from the first group of programmable interconnects 361 of its intra-chip interconnects to a second group of programmable interconnects 361 of its intra-chip interconnects to be passed to a second one of its small I/O circuits 203; the second one of its small I/O circuits 203 may drive the data output of said one of its programmable logic cells or elements (LCE) 2014 to one of the small I/O circuits 203 of one of the dedicated I/O chips 265 of the standard commodity FPGA IC chips 200 via one or more of programmable interconnects 361 of the inter-chip interconnects 371 of the standard commodity FPGA IC chips 200. For said one of the dedicated I/O chips 265, said one of its small I/O circuits 203 may drive the data output of said one of its programmable logic cells or elements (LCE) 2014 to one of its large I/O circuits 341 to be passed to the external circuitry 271 outside the standard commodity logic drive 300.

(3) Accessibility

Referring to FIGS. 16 and 17, the external circuitry 271 outside the standard commodity logic drive 300 may not be allowed to reload the resulting values and first, second and third programming codes from any of the NVM IC chips 250 of the standard commodity logic drive 300. Alternatively, the external circuitry 271 outside the standard commodity logic drive 300 may be allowed to reload the resulting values and first, second and third programming codes from one or more of the NVM IC chips 250 of the standard commodity logic drive 300.

Figure 18:
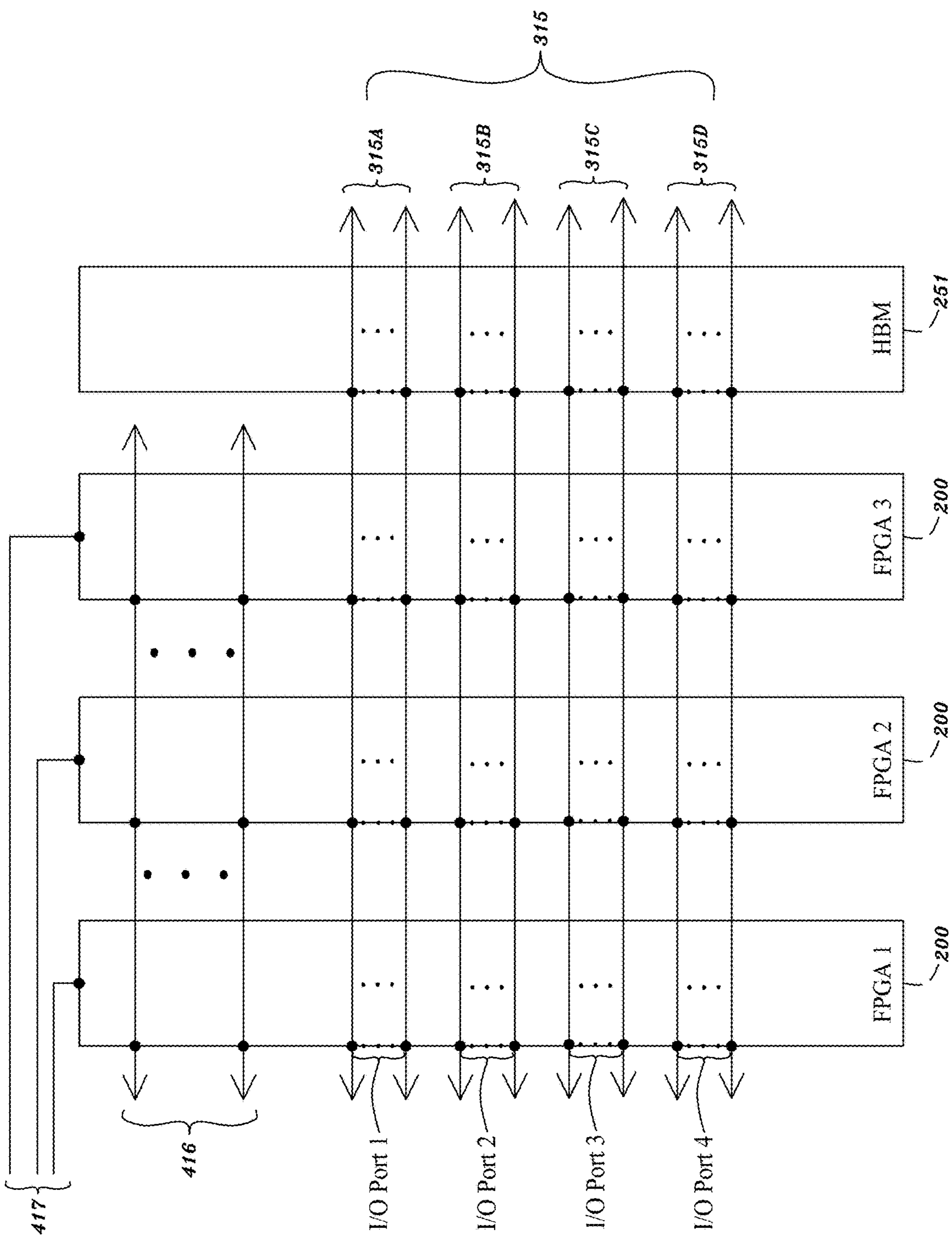
FIG. 18 is a block diagram illustrating multiple control buses for one or more standard commodity FPGA IC chips and multiple data buses for an expandable logic scheme based on one or more standard commodity FPGA IC chips and high bandwidth memory (HBM) IC chips in accordance with the present application.

Data and Control Buses for Expandable Logic Scheme Based on Standard Commodity FPGA IC Chips and/or High Bandwidth Memory (HBM) IC Chips FIG. 18 is a block diagram illustrating multiple control buses for one or more standard commodity FPGA IC chips and multiple data buses for an expandable logic scheme based on one or more standard commodity FPGA IC chips and high bandwidth memory (HBM) IC chips in accordance with the present application. Referring to FIGS. 14A, 16 and 18, the standard commodity logic drive 300 may be provided with multiple control buses 416 each constructed from multiple of the programmable interconnects 361 of its inter-chip interconnects 371 or multiple of the non-programmable interconnects 364 of its inter-chip interconnects 371.

For example, in the arrangement as illustrated in FIG. 14A, for the standard commodity logic drive 300, one of its control buses 416 may couple the IS1 pads 231 of all of its standard commodity FPGA IC chips 200 to each other or one another. Another of its control buses 416 may couple the IS2 pads 231 of all of its standard commodity FPGA IC chips 200 to each other or one another. Another of its control buses 416 may couple the IS3 pads 231 of all of its standard commodity FPGA IC chips 200 to each other or one another. Another of its control buses 416 may couple the IS4 pads 231 of all of its standard commodity FPGA IC chips 200 to each other or one another. Another of its control buses 416 may couple the OS1 pads 232 of all of its standard commodity FPGA IC chips 200 to each other or one another. Another of its control buses 416 may couple the OS2 pads 232 of all of its standard commodity FPGA IC chips 200 to each other or one another. Another of its control buses 416 may couple the OS3 pads 232 of all of its standard commodity FPGA IC chips 200 to each other or one another. Another of its control buses 416 may couple the OS4 pads 232 of all of its standard commodity FPGA IC chips 200 to each other or one another.

Referring to FIGS. 14A, 16 and 18, the standard commodity logic drive 300 may be provided with multiple chip-enable (CE) lines 417 each constructed from one or more of the programmable interconnects 361 of its inter-chip interconnects 371 or one or more of the non-programmable interconnects 364 of its inter-chip interconnects 371 to couple to the chip-enable (CE) pad 209 of one of its standard commodity FPGA IC chips 200.

Furthermore, referring to FIGS. 14A, 16 and 18, the standard commodity logic drive 300 may be provided with a set of data buses 315 for use in an expandable interconnection scheme. In this case, for the standard commodity logic drive 300, the set of its data buses 315 may include four data bus subsets or data buses, e.g., 315A, 315B, 315C and 315D, each coupling to or being associated with one of the I/O ports 377, e.g., I/O Port 1, I/O Port 2, I/O Port 3 and I/O Port 4, of each of its standard commodity FPGA IC chips 200 and one of multiple I/O ports of each of its high bandwidth memory (HBM) IC chips 251, that is, the data bus 315A couples to and is associated with one of the I/O ports 377, e.g., I/O Port 1, of each of its standard commodity FPGA IC chips 200 and a first one of the I/O ports of each of its high bandwidth memory (HBM) IC chips 251; the data bus 315B couples to and is associated with one of the I/O ports 377, e.g., I/O Port 2, of each of its standard commodity FPGA IC chips 200 and a second one of the I/O ports of each of its high bandwidth memory (HBM) IC chips 251; the data bus 315C couples to and is associated with one of the I/O ports 377, e.g., I/O Port 3, of each of its standard commodity FPGA IC chips 200 and a third one of the I/O ports of each of its high bandwidth memory (HBM) IC chips 251; and the data bus 315D couples to and is associated with one of the I/O ports 377, e.g., I/O Port 4, of each of its standard commodity FPGA IC chips 200 and a fourth one of the I/O ports of each of its high bandwidth memory (HBM) IC chips 251. Each of the four data buses, e.g., 315A, 315B, 315C and 315D, may provide data transmission with bit width ranging from 4 to 256, such as 64 for a case. In this case, for the standard commodity logic drive 300, each of its four data buses, e.g., 315A, 315B, 315C and 315D, may be composed of multiple data paths, having the number of 64 arranged in parallel, coupling respectively to the I/O pads 372, having the number of 64 arranged in parallel, of one of the I/O ports 377, e.g., I/O Port 1, I/O Port 2, I/O Port 3 and I/O Port 4, of each of its standard commodity FPGA IC chips 200, wherein each of the data paths of said each of its four data buses, e.g., 315A, 315B, 315C and 315D, may be constructed from multiple of the programmable interconnects 361 of its inter-chip interconnects 371 or multiple of the non-programmable interconnects 364 of its inter-chip interconnects 371.

Furthermore, referring to FIGS. 14A, 16 and 18, for the standard commodity logic drive 300, each of its data buses 315 may pass data for each of its standard commodity FPGA IC chips 200 and each of its high bandwidth memory (HBM) IC chips 251 (only one is shown in FIG. 18). For example, in a fifth clock cycle, for the standard commodity logic drive 300, a first one of its standard commodity FPGA IC chips 200 may be selected in accordance with a logic level at the chip-enable pad 209 of the first one of its standard commodity FPGA IC chips 200 to be enabled to pass data for the input operation of the first one of its standard commodity FPGA IC chips 200, and a second one of its standard commodity FPGA IC chips 200 may be selected in accordance with a logic level at the chip-enable pad 209 of the second one of its standard commodity FPGA IC chips 200 to be enabled to pass data for the output operation of the second one of its standard commodity FPGA IC chips 200. In the arrangement as illustrated in FIG. 14A, for the first one of the standard commodity FPGA IC chips 200 of the standard commodity logic drive 300, an I/O port, e.g. I/O Port 1, may be selected from its I/O ports 377, e.g., I/O Port 1, I/O Port 2, I/O Port 3 and I/O Port 4, to activate the small receivers 375 of the small I/O circuits 203 of its selected I/O port 377, e.g. I/O Port 1, in accordance with logic levels at its input-selection (IS) pads 231, e.g., IS1, IS2, IS3 and IS4 pads, and to disable the small drivers 374 of the small I/O circuits 203 of its selected I/O port 377, e.g. I/O Port 1, in accordance with logic levels at its output-selection (OS) pads 232, e.g., OS1, OS2, OS3 and OS4 pads; for the second one of its standard commodity FPGA IC chips 200, the same I/O port, e.g. I/O Port 1, may be selected from its I/O ports 377, e.g., I/O Port 1, I/O Port 2, I/O Port 3 and I/O Port 4, to enable the small drivers 374 of the small I/O circuits 203 of its selected I/O port 377, e.g. I/O Port 1, in accordance with logic levels at its output-selection (OS) pads 232, e.g., OS1, OS2, OS3 and OS4 pads, and to inhibit the small receivers 375 of the small I/O circuits 203 of its selected I/O port 377, e.g. I/O Port 1, in accordance with logic levels at its input-selection (IS) pads 231, e.g., IS1, IS2, IS3 and IS4 pads. Thereby, in the arrangement as illustrated in FIG. 14A, in the fifth clock cycle, for the standard commodity logic drive 300, the selected I/O port, e.g., I/O Port 1, of the second one of its standard commodity FPGA IC chips 200 may have the small drivers 374 to drive or pass first data associated with the data output of one of the programmable logic cells or elements (LCE) 2014 of the second one of its standard commodity FPGA IC chips 200, for example, to a first one, e.g., 315A, of its data buses 315 and the small receivers 375 of the selected I/O port, e.g., I/O Port 1, of the first one of its standard commodity FPGA IC chips 200 may receive the first data to be associated with a data input of the input data set of one of the programmable logic cells or elements (LCE) 2014 of the first one of its standard commodity FPGA IC chips 200, for example, from the first one, e.g., 315A, of its data buses 315. The first one, e.g., 315A, of its data buses 315 may have the data paths each coupling the small driver 374 of one of the small I/O circuits 203 of the selected I/O port, e.g., I/O Port 1, of the second one of its standard commodity FPGA IC chips 200 to the small receiver 375 of one of the small I/O circuits 203 of the selected I/O port, e.g., I/O Port 1, of the first one of its standard commodity FPGA IC chips 200.

Furthermore, referring to FIGS. 14A, 16 and 18, in the fifth clock cycle, for the standard commodity logic drive 300, a third one of its standard commodity FPGA IC chips 200 may be selected in accordance with a logic level at the chip-enable pad 209 of the third one of its standard commodity FPGA IC chips 200 to be enabled to pass data for the input operation of the third one of its standard commodity FPGA IC chips 200. In the arrangement as illustrated in FIG. 14A, for the third one of the standard commodity FPGA IC chips 200 of the standard commodity logic drive 300, an I/O port, e.g. I/O Port 1, may be selected from its I/O ports 377, e.g., I/O Port 1, I/O Port 2, I/O Port 3 and I/O Port 4, to activate the small receivers 375 of the small I/O circuits 203 of its selected I/O port 377, e.g. I/O Port 1, in accordance with logic levels at its input-selection (IS) pads 231, e.g., IS1, IS2, IS3 and IS4 pads, and to disable the small drivers 374 of the small I/O circuits 203 of its selected I/O port 377, e.g. I/O Port 1, in accordance with logic levels at its output-selection (OS) pads 232, e.g., OS1, OS2, OS3 and OS4 pads. Thereby, in the arrangement as illustrated in FIG. 14A, in the fifth clock cycle, for the standard commodity logic drive 300, the small receivers 375 of the selected I/O port, e.g., I/O Port 1, of the third one of its standard commodity FPGA IC chips 200 may receive the first data to be associated with a data input of the input data set of one of the programmable logic cells or elements (LCE) 2014 of the third one of its standard commodity FPGA IC chips 200, for example, from the first one, e.g., 315A, of its data buses 315. The first one, e.g., 315A, of its data buses 315 may have the data paths each coupling to the small receiver 375 of one of the small I/O circuits 203 of the selected I/O port, e.g., I/O Port 1, of the third one of its standard commodity FPGA IC chips 200. For the others of the standard commodity FPGA IC chips 200 of the standard commodity logic drive 300, the small driver and receiver 374 and 375 of each of the small I/O circuits 203 of their I/O ports 377, e.g. I/O Port 1, coupling to the first one, e.g., 315A, of its data buses 315 may be disabled and inhibited. For all of the high bandwidth memory (HBM) IC chips 251 of the standard commodity logic drive 300, the small driver and receiver 374 and 375 of each of the small I/O circuits 203 of their I/O ports, e.g. first I/O Port, coupling to the first one, e.g., 315A, of the data buses 315 of the standard commodity logic drive 300 may be disabled and inhibited.

Furthermore, referring to FIGS. 14A, 16 and 18, in the fifth clock cycle, in the arrangement as illustrated in FIG. 14A, for the first one of the standard commodity FPGA IC chips 200 of the standard commodity logic drive 300, an I/O port, e.g. I/O Port 2, may be selected from its I/O ports 377, e.g., I/O Port 1, I/O Port 2, I/O Port 3 and I/O Port 4, to enable the small drivers 374 of the small I/O circuits 203 of its selected I/O port 377, e.g. I/O Port 2, in accordance with logic levels at its output-selection (OS) pads 232, e.g., OS1, OS2, OS3 and OS4 pads, and to inhibit the small receivers 375 of the small I/O circuits 203 of its selected I/O port 377, e.g. I/O Port 2, in accordance with logic levels at its input-selection (IS) pads 231, e.g., IS1, IS2, IS3 and IS4 pads; for the second one of its standard commodity FPGA IC chips 200, the same I/O port, e.g. I/O Port 2, may be selected from its I/O ports 377, e.g., I/O Port 1, I/O Port 2, I/O Port 3 and I/O Port 4, to activate the small receivers 375 of the small I/O circuits 203 of its selected I/O port 377, e.g. I/O Port 2, in accordance with logic levels at its input-selection (IS) pads 231, e.g., IS1, IS2, IS3 and IS4 pads, and to disable the small drivers 374 of the small I/O circuits 203 of its selected I/O port 377, e.g. I/O Port 2, in accordance with logic levels at its output-selection (OS) pads 232, e.g., OS1, OS2, OS3 and OS4 pads. Thereby, in the arrangement as illustrated in FIG. 14A, in the fifth clock cycle, for the standard commodity logic drive 300, the selected I/O port, e.g., I/O Port 2, of the first one of its standard commodity FPGA IC chips 200 may have the small drivers 374 to drive or pass additional data associated with the data output of said one of the programmable logic cells or elements (LCE) 2014 of the first one of its standard commodity FPGA IC chips 200, for example, to a second one, e.g., 315B, of its data buses 315 and the small receivers 375 of the selected I/O port, e.g., I/O Port 2, of the second one of its standard commodity FPGA IC chips 200 may receive the additional data to be associated with a data input of the input data set of said one of the programmable logic cells or elements (LCE) 2014 of the second one of its standard commodity FPGA IC chips 200, for example, from the second one, e.g., 315B, of its data buses 315. The second one, e.g., 315B, of its data buses 315 may have the data paths each coupling the small driver 374 of one of the small I/O circuits 203 of the selected I/O port, e.g., I/O Port 2, of the first one of its standard commodity FPGA IC chips 200 to the small receiver 375 of one of the small I/O circuits 203 of the selected I/O port, e.g., I/O Port 2, of the second one of its standard commodity FPGA IC chips 200. For example, said one of the programmable logic cells or elements (LCE) 2014 of the first one of its standard commodity FPGA IC chips 200 may be programmed to perform logic operation for multiplication.

Further, referring to FIGS. 14A, 16 and 18, in a sixth clock cycle, for the standard commodity logic drive 300, the first one of its standard commodity FPGA IC chips 200 may be selected in accordance with the logic level at the chip-enable pad 209 of the first one of its standard commodity FPGA IC chips 200 to be enabled to pass data for the input operation of the first one of its standard commodity FPGA IC chips 200. In the arrangement as illustrated in FIG. 14A, for the first one of the standard commodity FPGA IC chips 200 of the standard commodity logic drive 300, the I/O port, e.g. I/O Port 1, may be selected from its I/O ports 377, e.g., I/O Port 1, I/O Port 2, I/O Port 3 and I/O Port 4, to activate the small receivers 375 of the small I/O circuits 203 of its selected I/O port 377, e.g. I/O Port 1, in accordance with logic levels at its input-selection (IS) pads 231, e.g., IS1, IS2, IS3 and IS4 pads, and to disable the small drivers 374 of the small I/O circuits 203 of its selected I/O port 377, e.g. I/O Port 1, in accordance with logic levels at its output-selection (OS) pads 232, e.g., OS1, OS2, OS3 and OS4 pads. Further, in the sixth clock cycle, for the standard commodity logic drive 300, a first one of its high bandwidth memory (HBM) IC chips 251 may be selected to be enabled to pass data for an output operation of the first one of its high bandwidth memory (HBM) IC chips 251. For the first one of the high bandwidth memory (HBM) IC chips 251 of the standard commodity logic drive 300, its first I/O port may be selected from its I/O ports, e.g., first, second, third and fourth I/O ports, to enable the small drivers 374 of the small I/O circuits 203 of its selected I/O port, e.g. first I/O Port, in accordance with logic levels at its I/O-port selection pads, and to inhibit the small receivers 375 of the small I/O circuits 203 of its selected I/O port, e.g. first I/O Port, in accordance with logic levels at its I/O-port selection pads. Thereby, in the arrangement as illustrated in FIG. 14A, in the sixth clock cycle, for the standard commodity logic drive 300, the selected I/O port, e.g., first I/O Port, of the first one of its high bandwidth memory (HBM) IC chips 251 may have the small drivers 374 to drive or pass second data to the first one, e.g., 315A, of its data buses 315 and the small receivers 375 of the selected I/O port, e.g., I/O Port 1, of the first one of its standard commodity FPGA IC chips 200 may receive the second data to be associated with a data input of the input data set of said one of the programmable logic cells or elements (LCE) 2014 of the first one of its standard commodity FPGA IC chips 200, for example, from the first one, e.g., 315A, of its data buses 315. The first one, e.g., 315A, of its data buses 315 may have the data paths each coupling the small driver 374 of one of the small I/O circuits 203 of the selected I/O port, e.g., first I/O port, of the first one of its high bandwidth memory (HBM) IC chips 251 to the small receiver 375 of one of the small I/O circuits 203 of the selected I/O port, e.g., I/O Port 1, of the first one of its standard commodity FPGA IC chips 200.

Furthermore, referring to FIGS. 14A, 16 and 18, in the sixth clock cycle, for the standard commodity logic drive 300, the second one of its standard commodity FPGA IC chips 200 may be selected in accordance with a logic level at the chip-enable pad 209 of the second one of its standard commodity FPGA IC chips 200 to be enabled to pass data for the input operation of the third one of its standard commodity FPGA IC chips 200. In the arrangement as illustrated in FIG. 14A, for the second one of the standard commodity FPGA IC chips 200 of the standard commodity logic drive 300, an I/O port, e.g. I/O Port 1, may be selected from its I/O ports 377, e.g., I/O Port 1, I/O Port 2, I/O Port 3 and I/O Port 4, to activate the small receivers 375 of the small I/O circuits 203 of its selected I/O port 377, e.g. I/O Port 1, in accordance with logic levels at its input-selection (IS) pads 231, e.g., IS1, IS2, IS3 and IS4 pads, and to disable the small drivers 374 of the small I/O circuits 203 of its selected I/O port 377, e.g. I/O Port 1, in accordance with logic levels at its output-selection (OS) pads 232, e.g., OS1, OS2, OS3 and OS4 pads. Thereby, in the arrangement as illustrated in FIG. 14A, in the sixth clock cycle, for the standard commodity logic drive 300, the small receivers 375 of the selected I/O port, e.g., I/O Port 1, of the second one of its standard commodity FPGA IC chips 200 may receive the second data to be associated with a data input of the input data set of said one of the programmable logic cells or elements (LCE) 2014 of the second one of its standard commodity FPGA IC chips 200, for example, from the first one, e.g., 315A, of its data buses 315. The first one, e.g., 315A, of its data buses 315 may have the data paths each coupling to the small receiver 375 of one of the small I/O circuits 203 of the selected I/O port, e.g., I/O Port 1, of the second one of its standard commodity FPGA IC chips 200. For the others of the standard commodity FPGA IC chips 200 of the standard commodity logic drive 300, the small driver and receiver 374 and 375 of each of the small I/O circuits 203 of their I/O ports 377, e.g. I/O Port 1, coupling to the first one, e.g., 315A, of the data buses 315 of the standard commodity logic drive 300 may be disabled and inhibited. For the others of the high bandwidth memory (HBM) IC chips 251 of the standard commodity logic drive 300, the small driver and receiver 374 and 375 of each of the small I/O circuits 203 of their I/O ports, e.g. first I/O Port, coupling to the first one, e.g., 315A, of the data buses 315 of the standard commodity logic drive 300 may be disabled and inhibited.

Further, referring to FIGS. 14A, 16 and 18, in a seventh clock cycle, for the standard commodity logic drive 300, the first one of its standard commodity FPGA IC chips 200 may be selected in accordance with a logic level at the chip-enable pad 209 of the first one of its standard commodity FPGA IC chips 200 to be enabled to pass data for the output operation of the first one of its standard commodity FPGA IC chips 200. In the arrangement as illustrated in FIG. 14A, for the first one of the standard commodity FPGA IC chips 200 of the standard commodity logic drive 300, the I/O port, e.g. I/O Port 1, may be selected from its I/O ports 377, e.g., I/O Port 1, I/O Port 2, I/O Port 3 and I/O Port 4, to enable the small drivers 374 of the small I/O circuits 203 of its selected I/O port 377, e.g. I/O Port 1, in accordance with logic levels at its output-selection (OS) pads 232, e.g., OS1, OS2, OS3 and OS4 pads, and to inhibit the small receivers 375 of the small I/O circuits 203 of its selected I/O port 377, e.g. I/O Port 1, in accordance with logic levels at its input-selection (IS) pads 231, e.g., IS1, IS2, IS3 and IS4 pads. Further, in the seventh clock cycle, for the standard commodity logic drive 300, the first one of its high bandwidth memory (HBM) IC chips 251 may be selected to be enabled to pass data for an input operation of the first one of its high bandwidth memory (HBM) IC chips 251. For the first one of the high bandwidth memory (HBM) IC chips 251 of the standard commodity logic drive 300, its first I/O port may be selected from its I/O ports, e.g., first, second, third and fourth I/O ports, to activate the small receivers 375 of the small I/O circuits 203 of its selected I/O port, e.g. first I/O Port, in accordance with logic levels at its I/O-port selection pads, and to disable the small drivers 374 of the small I/O circuits 203 of its selected I/O port, e.g. first I/O Port, in accordance with logic levels at its I/O-port selection pads. Thereby, in the arrangement as illustrated in FIG. 14A, in the seventh clock cycle, for the standard commodity logic drive 300, the selected I/O port, e.g., first I/O Port, of the first one of its high bandwidth memory (HBM) IC chips 251 may have the small receivers 375 to receive third data from the first one, e.g., 315A, of its data buses 315 and the small drivers 374 of the selected I/O port, e.g., I/O Port 1, of the first one of its standard commodity FPGA IC chips 200 may drive or pass the third data associated with the data output of said one of the programmable logic cells or elements (LCE) 2014 of the first one of its standard commodity FPGA IC chips 200, for example, to the first one, e.g., 315A, of its data buses 315. The first one, e.g., 315A, of its data buses 315 may have the data paths each coupling the small driver 374 of one of the small I/O circuits 203 of the selected I/O port, e.g., I/O Port 1, of the first one of its standard commodity FPGA IC chips 200 to the small receiver 375 of one of the small I/O circuits 203 of the selected I/O port, e.g., first I/O port, of the first one of its high bandwidth memory (HBM) IC chips 251.

Furthermore, referring to FIGS. 14A, 16 and 18, in the seventh clock cycle, for the standard commodity logic drive 300, the second one of its standard commodity FPGA IC chips 200 may be selected in accordance with a logic level at the chip-enable pad 209 of the second one of its standard commodity FPGA IC chips 200 to be enabled to pass data for the input operation of the second one of its standard commodity FPGA IC chips 200. In the arrangement as illustrated in FIG. 14A, for the second one of the standard commodity FPGA IC chips 200 of the standard commodity logic drive 300, an I/O port, e.g. I/O Port 1, may be selected from its I/O ports 377, e.g., I/O Port 1, I/O Port 2, I/O Port 3 and I/O Port 4, to activate the small receivers 375 of the small I/O circuits 203 of its selected I/O port 377, e.g. I/O Port 1, in accordance with logic levels at its input-selection (IS) pads 231, e.g., IS1, IS2, IS3 and IS4 pads, and to disable the small drivers 374 of the small I/O circuits 203 of its selected I/O port 377, e.g. I/O Port 1, in accordance with logic levels at its output-selection (OS) pads 232, e.g., OS1, OS2, OS3 and OS4 pads. Thereby, in the arrangement as illustrated in FIG. 14A, in the seventh clock cycle, for the standard commodity logic drive 300, the small receivers 375 of the selected I/O port, e.g., I/O Port 1, of the second one of its standard commodity FPGA IC chips 200 may receive the third data to be associated with a data input of the input data set of said one of the programmable logic cells or elements (LCE) 2014 of the second one of its standard commodity FPGA IC chips 200, for example, from the first one, e.g., 315A, of its data buses 315. The first one, e.g., 315A, of its data buses 315 may have the data paths each coupling to the small receiver 375 of one of the small I/O circuits 203 of the selected I/O port, e.g., I/O Port 1, of the second one of its standard commodity FPGA IC chips 200. For the others of the standard commodity FPGA IC chips 200 of the standard commodity logic drive 300, the small driver and receiver 374 and 375 of each of the small I/O circuits 203 of their I/O ports 377, e.g. I/O Port 1, coupling to the first one, e.g., 315A, of its data buses 315 may be disabled and inhibited. For the others of the high bandwidth memory (HBM) IC chips 251 of the standard commodity logic drive 300, the small driver and receiver 374 and 375 of each of the small I/O circuits 203 of their I/O ports, e.g. first I/O Port, coupling to the first one, e.g., 315A, of the data buses 315 of the standard commodity logic drive 300 may be disabled and inhibited.

Further, referring to FIGS. 14A, 16 and 18, in an eighth clock cycle, for the standard commodity logic drive 300, the first one of its high bandwidth memory (HBM) IC chips 251 may be selected to be enabled to pass data for an input operation of the first one of its high bandwidth memory (HBM) IC chips 251. For the first one of the high bandwidth memory (HBM) IC chips 251 of the standard commodity logic drive 300, its first I/O port may be selected from its I/O ports, e.g., first, second, third and fourth I/O ports, to activate the small receivers 375 of the small I/O circuits 203 of its selected I/O port, e.g. first I/O Port, in accordance with logic levels at its I/O-port selection pads, and to disable the small drivers 374 of the small I/O circuits 203 of its selected I/O port, e.g. first I/O Port, in accordance with logic levels at its I/O-port selection pads. Further, in the eighth clock cycle, for the standard commodity logic drive 300, a second one of its high bandwidth memory (HBM) IC chips 251 may be selected to be enabled to pass data for an output operation of the second one of its high bandwidth memory (HBM) IC chips 251. For the second one of the high bandwidth memory (HBM) IC chips 251 of the standard commodity logic drive 300, its first I/O port may be selected from its I/O ports, e.g., first, second, third and fourth I/O ports, to enable the small drivers 374 of the small I/O circuits 203 of its selected I/O port, e.g. first I/O Port, in accordance with logic levels at its I/O-port selection pads, and to inhibit the small receivers 375 of the small I/O circuits 203 of its selected I/O port, e.g. first I/O Port, in accordance with logic levels at its I/O-port selection pads. Thereby, in the eighth clock cycle, for the standard commodity logic drive 300, the selected I/O port, e.g., first I/O Port, of the first one of its high bandwidth memory (HBM) IC chips 251 may have the small receivers 375 to receive fourth data from the first one, e.g., 315A, of its data buses 315 and the selected I/O port, e.g., first I/O Port, of the second one of its high bandwidth memory (HBM) IC chips 251 may have the small drivers 374 to drive of pass the fourth data to the first one, e.g., 315A, of its data buses 315. The first one, e.g., 315A, of its data buses 315 may have the data paths each coupling the small driver 374 of one of the small I/O circuits 203 of the selected I/O port, e.g., first I/O port, of the second one of its high bandwidth memory (HBM) IC chips 251 to the small receiver 375 of one of the small I/O circuits 203 of the selected I/O port, e.g., first I/O port, of the first one of its high bandwidth memory (HBM) IC chips 251. For all of the standard commodity FPGA IC chips 200 of the standard commodity logic drive 300, the small driver and receiver 374 and 375 of each of the small I/O circuits 203 of their I/O ports 377, e.g. I/O Port 1, coupling to the first one, e.g., 315A, of its data buses 315 may be disabled and inhibited. For the others of the high bandwidth memory (HBM) IC chips 251 of the standard commodity logic drive 300, the small driver and receiver 374 and 375 of each of the small I/O circuits 203 of their I/O ports, e.g. first I/O Port, coupling to the first one, e.g., 315A, of the data buses 315 of the standard commodity logic drive 300 may be disabled and inhibited.

Architecture of Programming and Operation in Standard Commodity FPGA IC Chip

Figure 19:
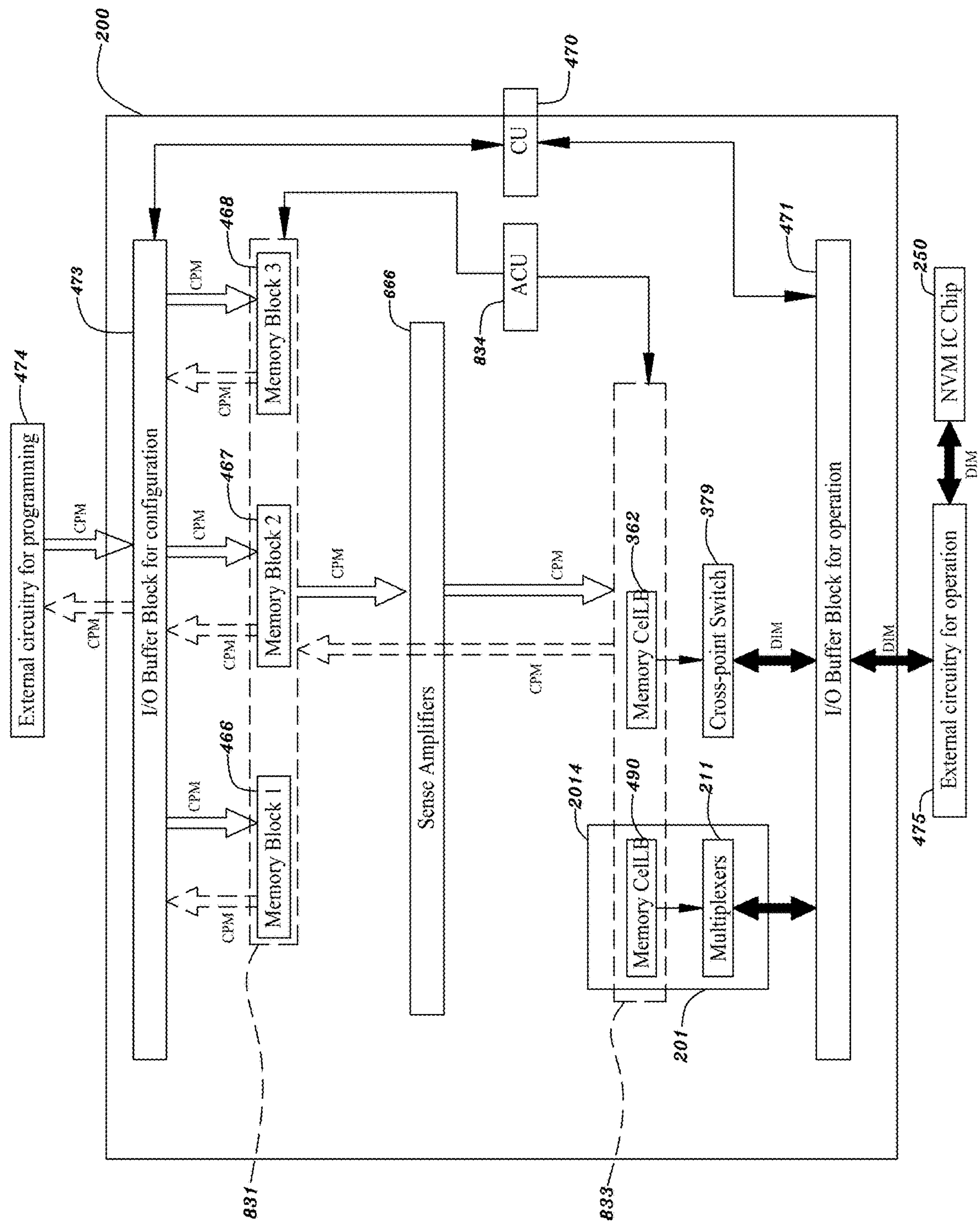
FIG. 19 is a block diagrams showing architecture of programming and operation in a standard commodity FPGA IC chip in accordance with the present application.

FIG. 19 is a block diagrams showing architecture of programming and operation in a standard commodity FPGA IC chip in accordance with the present application. Referring to FIG. 19, each of the standard commodity FPGA IC chips 200 in the standard commodity logic drive 300 as illustrated in FIG. 16 may include three non-volatile memory blocks 466, 467 and 468 each composed of the non-volatile storage units 830 arranged in the array 831 as illustrated in FIG. 13. The non-volatile memory cell 870, 880 or 907, i.e., configuration programming memory (CPM) cells, of each of the non-volatile storage units 830 in the non-volatile memory block 466 is configured to save or store original resulting values or programming codes for the look-up tables (LUT)

210 as seen in FIGS. 6A-6F or programming codes for the cross-point switches 379 as seen in FIG. 3A, 3B or 7, i.e., configuration programming memory (CPM) data. The original resulting values or programming codes, i.e., configuration programming memory (CPM) data, may be passed from configuration programming memory (CPM) cells of circuits 474 external of said each of the standard commodity FPGA IC chips 200, such as configuration programming memory (CPM) cells of the NVM IC chips 250 in the standard commodity logic drive 300 as illustrated in FIG. 16 or configuration programming memory (CPM) cells of circuits outside the standard commodity logic drive 300 as illustrated in FIG. 16, to the non-volatile memory cells 870, 880 or 907, i.e., configuration programming memory (CPM) cells, in the non-volatile memory block 466 through a plurality of the small I/O circuit 203 as seen in FIG. 5B in an I/O buffering block 473 of said each of the standard commodity FPGA IC chips 200 to be stored or saved in the non-volatile memory cells 870, 880 or 907, i.e., configuration programming memory (CPM) cells, of the non-volatile storage units 830 in the non-volatile memory block 466.

Referring to FIG. 19, the non-volatile memory cell 870, 880 or 907, i.e., configuration programming memory (CPM) cells, of each of the non-volatile storage units 830 in the non-volatile memory block 467 is configured to save or store immediately-previously self-configured resulting values or programming codes for the look-up tables (LUT) 210 as seen in FIGS. 6A-6F or programming codes for the cross-point switches 379 as seen in FIG. 3A, 3B or 7, i.e., configuration programming memory (CPM) data. The non-volatile memory cell 870, 880 or 907, i.e., configuration programming memory (CPM) cells, of each of the non-volatile storage units 830 in the non-volatile memory block 468 is configured to save or store currently self-configured resulting values or programming codes for the look-up tables (LUT) 210 of the programmable logic block (LB) 201 as seen in FIGS. 6A-6F or programming codes for the cross-point switches 379 as seen in FIG. 3A, 3B or 7, i.e., configuration programming memory (CPM) data.

Referring to FIG. 19, said each of the standard commodity FPGA IC chips 200 may include the sense amplifiers 666 as illustrated in FIG. 13 each configured to sense and amplify configuration programming memory (CPM) data saved or stored in one of the non-volatile memory cells 870, 880 or 907, i.e., configuration programming memory (CPM) cells, in one of the non-volatile memory blocks 466, 467 and 468 into the output "Out" of said each of the sense amplifiers 666.

Referring to FIG. 19, said each of the standard commodity FPGA IC chips 200 may include the control unit 834, e.g., address controller or decoder unit, as illustrated in FIG. 13 that is configured to select, one column by one column in turn, a group of ones from the non-volatile storage units 830 in one of the non-volatile memory blocks 466, 467 and 468 such that each of the sense amplifiers 666 may receive data from one of the non-volatile storage units 830 in the group.

Referring to FIG. 19, said each of the standard commodity FPGA IC chips 200 may include the volatile storage units 398 in the volatile memory array 833 as illustrated in FIG. 13. Each of the volatile storage units 398 may include the memory cell 490 configured to be programed to store one of the resulting values or programming codes, i.e., configuration programming memory (CPM) data, for the look-up table 210 of the programmable logic cells or element (LCE) 2014 as illustrated in FIG. 6A-6F or the memory cells 362 configured to be programed to store programming codes, i.e., configuration programming memory (CPM) data, to control the cross-point switches 379 as illustrated in FIGS. 3A, 3B and 7 or pass/no-pass switches 258 as illustrated in FIGS. 2A-2F. The control unit 834 is configured to select, one column by one column in turn, a group of ones from the volatile storage units 398 such that each of the sense amplifiers 666 may generate the output "Out" to one of the volatile storage units 398 in the group, as illustrated in FIG. 13. For said each of the standard commodity FPGA IC chips 200, the configuration programming memory (CPM) data stored in its memory cells 490 couple to the second set of input points of the multiplexer 211 of each of its programmable logic cells or elements (LCE) 2014 so as to define a function of said each of its programmable logic cells or elements (LCE) 2014 as illustrated in FIGS. 6A-6F; the configuration programming memory (CPM) data stored in its memory cells 362 couple to each of its cross-point switches 379 as seen in FIG. 3A, 3B or 7 so as to program said each of its cross-point switches 379.

Referring to FIG. 19, said each of the standard commodity FPGA IC chips 200 may include a control block 470 configured (1) to send control commands to circuits external of said each of the standard commodity FPGA IC chips 200 through the small I/O circuits 203 as seen in FIG. 3B in the I/O buffering blocks 471 and/or 473 and/or (2) to receive control commands from circuits external of said each of the standard commodity FPGA IC chips 200 through the small I/O circuits 203 as seen in FIG. 3B in the I/O buffering blocks 471 and/or 473.

Referring to FIG. 19, for said each of the standard commodity FPGA IC chips 200, a data information memory (DIM) stream may pass from data information memory (DIM) cells of its external circuits 475, such as SRAM or DRAM cells of the HBM IC chips 251 in the standard commodity logic drive 300 as illustrated in FIG. 16, to the first set of input points of the multiplexer 211 of its programmable logic cells or element (LCE) 2014 through the small I/O circuits 203 as seen in FIG. 5B in its I/O buffering block 471. Alternatively, the multiplexer 211 of each of its programmable logic cells or element (LCE) 2014 may generate a data output to data information memory (DIM) cells of its external circuits 475, such as SRAM or DRAM cells of the HBM IC chips 251 in the standard commodity logic drive 300 as illustrated in FIG. 16, through one of the small I/O circuits 203 as seen in FIG. 5B in its I/O buffering block 471. For said each of the standard commodity FPGA IC chips 200, each of its cross-point switches 379 may pass a data information memory (DIM) stream to or from data information memory (DIM) cells of its external circuits 475, such as SRAM or DRAM cells of the HBM IC chips 251 in the standard commodity logic drive 300 as illustrated in FIG. 16, through one of the small I/O circuits 203 as seen in FIG. 5B in its I/O buffering block 471.

Referring to FIG. 19, the data for the data information memory (DIM) stream saved or stored in the SRAM or DRAM cells, i.e., data information memory (DIM) cells, in the HBM IC chips 251 may be backed up or stored in the NVM IC chips 250 in the standard commodity logic drive 300 as illustrated in FIG. 16 or a memory device outside the standard commodity logic drive 300 as illustrated in FIG. 16. Thereby, when the power supply for the standard commodity logic drive 300 is turned off, the data for the data information memory (DIM) stream stored in the NVM IC chips 250 of the standard commodity logic drive 300 may be kept.

Referring to FIG. 19, for reconfiguration for artificial intelligence (AI), machine learning or deep learning for said each of the standard commodity FPGA IC chips 200, the current operation, such as AND logic operation, of one of its programmable logic cells or elements (LCE) 2014 as illustrated in FIG. 6A, 6E or 6F may be self-reconfigured to another operation, such as NAND logic operation, by reconfiguring the resulting values or programming codes, i.e., configuration programming memory (CPM) data, in a first group of its memory cells 490 for the look-up table (LUT) 210 as seen in FIGS. 6A-6F. The current switching state of one of its cross-point switches 379 as seen in FIG. 3A, 3B or 7 may be self-reconfigured to another switching state by reconfiguring the programming codes, i.e., configuration programming memory (CPM) data, in a second group of its memory cells 362. The currently self-reconfigured resulting values or programming codes, i.e., configuration programming memory (CPM) data, in its memory cells 490 and 362 may be passed to and stored in the non-volatile memory cells 870, 880 or 907, i.e., configuration programming memory (CPM) cells, in its non-volatile memory block 468. Also, the immediately-previously self-reconfigured resulting values or programming codes, i.e., configuration programming memory (CPM) data, in its memory cells 490 and 362 may be passed to and stored in the non-volatile memory cells 870, 880 or 907, i.e., configuration programming memory (CPM) cells, in its non-volatile memory block 467. Further, the original, immediately-previously self-reconfigured and currently self-reconfigured resulting values or programming codes may be passed from the non-volatile memory cells 870, 880 or 907 in its respective non-volatile memory blocks 466, 467 and 468 to configuration programming memory (CPM) cells of its external circuits 474 through a plurality of the small I/O circuit 203 as seen in FIG. 5B in its I/O buffering block 473. The configuration programming memory (CPM) data, i.e., the resulting values or programming codes for its look-up tables (LUT) 210 as seen in FIGS. 6A-6F or programming codes for its cross-point switches 379 as seen in FIG. 3A, 3B or 7, may be passed from the configuration programming memory (CPM) cells of its external circuits 474 to the non-volatile memory cells 870, 880 or 907 in either of its non-volatile memory blocks 467 and 468 through the small I/O circuits 203 as seen in FIG. 5B in its I/O buffering block 473 to be stored or saved in the non-volatile memory cells 870, 880 or 907 in said either of its memory blocks 467 and 468 to reconfigure its programmable logic cells or elements (LCE) 2014 and/or its cross-point switches 379.

Accordingly, referring to FIG. 19, for the standard commodity logic drive 300 as illustrated in FIG. 16, when it is powered on, each of its standard commodity FPGA IC chips 200 may reload the configuration programming memory (CPM) data stored or saved in the non-volatile memory cells 870, 880 or 907 in one of the three non-volatile memory blocks 466, 467 and 468 of said each of its standard commodity FPGA IC chips 200 to the memory cells 490 and 362 of said each of its standard commodity FPGA IC chips 200. During operation, said each of its standard commodity FPGA IC chips 200 may be reset to reload the configuration programming memory (CPM) data stored or saved in the non-volatile memory cells 870, 880 or 907 in the non-volatile memory block 466 or 467 of said each of its standard commodity FPGA IC chips 200 to the memory cells 490 and 362 of said each of its standard commodity FPGA IC chips 200.

Structure for Thermoelectric (TE) Cooler

Figure 20:
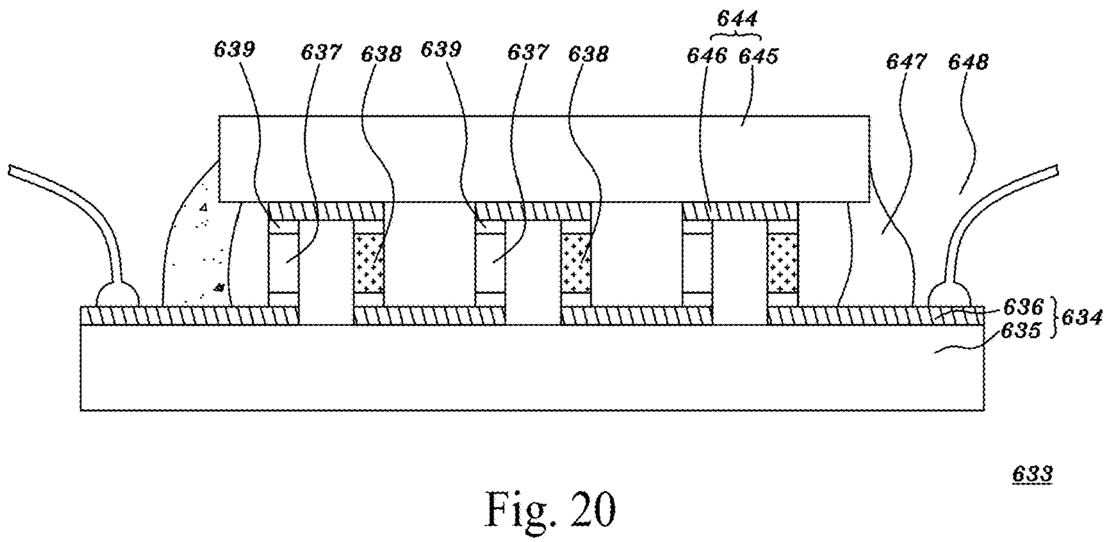
FIG. 20 is a schematically cross-sectional view showing a thermoelectric (TE) cooler in accordance with an embodiment of the present application.

FIG. 20 is a schematically cross-sectional view showing a thermoelectric (TE) cooler in accordance with an embodiment of the present application. Referring to FIG. 20, a thermoelectric (TE) cooler 633 includes (1) a first circuit substrate 634 having a first insulating panel 63, such as ceramic substrate made of aluminum oxide ($Al_2O_3$), aluminum nitride (AlN) or beryllium oxide (BeO) having a thickness between 0.1 and 25 μm, and a patterned circuit layer 636 on a top surface of the first insulating panel 635, wherein the patterned circuit layer 636 may include a patterned copper layer having a thickness between 5 and 50 μm on the top surface of the first insulating panel 635, (2) multiple N-type semiconductor spacers 637, such as bismuth telluride ($Bi_2Te_3$) or bismuth selenide ($Bi_2Se_3$), each having a bottom surface mounted to the patterned circuit layer 636 via an adhesive material 639 such as tin-containing solder, e.g., tin-lead alloy or tin-silver alloy, wherein each of the N-type semiconductor spacers 637 may have a width or largest horizontally transverse dimension between 100 and 1,000 μm and a height between 750 and 3,000 μm, (3) multiple P-type semiconductor spacers 638, such as bismuth telluride ($Bi_2Te_3$) or bismuth selenide ($Bi_2Se_3$), each having a bottom surface mounted to the patterned circuit layer 636 via the adhesive material 639 such as tin-containing solder, e.g., tin-lead alloy or tin-silver alloy, wherein each of the P-type semiconductor spacers 638 may have a width or largest horizontally transverse dimension between 100 and 1,000 μm and a height between 750 and 3,000 μm, wherein the N-type and P-type semiconductor spacers 637 and 638 are alternately arranged over the first insulating panel 635, that is, each of the N-type semiconductor spacers 637 in a center region is between neighboring two of the P-type semiconductor spacers 638 and each of the P-type semiconductor spacers 638 in a center region is between neighboring two of the N-type semiconductor spacers 637, (4) a second circuit substrate 644 having a second insulating panel 645, such as ceramic substrate made of aluminum oxide ($Al_2O_3$), aluminum nitride (AlN) or beryllium oxide (BeO) having a thickness between 0.1 and 25 μm, and a patterned circuit layer 646 on a bottom surface of the second insulating panel 645, wherein the patterned circuit layer 646 may include a patterned copper layer having a thickness between 5 and 50 μm on the bottom surface of the second insulating panel 645, wherein the patterned circuit layer 646 is bonded to the N-type and P-type semiconductor spacers 637 and 368 via the adhesive material 639 such as tin-containing solder, e.g., tin-lead alloy or tin-silver alloy, wherein the N-type and P-type semiconductor spacers 637 and 638 in each pair couple to each other through the patterned circuit layer 636, and the N-type and P-type semiconductor spacers 637 and 638 in each neighboring pairs couple to each other through the patterned circuit layer 646, and (5) an encapsulant 647 surrounding a gap between the first and second circuit substrates 634 and 635 to seal the N-type and P-type semiconductor spacers 637 and 638 in the gap.

Referring to FIG. 20, the patterned circuit layer 636 of the thermoelectric (TE) cooler 633 may have two terminals coupling respectively to one of the N-type semiconductor spacers 637 at its leftmost side and one of the P-type semiconductor spacers 638 at its rightmost side, configured to have two wires 648 bonded thereto respectively by a wirebonding process. For example, when a left one of the wires 648 couples to a voltage Vcc of power supply and a right one of the wires 648 couples to a voltage Vss of ground reference, an electric current may be generated from one of the two terminals of the thermoelectric (TE) cooler 633, e.g., a left one of the two terminals, to the other of the two terminals of the thermoelectric (TE) cooler 633, e.g., a right one of the two terminals, alternately through the N-type and P-type semiconductor spacers 637 and 638 such that electrons in the patterned circuit layer 646 may absorb heat or energy from the second insulating panel 645 to move to each of the N-type semiconductor spacers 637 and electrons in each of the N-type semiconductor spacers 637 may release heat or energy to the first insulating panel 635 to move to the patterned circuit layer 636, and electric charges in the patterned circuit layer 646 may absorb heat or energy from the second insulating panel 645 to move to each of the P-type semiconductor spacers 638 and electric charges in each of the P-type semiconductor spacers 638 may release heat or energy to the first insulating panel 635 to move to the patterned circuit layer 636. Thereby, the first insulating panel 635 is at a hot side of the thermoelectric (TE) cooler 633, and the second insulating panel 645 is at a cold side of the thermoelectric (TE) cooler 633.

Alternatively, when the right one of the wires 648 couples to a voltage Vcc of power supply and the left one of the wires 648 couples to a voltage Vss of ground reference, an electric current may be generated from one of the two terminals of the thermoelectric (TE) cooler 633, e.g., the right one of the two terminals, to the other of the two terminals of the thermoelectric (TE) cooler 633, e.g., the left one of the two terminals, alternately through the P-type and N-type semiconductor spacers 638 and 637 such that electrons in the patterned circuit layer 636 may absorb heat or energy from the first insulating panel 635 to move to each of the N-type semiconductor spacers 637 and electrons in each of the N-type semiconductor spacers 637 may release heat or energy to the second insulating panel 635 to move to the patterned circuit layer 646, and electric charges in the patterned circuit layer 636 may absorb heat or energy from the first insulating panel 635 to move to each of the P-type semiconductor spacers 638 and electric charges in each of the P-type semiconductor spacers 638 may release heat or energy to the second insulating panel 645 to move to the patterned circuit layer 646. Thereby, the first insulating panel 635 is at a cold side of the thermoelectric (TE) cooler 633, and the second insulating panel 645 is at a hot side of the thermoelectric (TE) cooler 633.

Specification for Processes for Fabricating Semiconductor Chip

FIG. 21A is a schematically cross-sectional view showing a first type of semiconductor chip in accordance with an embodiment of the present application. Referring to FIG. 21A, the standard commodity FPGA IC chips 200, DPIIC chips 410, dedicated I/O chips 265, dedicated control chip 260, NVM IC chips 250, IAC chip 402, HBM IC chips 251, GPU chips 269*a* and CPU chip 269*b* as seen in FIG. 16 may have a structure for a first type of semiconductor chip 100 mentioned as below. The first type of semiconductor chip 100 may include (1) a semiconductor substrate 2, such as silicon substrate, GaAs substrate, SiGe substrate or Silicon-On-Insulator (SOI) substrate; (2) multiple semiconductor devices 4 in or over a semiconductor-device area of the semiconductor substrate 2; (3) a first interconnection scheme for a chip (FISC) 20 over the semiconductor substrate 2, provided with one or more interconnection metal layers 6 coupling to the semiconductor devices 4 and one or more insulating dielectric layers 12 each between neighboring two of the interconnection metal layers 6, wherein each of the one or more interconnection metal layers 6 may have a thickness between 0.1 and 2 micrometers; (4) a passivation layer 14 over the first interconnection scheme for a chip (FISC) 20, wherein the first interconnection scheme 20 has multiple first metal pads at bottoms of multiple openings 14*a* in the passivation layer 14; (5) a second interconnection scheme 29 for a chip (SISC) optionally provided over the passivation layer 14, provided with one or more interconnection metal layers 27 coupling to the first metal pads of the first interconnection scheme for a chip (FISC) 20 through the openings 14*a* and one or more polymer layers 42 each between neighboring two of the interconnection metal layers 27, under a bottommost one of the interconnection metal layers 27 or over a topmost one of the interconnection metal layers 27, wherein the second interconnection scheme 29 has multiple second metal pads at bottoms of multiple openings 42*a* in the topmost one of its polymer layers 42, wherein each of the interconnection metal layers 27 may have a thicknesses between 3 and 5 micrometers; and (6) multiple micro-bumps or micro-pillars 34 on the second metal pads of the second interconnection scheme for a chip (SISC) 29 or, if the SISC 29 is not provided, on the first metal pads of the first interconnection scheme for a chip (FISC) 20.

Referring to FIG. 21A, the semiconductor devices 4 may include a memory cell, a logic circuit, a passive device, such as resistor, capacitor, inductor or filter, or an active device, such as p-channel and/or n-channel MOS devices. The semiconductor devices 4 may compose the multiplexer 211 of the programmable logic cells or elements (LCE) 2014, the memory cells 490 of the programmable logic cells or elements (LCE) 2014, the memory cells 362 for the cross-point switches 379 and the small I/O circuits 203, as illustrated in FIGS. 1A-7, 13, 14A and 14B, for each of the standard commodity FPGA IC chips 200 of the standard commodity logic drive 300 as seen in FIG. 16. The semiconductor devices 4 may compose the memory cells 362 for the cross-point switches 379 and small I/O circuits 203, as illustrated in FIGS. 1A-5B, 7, 13 and 15, for each of the DPIIC chips 410 of the standard commodity logic drive 300 as seen in FIG. 16. The semiconductor devices 4 may compose the large and small I/O circuits 341 and 203, as illustrated in FIGS. 5A and 5B, for each of the dedicated I/O chips 265 of the standard commodity logic drive 300 as seen in FIG. 16.

Referring to FIG. 21A, each of the interconnection metal layers 6 of the FISC 20 may include (1) a copper layer 24 having lower portions in openings in a lower one of the insulating dielectric layers 12, such as SiOC layers having a thickness of between 3 nm and 500 nm, and upper portions having a thickness of between 3 nm and 500 nm over the lower one of the insulating dielectric layers 12 and in openings in an upper one of the insulating dielectric layers 12, (2) an adhesion layer 18, such as titanium or titanium nitride having a thickness of between 1 nm and 50 nm, at a bottom and sidewall of each of the lower portions of the copper layer 24 and at a bottom and sidewall of each of the upper portions of the copper layer 24, and (3) a seed layer 22, such as copper, between the copper layer 24 and the adhesion layer 18, wherein the copper layer 24 has a top surface substantially coplanar with a top surface of the upper one of the insulating dielectric layers 12.

Referring to FIG. 21A, the passivation layer 14 containing a silicon-nitride, SiON or SiCN layer having a thickness greater than 0.3 μm for example may protect the semiconductor devices 4 and the interconnection metal layers 6 from being damaged by moisture foreign ion contamination, or from water moisture or contamination form external environment, for example sodium mobile ions. Each of the openings 14*a* in the passivation layer 14 may have a transverse dimension, from a top view, of between 0.5 and 20 μm.

Referring to FIG. 21A, each of the interconnection metal layers 27 of the SISC 29 may include (1) a copper layer 40 having lower portions in openings in one of the polymer layers 42 having a thickness of between 0.3 μm and 20 μm, and upper portions having a thickness 0.3 μm and 20 μm over said one of the polymer layers 42, (2) an adhesion layer 28*a*, such as titanium or titanium nitride having a thickness of between 1 nm and 50 nm, at a bottom and sidewall of each of the lower portions of the copper layer 40 and at a bottom of each of the upper portions of the copper layer 40, and (3) a seed layer 28*b*, such as copper, between the copper layer 40 and the adhesion layer 28*a*, wherein said each of the upper portions of the copper layer 40 may have a sidewall not covered by the adhesion layer 28*a*.

Figure 24A:
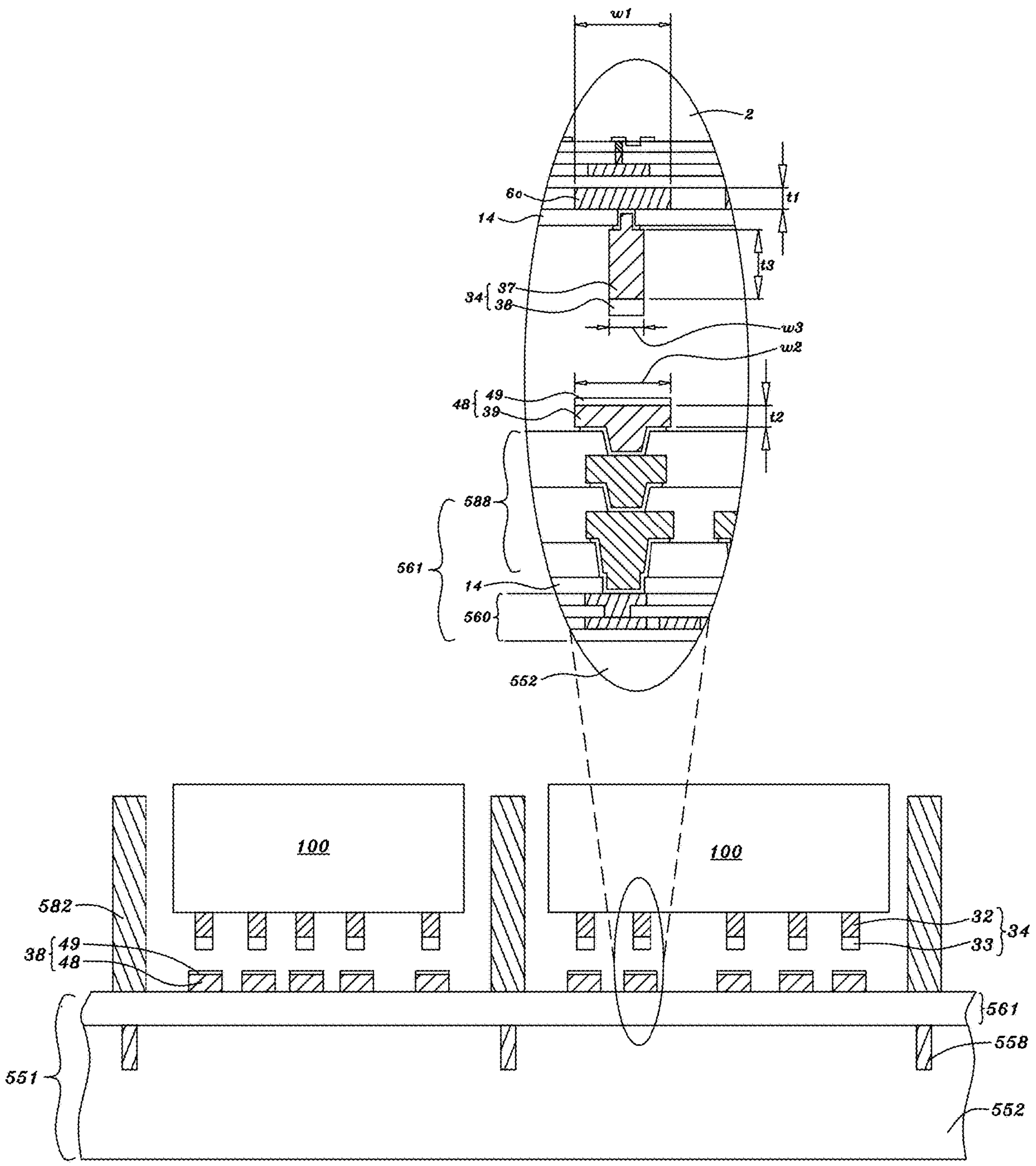
FIGS. 24A-24D are schematically cross-sectional views showing a process for fabricating a chip package for a standard commodity logic drive for a second alternative in accordance with an embodiment of the present application.
Figure 24B:
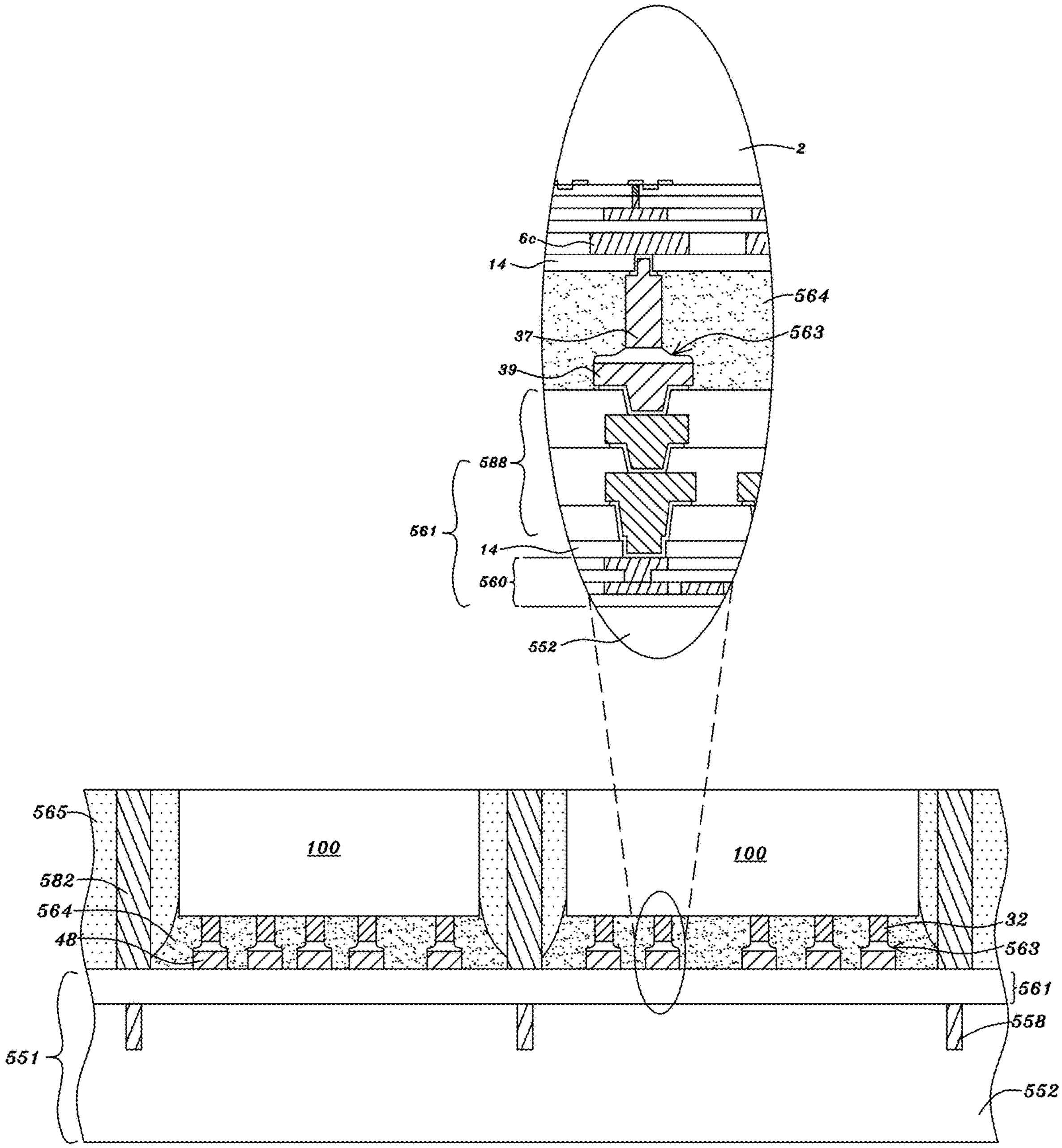

Referring to FIG. 21A, each of the micro-bumps or micro-pillars 34 over the second interconnection scheme for a chip (SISC) 29 or first interconnection scheme for a chip (FISC) 20 may be of various types. A first type of micro-bumps or micro-pillars 34 may include, as seen in FIG. 21A, (1) an adhesion layer 26*a*, such as titanium (Ti) or titanium nitride (TiN) layer having a thickness of between 1 nm and 50 nm, on the second metal pads of the second interconnection scheme for a chip (SISC) 29 or, if the second interconnection scheme for a chip (SISC) 29 is not provided, on the first metal pads of the first interconnection scheme for a chip (FISC) 20, (2) a seed layer 26*b*, such as copper, on its adhesion layer 26*a* and (3) a copper layer 32 having a thickness of between 1 μm and 60 μm on its seed layer 26*b*. Alternatively, a second type of micro-bumps or micro-pillars 34 may include the adhesion layer 26*a*, seed layer 26*b* and copper layer 32 as mentioned above, and may further include a tin-containing solder cap made of tin or a tin-silver alloy, which has a thickness of between 1 μm and 50 μm on its copper layer 32. Alternatively, a third type of micro-bumps or micro-pillars 34 may be thermal compression bumps, including the adhesion layer 26*a* and seed layer 26*b* as mentioned above, and may further include, as seen in FIG. 24A, a copper layer 37 having a thickness t3 of between 2 μm and 20 μm, such as 3 μm, and a largest transverse dimension w3, such as diameter in a circular shape, between 1 μm and 15 μm, such as 3 μm, on its seed layer 26*b* and a solder cap 38 made of a tin-silver alloy, a tin-gold alloy, a tin-copper alloy, a tin-indium alloy, indium or tin, which has a thickness of between 1 μm and 15 μm, such as 2 μm, and a largest transverse dimension, such as diameter in a circular shape, between 1 μm and 15 μm, such as 3 μm, on its copper layer 37. The third type of micro-bumps or micro-pillars 34 are formed respectively on multiple metal pads 6*c* provided as seen in FIGS. 24A and 24B by a frontmost one of the interconnection metal layers 27 of the second interconnection scheme for a chip (SISC) 29 or by, if the second interconnection scheme for a chip (SISC) 29 is not provided, a frontmost one of the interconnection metal layers 6 of the first interconnection scheme for a chip (FISC) 20, wherein each of the metal pads 6*c* may have a thickness t1 between 1 and 10 micrometers or between 2 and 10 micrometers and a largest transverse dimension w1, such as diameter in a circular shape, between 1 μm and 15 μm, such as 5 μm.

FIG. 21B is a schematically cross-sectional view showing a second type of semiconductor chip in accordance with an embodiment of the present application. Referring to FIG. 21B, a second type of semiconductor chip 100 may have similar structure as illustrated in FIG. 21A. For an element indicated by the same reference number shown in FIGS. 21A and 21B, the specification of the element as seen in FIG. 21B may be referred to that of the element as illustrated in FIG. 21A. The difference between the first and second types of semiconductor integrated-circuit (IC) chips 100 is that the second type of semiconductor chip 100 may be provided with (1) an insulating bonding layer 52 at its active side and on the topmost one of the insulating dielectric layers 12 of its first interconnection scheme for a chip (FISC) 20 and (2) multiple micro-pads 6*a* at its active side and in multiple openings 52*a* in its insulating bonding layer 52 and on the topmost one of the interconnection metal layers 6 of its first interconnection scheme for a chip (FISC) 20, instead of the passivation layer 14, second interconnection scheme for a chip (SISC) 29 and micro-bumps or micro-pillars 34 as seen in FIG. 21A. For the second type of semiconductor chip 100, its insulating bonding layer 52 may include a silicon-oxide layer having a thickness between 0.1 and 2 μm. Each of its micro-pads 6*a* may include (1) a copper layer 24 having a thickness of between 3 nm and 500 nm in one of the openings 52*a* in its insulating bonding layer 52, (2) an adhesion layer 18, such as titanium or titanium nitride having a thickness of between 1 nm and 50 nm, at a bottom and sidewall of the copper layer 24 of said each of its micro-pads 6*a*, and (3) a seed layer 22, such as copper, between the copper layer 24 and adhesion layer 18 of said each of its micro-pads 6*a*, wherein the copper layer 24 of said each of its micro-pads 6*a* may have a top surface substantially coplanar with a top surface of the silicon-oxide layer of its insulating bonding layer 52.

Embodiment for Interposer

One or more semiconductor integrated-circuit (IC) chips 100 of the first or second type as seen in FIGS. 21A and 21B may be packaged using an interposer. The interposer may be provided with high density interconnects for fan-out of the first or second type of semiconductor integrated-circuit (IC) chips 100 and interconnection between two of the first or second type of semiconductor integrated-circuit (IC) chips 100.

Figure 22A:
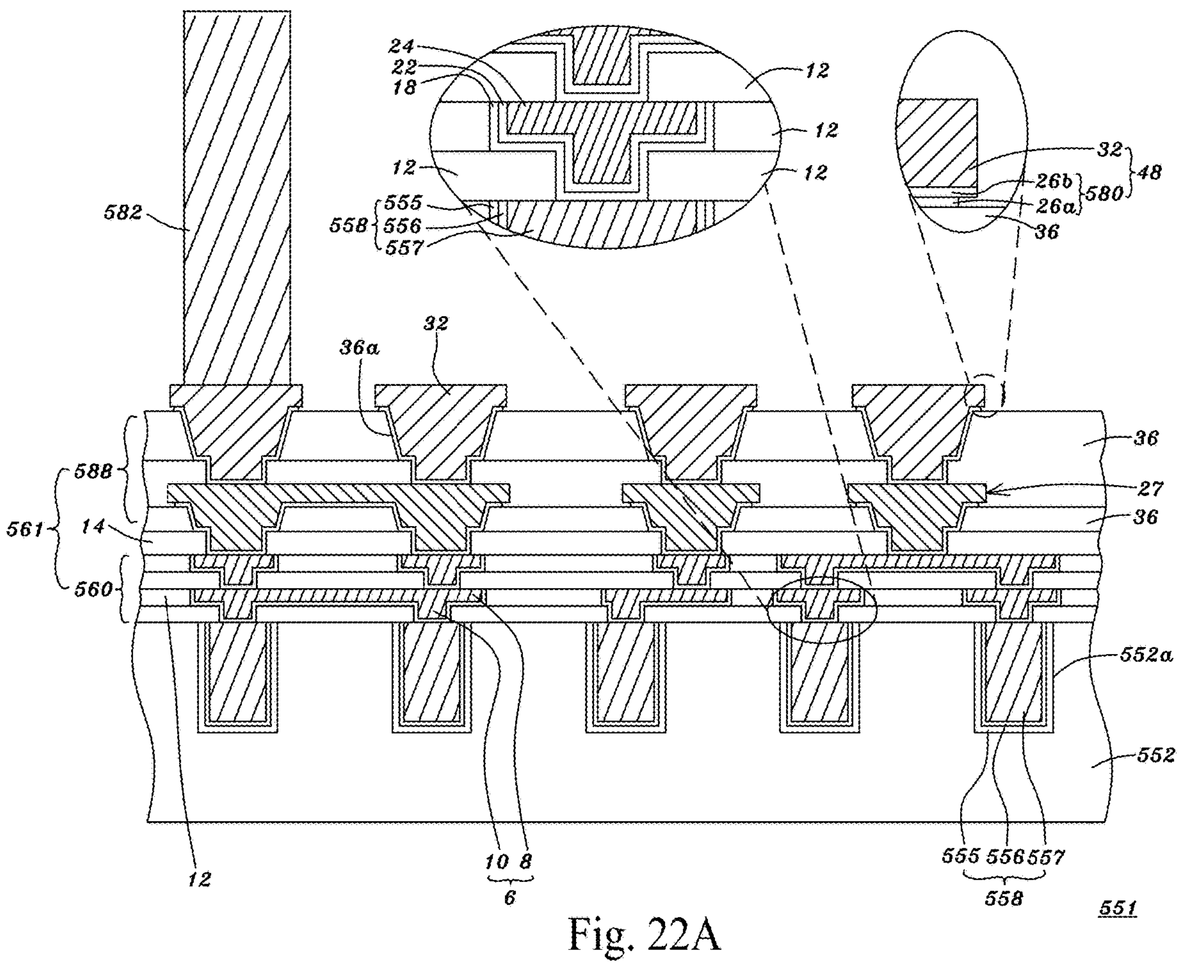
FIG. 22A is a schematically cross-sectional view showing a first type of interposer in accordance with various embodiments of the present application.

FIG. 22A is a schematically cross-sectional view showing a first type of interposer in accordance with various embodiments of the present application. Referring to FIG. 22A, a first type of interposer 551 may include (1) a semiconductor substrate 552, such as silicon wafer; (2) multiple vias 558 in the semiconductor substrate 552; (3) a first interconnection scheme for an interposer (FISIP) 560 over the semiconductor substrate 552, provided with one or more interconnection metal layers 6 coupling to the vias 558 and one or more insulating dielectric layers 12 each between neighboring two of the interconnection metal layers 6, wherein the specification and process for the interconnection metal layers 6 and insulating dielectric layers 12 for the FISIP 560 may be referred to those for the first interconnection scheme for a chip (FISC) 20 as illustrated in FIG. 21; (4) a passivation layer 14 over the first interconnection scheme for an interposer (FISIP) 560, wherein the first interconnection scheme 20 has multiple third metal pads at bottoms of multiple openings 14*a* in the passivation layer 14, wherein the specification and process for the passivation layer 14 over the FISIP 560 may be referred to those for the passivation layer 14 over the first interconnection scheme for a chip (FISC) 20 as illustrated in FIG. 21; (5) a second interconnection scheme for an interposer (SISIP) 588 optionally provided over the passivation layer 14, provided with one or more interconnection metal layers 27 coupling to the third metal pads of the first interconnection scheme for an interposer (FISIP) 560 through the openings 14*a* and one or more polymer layers 42 each between neighboring two of the interconnection metal layers 27, under a bottommost one of the interconnection metal layers 27 or over a topmost one of the interconnection metal layers 27, wherein the second interconnection scheme for an interposer (SISIP) 588 has multiple fourth metal pads at bottoms of multiple openings

42*a* in the topmost one of its polymer layers 42, wherein the specification and process for the interconnection metal layers 27 and polymer layers 14 for the SISIP 588 may be referred to those for the SISC 29 as illustrated in FIG. 21; (6) multiple micro-pads 48 on the fourth metal pads of the second interconnection scheme for an interposer (SISIP) 588 or, if the SISIP 588 is not provided, on the third metal pads of the first interconnection scheme for an interposer (FISIP) 560; and (7) multiple through package vias (TPVs) 582 each having a copper layer with a thickness of between 5 μm and 300 μm on the copper layer 32 of some of the micro-pads 48 of the first type of interposer 551.

For the first type of interposer 551, each of its micro-pads 48 over the SISIP 588 or FISIP 560 may be of various types. A first type of its micro-pads 48 may include, as seen in FIG. 22A, (1) an adhesion layer 26*a*, such as titanium (Ti) or titanium nitride (TiN) layer having a thickness of between 1 nm and 50 nm, on the fourth metal pads of its second interconnection scheme for an interposer (SISIP) 588 or, if the second interconnection scheme for an interposer (SISIP) 588 is not provided, on the third metal pads of its first interconnection scheme for an interposer (FISIP) 560, (2) a seed layer 26*b*, such as copper, on its adhesion layer 26*a* and (3) a copper layer 32 having a thickness of between 1 μm and 60 μm on its seed layer 26*b*. Alternatively, a second type of its micro-pads 48 may be thermal compression pads, including the adhesion layer 26*a* and seed layer 26*b* as mentioned above, and further including, as seen in FIG. 24A, a copper layer 48 having a thickness t2 of between 1 μm and 10 μm or between 2 and 10 micrometers and a largest transverse dimension w2, such as diameter in a circular shape, between 1 μm and 15 μm, such as 5 μm, on the seed layer 26*b* of the second type of its micro-pads 48, and a metal cap 49 made of a tin-silver alloy, a tin-gold alloy, a tin-copper alloy, a tin-indium alloy, indium, tin or gold, which has a thickness of between 0.1 μm and 5 μm, such as 1 μm, on the copper layer 48 of the second type of its micro-pads 48. Neighboring two of the second type of its micro-pads 48 may have a pitch (between centers of the neighboring two thereof) between 3 μm and 20 μm.

Referring to FIG. 22A, for the first type of interposer 551, each of its vias 558 may include (1) a copper layer 557 in its semiconductor substrate 552, (2) an insulating layer 555 at a sidewall and bottom of the copper layer 557 of said each of its vias 558 and in its semiconductor substrate 552 and (3) an adhesion/seed layer 556 at the sidewall and bottom of the copper layer 557 of said each of its vias 558 and between the copper layer 557 and insulating layer 555 of said each of its vias 558. Each of its vias 588 or the copper layer 577 of said each of its vias 558 may have a depth between 30 μm and 150 μm, or 50 μm and 100 μm, and a diameter or largest transverse size between 5 μm and 50 μm, or 5 μm and 15 μm. The adhesion/seed layer 556 of said each of its vias 558 may include (1) a titanium (Ti) or titanium nitride (TiN) layer for adhesion with a thickness of between 1 nm to 50 nm at the sidewall and bottom of the copper layer 557 of said each of its vias 558 and between the copper layer 557 and insulating layer 555 of said each of its vias 558, and (2) a seed layer, such as copper, with a thickness of between 3 nm and 200 nm at the sidewall and bottom of the copper layer 557 of said each of its vias 558 and between the copper layer 557 and titanium (Ti) or titanium nitride (TiN) layer of the adhesion/seed layer 556 of said each of its vias 558. The insulating layer 555 of said each of its vias 558 may include a thermally grown silicon oxide ($SiO_2$) and/or a CVD silicon nitride ($Si_3N_4$), for example.

Figure 22B:
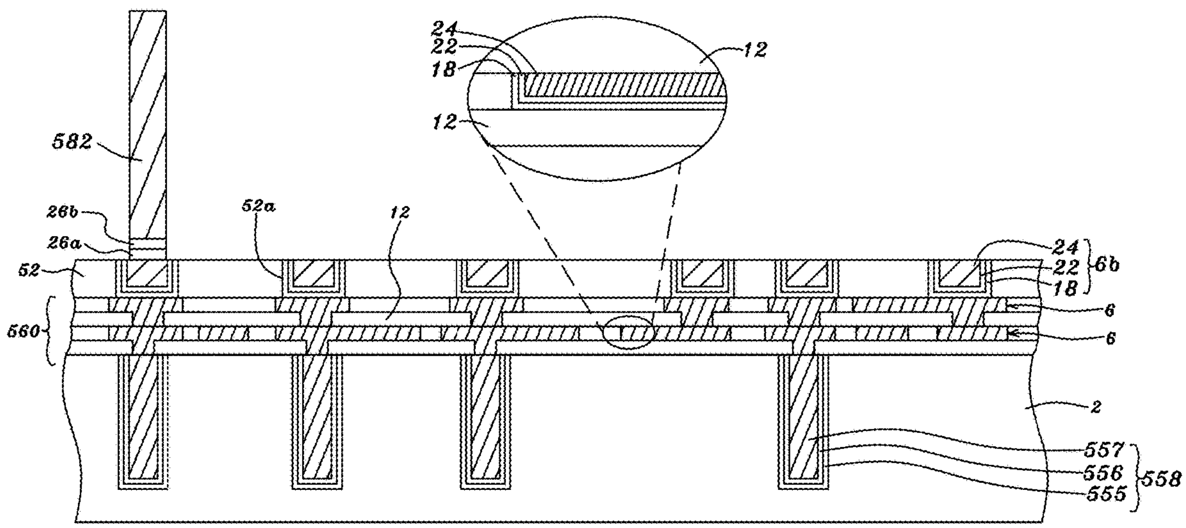
FIG. 22B is a schematically cross-sectional view showing a second type of interposer in accordance with an embodiment of the present application.

FIG. 22B is a schematically cross-sectional view showing a second type of interposer in accordance with an embodiment of the present application. Referring to FIG. 22B, a second type of interposer 551 may have similar structure as illustrated in FIG. 22A. For an element indicated by the same reference number shown in FIGS. 22A and 22B, the specification of the element as seen in FIG. 22B may be referred to that of the element as illustrated in FIG. 22A. The difference between the first and second types of interposers 551 is that the second type of interposer 551 may be provided with (1) an insulating bonding layer 52 on the topmost one of the insulating dielectric layers 12 of its first interconnection scheme for an interposer (FISIP) 560 and (2) multiple metal pads 6*b* in multiple openings 52*a* in its insulating bonding layer 52 and on the topmost one of the interconnection metal layers 6 of its first interconnection scheme for an interposer (FISIP) 560, instead of the passivation layer 14, second interconnection scheme for an interposer (SISIP) 588 and micro-pads 48 as seen in FIG. 22A. For the second type of interposers 551, its insulating bonding layer 52 may include a silicon-oxide layer having a thickness between 0.1 and 2 μm. Each of its metal pads 6*b* may include (1) a copper layer 24 having a thickness of between 3 nm and 500 nm in one of the openings 52*a* in its insulating bonding layer 52, (2) an adhesion layer 18, such as titanium or titanium nitride having a thickness of between 1 nm and 50 nm, at a bottom and sidewall of the copper layer 24 of said each of its metal pads 6*b*, and (3) a seed layer 22, such as copper, between the copper layer 24 and adhesion layer 18 of said each of its metal pads 6*b*, wherein the copper layer 24 of said each of its metal pads 6*b* may have a top surface substantially coplanar with a top surface of the silicon-oxide layer of its insulating bonding layer 52. Further, for the second type of interposer 551, each of its through package vias (TPVs) 582 may have a copper layer with a thickness of between 5 μm and 300 μm vertically over the copper layer 24 of one of its metal pads 6*b*. The second type of interposer 551 may have an adhesion layer 26*a*, such as titanium (Ti) or titanium nitride (TiN) layer having a thickness of between 1 nm and 50 nm, on the copper layer 24 of its metal pads 6*b* and between the copper layer of its through package vias (TPVs) 582 and the copper layer 24 of its metal pads 6*b*, and (2) a seed layer 26*b*, such as copper, on its adhesion layer 26*a* and between and the copper layer of its through package vias (TPVs) 582 and its adhesion layer 26*a*.

Chip-to-Interposer Assembly

Figure 23A:
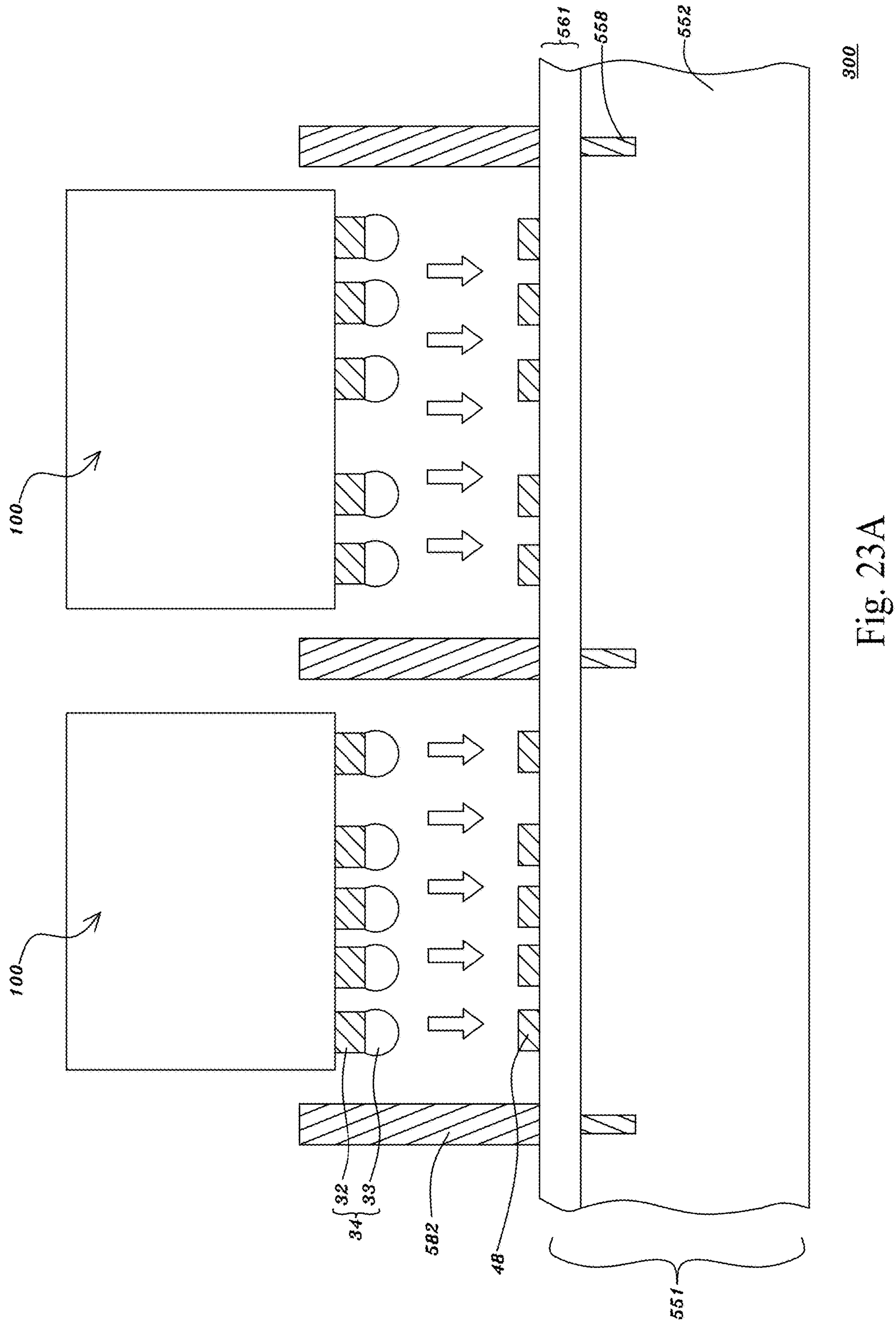
FIGS. 23A-23C are schematically cross-sectional views showing a process for fabricating a chip package for a standard commodity logic drive for a first alternative in accordance with an embodiment of the present application.
Figure 23B:
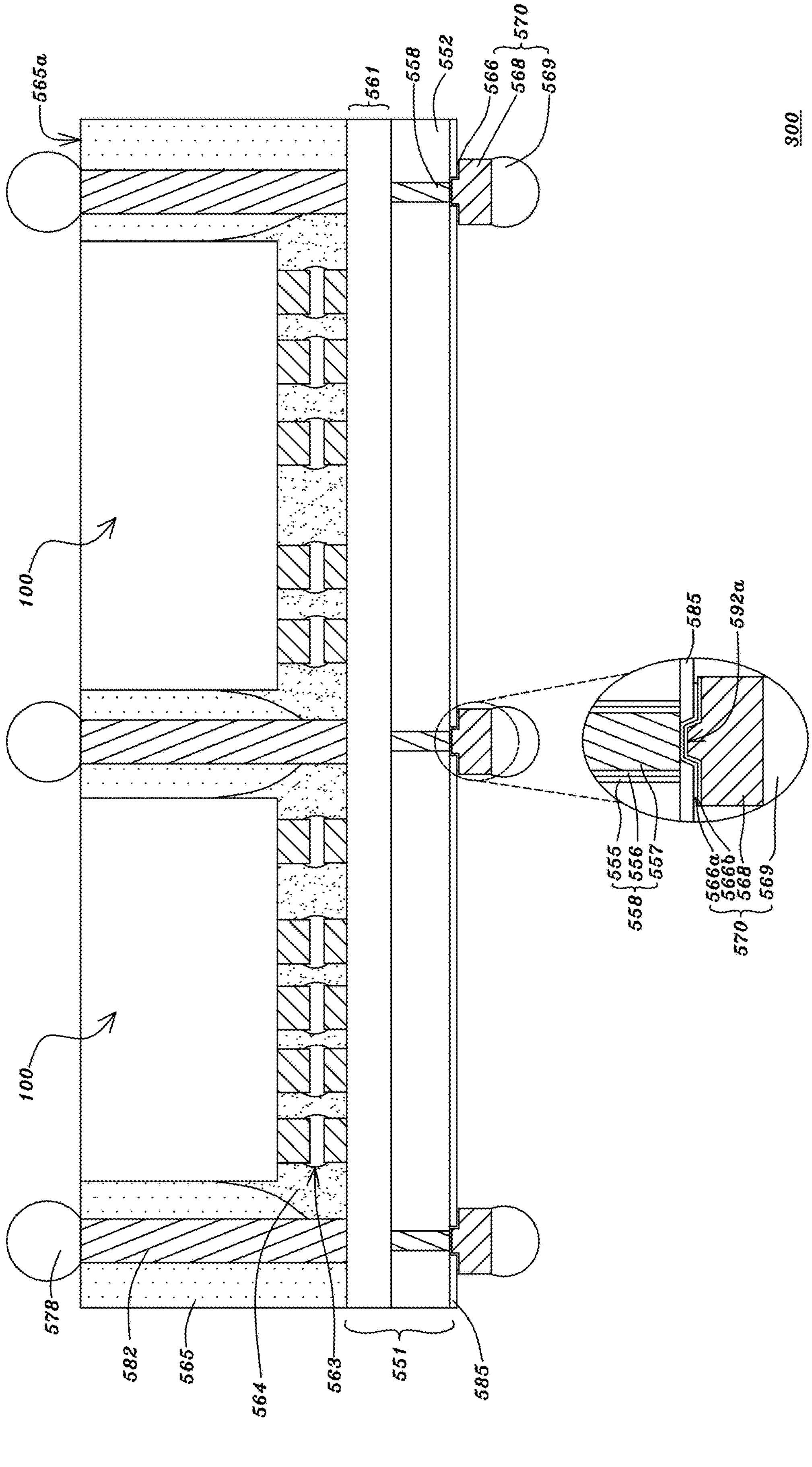
Figure 23C:
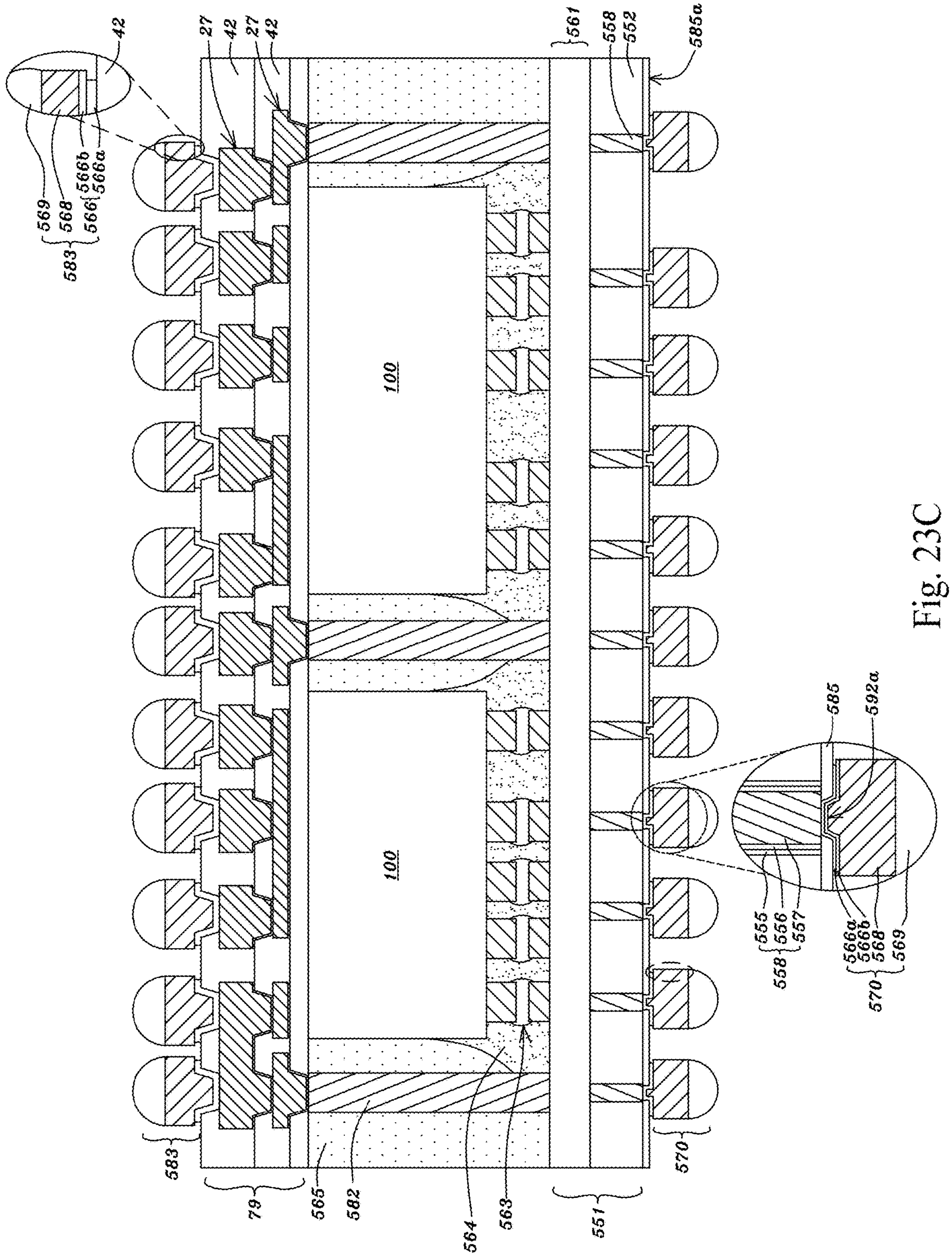

FIGS. 23A-23C are schematically cross-sectional views showing a process for fabricating a chip package for a standard commodity logic drive for a first alternative in accordance with an embodiment of the present application. FIGS. 24A-24D are schematically cross-sectional views showing a process for fabricating a chip package for a standard commodity logic drive for a second alternative in accordance with an embodiment of the present application. FIGS. 25A-25D are schematically cross-sectional views showing a process for fabricating a chip package for a standard commodity logic drive for a third alternative in accordance with an embodiment of the present application.

For a first alternative, referring to FIG. 23A, each of the first type of semiconductor integrated-circuit (IC) chips 100 as seen in FIG. 21A may have the second type of micro-bumps or micro-pillars 34 to be bonded to the first type of micro-pads 48 preformed on the first type of interposer 551 as seen in FIG. 22A. For example, for said each of the first type of semiconductor integrated-circuit (IC) chips 100, the second type of its micro-bumps or micro-pillars 34 may have the tin-containing solder cap 33 to be bonded onto the copper layer 32 of the first type of micro-pads 48 preformed on the first type of interposer 551 into multiple bonded contacts 563 as seen in FIG. 23B, wherein each of the second type of its micro-bumps or micro-pillars 34 may have the copper layer 32 having the thickness greater than the thickness of the copper layer 32 of the first type of micro-pads 48 preformed on the first type of interposer 551. Next, an underfill 564, such as epoxy resins or compounds, may be filled into a gap between each of the first type of semiconductor integrated-circuit (IC) chips 100 and the first type of interposer 551, enclosing the bonded contacts 563. An interconnection scheme 561 shown in FIGS. 23A-23B represents the first interconnection scheme for an interposer (FISIP) 560 and second interconnection scheme for an interposer (SISIP) 588 as seen in FIG. 22A or, if the second interconnection scheme for an interposer (SISIP) 588 is not provided, represents the first interconnection scheme for an interposer (FISIP) 560 as seen in FIG. 22A.

For a second alternative, referring to FIG. 24A, each of the first type of semiconductor integrated-circuit (IC) chips 100 as illustrated in FIG. 21A may have the third type of micro-bumps or micro-pillars 34 to be thermally compressed, at a temperature between 240 and 300 degrees Celsius and at a pressure between 0.3 and 3 MPa, onto the second type of micro-pads 48 preformed on the first type of interposer 551 as illustrated in FIG. 22A for a time period between 3 and 15 seconds. A force applied to the first type of semiconductor integrated-circuit (IC) chips 100 in the thermal compression process may be substantially equal to the pressure times a contact area between one of the third type of micro-bumps or micro-pillars 34 and one of the second type of micro-pads 48 times the total number of the third type of micro-bumps or micro-pillars 34 of the first type of semiconductor chip 100. For example, for said each of the first type of semiconductor integrated-circuit (IC) chips 100, the third type of its micro-bumps or micro-pillars 34 may have the solder cap 38 to be bonded onto the metal cap 49 of the second type of micro-pads 48 preformed on the first type of interposer 551 into multiple bonded contacts 563 as seen in FIG. 24B, wherein each of the third type of its micro-bumps or micro-pillars 34 may be provided with the copper layer 37 having the thickness t3 greater than the thickness t2 of the copper layer 39 of the second type of micro-pads 48 preformed on the first type of interposer 551 and having the largest transverse dimension w3 equal to between 0.7 and 0.1 times of the largest transverse dimension w2 of the copper layer 39 of the second type of micro-pads 48 preformed on the first type of interposer 551. Alternatively, each of the third type of its micro-bumps or micro-pillars 34 may be provided with the copper layer 37 having a cross-sectional area equal to between 0.5 and 0.01 times of the cross-sectional area of the copper layer 39 of the second type of micro-pads 48 preformed on the first type of interposer 551. Thereby, the interconnection scheme 561 of the first type of interposer 551 may bear reduced stress from the third type of micro-bumps or micro-pillars 34 of the first type of semiconductor integrated-circuit (IC) chips 100 during the thermal compression process. For example, for said each of the first type of semiconductor integrated-circuit (IC) chips 100, each of the third type of its micro-bumps or micro-pillars 34 may be formed on a metal pad 6*c* of the bottommost one of the interconnection metal layers 6 of its first interconnection scheme for a chip (FISC), and provided with the copper layer 37 having the thickness t3 greater than the thickness t1 of its metal pad 6*c* and having the largest transverse dimension w3 equal to between 0.7 and 0.1 times of the largest transverse dimension w1 of its metal pad 6*c*. Alternatively, each of the third type of its micro-bumps or micro-pillars 34 may be provided with the copper layer 37 having a cross-sectional area equal to between 0.5 and 0.01 times of the cross-sectional area of its metal pad 6*c*. Thereby, for said each of the first type of semiconductor integrated-circuit (IC) chips 100, its first interconnection scheme for a chip (FISC) 20 may bear reduced stress from the third type of its micro-bumps or micro-pillars 34 during the thermal compression process. A bonded solder between the copper layers 32 and 48 of each of the bonded contacts 563 may be mostly kept on a top surface of the copper layer 48 of one of the second type of micro-pads 38 of the first type of interposer 551 and extends out of the edge of the copper layer 48 of said one of the second type of micro-pads 48 of the first type of interposer 551 less than 0.5 micrometers. Thus, a short between neighboring two of the bonded contacts 563 even in a fine-pitched fashion may be avoided. Next, an underfill 564, such as epoxy resins or compounds, may be filled into a gap between each of the first type of semiconductor integrated-circuit (IC) chips 100 and the first type of interposer 551, enclosing the bonded contacts 563. An interconnection scheme 561 shown in FIGS. 24A-24B represents the first interconnection scheme for an interposer (FISIP) 560 and second interconnection scheme for an interposer (SISIP) 588 as seen in FIG. 22A or, if the SISIP 588 is not provided, represents the first interconnection scheme for an interposer (FISIP) 560 as seen in FIG. 22A.

Figure 25A:
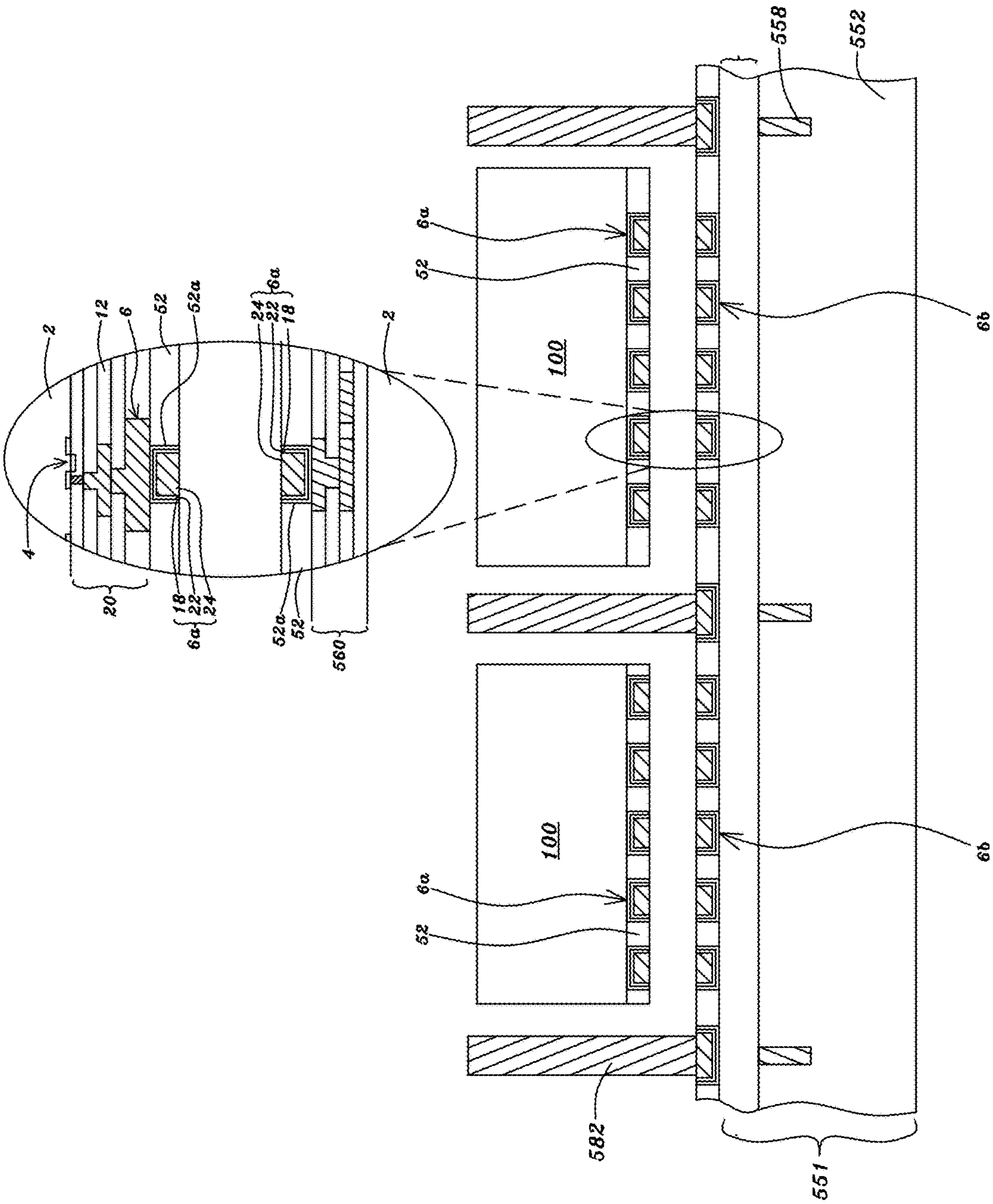
FIGS. 25A-25D are schematically cross-sectional views showing a process for fabricating a chip package for a standard commodity logic drive for a third alternative in accordance with an embodiment of the present application.

For a third alternative, referring to FIG. 25A, before each of the second type of semiconductor integrated-circuit (IC) chips 100 as illustrated in FIG. 21B join the second type of interposer 551 as illustrated in FIG. 22B, a joining surface, i.e., silicon oxide, of the insulating bonding layer 52 of the second type of interposer 551 may be activated with nitrogen plasma for increasing a hydrophilic property thereof, and then the joining surface of the insulating bonding layer 52 of the second type of interposer 551 may be rinsed with deionized water for water adsorption and cleaning. Further, a joining surface, i.e., silicon oxide, of the insulating bonding layer 52 of each of the second type of semiconductor integrated-circuit (IC) chips 100, the backside of which may be attached to a temporary substrate (not shown) in advance, may be activated with nitrogen plasma for increasing a hydrophilic property thereof, and then the joining surface of the insulating bonding layer 52 of said each of the second type of semiconductor integrated-circuit (IC) chips 100 may be rinsed with deionized water for water adsorption and cleaning. Next, said each of the second type of semiconductor integrated-circuit (IC) chips 100 may be released from the temporary substrate(s). Next, referring to FIGS. 25A and 25B, said each of the second type of semiconductor integrated-circuit (IC) chips 100 may join the second type of interposer 551 by (1) picking up said each of the second type of semiconductor integrated-circuit (IC) chips 100 to be placed on the second type of interposer 551 with each of the metal pads 6*a* of said each of the second type of semiconductor integrated-circuit (IC) chips 100 in contact with one of the metal pads 6*b* of the second type of interposer 551 and with the joining surface of the insulating bonding layer 52 of said each of the second type of semiconductor integrated-circuit (IC) chips 100 in contact with the joining surface of the insulating bonding layer 52 of the second type of interposer 551, and (2) next performing a direct bonding process including (a) oxide-to-oxide bonding at a temperature between 100 and 200 degrees Celsius and for a time period between 5 and 20 minutes to bond the joining surface of the insulating bonding layer 52 of said each of the second type of semiconductor integrated-circuit (IC) chips 100 to the joining surface of the insulating bonding layer 52 of the second type of interposer 551 and (b) copper-to-copper bonding at a temperature between 300 and 350 degrees Celsius and for a time period between 10 and 60 minutes to bond the copper layer 24 of each of the metal pads 6*a* of said each of the second type of semiconductor integrated-circuit (IC) chips 100 to the copper layer 24 of one of the metal pads 6*b* of the second type of interposer 551, wherein the oxide-to-oxide bonding may be caused by water desorption from reaction between the joining surface of the insulating bonding layer 52 of said each of the second type of semiconductor integrated-circuit (IC) chips 100 and the joining surface of the insulating bonding layer 52 of the second type of interposer 551, and the copper-to-copper bonding may be caused by metal inter-diffusion between the copper layer 24 of the metal pads 6*a* of said each of the second type of semiconductor integrated-circuit (IC) chips 100 and the copper layer 24 of the metal pads 6*b* of the second type of interposer 551.

Figure 25B:
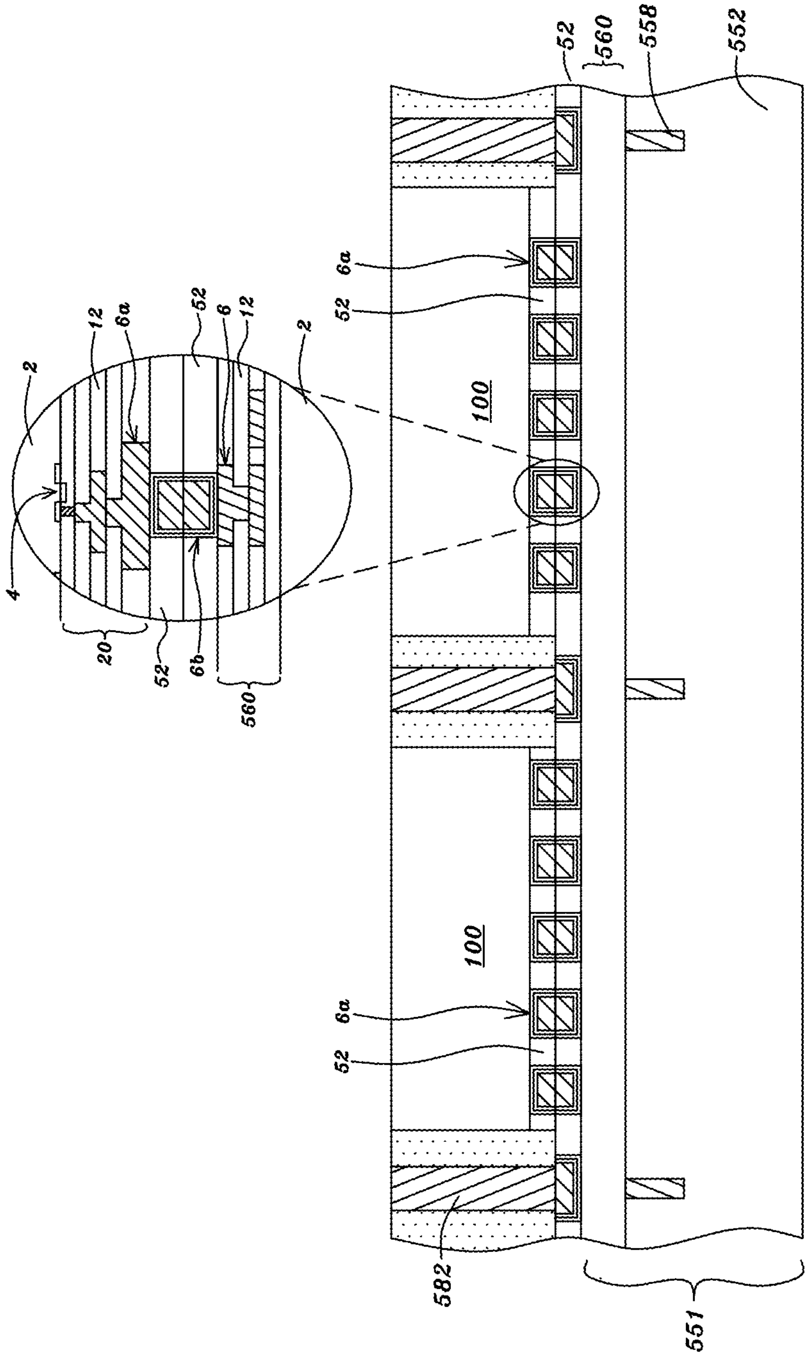

Next, for the above first, second and third alternatives as seen in FIGS. 23B, 24B and 25B respectively, a polymer layer 565, e.g., resin or compound, may be applied to fill a gap between each neighboring two of the first or second type of semiconductor integrated-circuit (IC) chips 100, to fill a gap between each neighboring two of the through package vias (TPVs) 582, and to cover a backside of said each of the first or second type of semiconductor integrated-circuit (IC) chips 100 and a top of each of the through package vias (TPVs) 582. Next, a polishing or grinding process may be applied to remove a top portion of the polymer layer 565 and a top portion of one or more of the first or second type of semiconductor integrated-circuit (IC) chips 100 until the top of said each of the through package vias (TPVs) 582 is exposed.

Figure 24C:
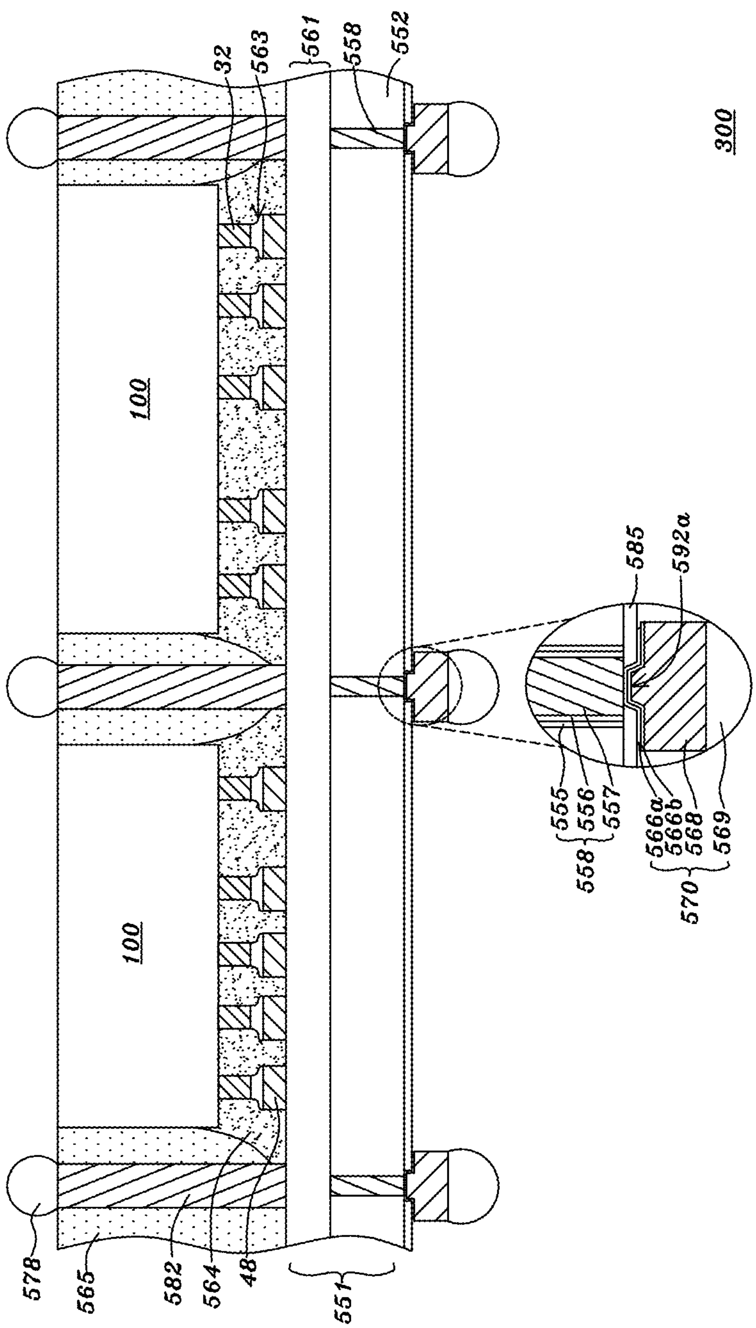
Figure 25C:
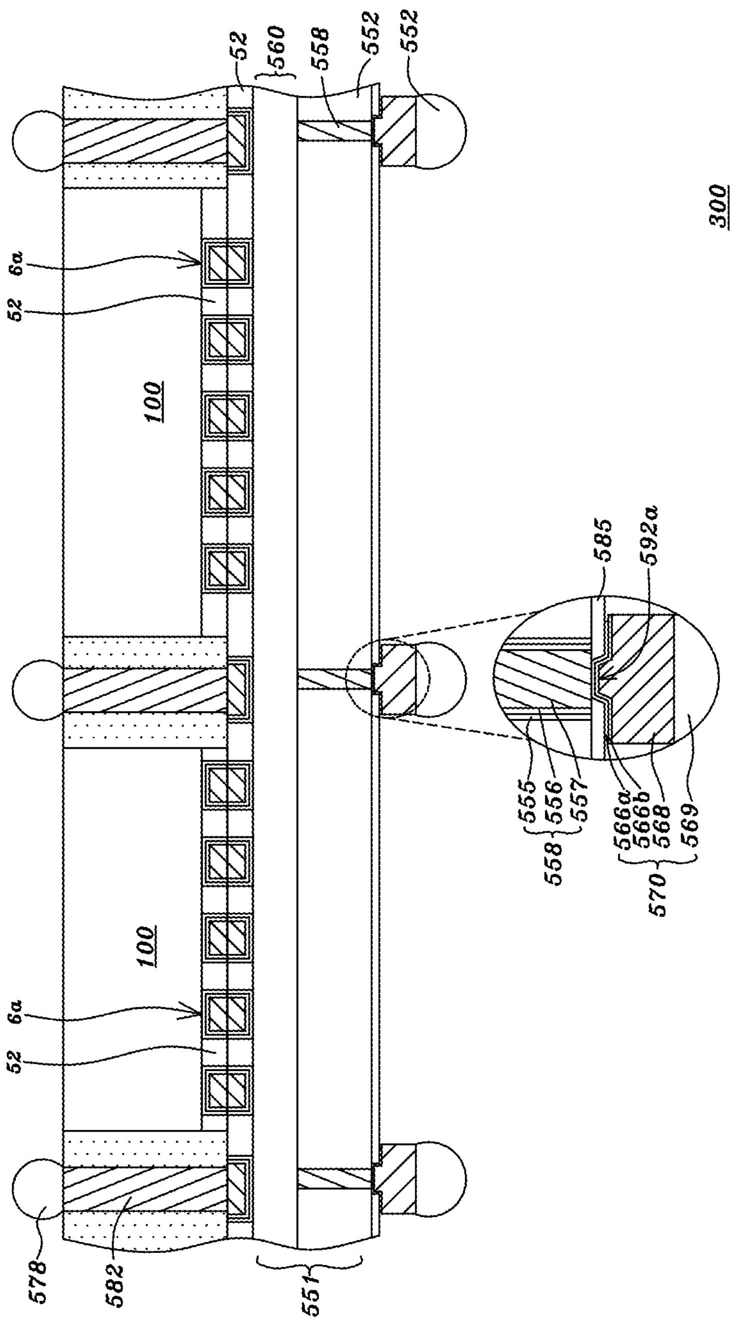

Next, for the above first, second and third alternatives as seen in FIGS. 23B, 24C and 25C respectively, a chemically-and-mechanically-polishing (CMP) process or a wafer backside grinding process is applied to a backside of the first or second type of interposer 551 until each of the vias 558 is exposed, that is, its insulating layer 555 at its backside is removed into an insulating lining surrounding its adhesion/seed layer 556 and copper layer 557, and a bottom end of its copper layer 557 is exposed. Next, a polymer layer 585 may be formed on a bottom surface of the first or second type of interposer 551, and multiple openings 585*a* in the polymer layer 585 may expose the copper layer 557 of the vias 558 of the first or second type of interposer 551. Next, multiple metal bumps 570 may be formed on and under the copper layer 557 of the vias 558 of the first or second type of interposer 551. Each of the metal bumps 570 may be of various types. A first type of metal bumps 570 may include (1) an adhesion layer 566*a*, such as titanium (Ti) or titanium nitride (TiN) layer having a thickness of between 1 nm and 200 nm, on and under the copper layer 557 of the vias 558, (2) a seed layer 566*b*, such as copper, on and under the adhesion layer 566*a* and (3) a copper layer 568 having a thickness of between 1 μm and 50 μm on and under the seed layer 566*b*. Alternatively, a second type of metal bumps 570 may include the adhesion layer 566*a*, seed layer 566*b* and copper layer 568 as mentioned above, and may further include a tin-containing solder cap 569 such as tin or a tin-silver alloy having a thickness of between 1 μm and 50 μm on and under the copper layer 568. Next, multiple metal bumps 578, such as tin-containing solder, may be optionally formed on the tops of the through package vias (TPVs) 582.

Figure 24D:
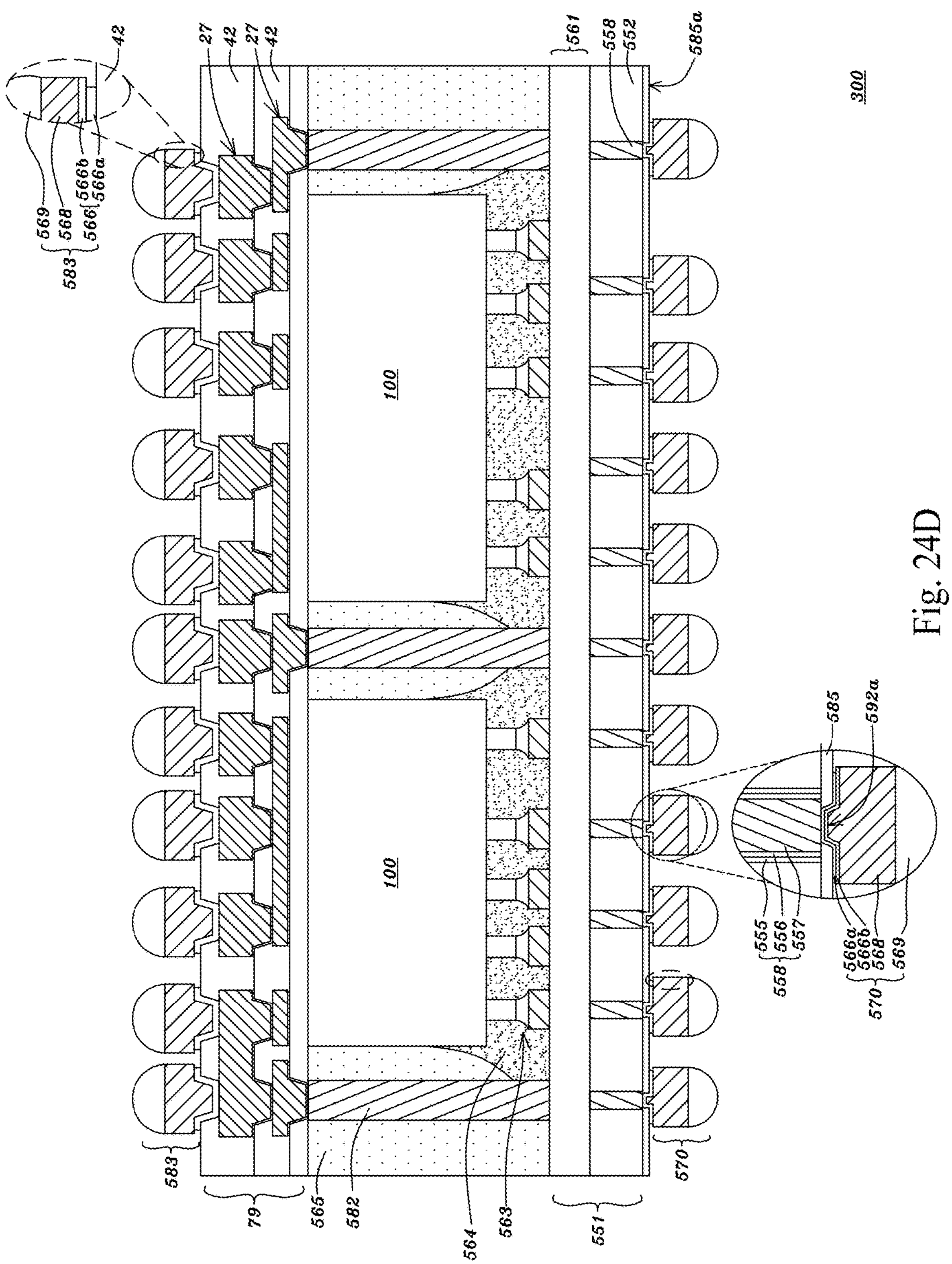
Figure 25D:
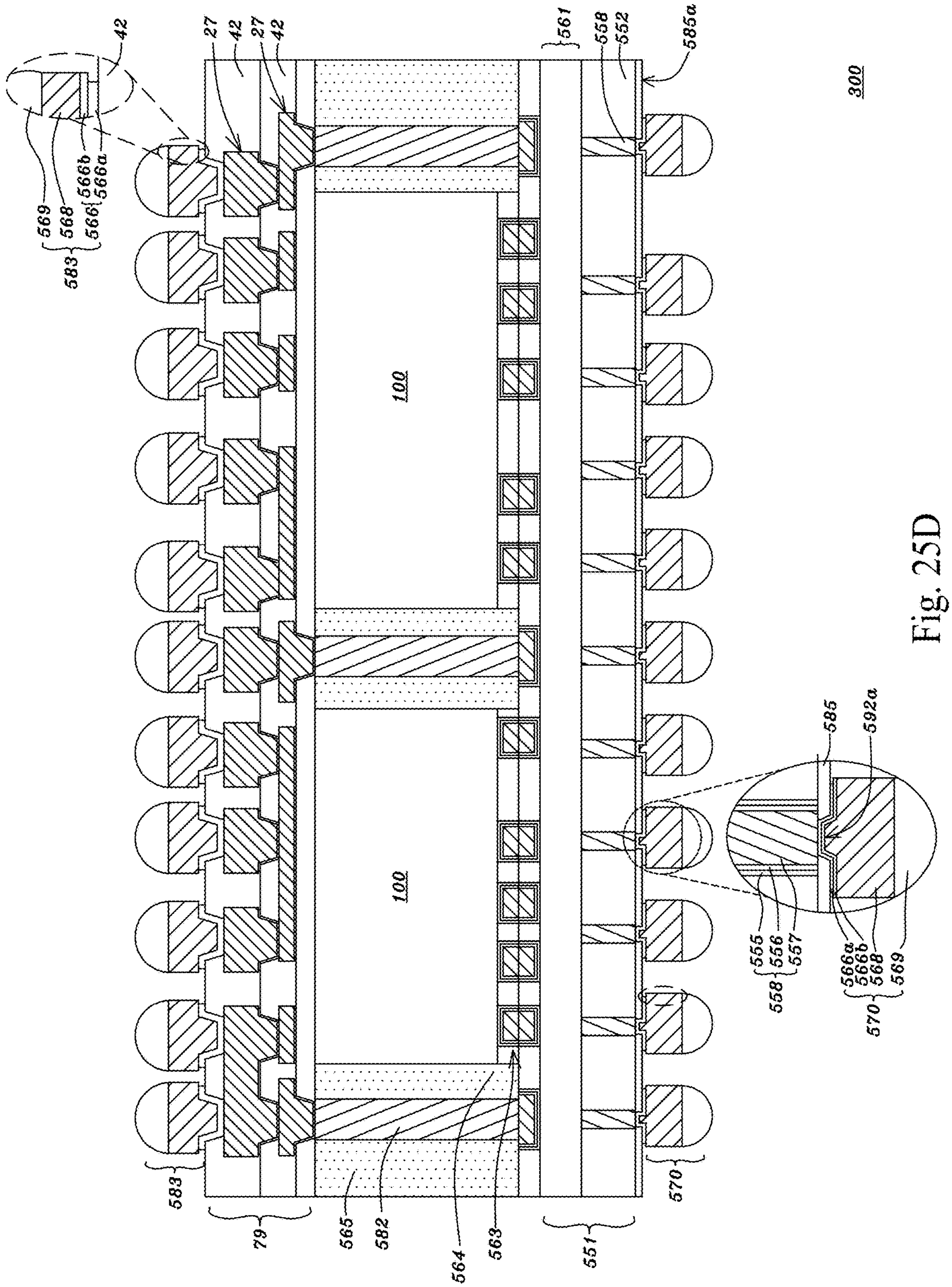

Alternatively, referring to FIGS. 23C, 24D and 25D, after the polishing or grinding process applied to the polymer layer 565 is performed as illustrated in FIGS. 23B, 24B and 25B and before the CMP process or wafer backside grinding process applied to the interposer 551 is performed as illustrated in FIGS. 23B, 24C and 25C, a backside metal interconnection scheme for a drive (BISD) 79 as seen in FIGS. 23C, 24D and 25D may be formed on and above the first or second type of semiconductor integrated-circuit (IC) chips 100, polymer layer 565 and through package vias (TPVs) 582. The specification for the backside metal interconnection scheme for a drive (BISD) 79 may be referred to the specification for the second interconnection scheme for a chip (SISC) 29 as illustrated in FIG. 21A. The backside metal interconnection scheme for a drive (BISD) 79 may include one or more interconnection metal layers 27 coupling to the through package vias (TPVs) 582 and one or more polymer layers 42 each between neighboring two of the interconnection metal layers 27, under a bottommost one of the interconnection metal layers 27 or over a topmost one of the interconnection metal layers 27, wherein the backside metal interconnection scheme for a drive (BISD) 79 has multiple fifth metal pads at bottoms of multiple openings 42*a* in the topmost one of its polymer layers 42. One of the interconnection metal layers 27 of the backside metal interconnection scheme for a drive (BISD) 79 may include two metal planes used as a power plane and ground plane respectively, wherein the two metal planes may have a thickness, for example, between 5 μm and 50 μm. Each of the two metal planes may be layout as an interlaced or interleaved shaped structure or fork-shaped structure, that is, each of the two metal planes may have multiple parallel-extension sections and a transverse connection section coupling the parallel-extension sections. One of the two metal planes may have one of the parallel-extension sections arranged between neighboring two of the parallel-extension sections of the other of the two metal planes.

Next, referring to FIGS. 23C, 24D and 25D, multiple metal bumps 583 may be optionally formed on the fifth metal pads of the backside metal interconnection scheme for a drive (BISD) 79. The specification for the metal bumps 583 may be referred to the specification for the metal bumps 570 as illustrated in FIGS. 23B, 24C and 25C. Next, the chemically-and-mechanically-polishing (CMP) process or a wafer backside grinding process is applied to the backside of the first or second type of interposer 551, as illustrated in FIGS. 23B, 24C and 25C. Next, the polymer layer 585 and metal bumps 570 may be formed at a bottom side of the first or second of interposer 551, as illustrated in FIGS. 23B, 24C and 25C.

Referring to FIGS. 23C, 24D and 25D, since the first or second type of semiconductor integrated-circuit (IC) chips 100 may include the FPGA IC chips 200 and DPIIC chips 410 as seen in FIG. 16, and the interconnection metal layers 27 of the backside metal interconnection scheme for a drive (BISD) 79 and interconnection metal layers 6 and/or 27 of the FISIP 560 and/or SISIP 588 of the first or second type interposer 551 are provided for the programmable interconnects 361 of the inter-chip interconnects 371 as seen in FIG. 16 coupling to the pass/no-pass switches 258 and/or cross-point switches 379 of the FPGA IC chips 200 and/or DPIIC chips 410 and/or to the programmable logic cells or elements (LCE) 2014 of the standard commodity FPGA IC chips 200. Accordingly, the fifth metal pads and/or metal bumps 583, the metal bumps 570 and/or vias 558 and the through package via (TPV) 582 may couple to the pass/no-pass switches 258 and/or cross-point switches 379 of the standard commodity FPGA IC chips 200 and/or DPIIC chips 410 and/or to the programmable logic cells or elements (LCE) 2014 of the standard commodity FPGA IC chips 200 through the interconnection metal layers 27 of the backside metal interconnection scheme for a drive (BISD) 79 and the interconnection metal layers 6 and/or 27 of the FISIP 560 and/or SISIP 588 of the interposer 551 to become programmable.

Accordingly, referring to FIGS. 23C, 24D and 25D, each of the FPGA IC chips 200 of the logic drive 300 may select, in accordance with the logic levels at its output selection (OS) pads 232, an I/O port from its multiple I/O ports 377 as seen in FIG. 14A to pass data associated with the data output Dout of one of its programmable logic cells or elements (LCE) 2014 as illustrated in FIG. 6A, 6E or 6F to another of the semiconductor integrated-circuit (IC) chips 100 of the logic drive 300, such as DPIIC chip 410, HBM IC chip 251, CPU chip 269*b*, GPU chip 269*a* or another FPGA IC chip 200 of the logic drive 300 as seen in FIG. 16, through the interconnection metal layers 6 and/or 27 of the interposer 551.

Referring to FIGS. 23C, 24D and 25D, each of the FPGA IC chips 200 of the logic drive 300 may include one of the cross-point switches 379 as seen in FIGS. 3A, 3B and 7 configured to pass data from a first one of its programmable interconnects 361 to another of the semiconductor integrated-circuit (IC) chips 100 of the logic drive 300, such as DPIIC chip 410, HBM IC chip 251, CPU chip 269*b*, GPU chip 269*a* or another FPGA IC chip 200 of the logic drive 300 as seen in FIG. 16, through a second one of its programmable interconnects 361 and the interconnection metal layers 6 and/or 27 of the interposer 551 in sequence, wherein said one of the cross-point switches 379 is configured to control connection between the first and second ones of its programmable interconnects 361, wherein said each of the FPGA IC chips 200 of the logic drive 300 may select, in accordance with the logic levels at its output selection (OS) pads 232, an I/O port from its multiple I/O ports 377 as seen in FIG. 14A to output the data passed by one of the cross-point switches 379 to said another of the semiconductor integrated-circuit (IC) chips 100 of the logic drive 300.

Interposer-to-Interposer Assembly for Logic and Memory Drives

Figure 26A:
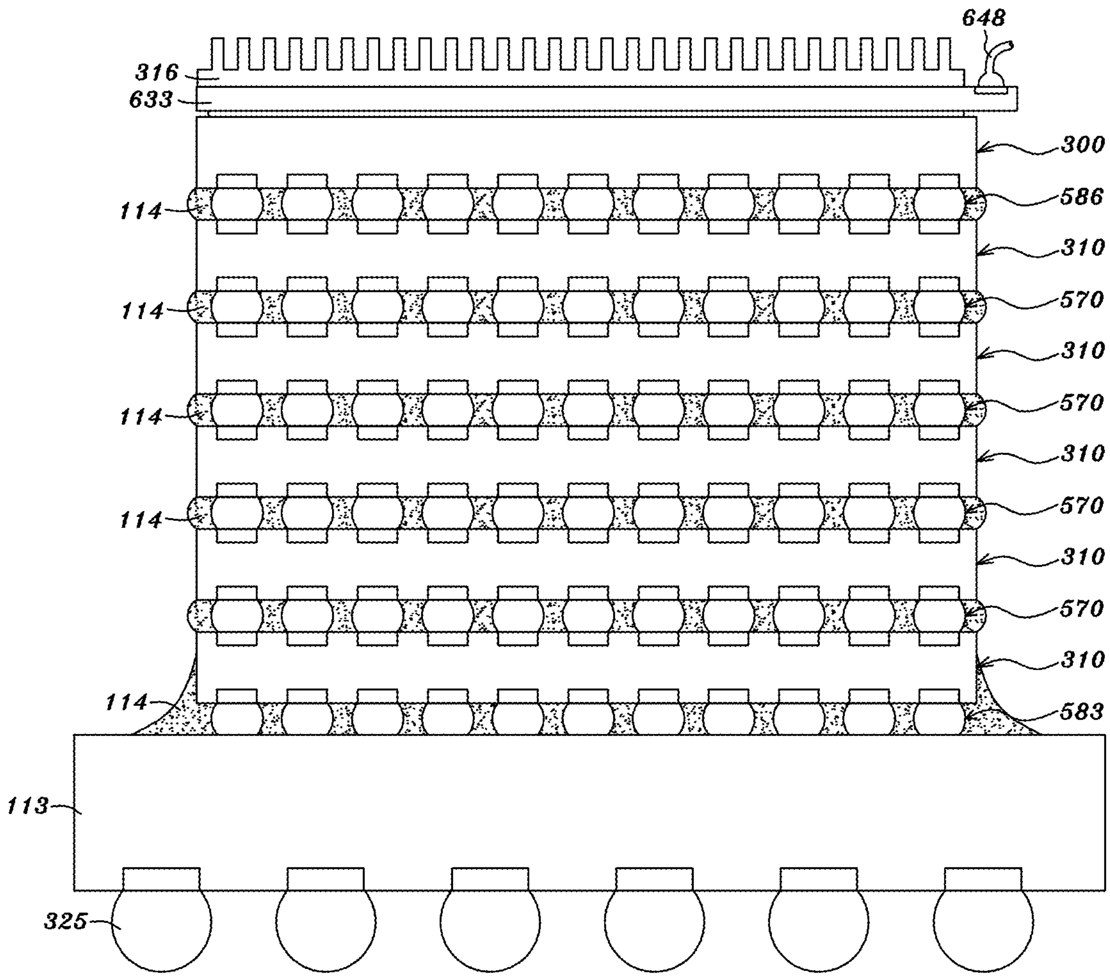
FIG. 26A is a schematically cross-sectional view showing a package-on-package assembly for a standard commodity logic drive and multiple memory drives in accordance with an embodiment of the present application.
Figure 26B:
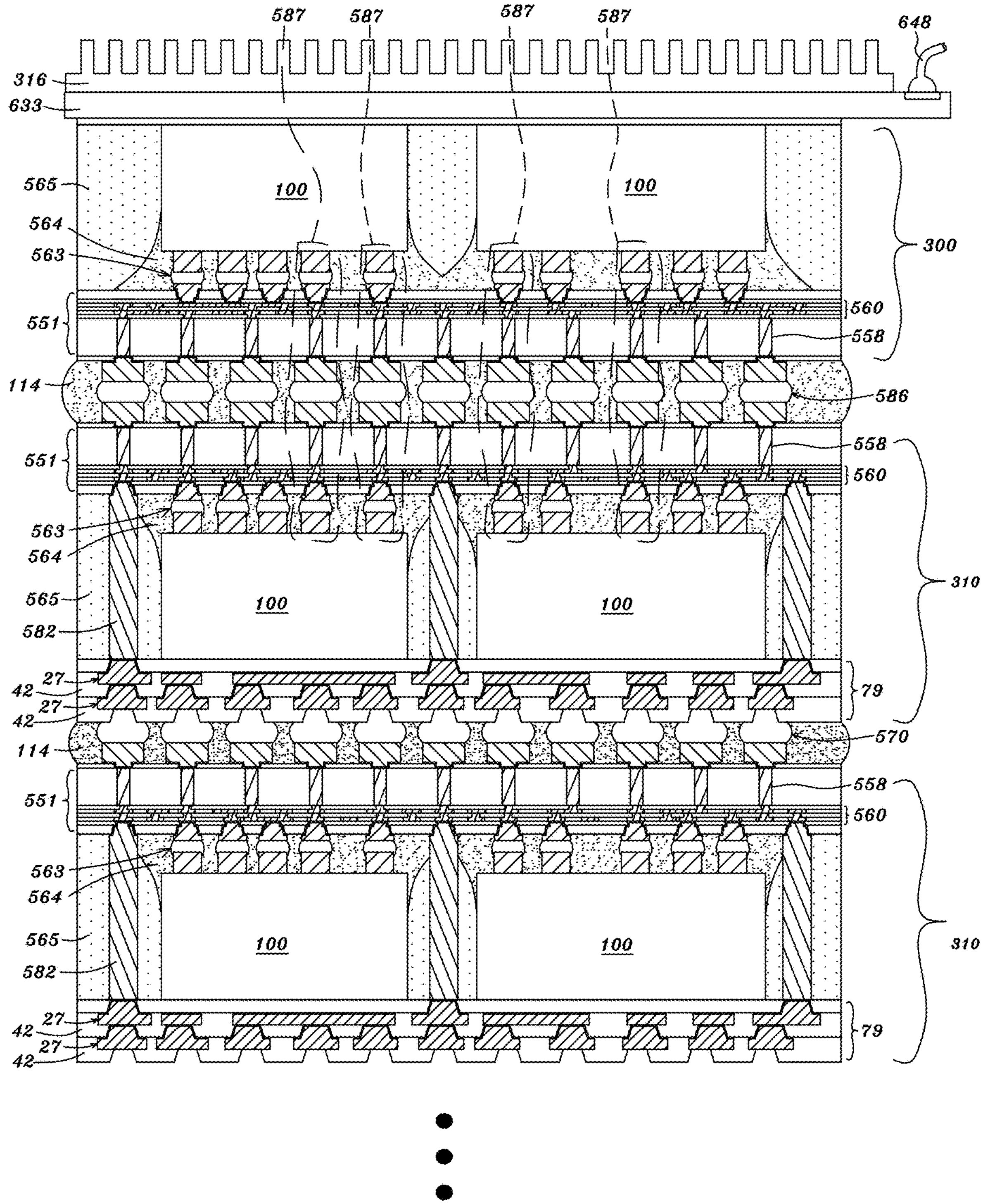
FIG. 26B is a schematically cross-sectional expanded view showing a stacked structure of a standard commodity logic drive and two memory drives for a top portion of a package-on-package assembly in accordance with an embodiment of the present application.

FIG. 26A is a schematically cross-sectional view showing a package-on-package assembly for a standard commodity logic drive and multiple memory drives in accordance with an embodiment of the present application. FIG. 26B is a schematically cross-sectional expanded view showing a stacked structure of a standard commodity logic drive and two memory drives for a top portion of a package-on-package assembly in accordance with an embodiment of the present application.

Referring to FIGS. 26A and 26B, all of the FPGA IC chips 200, GPU chips 269*a*, CPU chip 269*b*, DSP chip 270, IAC chip 402 and dedicated programmable interconnection (DPI) IC chips 410 in the standard commodity logic drives 300 for the first through third alternatives as illustrated in FIGS. 16, 23A-23C, 24A-24D and 25A-25D may not be provided, but each of the first or second type of semiconductor integrated-circuit (IC) chips 100 in the standard commodity logic drives 300 for the first through third alternatives as illustrated in FIGS. 16, 23A-23C, 24A-24D and 25A-25D may be provided for a memory chip, e.g., high-bitwidth-memory (HBM) IC chips, cache static-random-access-memory (SRAM) IC chips, dynamic-random-access-memory (DRAM) IC chips, or non-volatile-memory (NVM) IC chips for spin-orbit-torque (SOT) based magnetoresistive random access memory (MRAM), resistive random access memory (RRAM) or NAND flash memory, to operate for a memory drive 310 instead of the standard commodity logic drives 300, the memory drive 310 also include the first or second interposer 551, through package vias (TPVs) 582, backside metal interconnection scheme for a drive (BISD) 79 and metal bumps 570 and 583 as illustrated in FIGS. 23A-23C, 24A-24D and 25A-25D for the first through third alternatives respectively. The memory drives 310 for each of the first through third alternatives may have two types, one of which is a non-volatile memory drive, and the other of which is a volatile memory drive. Each of the first or second type of semiconductor integrated-circuit (IC) chips 100 of the non-volatile memory (NVM) drive for each of the first through third alternatives may be a non-volatile memory (NVM) IC chip, such as NAND flash memory IC chip, SOT based MRAM IC chip or RRAM IC chip. Each of the first or second type of semiconductor integrated-circuit (IC) chips 100 of the volatile memory drive for each of the first through third alternatives may be a volatile memory (VM) IC chip, such as DRAM IC chip, SRAM IC chip or HBM IC chip.

Referring to FIGS. 26A and 26B, the memory drives 310 having the number of four for each of the first through third alternatives may be provided to be stacked one by one over a circuit board 113. A bottommost one of the memory drives 310 for each of the first through third alternatives may include the second type of metal bumps 583 as seen in FIGS. 23C, 24D and 25D each having the tin-containing solder cap 569 to be bonded to the circuit board 113. An underfill 114 may be filled into a gap between the bottommost one of the memory drives 310 for each of the first through third alternatives and the circuit board 113 to enclose each of the second type of metal bumps 583 therebetween. Each of the others of the memory drives 310 for each of the first through third alternatives over the bottommost one of the memory drives 310 may have none of the metal bumps 583 as seen in FIGS. 23C, 24D and 25D but the outmost one of the interconnection metal layers 27 of its backside interconnect scheme for a drive 79 may have the fifth metal pads each exposed by an opening in an outmost one of the polymer layers 42. A lower one of the memory drives 310 for each of the first through third alternatives may include the second type of metal bumps 570 as seen in FIGS. 23C, 24D and 25D each having the tin-containing solder cap 569 to be bonded to one of the fifth metal pads of the BISD 79 of an upper one of the memory drives 310 for each of the first through third alternatives. An underfill 114 may be filled into a gap between the lower and upper ones of the memory drives 310 for each of the first through third alternatives to enclose each of the second type of metal bumps 570 therebetween. For example, each of the lower two of the memory drives 310 for each of the first through third alternatives may be the non-volatile memory (NVM) drive; each of the upper two of the memory drives 310 for each of the first through third alternatives may be the volatile memory (NVM) drive.

Referring to FIGS. 26A and 26B, the top one of the memory drives 310 for each of the first through third alternatives may have the metal bumps 570 to be bonded to the metal bumps 570 of the standard commodity logic drive 300 for each of the first through third alternatives to form multiple bonded contacts 586 between the top one of the memory drives 310 and the standard commodity logic drive 300. Each of stacked vias may be composed of (1) one of the bonded contacts 586, (2) one of stacked portions provided by the vias 558 and interconnection metal layers 6 and/or 27 of the FISIP 560 and/or SISIP 588, as seen in FIG. 22A or 22B, of the first or second type of interposer 551 of the standard commodity logic drive 300, (3) one of the bonded contacts 563 of the standard commodity logic drive 300 for the first or second alternative or one of the bonded contacts of the metal pads 6*a* and 6*b* of the standard commodity logic drive 300 for the third alternative, (4) one of stacked portions provided by the vias 558 and interconnection metal layers 6 and/or 27 of the FISIP 560 and/or SISIP 588, as seen in FIG. 22A or 22B, of the first or second type of interposer 551 of the top one of the memory drives 310 and (5) one of the bonded contacts 563 of the top one of the memory drives 310 for the first or second alternative or one of the bonded contacts of the metal pads 6*a* and 6*b* of the top one of the memory drives 310 for the third alternative, which are aligned in a vertical direction to form a vertical path 587 between one of the first or second type of semiconductor integrated-circuit (IC) chips 100 of the standard commodity logic drive 300, such as FPGA IC chip 200, GPU chip 269*a*, CPU chip 269*c* or DSP chip 270 as seen in FIG. 16, and one of the semiconductor integrated-circuit (IC) chips 100 of the top one of the memory drives 310, such as HBM IC chip, SRAM IC chip, DRAM IC chip or NVM IC chip. The number of vertical paths 587 connected between said one of the first or second type of semiconductor integrated-circuit (IC) chips 100 of the standard commodity logic drive 300 and said one of the first or second type of semiconductor integrated-circuit (IC) chips 100 of the top one of the memory drives 310 may have the number equal to or greater than 64, 128, 256, 512, 1024, 2048, 4096, 8K, or 16K, for example, for parallel signal transmission or power or ground delivery.

Referring to FIGS. 26A and 26B, said one of the first or second type of semiconductor integrated-circuit (IC) chips 100 of the standard commodity logic drive 300 may include the small I/O circuits 203 as seen in FIG. 5B having the driving capability, loading, output capacitance or input capacitance between 0.1 pF and 2 pF or between 0.1 pF and 1 pF, or smaller than 2 pF or 1 pF, each of which may couple to one of the vertical paths 587 through one of its I/O pads 372; furthermore, said one of the semiconductor integrated-circuit (IC) chips 100 of the top one of the memory drives 310 may include the small I/O circuits 203 as seen in FIG. 5B having the driving capability, loading, output capacitance or input capacitance between 0.1 pF and 2 pF or between 0.1 pF and 1 pF, each of which may couple to said one of the vertical paths 587 through one of its I/O pads 372.

Referring to FIGS. 26A and 26B, the thermoelectric (TE) cooler 633 as illustrated in FIG. 20 may have the cold side attached to a backside of each of the first or second type of semiconductor integrated-circuit (IC) chips 100 of the standard commodity logic drive 300, such as FPGA IC chip 200, GPU chip 269*a*, CPU chip 269*c*, DSP chip 270, DPIIC chip 410, dedicated control and I/O chip 260, dedicated I/O chip 265, HBM IC chip 251, NVM IC chip 250 or IAC chip 402 as seen in FIG. 16, and to the polymer layer 565 of the standard commodity logic drive 300, wherein a heat sink 316 made of copper or aluminum for example may be attached to the hot side of the thermoelectric (TE) cooler 633. A wire 648 may be bonded to the thermoelectric (TE) cooler 633 by a wirebonding process. Multiple solder balls 325 may be planted on a backside of the circuit board 113.

Figure 26C:
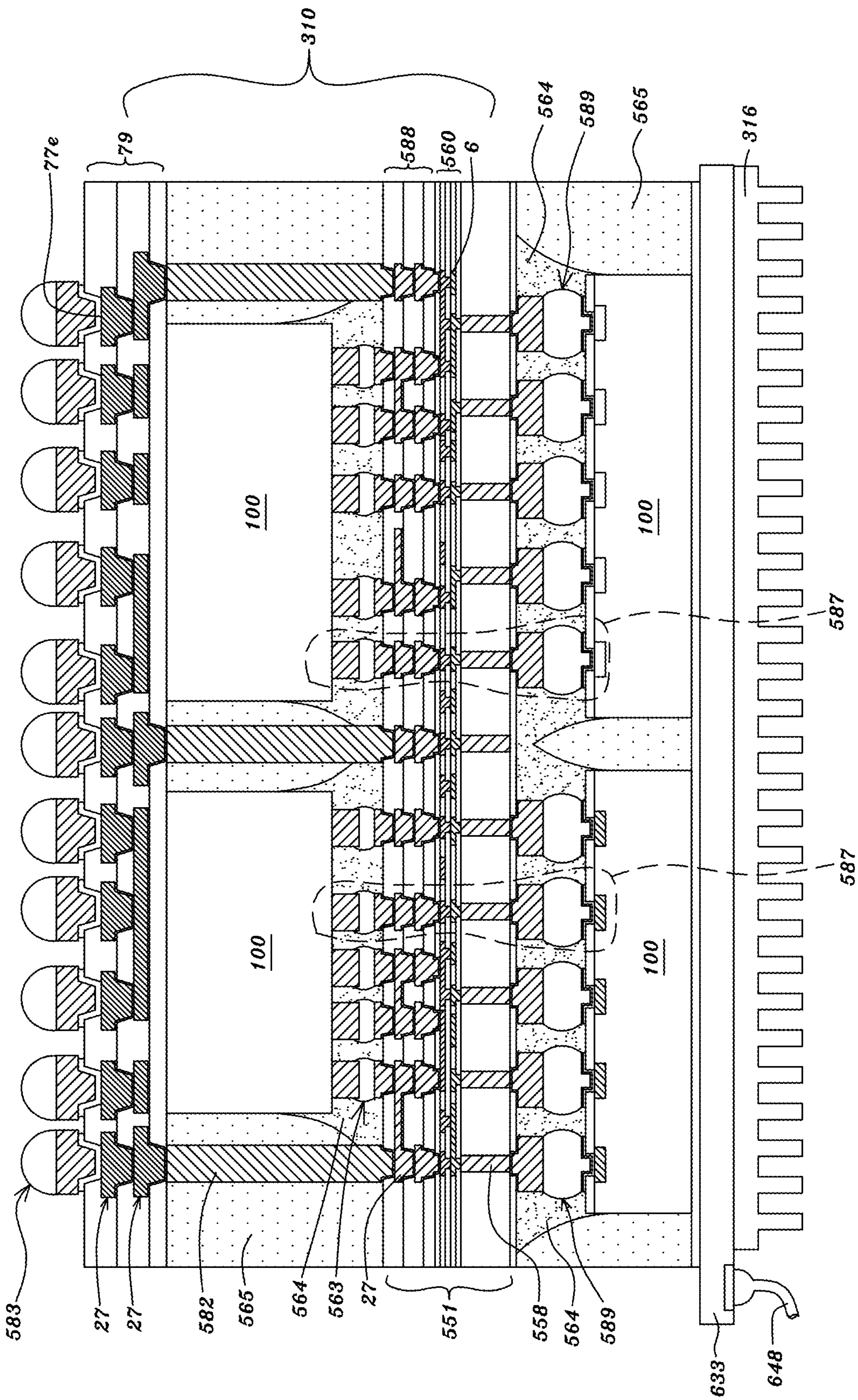
FIG. 26C is a schematically cross-sectional view showing an assembly for multiple semiconductor chips bonded to a memory drive in accordance with an embodiment of the present application.

Alternatively, FIG. 26C is a schematically cross-sectional view showing an assembly for multiple semiconductor chips bonded to a memory drive in accordance with an embodiment of the present application. Referring to FIG. 26C, each of the first type of semiconductor integrated-circuit (IC) chips 100 as illustrated in FIG. 21A, such as FPGA IC chip, GPU chip, CPU chip or DSP chip, may be provided with the first or second type of micro-bumps or micro-pillars 34 to be bonded to the first or second type of the metal bumps 570 of the memory drive 310 as illustrated in FIGS. 26A and 26B to form multiple bonded contacts 589 between the memory drive 310 and said each of the first type of semiconductor integrated-circuit (IC) chips 100.

Referring to FIG. 26C, each of the first type of semiconductor integrated-circuit (IC) chips 100 as seen in FIG. 21A may have the second type of micro-bumps or micro-pillars 34 each to be bonded to one of the first or second type of metal bumps 570 of the memory drive 310. For example, for said each of the first type of semiconductor integrated-circuit (IC) chips 100, each of the second type of its micro-bumps or micro-pillars 34 may have the tin-containing solder cap 33 to be bonded onto the copper layer 568 of one of the first type of metal bumps 570 of the memory drive 310 or tin-containing solder cap 569 of one of the second type of metal bumps 570 of the memory drive 310 into one of the bonded contacts 589. Alternatively, each of the first type of semiconductor integrated-circuit (IC) chips 100 as seen in FIG. 21A may have the first type of micro-bumps or micro-pillars 34 each to be bonded to one of the second type of metal bumps 570 of the memory drive 310. For example, for said each of the first type of semiconductor integrated-circuit (IC) chips 100, each of the first type of its micro-bumps or micro-pillars 34 may have the copper layer 32 to be bonded onto the tin-containing solder cap 569 of one of the second type of metal bumps 570 of the memory drive 310 into one of the bonded contacts 589. Next, an underfill 564, such as epoxy resins or compounds, may be filled into a gap between said each of the first type of semiconductor integrated-circuit (IC) chips 100 and the memory drive 310, enclosing the bonded contacts 589. Next, a polymer layer 565, e.g., resin or compound, may be applied to fill a gap between each neighboring two of the first type of semiconductor integrated-circuit (IC) chips 100, at a front side, i.e., bottom side, of the memory drive 310 and to cover a backside of said each of the first type of semiconductor integrated-circuit (IC) chips 100 at the front side of the memory drive 310. Next, a polishing or grinding process may be applied to remove a backside portion of the polymer layer 565 and a backside portion of each of the first type of semiconductor integrated-circuit (IC) chips 100 at the front side of the memory drive 310 until a backside of each of the first type of semiconductor integrated-circuit (IC) chips 100 at the front side of the memory drive 310 is exposed.

Referring to FIG. 26C, the memory drive 310 may have the metal bumps 583 formed on the metal pads 77*e* of its BISD 79 for connecting the memory drive 300 to an external circuitry. For the memory drive 310, one of its metal bumps 583 may (1) couple to one of its first or second type of semiconductor integrated-circuit (IC) chips 100 through the interconnection metal layers 77 of its BISD 79, one or more of its TPVs 582, the interconnection metal layers 6 and/or 27 of the FISIP 560 and/or SISIP 588 of its first or second type of interposer 551 and one of its bonded contacts 563 for the first or second alternative, or one of the bonded contacts of its metal pads 6*a* and 6*b* for the third alternative, in sequence, and/or (2) couple to one of the first type of semiconductor integrated-circuit (IC) chips 100 at the front side of the memory drive 310 through the interconnection metal layers 77 of its BISD 79, one of its TPVs 582, the interconnection metal layers 6 and/or 27 of the FISIP 560 and/or SISIP 588 of its first or second type of interposer 551, one of the vias 558 of its first or second type of interposer 551 and one of the bonded contacts 589 in sequence.

Referring to FIG. 26C, the thermoelectric (TE) cooler 633 as illustrated in FIG. 20 may have the cold side attached to the backside of each of the first type of semiconductor integrated-circuit (IC) chips 100 at the front side of the memory drive 310 and to the polymer layer 565 at the front side of the memory drive 310, wherein a heat sink 316 made of copper or aluminum for example may be attached to the hot side of the thermoelectric (TE) cooler 633. A wire 648 may be bonded to the thermoelectric (TE) cooler 633 by a wirebonding process.

Referring to FIG. 26C, high speed, high bandwidth and wide bitwidth communications may be performed between a first one of the first or second type of semiconductor integrated-circuit (IC) chips 100 of the memory drive 310, such as HBM IC chip, SRAM IC chip, DRAM IC chip or NVM IC chip, and a second one of the first type of semiconductor integrated-circuit (IC) chips 100, such as FPGA IC chip, GPU chip, CPU chip or DSP chip, at a front side, i.e., bottom side, of the memory drive 310. The first one of the first or second type of semiconductor integrated-circuit (IC) chips 100 may be arranged vertically over and aligned with the second one of the first type of semiconductor integrated-circuit (IC) chips 100. Each of stacked vias may be composed of (1) one of the bonded contacts 589, (2) one of stacked portions provided by the vias 558 and interconnection metal layers 6 and/or 27 of the FISIP 560 and/or SISIP 588, as seen in FIG. 22A or 22B, of the first or second type of interposer 551 of the memory drive 310, and (3) one of the bonded contacts 563 of the memory drive 310 for the first or second alternative or one of the bonded contacts of the metal pads 6a and 6b of the memory drive 310 for the third alternative, which are aligned in a vertical direction to form a vertical path 587 between the first one of the first or second type of semiconductor integrated-circuit (IC) chips 100 and the second one of the first type of semiconductor integrated-circuit (IC) chips 100. The number of vertical paths 587 connected between the first one of the first or second type of semiconductor integrated-circuit (IC) chips 100 and the second one of the first type of semiconductor integrated-circuit (IC) chips 100 may have the number equal to or greater than 64, 128, 256, 512, 1024, 2048, 4096, 8K, or 16K, for example, for parallel signal transmission or power or ground delivery.

Referring to FIG. 26C, the first one of the first or second type of semiconductor integrated-circuit (IC) chips 100 may include the small I/O circuits 203 as seen in FIG. 5B having the driving capability, loading, output capacitance or input capacitance between 0.1 pF and 2 pF or between 0.1 pF and 1 pF, or smaller than 2 pF or 1 pF, each of which may couple to one of the vertical paths 587 through one of its I/O pads 372; furthermore, the second one of the first type of semiconductor integrated-circuit (IC) chips 100 may include the small I/O circuits 203 as seen in FIG. 5B having the driving capability, loading, output capacitance or input capacitance between 0.1 pF and 2 pF or between 0.1 pF and 1 pF, each of which may couple to said one of the vertical paths 587 through one of its I/O pads 372.

Figure 26D:
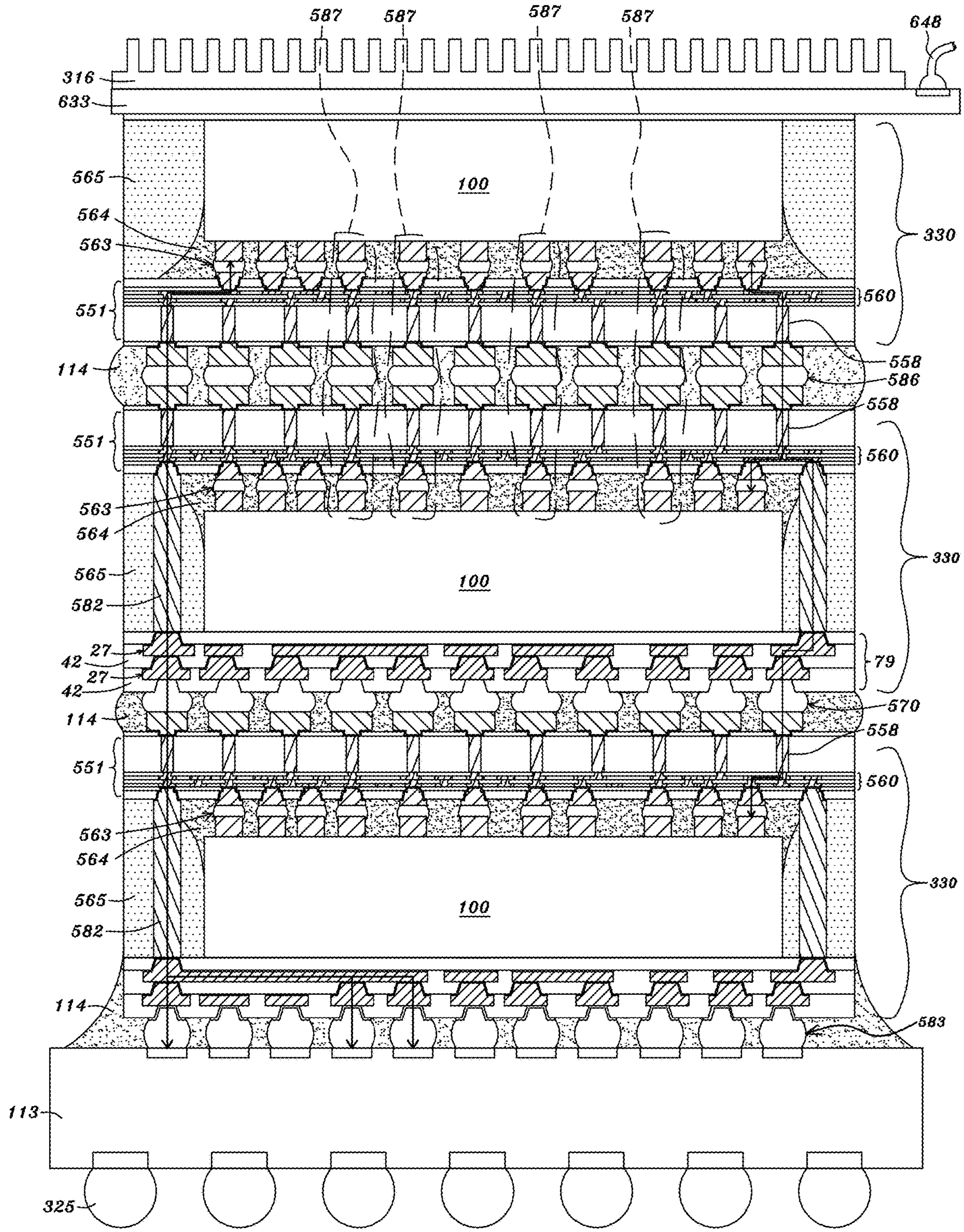
FIGS. 26D and 26E are schematically cross-sectional views showing various package-on-package assemblies for multiple single-chip packages in accordance with an embodiment of the present application.
Figure 26E:
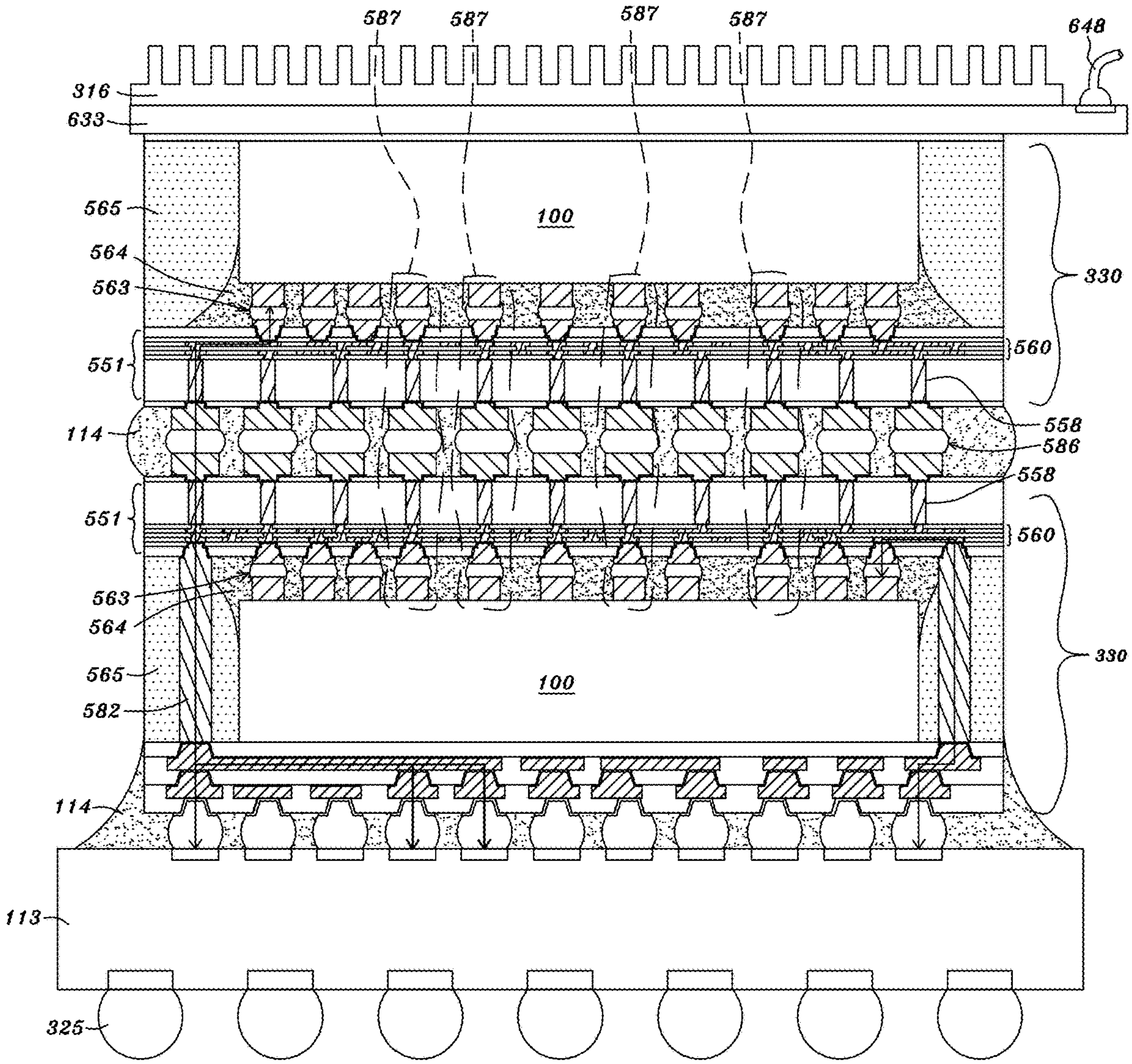

Alternatively, FIGS. 26D and 26E are schematically cross-sectional views showing various package-on-package assemblies for multiple single-chip packages in accordance with an embodiment of the present application. Referring to FIGS. 26D and 26E, for a single-chip package 330 having a similar structure as the standard commodity logic drive 300 for the first through third alternatives as illustrated in FIGS. 16, 23A-23C, 24A-24D and 25A-25D, the difference between the single-chip package 330 and the standard commodity logic drive 300 for the first through third alternatives is that the single-chip package 330 is provided with only one semiconductor chip 100 of the first or second type as illustrated in FIGS. 21A and 21B, wherein the only one semiconductor chip 100 may be any of the FPGA IC chip 200, GPU chip 269a, CPU chip 269b, DSP chip 270, IAC chip 402, dedicated programmable interconnection (DPI) IC chip 410, HBM IC chip 251 and non-volatile memory IC chip 250 as packaged in the standard commodity logic drive 300 shown in FIG. 16.

Referring to FIG. 26D, the single-chip packages 330 having the number of three for each of the first through third alternatives may be provided to be stacked one by one over the circuit board 113. A bottom one of the single-chip packages 330 for each of the first through third alternatives may include the second type of metal bumps 583 as seen in FIGS. 23C, 24D and 25D each having the tin-containing solder cap 569 to be bonded to the circuit board 113. An underfill 114 may be filled into a gap between the bottom one of the single-chip packages 330 for each of the first through third alternatives and the circuit board 113 to enclose each of the second type of metal bumps 583 therebetween. The middle one of the single-chip packages 330 for each of the first through third alternatives over the bottom one of the single-chip packages 330 may have none of the metal bumps 583 as seen in FIGS. 23C, 24D and 25D but the outmost one of the interconnection metal layers 27 of its backside interconnect scheme for a drive 79 may have the fifth metal pads each exposed by an opening in an outmost one of the polymer layers 42. A bottom one of the single-chip packages 330 for each of the first through third alternatives may include the second type of metal bumps 570 as seen in FIGS. 23C, 24D and 25D each having the tin-containing solder cap 569 to be bonded to one of the fifth metal pads of the BISD 79 of the middle one of the single-chip packages 330 for each of the first through third alternatives. An underfill 114 may be filled into a gap between the bottom and middle ones of the single-chip packages 330 for each of the first through third alternatives to enclose each of the second type of metal bumps 570 therebetween.

Referring to FIG. 26D, the middle one of the single-chip packages 330 for each of the first through third alternatives may have the metal bumps 570 to be bonded to the metal bumps 570 of the top one of the single-chip packages 330 for each of the first through third alternatives to form multiple bonded contacts 586 between the top and middle ones of the single-chip packages 330. Each of stacked vias may be composed of (1) one of the bonded contacts 586, (2) one of stacked portions provided by the vias 558 and interconnection metal layers 6 and/or 27 of the FISIP 560 and/or SISIP 588, as seen in FIG. 22A or 22B, of the first or second type of interposer 551 of the top one of the single-chip packages 330, (3) one of the bonded contacts 563 of the top one of the single-chip packages 330 for the first or second alternative or one of the bonded contacts of the metal pads 6a and 6b of the top one of the single-chip packages 330 for the third alternative, (4) one of stacked portions provided by the vias 558 and interconnection metal layers 6 and/or 27 of the FISIP 560 and/or SISIP 588, as seen in FIG. 22A or 22B, of the first or second type of interposer 551 of the middle one of the single-chip packages 330 and (5) one of the bonded contacts 563 of the middle one of the single-chip packages 330 for the first or second alternative or one of the bonded contacts of the metal pads 6a and 6b of the middle one of the single-chip packages 330 for the third alternative, which are aligned in a vertical direction to form a vertical path 587 between the only one semiconductor chip 100 of the top one of the single-chip packages 330 and the only one semiconductor chip 100 of the middle one of the single-chip packages 330. The number of vertical paths 587 connected between the only one semiconductor chip 100 of the top one of the single-chip packages 330 and the only one semiconductor chip 100 of the middle one of the single-chip packages 330 may have the number equal to or greater than 64, 128, 256, 512, 1024, 2048, 4096, 8K, or 16K, for example, for parallel signal transmission or power or ground delivery.

Referring to FIG. 26D, the only one semiconductor chip 100 of the top one of the single-chip packages 330 may include the small I/O circuits 203 as seen in FIG. 5B having the driving capability, loading, output capacitance or input capacitance between 0.1 pF and 2 pF or between 0.1 pF and 1 pF, or smaller than 2 pF or 1 pF, each of which may couple to one of the vertical paths 587 through one of its I/O pads 372; furthermore, the only one semiconductor chip 100 of the middle one of the single-chip packages 330 may include the small I/O circuits 203 as seen in FIG. 5B having the driving capability, loading, output capacitance or input capacitance between 0.1 pF and 2 pF or between 0.1 pF and 1 pF, each of which may couple to said one of the vertical paths 587 through one of its I/O pads 372.

Referring to FIG. 26D, the thermoelectric (TE) cooler 633 as illustrated in FIG. 20 may have the cold side attached to a backside of the only one semiconductor chip 100 of the top one of the single-chip packages 330 and to the polymer layer 565 of the top one of the single-chip packages 330, wherein a heat sink 316 made of copper or aluminum for example may be attached to the hot side of the thermoelectric (TE) cooler 633. A wire 648 may be bonded to the thermoelectric (TE) cooler 633 by a wirebonding process. Multiple solder balls 325 may be planted on a backside of the circuit board 113.

Referring to FIG. 26D, the middle and bottom ones of the single-chip packages 330 may include the through package vias 582 as seen for the left one in FIG. 26D aligned with each other to couple one of the large I/O circuits 341 as illustrated in FIG. 5A of the only one semiconductor chip 100 of the top one of the single-chip packages 330 to the circuit board 113 and not to couple the only one semiconductor chip 100 of the top one of the single-chip packages 330 to the only one semiconductor chip 100 of any of the middle and bottom ones of the single-chip packages 330. Further, the middle and bottom ones of the single-chip packages 330 may include the through package vias 582 as seen for the right one in FIG. 26D aligned with each other to couple one of the small I/O circuits 203 as illustrated in FIG. 5B of the only one semiconductor chip 100 of the top one of the single-chip packages 330 to one of the small I/O circuits 203 as illustrated in FIG. 5B of the only one semiconductor chip 100 of each of the middle and bottom ones of the single-chip packages 330 and not to couple the only one semiconductor chip 100 of the top one of the single-chip packages 330 to the circuit board 113.

For example, referring to FIG. 26D, in a first aspect, the only one semiconductor chip 100 of the top one of the single-chip packages 330 may be a FPGA IC chip 200, GPU chip 269*a*, CPU chip 269*c* or DSP chip 270 as illustrated in FIG. 16; the only one semiconductor chip 100 of the middle one of the single-chip packages 330 may be a dedicated control and I/O chip 260 or dedicated I/O chip 265 as illustrated in FIG. 16; the only one semiconductor chip 100 of the bottom one of the single-chip packages 330 may be a HBM IC chip 251 as illustrated in FIG. 16. In a second aspect, the only one semiconductor chip 100 of the top one of the single-chip packages 330 may be a FPGA IC chip 200, GPU chip 269*a*, CPU chip 269*c* or DSP chip 270 as illustrated in FIG. 16; the only one semiconductor chip 100 of the middle one of the single-chip packages 330 may be a HBM IC chip 251 as illustrated in FIG. 16; the only one semiconductor chip 100 of the bottom one of the single-chip packages 330 may be a non-volatile memory IC chip 250 as illustrated in FIG. 16.

The package-on-package (POP) assembly as seen in FIG. 26E is similar to that as illustrated in FIG. 26D, the difference therebetween is that the single-chip packages 330 of the package-on-package (POP) assembly as seen in FIG. 26E has the number of two for each of the first through third alternatives stacked one by one over the circuit board 113, that is, the middle one of the single-chip packages 330 of the package-on-package (POP) assembly as seen in FIG. 26D may be omitted. For an element indicated by the same reference number shown in FIGS. 26D and 26E, the specification of the element as seen in FIG. 26E may be referred to that of the element as illustrated in FIG. 26D.

For more elaboration, referring to FIG. 26E, the bottom one of the single-chip packages 330 for each of the first through third alternatives may have the metal bumps 570 to be bonded to the metal bumps 570 of the top one of the single-chip packages 330 for each of the first through third alternatives to form multiple bonded contacts 586 between the top and bottom ones of the single-chip packages 330. Each of stacked vias may be composed of (1) one of the bonded contacts 586, (2) one of stacked portions provided by the vias 558 and interconnection metal layers 6 and/or 27 of the FISIP 560 and/or SISIP 588, as seen in FIG. 22A or 22B, of the first or second type of interposer 551 of the top one of the single-chip packages 330, (3) one of the bonded contacts 563 of the top one of the single-chip packages 330 for the first or second alternative or one of the bonded contacts of the metal pads 6*a* and 6*b* of the top one of the single-chip packages 330 for the third alternative, (4) one of stacked portions provided by the vias 558 and interconnection metal layers 6 and/or 27 of the FISIP 560 and/or SISIP 588, as seen in FIG. 22A or 22B, of the first or second type of interposer 551 of the bottom one of the single-chip packages 330 and (5) one of the bonded contacts 563 of the bottom one of the single-chip packages 330 for the first or second alternative or one of the bonded contacts of the metal pads 6*a* and 6*b* of the bottom one of the single-chip packages 330 for the third alternative, which are aligned in a vertical direction to form a vertical path 587 between the only one semiconductor chip 100 of the top one of the single-chip packages 330 and the only one semiconductor chip 100 of the bottom one of the single-chip packages 330. The number of vertical paths 587 connected between the only one semiconductor chip 100 of the top one of the single-chip packages 330 and the only one semiconductor chip 100 of the bottom one of the single-chip packages 330 may have the number equal to or greater than 64, 128, 256, 512, 1024, 2048, 4096, 8K, or 16K, for example, for parallel signal transmission or power or ground delivery.

Referring to FIG. 26E, the only one semiconductor chip 100 of the top one of the single-chip packages 330 may include the small I/O circuits 203 as seen in FIG. 5B having the driving capability, loading, output capacitance or input capacitance between 0.1 pF and 2 pF or between 0.1 pF and 1 pF, or smaller than 2 pF or 1 pF, each of which may couple to one of the vertical paths 587 through one of its I/O pads 372; furthermore, the only one semiconductor chip 100 of the bottom one of the single-chip packages 330 may include the small I/O circuits 203 as seen in FIG. 5B having the driving capability, loading, output capacitance or input capacitance between 0.1 pF and 2 pF or between 0.1 pF and 1 pF, each of which may couple to said one of the vertical paths 587 through one of its I/O pads 372.

Referring to FIG. 26E, the bottom one of the single-chip packages 330 may include the through package vias 582 as seen for the left one in FIG. 26E to couple one of the large I/O circuits 341 as illustrated in FIG. 5A of the only one semiconductor chip 100 of the top one of the single-chip packages 330 to the circuit board 113 and not to couple the only one semiconductor chip 100 of the top one of the single-chip packages 330 to the only one semiconductor chip 100 of the bottom one of the single-chip packages 330. Further, the bottom one of the single-chip packages 330 may include the through package vias 582 as seen for the right one in FIG. 26E to couple one of the large I/O circuits 341 as illustrated in FIG. 5A of the only one semiconductor chip 100 of the bottom one of the single-chip packages 330 to the circuit board 113 and not to couple the only one semiconductor chip 100 of the bottom one of the single-chip packages 330 to the only one semiconductor chip 100 of the top one of the single-chip packages 330.

For example, referring to FIG. 26E, in a first aspect, the only one semiconductor chip 100 of the top one of the single-chip packages 330 may be a FPGA IC chip 200, GPU chip 269*a*, CPU chip 269*c* or DSP chip 270 as illustrated in FIG. 16; the only one semiconductor chip 100 of the bottom one of the single-chip packages 330 may be a dedicated control and I/O chip 260 or dedicated I/O chip 265 as illustrated in FIG. 16. In a second aspect, the only one semiconductor chip 100 of the top one of the single-chip packages 330 may be a FPGA IC chip 200, GPU chip 269*a*, CPU chip 269*c* or DSP chip 270 as illustrated in FIG. 16; the only one semiconductor chip 100 of the bottom one of the single-chip packages 330 may be a HBM IC chip 251 as illustrated in FIG. 16.

Immersive IC Interconnection Environment (IIEE)

Referring to FIGS. 21A, 21B, 22A, 22B, 23C, 24D and 25D, the standard commodity logic drives 300 may be stacked to form a super-rich interconnection scheme or environment, wherein their semiconductor integrated-circuit (IC) chips 100 represented for the standard commodity FPGA IC chips 200 provided with the programmable logic blocks (LB) 201 as illustrated in FIGS. 6A-6F and the cross-point switches 379 as illustrated in FIGS. 3A, 3B and 7, immerses in the super-rich interconnection scheme or environment, i.e., programmable 3D Immersive IC Interconnection Environment (IIIE). For one of the standard commodity FPGA IC chips 200 in one of the logic drives 300, (1) the interconnection metal layers 6 and/or 27 of its FISC 20 and/or SISC 29, the bonded contacts 563, or the bonded contacts of the metal pads 6*a* and 6*b*, between said one of the standard commodity FPGA IC chips 200 and the interposer 551 of said one of the logic drives 300, the interconnection metal layers 6 and/or 27, i.e., inter-chip interconnects 371, of the FISIP 560 and/or SISIP 588 of the interposer 551 of said one of the logic drives 300, and the metal pillars or bumps 570 are provided under the programmable logic blocks (LB) 201 and cross-point switches 379 of said one of the standard commodity FPGA IC chips 200; (2) the interconnection metal layers 27 of the BISD 79 of said one of the logic drives 300 and the fifth metal pads of the BISD 79 of said one of the logic drives 300 are provided over the programmable logic blocks (LB) 201 and cross-point switches 379 of said one of the standard commodity FPGA IC chips 200; and (3) the TPVs 582 of said one of the logic drives 300 are provided surrounding the programmable logic blocks (LB) 201 and cross-point switches 379 of said one of the standard commodity FPGA IC chips 200. Thus, the programmable 3D IIIE provides the super-rich interconnection scheme or environment, comprising the FISC 20 and/or SISC 29 of each of the semiconductor integrated-circuit (IC) chips 100 for the standard commodity FPGA IC chips 200 and DPIIC chips 410, the bonded contacts 563, or the bonded contacts of the metal pads 6*a* and 6*b*, between each of the semiconductor integrated-circuit (IC) chips 100 and one of the interposers 551, the interposers 551, the BISD 79 of each of the logic drives, the TPVs 582 of each of the logic drives 300 and the metal pillars or bumps 570, for constructing an interconnection scheme or system in three dimensions (3D). The interconnection scheme or system in a horizontal direction may be programmed by the cross-point switches 379 of each of the standard commodity FPGA IC chips 200 and DPIIC chips 410 of the logic drive 300. Also, the interconnection scheme or system in a vertical direction may be programmed by the cross-point switches 379 of each of the standard commodity FPGA IC chips 200 and DPIIC chips 410 of the logic drive 300.

Figure 27A:
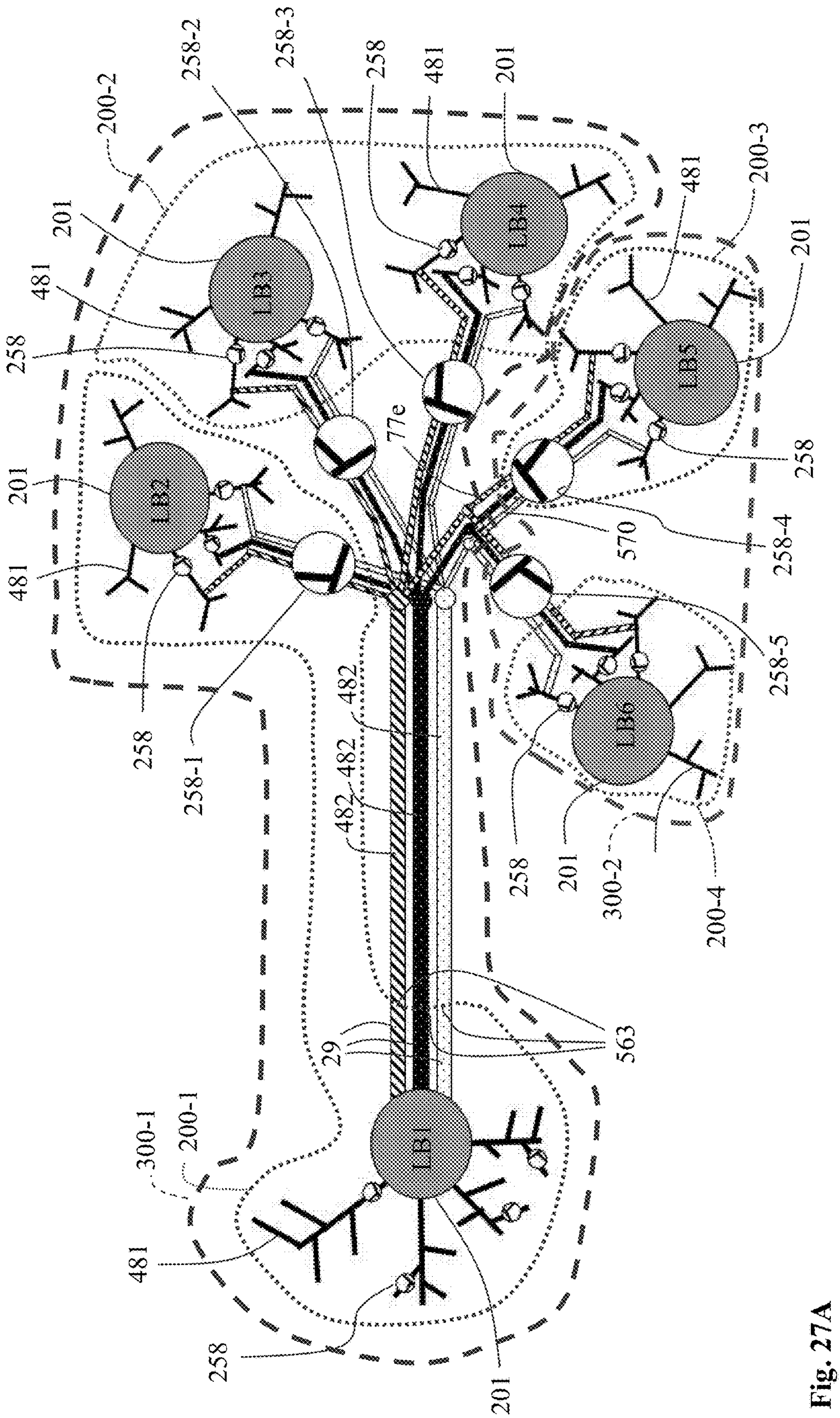
FIGS. 27A and 27B are conceptual views showing interconnection between multiple programmable logic blocks in view of an aspect of human's nerve system in accordance with an embodiment of the present application.
Figure 27B:
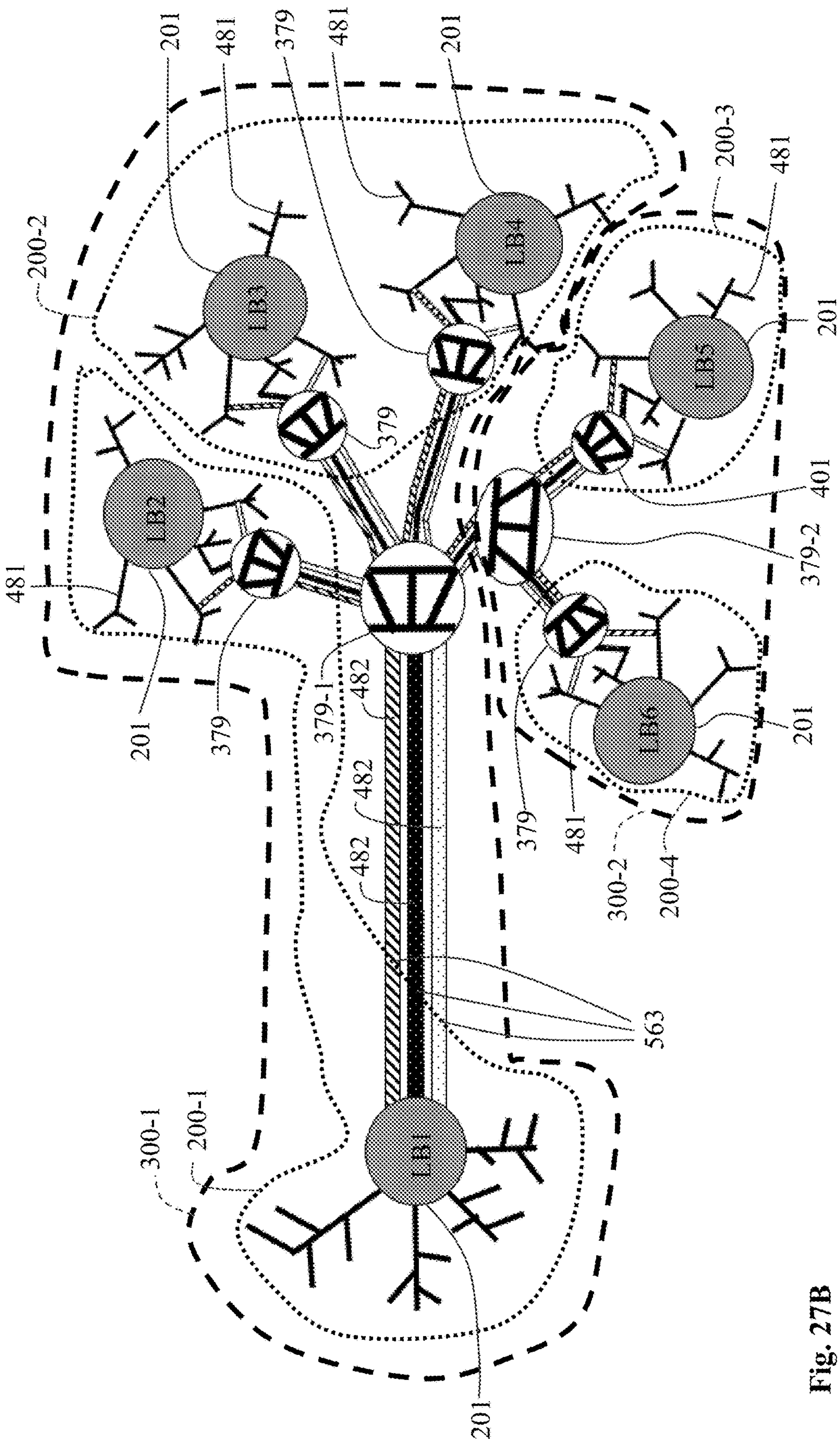

FIGS. 27A and 27B are conceptual views showing interconnection between multiple programmable logic blocks in view of an aspect of human's nerve system in accordance with an embodiment of the present application. For an element indicated by the same reference number shown in FIGS. 27A and 27B and in above-illustrated figures, the specification of the element as seen in FIGS. 27A and 27B may be referred to that of the element as above illustrated in the figures. Referring to FIG. 27A, the programmable 3D IIIE is similar or analogous to a human brain. The programmable logic blocks (LB) 201 as seen in FIG. 6A-6F are similar or analogous to neurons or nerve cells; the interconnection metal layers 6 of the FISC 20 and/or the interconnection metal layers 27 of the SISC 29 are similar or analogous to the dendrites connecting to the neurons or nerve cells 201. The bonded contacts 563 connecting to the small receivers 375 of the small I/O circuits 203 of said one of the standard commodity FPGA IC chips 200 for the inputs of the programmable logic blocks (LB) 201 of said one of the standard commodity FPGA IC chips 200 are similar or analogous to post-synaptic cells at ends of the dendrites. For a short distance between two of the programmable logic blocks (LB) 201 in one of the standard commodity FPGA IC chips 200, the interconnection metal layers 6 of its FISC 20 and/or the interconnection metal layers 27 of its SISC 29 may construct an interconnect 482 like an axon connecting from one of the neurons or nerve cells 201 to another of the neurons or nerve cells 201. For a long distance between two of the standard commodity FPGA IC chips 200, the interconnection metal layers 6 and/or 27 of the FISIP 560 and/or SISIP 588 of the interposers 551 of the logic drives 300, the interconnection metal layers 27 of the BISDs 79 of the logic drives 300 and the TPVs 582 of the logic drives 300 may construct the axon-like interconnect 482 connecting from one of the neurons or nerve cells 201 to another of the neurons or nerve cells 201. One of the bonded contacts 563 physically between a first one of the standard commodity FPGA IC chips 200 and one of the interposers 551 for physically connecting to the axon-like interconnect 482 may be programmed to connect to the small drivers 374 of the small I/O circuits 203 of a second one of the standard commodity FPGA IC chips 200 and thus is similar or analogous to pre-synaptic cells at a terminal of the axon 482.

For more elaboration, referring to FIG. 27A, a first one 200-1 of the standard commodity FPGA IC chips 200 may include first and second ones LB1 and LB2 of the programmable logic blocks (LB) 201 as illustrated in FIGS. 6A-6F like the neurons, its FISC 20 and/or SISC 29 like the dendrites 481 coupling to the first and second ones LB1 and LB2 of the programmable logic blocks (LB) 201 and the cross-point switches 379 programmed for connection of its FISC 20 and/or SISC 29 to the first and second ones LB1 and LB2 of the programmable logic blocks (LB) 201. A second one 200-2 of the standard commodity FPGA IC chips 200 may include third and fourth ones LB3 and LB4 of the programmable logic blocks (LB) 201 like the neurons, its FISC 20 and/or SISC 29 like the dendrites 481 coupling to the third and fourth ones LB3 and LB4 of the programmable logic blocks (LB) 201 and the cross-point switches 379 programmed for connection of its FISC 20 and/or SISC 29 to the third and fourth ones LB3 and LB4 of the programmable logic blocks (LB) 201. A first one 300-1 of the logic drives 300 may include the first and second ones 200-1 and 200-2 of the standard commodity FPGA IC chips 200. A third one 200-3 of the standard commodity FPGA IC chips 200 may include a fifth one LB5 of the programmable logic blocks (LB) 201 like the neurons, its FISC 20 and/or SISC 29 like the dendrites 481 coupling to the fifth one LB5 of the programmable logic blocks (LB) 201 and its cross-point switches 379 programmed for connection of its FISC 20 and/or SISC 29 to the fifth one LB5 of the programmable logic blocks (LB) 201. A fourth one 200-4 of the standard commodity FPGA IC chips 200 may include a sixth one LB6 of the programmable logic blocks (LB) 201 like the neurons, its FISC 20 and/or SISC 29 like the dendrites 481 coupling to the sixth one LB6 of the programmable logic blocks (LB) 201 and the cross-point switches 379 programmed for connection of its FISC 20 and/or SISC 29 to the sixth one LB6 of the programmable logic blocks (LB) 201. A second one 300-2 of the logic drives 300 may include the third and fourth ones 200-3 and 200-4 of the standard commodity FPGA IC chips 200. (1) A first portion, which is provided by the interconnection metal layers 6 and 27 of the FISC 20 and/or SISC 29 of the first one 200-1 of the standard commodity FPGA IC chips 200, extending from the first one LB1 of the programmable logic block (LB) 201, (2) one of the bonded contacts 563 extending from the first portion, (3) a second portion, which is provided by the interconnection metal layers 6 and/or 27 of the FISIP 560 and/or SISIP 588 of the interposer 551 and/or the TPVs 582 of the first one 300-1 of the logic drives 300 and/or the interconnection metal layers 27 of the BISD 79 of the first one 300-1 of the logic drives 300, extending from said one of the bonded contacts 563, (4) the other one of the bonded contacts 563 extending from the second portion, and (5) a third portion, which is provided by the interconnection metal layers 6 and 27 of the FISC 20 and/or SISC 29 of the first one 200-1 of the standard commodity FPGA IC chips 200, extending from the other one of the bonded contacts 563 to the second one LB2 of the programmable logic blocks (LB) 201 may compose the axon-like interconnect 482. The axon-like interconnect 482 may be programmed to connect the first one LB1 of the programmable logic blocks (LB) 201 to one or more of the second through sixth ones LB2, LB3, LB4, LB5 and LB6 of the programmable logic blocks (LB) 201 according to switching of first through fifth ones 258-1 through 258-5 of the pass/no-pass switches 258 of the cross-point switches 379 set on the axon-like interconnect 482. The first one 258-1 of the pass/no-pass switches 258 may be arranged in the first one 200-1 of the standard commodity FPGA IC chips 200. The second and third ones 258-2 and 258-3 of the pass/no-pass switches 258 may be arranged in one of the DPIIC chips 410 in the first one 300-1 of the logic drives 300. The fourth one 258-4 of the pass/no-pass switches 258 may be arranged in the third one 200-3 of the standard commodity FPGA IC chips 200. The fifth one 258-5 of the pass/no-pass switches 258 may be arranged in one of the DPIIC chips 410 in the second one 300-2 of the logic drives 300. The first one 300-1 of the logic drives 300 may have the fifth metal pads coupling to the second one 300-2 of the logic drives 300 through the metal bumps or pillars 570.

Furthermore, referring to FIG. 27B, the axon-like interconnect 482 may be considered as a scheme or structure of a tree including (i) a trunk or stem connecting to the first one LB1 of the programmable logic blocks (LB) 201, (ii) multiple branches branching from the trunk or stem for connecting its trunk or stem to one or more of the second and sixth ones LB2-LB6 of the programmable logic blocks (LB) 201, (iii) a first one 379-1 of the cross-point switches 379 set between its trunk or stem and each of its branches for switching the connection between its trunk or stem and one of its branches, (iv) multiple sub-branches branching from one of its branches for connecting said one of its branches to one or more of the fifth and sixth ones LB5 and LB6 of the programmable logic blocks (LB) 201, and (v) a second one 379-2 of the cross-point switches 379 set between said one of its branches and each of its sub-branches for switching the connection between said one of its branches and one or more of its sub-branches. The first one 379-1 of the cross-point switches 379 may be provided in one of the DPIIC chips 410 in the first one 300-1 of the logic drives 300, and the second one 379-2 of the cross-point switches 379 may be provided in one of the DPIIC chips 410 in the second one 300-2 of the logic drives 300. Each of the dendrite-like interconnects 481 may include (i) a stem connecting to one of the first through sixth ones LB1-LB6 of the programmable logic blocks (LB) 201, (ii) multiple branches branching from the stem, (iii) a cross-point switch 379 set between its stem and each of its branches for switching the connection between its stem and one or more of its branches. Each of the programmable logic blocks (LB) 201 of one of the standard commodity FPGA IC chips 200-1 through 200-4 may couple to multiple of the dendrite-like interconnects 481 composed of the interconnection metal layers 6 and/or 27 of the FISC 20 and/or SISC 29 of said one of the standard commodity FPGA IC chips 200-1 through 200-4. Each of the programmable logic blocks (LB) 201 may be coupled to a distal terminal of one or more of the axon-like interconnects 482 through the dendrite-like interconnects 481 extending from said each of the programmable logic blocks (LB) 201.

Referring to FIGS. 27A and 27B, each of the logic drives 300-1 and 300-2 may provide a reconfigurable plastic, elastic and/or integral (granular) architecture for system/machine computing or processing using integral (granular) and alterable memory units and logic units in each of the programmable logic blocks (LB) 201, in addition to the sequential, parallel, pipelined or Von Neumann computing or processing system architecture and/or algorithm. Each of the logic devices 300-1 and 300-2 with plasticity, elasticity and integrality (granularity) may include integral, granular and alterable memory units and logic units to alter or reconfigure logic functions and/or computing (or processing) architecture (or algorithm) and/or memories (data or information) in the memory units. The properties of the plasticity, elasticity and integrality (granularity) of the logic drive 300-1 or 300-2 is similar or analogous to that of a human brain. The brain or nerves have plasticity, elasticity and integrality (granularity). Many aspects of brain or nerves can be altered (or are "plastic" or "elastic") and reconfigured through adulthood. The logic drives 300-1 and 300-2, or standard commodity FPGA IC chips 200-1, 200-2, 200-3 and 200-4, described and specified above provide capabilities to alter or reconfigure the logic functions and/or computing (or processing) architecture (or algorithm) for a given fixed hardware by reconfiguring the resulting values or programming codes, i.e., configuration programming memory (CPM) data, stored in the memory cells 490 in the FPGA IC chips 200 as seen in FIG. 16 (e.g., programming codes stored in the memory cells 362 in the FPGA IC chips 200 as seen in FIG. 16 for the cross-point switches 379 or pass/no-pass switches 258 as seen in FIGS. 2A-2C, 3A, 3B and 7 and programming codes or resulting values stored in the memory cells 490 in the FPGA IC chips 200 as seen in FIG. 16 for the look-up tables 210 as seen in FIGS. 6A-6F).

Referring to FIGS. 27A-27D, for each of the logic drives 300-1 and 300-2, the data or information stored in the memory cells 490 and 362, i.e., configuration programming memory (CPM) cells, of its FPGA IC chips 200 as illustrated in FIG. 16 and in the memory cells 362, i.e., configuration programming memory (CPM) cells, of the DPIIC chips 410 as illustrated in FIG. 16 may be used for altering or reconfiguring logic functions and/or computing/processing architecture (or algorithm). The data or information stored in data information memory (DIM) cells of the HBM IC chips 251 as illustrated in FIG. 16 may be used for storing data or information input to or output from the logic functions and/or computing/processing architecture (or algorithm).

Figure 27C:
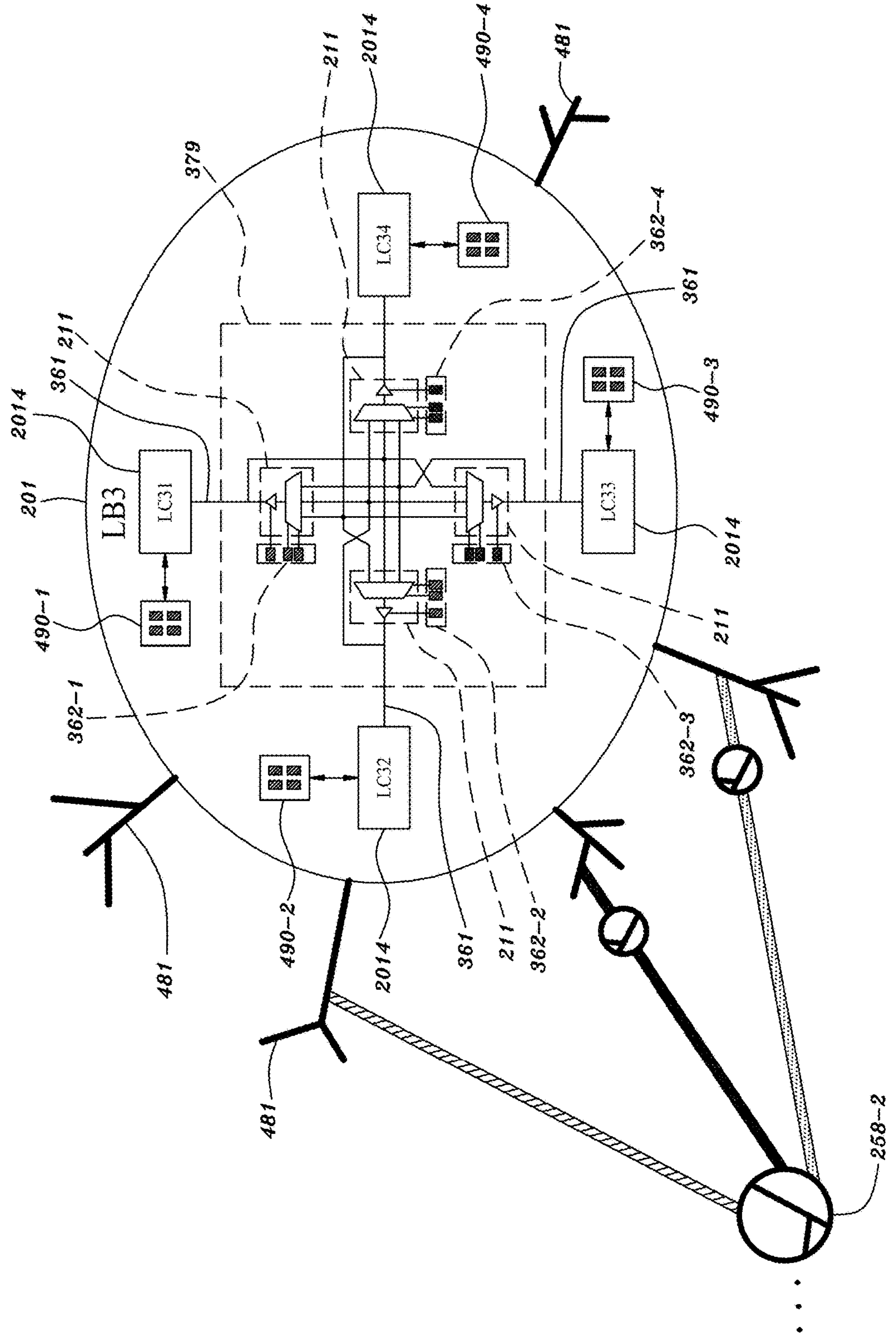
FIG. 27C is a schematic diagram for a reconfigurable plastic, elastic and/or integral architecture in accordance with an embodiment of the present application.

For example, FIG. 27C is a schematic diagram for a reconfigurable plastic, elastic and/or integral architecture in accordance with an embodiment of the present application. Referring to FIG. 27C, the third one LB3 of the programmable logic blocks (LB) 201 may include four programmable logic cells or elements (LCE) 2014, i.e., LC31, LC32, LC33 and LC34, a cross-point switch 379, eight sets of configuration programming memory (CPM) cells 362-1, 362-2, 362-3, 362-4, 490-1, 490-2, 490-3 and 490-4. The cross-point switch 379 may be referred to one as illustrated in FIG. 7. For an element indicated by the same reference number shown in FIGS. 27C and 7, the specification of the element as seen in FIG. 27C may be referred to that of the element as illustrated in FIG. 7. The four programmable interconnects 361 at four ends of the cross-point switch 379 may couple to the four programmable logic cells LC31, LC32, LC33 and LC34. Each of the programmable logic cells LC31, LC32, LC33 and LC34 may have the same architecture as the programmable logic cells or element (LCE) 2014 illustrated in FIG. 6A, 6E or 6F with its output Dout or one of its inputs A0 and A1 coupling to one of the four programmable interconnects 361 at the four ends of the cross-point switch 379. Each of the programmable logic cells LC31, LC32, LC33 and LC34 may couple to one of the four sets of configuration programming memory (CPM) cells 490-1, 490-2, 490-3 and 490-4 for storing resulting values or programming codes for its look-up table 210 for an event. Thereby, the logic functions and/or computing/processing architecture (or algorithm) of the third one LB3 of the programmable logic blocks (LB) 201 may be altered or reconfigured when the configuration programming memory (CPM) data stored in any of the four sets of configuration programming memory (CPM) cells 490-1, 490-2, 490-3 and 490-4 of the third one LB3 of the programmable logic blocks (LB) 201 are altered or reconfigured.

Evolution and Reconfiguration for Logic Drive

Figure 28:
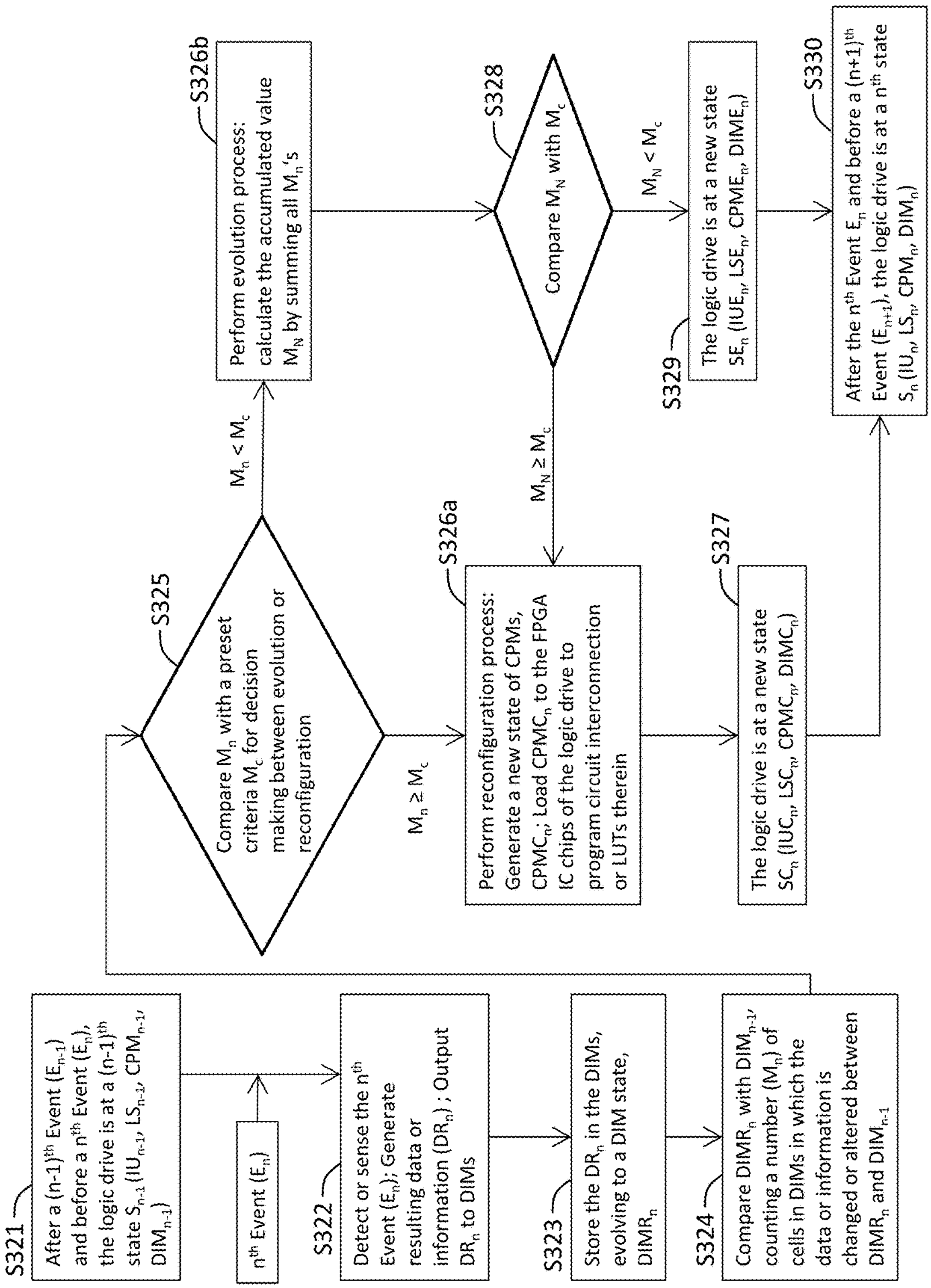
FIG. 28 is a block diagram illustrating an algorithm or flowchart for evolution and reconfiguration for a commodity standard logic drive in accordance with an embodiment of the present application.

FIG. 28 is a block diagram illustrating an algorithm or flowchart for evolution and reconfiguration for a commodity standard logic drive in accordance with an embodiment of the present application. Referring to FIG. 28, a state (S) of the standard commodity logic drive 300 comprises an integral unit (IU), a logic state (LS), a CPM state and a DIM state, and can be described as S (IU, LS, CPM, DIM). The evolution or reconfiguration of the state of the standard commodity logic drive 300 is performed as follows:

In a step S321, after a $(n-1)^{th}$ Event ($E_{n-1}$) and before a $n^{th}$ Event ($E_n$), the standard commodity logic drive 300 is at a $(n-1)^{th}$ state $S_{n-1}$ ($IU_{n-1}$, $LS_{n-1}$, $CPM_{n-1}$, $DIM_{n-1}$), wherein n is a positive integer, i.e., 1, 2, 3, . . . or N.

In a step S322, when the standard commodity logic drive 300, or a machine, system or device external of the standard commodity logic drive 300, is subject to the $n^{th}$ Event ($E_n$), it detects or senses the $n^{th}$ Event ($E_n$) and generate a $n^{th}$ signal ($F_n$); the detected or sensed signal ($F_n$) is input to the standard commodity logic drive 300. The standard commodity FPGA IC chips 200 of the standard commodity logic drive 300 perform processing and computing based on the $n^{th}$ signal ($F_n$), generate a $n^{th}$ resulting data or information ($DR_n$) and output the $n^{th}$ resulting data or information ($DR_n$) to be stored in the data information memory (DIM) cells, such as in the HBM IC chips 251, of the standard commodity logic drive 300.

In a step S323, the data information memory (DIM) cells store the $n^{th}$ resulting data or information ($DR_n$) and are evolved to a data infirmary memory (DIM) state for the $n^{th}$ resulting data or information ($DR_n$), i.e., $DIMR_n$.

In a step S324, the standard commodity FPGA IC chips 200, or other control, processing or computing IC chips, such as dedicated control chip 260, GPU chips 269*a* and/or CPU chips 269*b* as seen in FIG. 13, of the standard commodity logic drive 300 may perform comparison between the $n^{th}$ resulting data or information ($DR_n$) for $DIMR_n$ and the $(n-1)^{th}$ resulting data or information ($DR_{n-1}$) for data information memory cells, i.e., $DIM_{n-1}$, by detecting the changes between them, for example, and then may count a number ($M_n$) of the data information memory (DIM) cells in which the data information memory (DIM) is changed or altered between $DIMR_n$ and $DIM_{n-1}$.

In a step S325, the standard commodity FPGA IC chips 200 or the other control, processing or computing IC chips of the standard commodity logic drive 300 compare the number ($M_n$) to preset criteria ($M_c$) for decision making between evolution or reconfiguration of the standard commodity logic drive 300.

Referring to FIG. 22, if the number ($M_n$) is equal to or larger than the preset criteria ($M_c$), the event $E_n$ is a grand event, and a step S326*a* continues for the reconfiguration route. If the bumber ($M_n$) is smaller than the preset criteria ($M_c$), the event $E_n$ is not a grand event, and a step S326*b* continues for the evolution route.

In the step 326*a*, the standard commodity logic drive 300 may perform the reconfiguration process to generate a new state of configuration programming memory (CPMs) (data or information), i.e., $CPMC_n$. For example, based on the $n^{th}$ resulting data or information ($DR_n$) for $DIMR_n$, new truth tables may be generated and then may be transformed into the new state of configuration programming memory ($CPMC_n$). The configuration programming memory ($CPMC_n$) (data or information) is loaded to the standard commodity FPGA IC chips 200 of the standard commodity logic drive 300 to program the programmable interconnects 361 as illustrated in FIGS. 2A-2C, 3A, 3B and 8 and/or look-up tables 210 (LUTs) as illustrated in FIG. 6 therein. After the reconfiguration, in a step S327, the standard commodity logic drive 300 is at a new state $SC_n$ ($IUC_n$, $LSC_n$, $CPMC_n$, $DIMC_n$), comprising the new states of $IUC_n$, $LSC_n$, $CPMC_n$, and $DIMC_n$. The new state $SC_n$ ($IUC_n$, $LSC_n$, $CPMC_n$, $DIMC_n$) will be defined, in a step S330, as a final state $S_n$ ($IU_n$, $LS_n$, $CPM_n$, $DIM_n$) of the standard commodity logic drive 300 after the grand event $E_n$.

In the step S326*b*, the standard commodity logic drive 300 may perform the evolution process. The standard commodity FPGA IC chips 200, or the other control, processing or computing IC chips of the standard commodity logic drive 300, may calculate the accumulated value ($M_N$) by summing all of the numbers ($M_n$'s), wherein n is: (A) from 1 to n if no grand event happened; or (B) from (R+1) to n if a last grand event happened at the $R^{th}$ event $E_R$, wherein R is a positive integer. In a step S328, the standard commodity FPGA IC chips 200, or the other control, processing or computing IC chips, of the standard commodity logic drive 300 may compare the number $M_N$ to $M_c$. If the number $M_N$ is equal to or larger than the preset criteria $M_c$, the reconfiguration process in the step S326*a* as described and specified above continues. If the number $M_N$ is smaller than the preset criteria $M_c$, a step S329 for evolution continues. In the step S329, the standard commodity logic drive 300 is at an evolution state $SE_n$ ($IUE_n$, $LSE_n$, $CPME_n$, $DIME_n$), wherein the states of LS and CPM do not change from those after the event $E_{n-1}$, that means, $LE_n$ is the same as $LS_{n-1}$, $CPME_n$ is the same as $CPM_{n-1}$; while $DIME_n$ is $DIMR_n$. The evolution state $SE_n$ ($IUE_n$, $LSE_n$, $CPME_n$, $DIME_n$) may be defined, in the step S330, as a final state $S_n$ ($IU_n$, $LS_n$, $CPM_n$, $DIM_n$) of the logic drive after the evolution event $E_n$.

Referring to FIG. 22, the steps S321 through S330 may be repeated for the $(n+1)^{th}$ Event $E_{n+1}$.

The reconfiguration in the step S326*a* of generating the new states of $IUC_n$, $DIMC_n$ comprises (i) Reorganization of the integral unit (IU) and/or (ii) condense or concise processes as follows:

I. Reorganization of the Integral Unit (IU):

The FPGA IC chip 200 may perform the reconfiguration by reorganizing the integral units (IU) in an integral unit (IU) state. Each integral unit (IU) state may comprise several integral units (IU). Each integral unit (IU) is related to a certain logic function and may comprise several CPMs and DIMs. The reorganization may change (1) the number of integral units (IU) in the integral unit (IU) state, (2) the number and content (the data or information therein) in CPM and DIM in each of the integral units (IU). The reconfiguration may further comprise (1) relocating original CPM or DIM data in different locations or addresses, or (2) storing new CPM or DIM data in some locations or addresses originally storing original CPM or DIM data or in new locations or addresses. If data in CPM or DIM are identical or similar, they may be removed from CPM or DIM memory cells after reconfiguration and may be stored in remote storage memory cells in devices external of the logic drive 300 (and/or stored in NAND flash memory cells of the NVM IC chips 250 in the logic drive 300 as seen in FIG. 13).

Criteria are established for the identical or similar cells in CPM or DIM: (1) A machine/system external of the logic drive 300 (and/or the FPGA IC chips 200 or other control, processing or computing IC chips of the logic drive 300, such as dedicated control chip 260, GPU chips 269*a* and/or CPU chips 269*b* as seen in FIG. 13) checks the $DIM_n$ to find identical memories, and then keeping only one memory of all identical memories in the CPM or DIM of SRAM or DRAM cells in the HBM IC chips 251 in the logic drive 300 and NAND flash memory cells in the NVM IC chips 250 in the logic drive 300, removing all other identical memories from CPM or DIM memory cells after reconfiguration, wherein the identical memories may be stored in remote storage memory cells in devices external of the logic drive (and/or stored in NAND flash memory cells of the NVM IC chips 250 in the logic drive 300); and/or (2) A machine/system external of the logic drive 300 (and/or the FPGA IC chips 200 or other control, processing or computing IC chips of the logic drive 300, such as dedicated control chip 260, GPU chips 269*a* and/or CPU chips 269*b* as seen in FIG. 13) checks the $DIM_n$ to find similar memories (similarity within a given percentage x %, for example, is equal to or smaller than 2%, 3%, 5% or 10% in difference), and keeping only one or two memories of all similar memories in the CPM or DIM of SRAM or DRAM cells in the HBM IC chips 251 in the logic drive 300 and NAND flash memory cells in the NVM IC chips 250 in the logic drive 300, removing all other similar memories from CPM or DIM memory cells after reconfiguration, wherein the similar memories may be stored in remote storage memory cells in devices external of the logic drive 300 (and/or stored in NAND flash memory cells of the NVM IC chips 250 in the logic drive); alternatively, a representative memory (data or information) of all similar memories may be generated and kept in the CPM or DIM of SRAM or DRAM cells in the HBM IC chips 251 in the logic drive 300 and NAND flash memory cells in the NVM IC chips 250 in the logic drive 300, removing all other similar memories from CPM or DIM memory cells after reconfiguration, wherein the similar memories may be stored in remote storage memory cells in devices external of the logic drive 300 (and/or stored in NAND flash memory cells of the NVM IC chips 250 in the logic drive 300).

II. Learning Processes:

The logic drive 300 may further provide capability of a learning process. Based on $S_n$ ($IU_n$, $LS_n$, $CPM_n$, $DIM_n$), performing an algorithm to select or screen (memorize) useful, significant and important integral units IUs, logic states LSs, CPMs and DIMs, and forget non-useful, non-significant or non-important integral units IUs, logic states LSs, CPMs or DIMs by storing the useful, significant and important integral units IUs, logic states LSs, CPMs and DIMs in the CPM or DIM of SRAM or DRAM cells in the HBM IC chips 251 in the logic drive 300 and NAND flash memory cells in NVM IC chips 250 in the logic drive 300, removing all other identical memories from CPM or DIM memory cells after reconfiguration, wherein the identical memories may be stored in remote storage memory cells in devices external of the logic drive 300 (and/or stored in NAND flash memory cells of the NVM IC chips 250 in the logic drive 300). The selection or screening algorithm may be based on a given statistical method, for example, based on the frequency of use of integral units IUs, logic states LSs, CPMs and or DIMs in the previous n events. For example, if a logic function of a logic gate is not used frequently, the logic gate may be used for another different function. Another example, the Bayesian inference may be used for generating a new state of the logic drive after learning $SL_n$ ($IUL_n$, $LSL_n$, $CPML_n$, $DIML_n$).

FIG. 29 shows two tables illustrating reconfiguration for a commodity standard logic drive in accordance with an embodiment of the present application. For a configuration programming memory state $CPM_{(i,j,k)}$, the subscript of "i" means a set "i" of configuration programming memory, and the subscripts of "j" and "k" mean an address "j" for storing data "k" for configuration programming memory. For a data information memory state $DIM_{(a,b,c)}$, the subscript of "a" means a set "a" of data information memory, and the subscripts of "b" and "c" mean an address "b" for storing data "c" for data information memory. Referring to FIG. 23, before reconfiguration, the standard commodity logic drive 300 may include three integral units $IU_{(n-1)a}$, $IU_{(n-1)b}$ and $IU_{(n-1)c}$ in the event $E_{(n-1)}$, wherein the integral unit $IU_{(n-1)a}$ may perform a logic state $LS_{(n-1)a}$ based on a configuration programming memory state $CPM_{(a,1,1)}$ and store data information memory states $DIM_{(a,1,1')}$ and $DIM_{(a,2,2')}$, the integral unit $IU_{(n-1)b}$ may perform a logic state $L_{(n-1)b}$ based on configuration programming memory states $CPM_{(b,2,2)}$ and $CPM_{(b,3,3)}$ and store data information memory states $DIM_{(b,3,3')}$ and $DIM_{(b,4,4')}$ and the integral unit $IU_{(n-1)c}$ may perform a logic state $LS_{(n-1)c}$ based on a configuration programming memory state $CPM_{(c,4,4)}$ and store data information memory states $DIM_{(c,5,5')}$, $DIM_{(c,6,6')}$ and $DIM_{(c,7,6')}$. During reconfiguration, the standard commodity logic drive 300 may include four integral units $IUC_{ne}$, $IUC_{nf}$, $IUC_{ng}$, and $IUC_{nh}$ in the event $E_n$, wherein the integral unit $IUC_{ne}$ may perform a logic state $LSC_{ne}$ based on a configuration programming memory state $CPMC_{(e,1,1)}$ and store data information memory states $DIMC_{(e,1,1')}$ and $DIMC_{(e,2,2')}$, the integral unit $IUC_{ng}$ may perform a logic state $LSC_{ng}$ based on configuration programming memory states $CPMC_{(f,2,4)}$ and $CPMC_{(f,3,5)}$ and store data information memory states $DIMC_{(f,3,8')}$, $DIMC_{(f,4,9')}$ and $DIMC_{(f,5,10')}$, the integral unit $IUC_{ng}$ may perform a logic state $LSC_{ng}$ based on configuration programming memory states $CPMC_{(g,4,2)}$ and $CPMC_{(g,5,5)}$ and store data information memory states $DIMC_{(g,6,11')}$ and $DIMC_{(g,8,5')}$, and the integral unit $IUC_{nh}$ may perform a logic state $LSC_{nh}$ based on a configuration programming memory state $CPMC_{(h,6,6)}$ and store data information memory states $DIMC_{(h,7,7')}$ and $DIMC_{(h,9,6')}$.

In comparison between the states before reconfiguration and during reconfiguration, the CPM data “4” originally stored in the CPM address “4” is kept to be stored in the CPM address “2” during reconfiguration; the CPM data “2” originally stored in the CPM address “2” is kept to be stored in the CPM address “4” during reconfiguration; the CPM data “3” is different from the CPM data “2” by less than 5% in difference and is removed from the CPM cells during reconfiguration and may be stored in remote storage memory cells in devices external of the logic drive 100 and/or stored in NAND flash memory cells of the NVM IC chips 250 in the logic drive 300 as seen in FIG. 13. The DIM data “5” originally stored in the DIM address “5” is kept during reconfiguration to be stored in the DIM address “8”; the DIM data “6” originally stored in both DIM addresses “6” and “7” is kept during reconfiguration with only one copy to be stored in the DIM address “9”; the DIM data “3” and “4” are removed from the DIM cells during reconfiguration and may be stored in remote storage memory cells in devices external of the logic drive 300 and/or stored in NAND flash memory cells of the NVM IC chips 250 in the logic drive 300; the DIM addresses “3”, “4”, “5”, “6” and “7” store new DIM data “8”, “9”, “10”, “11” and “7” respectively, during reconfiguration; new DIM addresses “8” and “9” store original DIM data “5” and “6” respectively, during reconfiguration.

An example of plasticity, elasticity and integrality is taken using the programmable logic block LB3, as illustrated in FIGS. 31A-31C, as GPS (Global Positioning System) functions, as below:

The programmable logic block LB3 is, for example, functioning as GPS, remembering routes and enabling to drive to various locations. A driver and/or machine/system was planning to drive from San Francisco to San Jose, and the programmable logic block LB3 may functions as:

(1) In a first event E1, the driver and/or machine/system looked up a map and found two Freeways 101 and 280 to get to San Jose from San Francisco. The machine/system used the programmable logic cells LC31 and LC32 for computing and processing the first event E1 and memorized a first logic configuration LS1 for the first event E1 and the related data, information or outcomes of the first event E1. That was: the machine/system (a) formulated the programmable logic cells LC31 and LC32 at the first logic configuration LS1 based on a first set of configuration-programming-memory data CPM1 in the CPM cells 362-1, 362-2, 362-3, 362-4, 490-1 and 490-2 of the programmable logic block LB3 and (b) stored a first set of data-information-memory data DIM1 in the HBM IC chips 251 in the standard commodity logic drive 300-1. The integral state of GPS functions in the programmable logic block LB3 after the first event E1 may be defined as S1LB3 relating to the first logic configuration LS1 for E1, CPM1 and DIM1.

(2) In a second event E2, the driver and/or machine/system decided to take Freeway 101 to get to San Jose from San Francisco. The machine/system used the programmable logic blocks LB31 and LB33 for computing and processing the second event E2 and memorized a second logic configuration LS2 for the second event E2 and the related data, information or outcomes of the second event E2. That was: the machine/system (a) formulated the programmable logic blocks LB31 and LB33 at the second logic configuration LS2 based on a second set of configuration-programming-memory data CPM2 in the configuration programming memory (CPM) cells 362-1, 362-2, 362-3, 362-4, 490-1 and 490-3 of the logic section LS3 and/or the first set of data memories DM1 and (b) stored a second set of data-information-memory data DIM2 in the HBM IC chips 251 in the standard commodity logic drive 300-1. The integral state of GPS functions in the logic section LS3 after the second event E2 may be defined as S2LS3 relating to the second logic configuration LS2 for E2, CPM2 and DIM2. The second set of data-information-memory data DIM2 may include newly added information relating to the second event E2 and the data and information reorganized based on DIM1, and thereby keeps useful and important information of the first event E1.

(3) In a third event E3, the driver and/or machine/system drove from San Francisco to San Jose through Freeway 101. The machine/system used the programmable logic cells LC31, LC32 and LC33 for computing and processing the third event E3 and memorized a third logic configuration LS3 for the third event E3 and the related data, information or outcomes of the third event E3. That was: the machine/system (a) formulated the programmable logic cells LC31, LC32 and LC33 at the third logic configuration LS3 based on a third set of configuration-programming-memory data CPM3 in the configuration programming memory (CPM) cells 362-1, 362-2, 362-3, 362-4, 490-1, 490-2 and 490-3 of the programmable logic block LB3 and/or the second set of data-information-memory data DIM2 and (b) stored a third set of data-information-memory data DIM3 in the HBM IC chips 251 in the standard commodity logic drive 300-1. The integral state of GPS functions in the programmable logic block LB3 after the third event E3 may be defined as S3LB3 relating to the third logic configuration LS3 for E3, CPM3 and DIM3. The third set of data-information-memory data DIM3 may include newly added information relating to the third event E3 and the data and information reorganized based on DIM1 and DIM2, and thereby keeps useful and important information of the first and second events E1 and E2.

(4) In a fourth event E4 after two months of the third event E3, the driver and/or machine/system drove from San Francisco to San Jose through Freeway 280. The machine/system used the programmable logic cells LC31, LC32, LC33 and LC34 for computing and processing the fourth event E4 and memorized a fourth logic configuration LS4 for the fourth event E4 and the related data, information or outcomes of the fourth event E4. That was: the machine/system (a) formulated the programmable logic cells LC31, LC32, LC33 and LC34 at the fourth logic configuration LS4 based on a fourth set of configuration-programming-memory data CPM4 in the configuration programming memory (CPM) cells 362-1, 362-2, 362-3, 362-4, 490-1, 490-2, 490-3 and 490-4 of the programmable logic block LB3 and/or the third set of data-information-memory data DIM3 and (b) stored a fourth set of data-information-memory data DIM4 in the HBM IC chips 251 in the standard commodity logic drive 300-1. The integral state of GPS functions in the programmable logic block LB3 after the fourth event E4 may be defined as S4LB3 relating to the fourth logic configuration LS4 for E4, CPM4 and DIM4. The fourth set of data-information-memory data DIM4 may include newly added information relating to the fourth event E4 and the data and information reorganized based on DIM1, DIM2 and DIM3, and thereby keeps useful and important information of the first, second and third events E1, E2 and E3.

(5) In a fifth event E5 after one week of the fourth event E4, the driver and/or machine/system drove from San Francisco to Cupertino through Freeway 280. Cupertino was in the middle way of the route in the fourth event E4. The machine/system used the programmable logic cells LC31, LC32, LC33 and LC34 at the fourth logic configuration LS4 for computing and processing the fifth event E5 and memorized the fourth logic configuration LS4 for the fifth event E5 and the related data, information or outcomes of the fifth event E5. That was: the machine/system (a) formulated the programmable logic cells LC31, LC32, LC33 and LC34 at the fourth logic configuration LS4 based on the fourth set of configuration-programming-memory data (CPM4) in the configuration programming memory (CPM) cells 362-1, 362-2, 362-3, 362-4, 490-1, 490-2, 490-3 and 490-4 of the programmable logic block LB3 and/or the fourth set of data-information-memory data DIM4 and (b) stored a fifth set of data-information-memory data DIM5 in the HBM IC chips 251 in the standard commodity logic drive 300-1. The integral state of GPS functions in the programmable logic block LB3 after the fifth event E5 may be defined as S5LB3 relating to the fourth logic configuration LS4 for E5, CPM4 and DIM5. The fifth set of data-information-memory data DIM5 may include newly added information relating to the fifth event E5 and the data and information reorganized based on DIM1-DIM4, and thereby keeps useful and important information of the first through fourth events E1-E4.

(6) In a sixth event E6 after six months of the fifth event E5, the driver and/or machine/system was planning to drive from San Francisco to Los Angeles. The driver and/or machine/system looked up a map and found two Freeways 101 and 5 to get to Los Angeles from San Francisco. The machine/system used the programmable logic cell LC31 of the programmable logic block LB3 and the programmable logic cell LC41 of the programmable logic block LB4 for computing and processing the sixth event E6 and memorized a sixth logic configuration LS6 for the sixth event E6 and the related data, information or outcomes of the sixth event E6. The programmable logic block LB4 may have the same architecture as the programmable logic block LB3 illustrated in FIG. 27C, but the four programmable logic cells LC31, LC32, LC33 and LC34 in the programmable logic block LB3 are renumbered as LC41, LC42, LC43 and LC44 in the programmable logic block LB4 respectively. That was: the machine/system (a) formulated the programmable logic cells LC31 and LC41 at the sixth logic configuration LS6 based on a sixth set of configuration-programming-memory data CPM6 in the configuration programming memory (CPM) cells 362-1, 362-2, 362-3, 362-4 and 490-1 of the programmable logic block LB3 and those of the programmable logic block LB4 and/or the fifth set of data-information-memory data DIM5 and (b) stored a sixth set of data-information-memory data DIM6 in the HBM IC chips 251 in the standard commodity logic drive 300-1. The integral state of GPS functions in the programmable logic blocks LB3 and LB4 after the sixth event E6 may be defined as S6LB3&4 relating to the sixth logic configuration LS6 for E6, CPM6 and DIM6. The sixth set of data-information-memory data DIM6 may include newly added information relating to the sixth event E6 and the data and information reorganized based on DIM1-DIM5, and thereby keeps useful and important information of the first through fifth events E1-E5.

(7) In a seventh event E7, the driver and/or machine/system decided to take Freeway 5 to get to Los Angeles from San Francisco. The machine/system used the programmable logic blocks LB31 and LB33 at the second logic configuration LS2 and/or the sixth set of data-information-memory data DIM6 for computing and processing the seventh event E7 and memorized the second logic configuration LS2 for the seventh event E7 and the related data, information or outcomes of the seventh event E7. That was: the machine/system (a) used the sixth set of data-information-memory data DIM6 for logic processing with the programmable logic cells LC31 and LC33 at the second logic configuration LS2 based on the second set of configuration-programming-memory data CPM2 in the configuration programming memory (CPM) cells 362-1, 362-2, 362-3, 362-4, 490-1 and 490-3 of the programmable logic block LB3 and (b) stored a seventh set of data-information-memory data DIM7 in the HBM IC chips 251 in the standard commodity logic drive 300-1. The integral state of GPS functions in the programmable logic block LB3 after the seventh event E7 may be defined as S7LB3 relating to the second logic configuration LS2 for E7, CPM2 and DIM7. The seventh set of data-information-memory data DIM7 may include newly added information relating to the seventh event E7 and the data and information reorganized based on DIM1-DIM6, and thereby keeps useful and important information of the first through sixth events E1-E6.

Figure 27D:
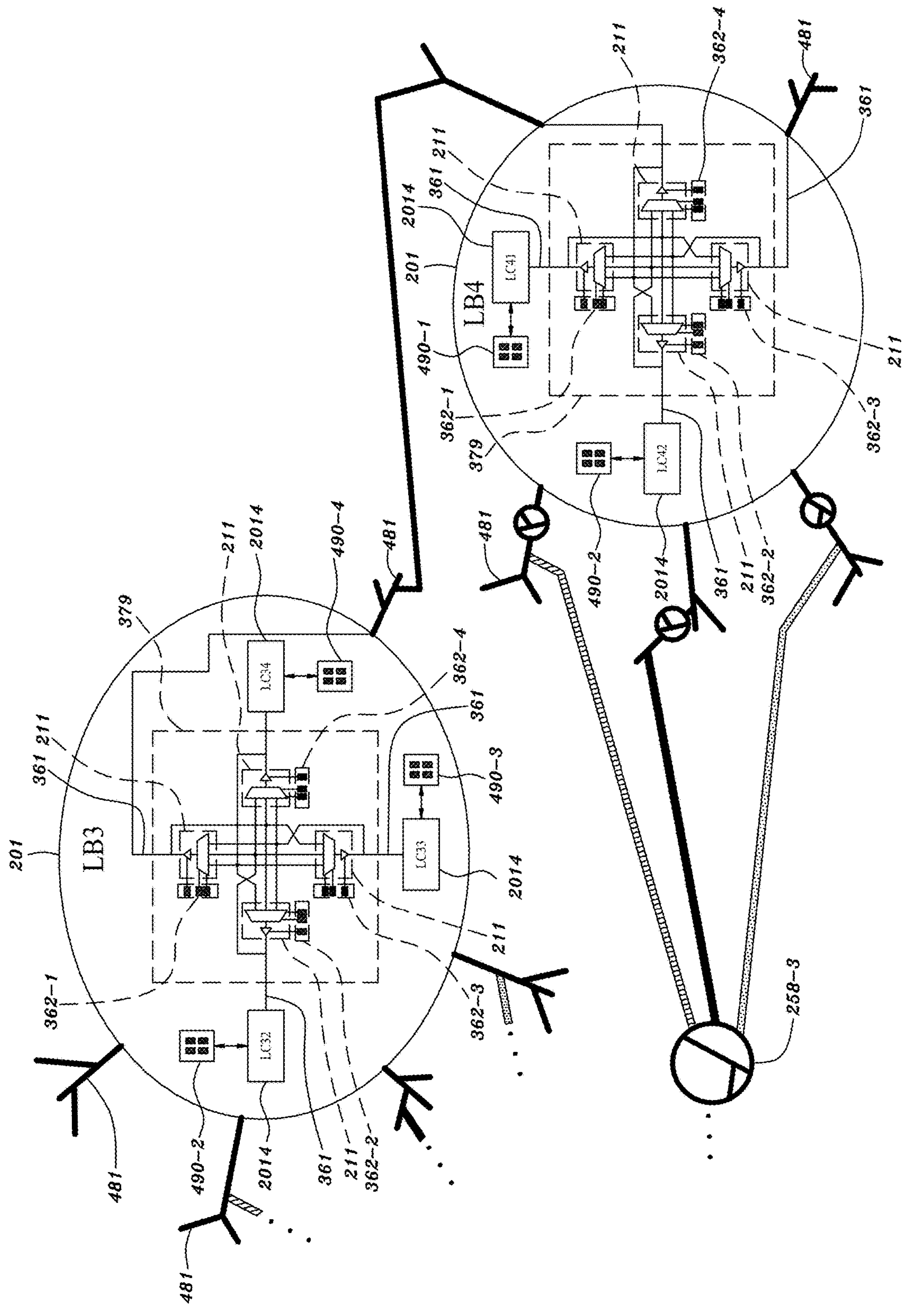
FIG. 27D is a schematic diagram for a reconfigurable plastic, elastic and/or integral architecture for the eighth event E8 in accordance with an embodiment of the present application.

(8) In an eighth event E8 after two weeks of the seventh event E7, the driver and/or machine/system drove from San Francisco to Los Angeles through Freeway 5. The machine/system used the programmable logic cells LC32, LC33 and LC34 of the programmable logic block LB3 and the programmable logic cells LC41 and LC42 of the programmable logic block LB4 for computing and processing the eighth event E8 and memorized an eighth logic configuration LS8 of the eighth event E8 and the related data, information or outcomes of the eighth event E8. The machine/system used the programmable logic cells LC32, LC33 and LC34 of the programmable logic block LB3 and the programmable logic cells LC41 and LC42 of the programmable logic block LB4 for computing and processing the eighth event E8 and memorized the eighth logic configuration LS8 for the eighth event E8 and the related data, information or outcomes of the eighth event E8. The programmable logic block LB4 may have the same architecture as the programmable logic block LB3 illustrated in FIG. 27C, but the four programmable logic cells LC31, LC32, LC33 and LC34 in the programmable logic block LB3 are renumbered as LC41, LC42, LC43 and LC44 in the programmable logic block LB4 respectively. FIG. 27D is a schematic diagram for a reconfigurable plastic, elastic and/or integral architecture for the eighth event E8 in accordance with an embodiment of the present application. Referring to FIGS. 27A-27D, the cross-point switch 379 of the programmable logic block LB3 may have its top terminal switched not to couple to the programmable logic cell LC31 (not shown in FIG. 27D but shown in FIG. 27C) but to a first portion of the FISC 20 and SISC 29 of the second semiconductor chip 200-2, like one of the dendrites 481 of the neurons for the programmable logic block LB3. The cross-point switch 379 of the programmable logic block LB4 may have its right terminal switched not to couple to the programmable logic cell LC44 (not shown) but to a second portion of the FISC 20 and SISC 29 of the second semiconductor chip 200-2, like one of the dendrites 481 of the neurons for the programmable logic block LB4, connecting to the first portion of the FISC 20 and SISC 29 of the second semiconductor chip 200-2 through a third portion of the FISC 20 and SISC 29 of the second semiconductor chip 200-2. The cross-point switch 379 of the programmable logic block LB4 may have its bottom terminal switched not to couple to the programmable logic cell LC43 (now shown) but to a fourth portion of the FISC 20 and SISC 29 of the second semiconductor chip 200-2, like one of the dendrites 481 of the neurons for the programmable logic block LB4. That was: the machine/system (a) formulated the programmable logic cells LC32, LC33, LC34, LC41 and LC42 at the eighth logic configuration LS8 based on an eighth set of configuration-programming-memory data CPM8 in the configuration programming memory (CPM) cells 362-1, 362-2, 362-3, 362-4, 490-1, 490-2 and 490-3 of the programmable logic block LB3 and the configuration programming memory (CPM) cells 362-1, 362-2, 362-3, 362-4, 490-1 and 490-2 of the programmable logic block LB4 and/or the seventh set of data-information-memory data DIM7 and (b) stored an eighth set of data-information-memory data DIM8 in the HBM IC chips 251 in the standard commodity logic drive 300-1. The integral state of GPS functions in the programmable logic blocks LB3 and LB4 after the eighth event E8 may be defined as S8LB3&4 relating to the eighth logic configuration LS8 for E8, CPM8 and DIM8. The eighth set of data-information-memory data DIM8 may include newly added information relating to the eighth event E8 and the data and information reorganized based on DIM1-DIM7, and thereby keeps useful and important information of the first through seventh events E1-E7.

(9) The event E8 is quite different from the previous first through seventh events E1-E7, and is categorized as a grand event E9, resulting in an integral state S9LB3. In the grand event E9 for grand reconfiguration after the first through eighth events E1-E8, the driver and/or machine/system may reconfigure the first through eighth logic configurations LS1-LS8 into a ninth logic configuration LS9 (1) to formulate the programmable logic cells LC31, LC32, LC33 and LC34 of the programmable logic block LB3 at the ninth logic configuration LS9 based on a ninth set of configuration-programming-memory data CPM9 in the configuration programming memory (CPM) cells 362-1, 362-2, 362-3 and 362-4 of the programmable logic block LB3 and/or the first through eighth sets of data-information-memory data DIM1-DIM8 for the GPS functions for the locations in the California area between San Francisco and Los Angeles and (2) to store a ninth set of data-information-memory data DIM5 in the configuration programming memory (CPM) cells 490-1, 490-2, 490-3 and 490-4 of the programmable logic block LB3.

The machine/system may perform the grand reconfiguration with certain given criteria. The grand reconfiguration is like the human brain reconfiguration after a deep sleep. The grand reconfiguration comprises condense or concise processes and learning processes, mentioned as below:

In the condense or concise processes for reconfiguration of data-information-memory (DIM) data in the event E9, the machine/system may check the eighth set of data-information-memory data DIM8 to find identical data-information-memory data, and keep only one of the identical data memories in the programmable logic block LB3; alternatively, the machine/system may check the eighth set of data-information-memory data DIM8 to find similar data with more than 70%, e.g., between 80% and 99%, of similarity among them, and select only one or two from the similar data as representative data-information-memory (DIM) data for the similar data.

In the condense or concise processes for reconfiguration of configuration-programming-memory (CPM) data in the event E9, the machine/system may check the eighth set of configuration-programming-memory data CPM8 for corresponding logic functions to find identical data for the same or similar logic functions, and keep only one of the identical data in the programmable logic block LB3 for the logic functions; alternatively, the machine/system may check the eighth set of configuration-programming-memory data CPM8 for the same or similar logic functions to find similar date with 70%, e.g., between 80% and 99%, of similarity among them, for the same or similar logic functions and keep only one or two from the similar data for the same or similar logic functions as representative configuration-programming-memory (CPM) data for the similar data for the same or similar logic functions.

In the learning processes in the event E9, an algorithm may be performed to (1) CPM1-CPM4, CPM6 and CPM8 for the logic configurations LS1-LS4, LS6 and LS8 and (2) DIM1-DIM8, for optimizing, e.g., selecting or screening, CPM1-CPM4, CPM6 and CPM8 into useful, significant and important ones as CPM9 and optimizing, e.g., selecting or screening, DIM1-DIM8 into useful, significant and important ones as DIM5. Further, the algorithm may be performed to (1) CPM1-CPM4, CPM6 and CPM8 for the logic configurations LS1-LS4, LS6 and LS8 and (2) DIM1-DIM8 for deleting non-useful, non-significant or non-important ones of the programming memories CPM1-CPM4, CPM6 and CPM8 and deleting non-useful, non-significant or non-important ones of the data memories DIM1-DIM8. The algorithm may be performed based on a statistical method, e.g., the frequency of use of CPM1-CPM4, CPM6 and CPM8 in the events E1-E8 and/or the frequency of use of DIM1-DIM8 in the events E1-E8.

Internet or Network Between Data Centers and Users

Figure 30:
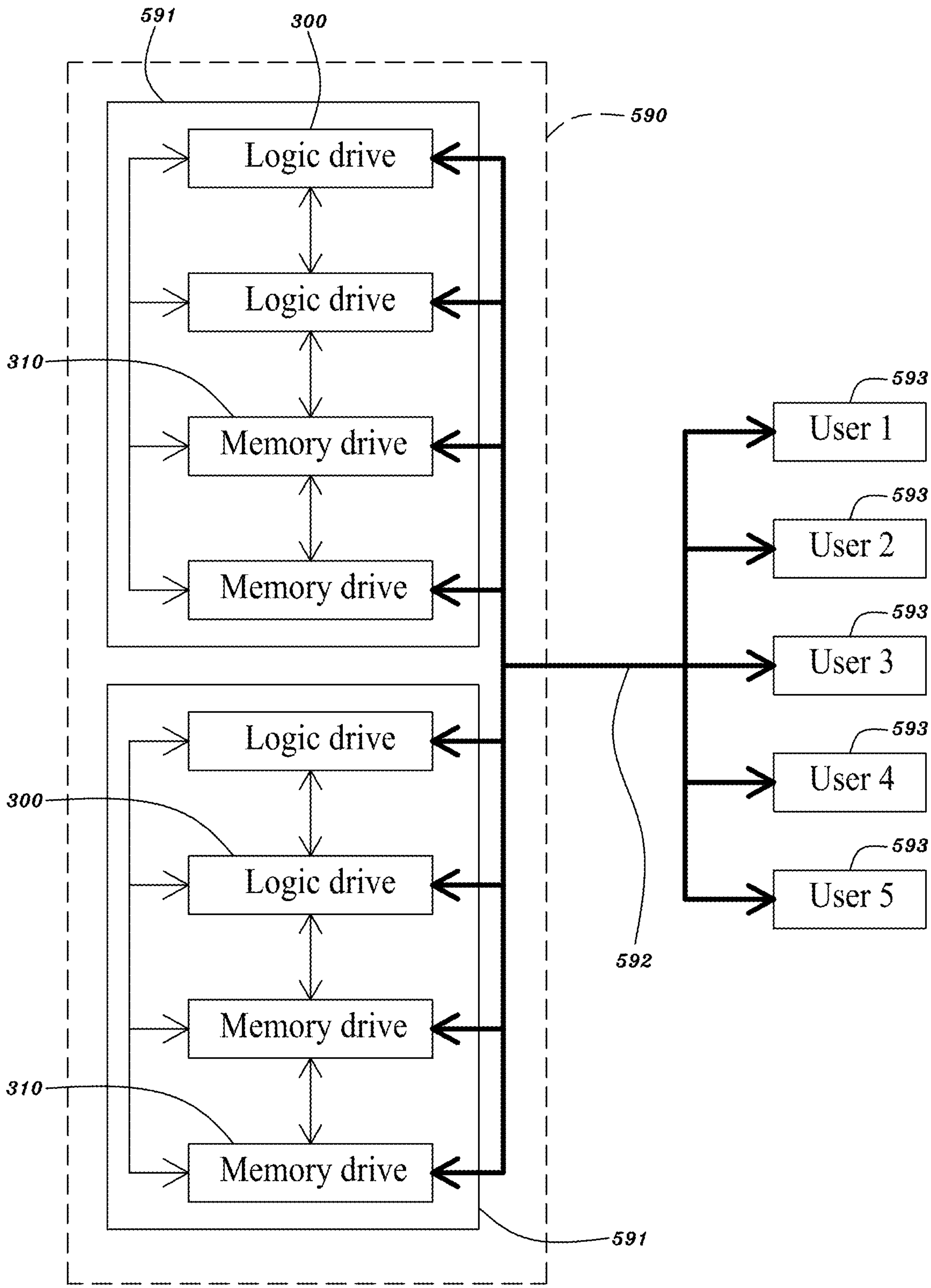
FIG. 30 is a block diagram illustrating networks between multiple data centers and multiple users in accordance with an embodiment of the present application.

FIG. 30 is a block diagram illustrating networks between multiple data centers and multiple users in accordance with an embodiment of the present application. Referring to FIG. 30, in the cloud 590 are multiple data centers 591 connected to each other or one another via the internet or networks 592. In each of the data centers 591 may be a plurality of one of the standard commodity logic drives 300 and/or a plurality of one of the memory drives 310, as illustrated in FIGS. 26A and 26B, allowed for one or more of user devices 593, such as computers, smart phones or laptops, to offload and/or accelerate service-oriented functions of all or any combinations of functions of artificial intelligence (AI), machine learning, deep learning, big data, internet of things (JOT), industry computing, virtual reality (VR), augmented reality (AR), car electronics, graphic processing (GP), video streaming, digital signal processing (DSP), micro controlling (MC), and/or central processing (CP) when said one or more of the user devices 593 is connected via the internet or networks to the standard commodity logic drives 300 and/or memory drives 310 in one of the data centers 591 in the cloud 590. In each of the data centers 591, the standard commodity logic drives 300 may couple to each other or one another via local circuits of said each of the data centers 591 and/or the internet or networks 592 and to the memory drives 310 via local circuits of said each of the data centers 591 and/or the internet or networks 592, wherein the memory drives 310 may couple to each other or one another via local circuits of said each of the data centers 591 and/or the internet or networks 592. Accordingly, the standard commodity logic drives 300 and memory drives 310 in the data centers 591 in the cloud 590 may be used as an infrastructure-as-a-service (IaaS) resource for the user devices 593. Similarly, to renting virtual memories (VMs) in a cloud, the field programmable gate arrays (FPGAs), which may be considered as virtual logics (VL), may be rented by users. In a case, each of the standard commodity logic drives 300 in one or more of the data centers 591 may include the FPGA IC chips 200 fabricated using a semiconductor IC process technology node more advanced than 28 nm technology node. A software program may be written on the user devices 593 in a common programing language, such as Java, C++, C#, Scala, Swift, Matlab, Assembly Language, Pascal, Python, Visual Basic, PL/SQL or JavaScript language. The software program may be uploaded by one of the user devices 590 via the internet or networks 592 to the cloud 590 to program the standard commodity logic drives 300 in the data centers 591 or cloud 590. The programmed logic drives 300 in the cloud 590 may be used by said one or another of the user devices 593 for an application via the internet or networks 592.

The scope of protection is limited solely by the claims, and such scope is intended and should be interpreted to be as broad as is consistent with the ordinary meaning of the language that is used in the claims when interpreted in light of this specification and the prosecution history that follows, and to encompass all structural and functional equivalents thereof

What is claimed is:

1. A semiconductor integrated-circuit (IC) chip comprising:

a non-volatile memory (NVM) cell for storing configuration data therein, wherein the non-volatile memory (NVM) cell comprises a first spin-orbit-torque-based (SOT-based) magnetoresistive-random-access-memory (MRAM) cell therein comprising a metal layer, a first magnetic layer, an oxide layer between the metal layer and first magnetic layer, and a second magnetic layer between the metal layer and oxide layer and in contact with the metal layer, wherein the metal layer has a first node and a second node and is configured for an electric current flowing along a horizontal direction from the first node to the second node through the metal layer;

a switch having first data at an input point thereof, wherein the first data is associated with the configuration data;

a first interconnect coupling to the configurable switch; and a second interconnect coupling to the switch, wherein the switch is configured to control, in accordance with the first data, coupling between the first and second interconnects.

2. The semiconductor integrated-circuit (IC) chip of claim 1, wherein the metal layer comprises platinum.

3. The semiconductor integrated-circuit (IC) chip of claim 1, wherein the metal layer comprises tantalum.

4. The semiconductor integrated-circuit (IC) chip of claim 1, wherein the metal layer comprises tungsten.

5. The semiconductor integrated-circuit (IC) chip of claim 1, wherein the first spin-orbit-torque-based (SOT-based) magnetoresistive-random-access-memory (MRAM) cell has a third node coupling to the first node through, in sequence, the first magnetic layer, oxide layer, second magnetic layer and metal layer, and the third node couples to the second node through, in sequence, the first magnetic layer, oxide layer, second magnetic layer and metal layer.

6. The semiconductor integrated-circuit (IC) chip of claim 1, wherein the oxide layer comprises magnesium oxide.

7. The semiconductor integrated-circuit (IC) chip of claim 1, wherein the first magnetic layer comprises cobalt, iron and boron.

8. The semiconductor integrated-circuit (IC) chip of claim 1, wherein the first spin-orbit-torque-based (SOT-based) magnetoresistive-random-access-memory (MRAM) cell further comprises an antiferromagnetic layer therein, wherein the first magnetic layer is between the oxide layer and antiferromagnetic layer.

9. The semiconductor integrated-circuit (IC) chip of claim 1, wherein the non-volatile memory (NVM) cell further comprises a second spin-orbit-torque-based (SOT-based) magnetoresistive-random-access-memory (MRAM) cell therein coupling to the first spin-orbit-torque-based (SOT-based) magnetoresistive-random-access-memory (MRAM) cell.

10. The semiconductor integrated-circuit (IC) chip of claim 1 is a field-programmable-gate-array (FPGA) integrated-circuit (IC) chip.

11. The semiconductor integrated-circuit (IC) chip of claim 1 further comprising a data latch circuit for storing second data therein associated with the configuration data, wherein the first data is associated with the second data.

12. The semiconductor integrated-circuit (IC) chip of claim 11, wherein the data latch circuit comprises a static-random-access memory (SRAM) cell.

13. The semiconductor integrated-circuit (IC) chip of claim 1 further comprising a sense amplifier for generating second data at an output point thereof by sensing third data at an input point thereof associated with the configuration data, wherein the first data is associated with the second data.

14. The semiconductor integrated-circuit (IC) chip of claim 13 further comprising a static-random-access memory (SRAM) cell for storing fourth data therein associated with the second data, wherein the first data is associated with the fourth data.

15. A semiconductor integrated-circuit (IC) chip comprising:

a non-volatile memory (NVM) cell for storing therein a resulting value of a look-up table (LUT) for logic operation, wherein a spin-orbit-torque-based (SOT-based) magnetoresistive-random-access-memory (MRAM) cell of the non-volatile memory (NVM) cell comprises a metal layer, a first magnetic layer, an oxide layer between the metal layer and first magnetic layer, and a second magnetic layer between the metal layer and oxide layer and in contact with the metal layer, wherein the metal layer has a first node and a second node and is configured for an electric current flowing along a horizontal direction from the first node to the second node through the metal layer; and a selection circuit to be configured in accordance with a first input data set having data associated with the resulting value.

16. The semiconductor integrated-circuit (IC) chip of claim 15, wherein the metal layer comprises platinum.

17. The semiconductor integrated-circuit (IC) chip of claim 15, wherein the metal layer comprises tantalum.

18. The semiconductor integrated-circuit (IC) chip of claim 15, wherein the metal layer comprises tungsten.

19. The semiconductor integrated-circuit (IC) chip of claim 15, wherein the spin-orbit-torque-based (SOT-based) magnetoresistive-random-access-memory (MRAM) cell has a third node coupling to the first node through, in sequence, the first magnetic layer, oxide layer, second magnetic layer and metal layer, and the third node couples to the second node through, in sequence, the first magnetic layer, oxide layer, second magnetic layer and metal layer.

20. The semiconductor integrated-circuit (IC) chip of claim 15, wherein the oxide layer comprises magnesium oxide.

21. The semiconductor integrated-circuit (IC) chip of claim 15, wherein the first magnetic layer comprises cobalt, iron and boron.

22. The semiconductor integrated-circuit (IC) chip of claim 15, wherein the spin-orbit-torque-based (SOT-based) magnetoresistive-random-access-memory (MRAM) cell further comprises an antiferromagnetic layer therein, wherein the first magnetic layer is between the oxide layer and antiferromagnetic layer.

23. The semiconductor integrated-circuit (IC) chip of claim 15 is a field-programmable-gate-array (FPGA) integrated-circuit (IC) chip.

24. The semiconductor integrated-circuit (IC) chip of claim 15, wherein the selection circuit comprises a first set of input points for the first input data set and a second set of input points for a second input data set for the logic operation, wherein the selection circuit is configured to select, in accordance with the second input data set, input data from the first input data set as output data for the logic operation.

* * * * *